(12) United States Patent
Kurokawa et al.

(10) Patent No.: US 10,650,766 B2
(45) Date of Patent: May 12, 2020

(54) SEMICONDUCTOR DEVICE AND ELECTRONIC DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Yoshiyuki Kurokawa, Sagamihara (JP); Takayuki Ikeda, Atsugi (JP); Tatsunori Inoue, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 73 days.

(21) Appl. No.: 15/876,724

(22) Filed: Jan. 22, 2018

(65) Prior Publication Data

US 2018/0211620 A1    Jul. 26, 2018

(30) Foreign Application Priority Data

Jan. 26, 2017  (JP) ................................ 2017-011939
Feb. 16, 2017  (JP) ................................ 2017-026719
Feb. 23, 2017  (JP) ................................ 2017-031672

(51) Int. Cl.
*G09G 3/36* (2006.01)
*G11C 19/18* (2006.01)
(Continued)

(52) U.S. Cl.
CPC ......... *G09G 3/3674* (2013.01); *G06N 3/0454* (2013.01); *G06N 3/0481* (2013.01);
(Continued)

(58) Field of Classification Search
CPC .. G09G 3/3674; G09G 3/3677; G09G 3/3688; G09G 2310/0286;
(Continued)

(56) References Cited

U.S. PATENT DOCUMENTS 9,716,852 B2     7/2017  Kurokawa
2003/0071779 A1*  4/2003  Lee ..................... G09G 3/2011
                                              345/99
(Continued)

FOREIGN PATENT DOCUMENTS

CN    101494020 A    7/2009
CN    102682688 A    9/2012
(Continued)

OTHER PUBLICATIONS

Kawashima.S et al., "13.3-in. 8K×4K 664-ppi OLED Display Using CAAC-OS FETs", SID Digest '14 : SID International Symposium Digest of Technical Papers, Jun. 3, 2014, pp. 627-630.
(Continued)

*Primary Examiner* — Stephen G Sherman
(74) *Attorney, Agent, or Firm* — Robinson Intellectual Property Law Office; Eric J. Robinson

(57) ABSTRACT

A semiconductor device with a small circuit area that consumes low power is provided. The semiconductor device includes a shift register, a sample-and-hold circuit, a first buffer circuit, and a second buffer circuit. The sample-and-hold circuit includes a first input terminal, a second input terminal, and an output terminal. An output terminal of the first buffer circuit is electrically connected to the first input terminal. The shift register is electrically connected to the second input terminal. An input terminal of the second buffer circuit is electrically connected to the output terminal of the sample-and-hold circuit. In the semiconductor device, the potential of an input analog signal is retained in the sample-and-hold circuit and the analog signal is output from an output terminal of the second buffer circuit.

17 Claims, 54 Drawing Sheets

(51) Int. Cl.
| | |
|---|---|
| *H01L 29/786* | (2006.01) |
| *H01L 27/12* | (2006.01) |
| *G11C 27/04* | (2006.01) |
| *G11C 27/02* | (2006.01) |
| *G06N 3/08* | (2006.01) |
| *G06N 3/063* | (2006.01) |
| *G06N 3/04* | (2006.01) |

(52) U.S. Cl.
CPC ............ *G06N 3/063* (2013.01); *G06N 3/084* (2013.01); *G09G 3/3677* (2013.01); *G09G 3/3688* (2013.01); *G11C 19/184* (2013.01); *G11C 27/024* (2013.01); *G11C 27/04* (2013.01); *H01L 27/1225* (2013.01); *H01L 27/1251* (2013.01); *H01L 29/7869* (2013.01); *H01L 29/78648* (2013.01); *G06N 3/04* (2013.01); *G06N 3/08* (2013.01); *G09G 2310/0286* (2013.01); *G09G 2310/0291* (2013.01); *G09G 2310/0294* (2013.01); *G09G 2310/0297* (2013.01)

(58) Field of Classification Search
CPC ... G09G 2310/0291; G09G 2310/0294; G09G 2310/0297; G11C 19/184; G11C 27/024; G11C 27/04; H01L 27/1251; H01L 29/78648; H01L 29/7869; G06N 3/04; G06N 3/08
See application file for complete search history.

(56) References Cited

U.S. PATENT DOCUMENTS

| | | | |
|---|---|---|---|
| 2004/0125067 A1* | 7/2004 | Kim | G09G 3/3614 345/98 |
| 2006/0146000 A1* | 7/2006 | Choi | G09G 3/2011 345/100 |
| 2007/0013774 A1* | 1/2007 | Maeng | G02F 1/13306 348/87 |
| 2007/0286287 A1 | 12/2007 | Kim et al. | |
| 2008/0158450 A1* | 7/2008 | Tsuruta | G09G 3/3696 349/33 |
| 2008/0230768 A1* | 9/2008 | Goh | H01L 27/12 257/40 |
| 2009/0189881 A1 | 7/2009 | Ooishi et al. | |
| 2010/0045655 A1* | 2/2010 | Jang | G09G 3/20 345/213 |
| 2012/0062529 A1 | 3/2012 | Koyama | |
| 2012/0229431 A1 | 9/2012 | Hiroki | |
| 2013/0134413 A1* | 5/2013 | Yamazaki | H01L 29/7869 257/43 |
| 2016/0140918 A1 | 5/2016 | Koyama | |
| 2016/0343452 A1 | 11/2016 | Ikeda et al. | |
| 2017/0104985 A1 | 4/2017 | Hiroki | |
| 2017/0301391 A1 | 10/2017 | Kurokawa | |
| 2019/0236451 A1* | 8/2019 | Jaitly | G06N 3/0445 |

FOREIGN PATENT DOCUMENTS

| | | |
|---|---|---|
| JP | 07-134279 A | 5/1995 |
| JP | 2001-306034 A | 11/2001 |
| JP | 2009-175468 A | 8/2009 |
| JP | 2012-256012 A | 12/2012 |
| JP | 2013-137486 A | 7/2013 |
| JP | 2016-004549 A | 1/2016 |
| JP | 2016-106399 A | 6/2016 |
| JP | 2016-219011 A | 12/2016 |
| JP | 2017-130195 A | 7/2017 |
| KR | 2007-0118756 A | 12/2007 |

OTHER PUBLICATIONS

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.

Hamasaki.K et al., "A proposal of a stream image compression architecture using neural networks", IEICE Technical Report, Jan. 22, 2015, vol. 114, No. 428, pp. 129-132, IEICE(The Institute of Electronics,Information and Communication Engineers).

International Search Report (Application No. PCT/IB2018/050296) dated Apr. 24, 2018.

Written Opinion (Application No. PCT/IB2018/050296) dated Apr. 24, 2018.

* cited by examiner $$D_a[1,1] = g[1,1]f_a[1,1] + g[1,2]f_a[1,2] + \cdots + g[t,s]f_a[t,s]$$

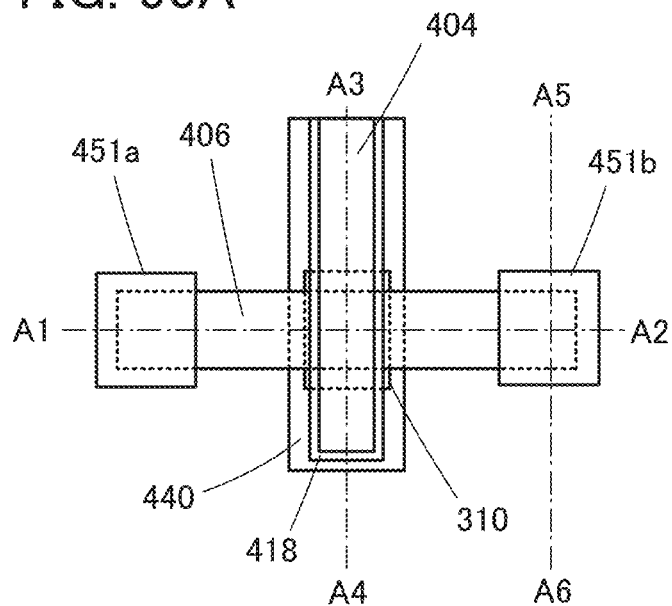
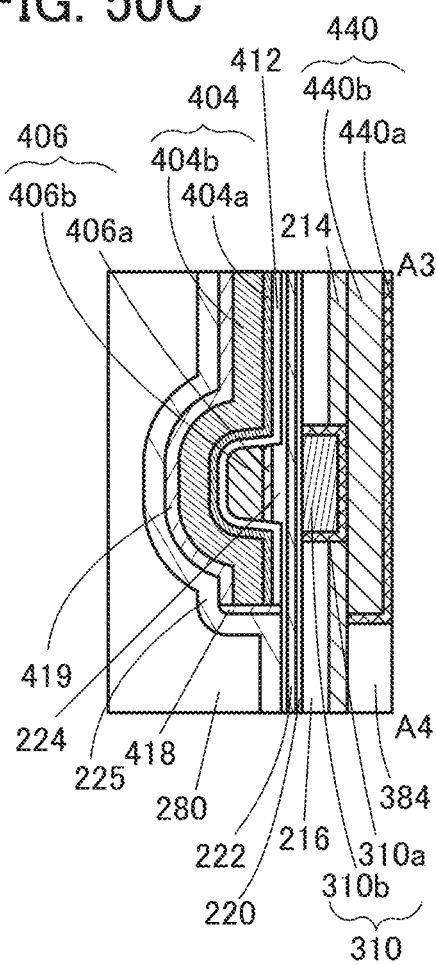
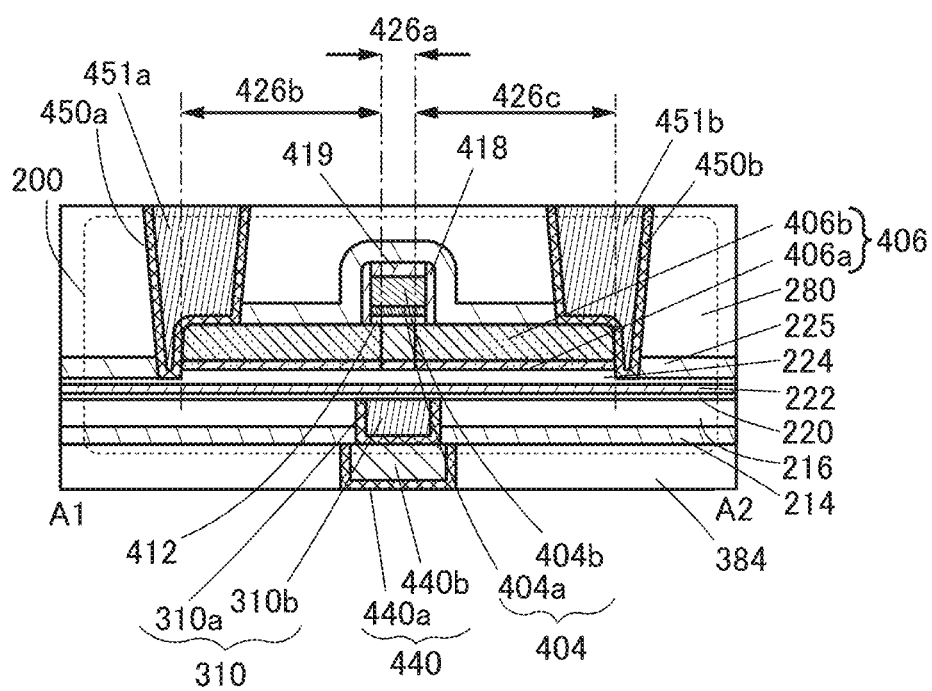
FIG. 50A
FIG. 50B
FIG. 50C

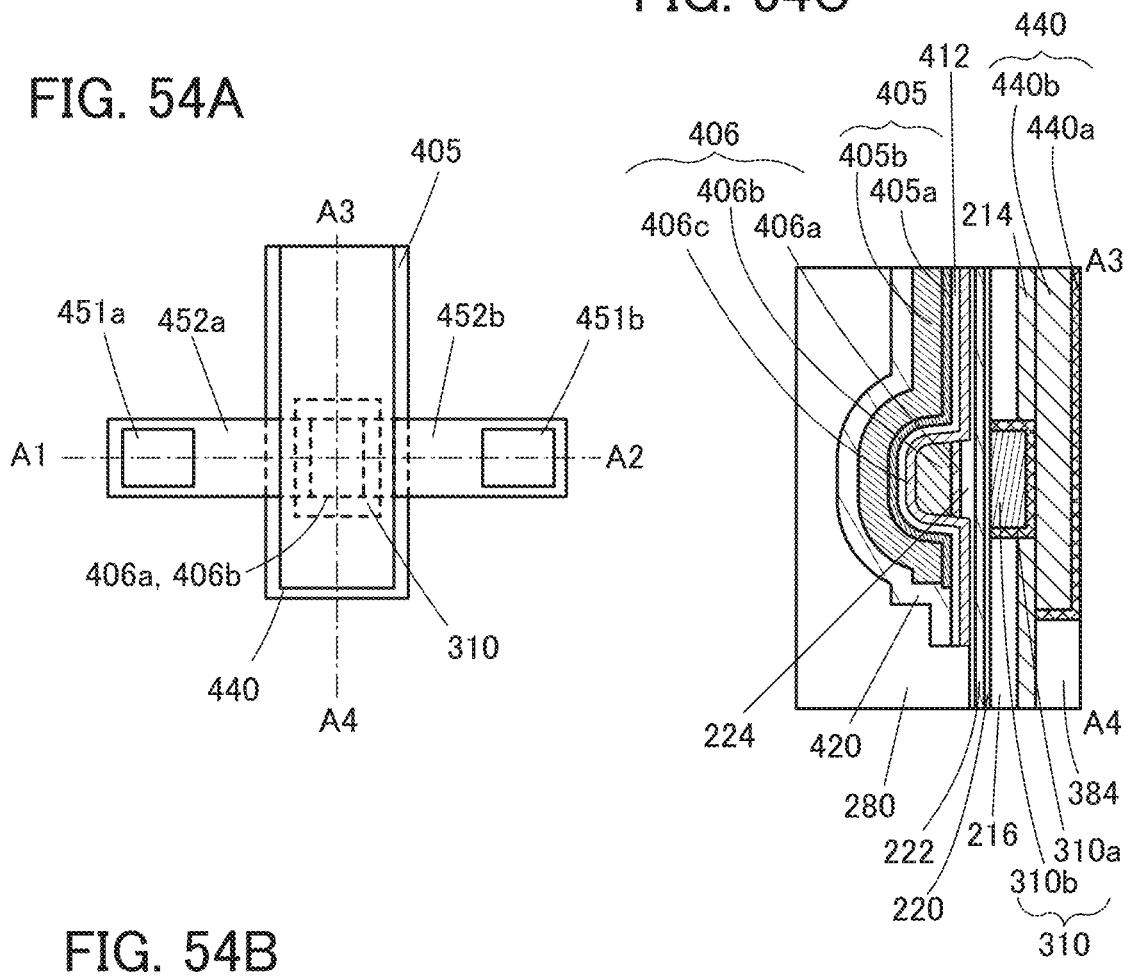
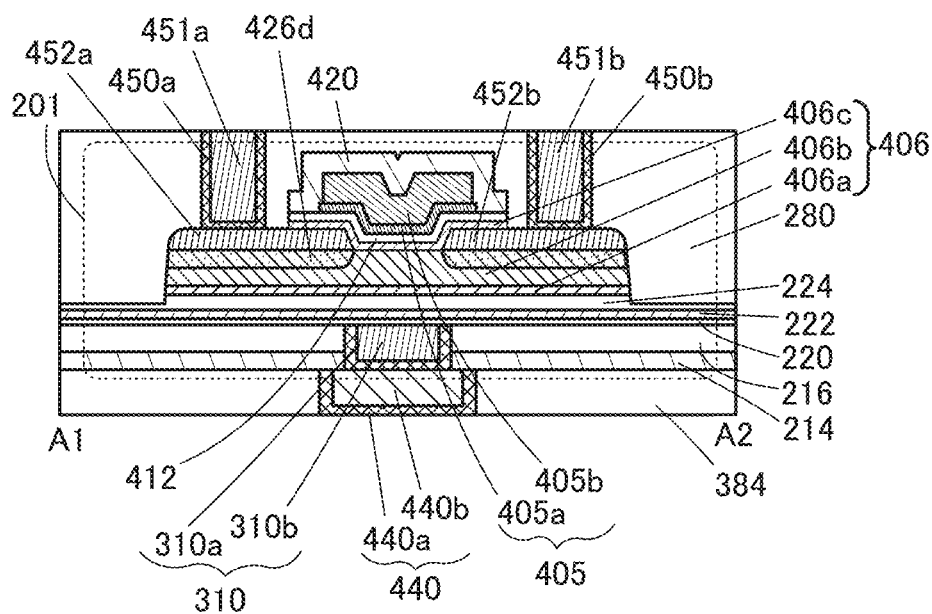
FIG. 54A
FIG. 54B
FIG. 54C

SEMICONDUCTOR DEVICE AND ELECTRONIC DEVICE INCLUDING THE SEMICONDUCTOR DEVICE

TECHNICAL FIELD

One embodiment of the present invention relates to a semiconductor device and an electronic device including the semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a system, a method for driving any of them, a method for manufacturing any of them, and a method for inspecting any of them.

BACKGROUND ART

A demand for high-definition images is increased along with an increase in the size of a screen of a television (TV). For this reason, ultra-high definition TV (UHDTV) broadcasting has been increasingly put into practical use. Japan, which has promoted UHDTV broadcasting, started 4K broadcast services utilizing a communication satellite (CS) and an optical line in 2015. Furthermore, the test broadcasting of UHDTV (4K and 8K) by a broadcast satellite (BS) will start in the future. Therefore, a variety of electronic devices compatible with 8K broadcasting have been developed (see Non-Patent Document 1). In practical 8K broadcasting, 4K broadcasting and 2K broadcasting (full-high vision broadcasting) will be also employed.

Not only televisions but also a variety of electronic devices that incorporate artificial intelligence utilizing artificial neural networks or the like have been developed. Artificial neural networks are expected to provide computers with higher performance than conventional Neumann computers. In recent years, a variety of researches on artificial neural networks realized with electronic circuits have been carried out. Non-Patent Document 2 discloses a technique relating to a chip having a self-learning function with artificial neural networks.

Furthermore, Patent Document 1 discloses an invention in which weight data necessary for computation with an artificial neural network is retained in a memory device including a transistor that contains an oxide semiconductor in a channel formation region.

REFERENCE

Patent Document

[Patent Document 1] United States Patent Application Publication No. 2016/0343452

Non-Patent Documents

[Non-Patent Document 1] S. Kawashima, et al., "13.3-In. 8K×4K 664-ppi OLED Display Using CAAC-OS FETs," SID 2014 Digest, pp. 627-630.

[Non-Patent Document 2] Yutaka Arima et al., "A Self-Learning Neural Network Chip with 125 Neurons and 10K Self-Organization Synapses," IEEE Journal of Solid-State Circuits, Vol. 26, No. 4, April 1991, pp. 607-611.

DISCLOSURE OF INVENTION

As a video encoding method for 8K broadcasting, a new standard of H.265 MPEG-H high efficiency video coding (HEVC) is employed. The resolution (the number of pixels in the horizontal and perpendicular directions) of an image in 8K broadcasting is 7680×4320, which is 4 times as high as that in 4K broadcasting (3840×2160) and is 16 times as high as that in 2K broadcasting (1920×1080). Thus, it is necessary to use a large volume of image data in 8K broadcasting.

In a television that has received a signal for 8K broadcasting, for example, the received broadcast signal is decompressed (decoded) to obtain an enormous amount of data corresponding to an 8K image. In the case of transmitting such an enormous amount of image data to a display device, the number of wirings used for transmitting the image data is increased as the resolution of the display device becomes higher. Thus, the cost for components such as the wirings and power required for transmitting image data are increased.

An object of one embodiment of the present invention is to provide a novel semiconductor device. Another object of one embodiment of the present invention is to provide an electronic device including a novel semiconductor device. Another object of one embodiment of the present invention is to provide a semiconductor device with a small circuit area. Another object of one embodiment of the present invention is to provide a semiconductor device with low power consumption. Another object of one embodiment of the present invention is to provide a semiconductor device capable of performing high-speed arithmetic processing.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects. One embodiment of the present invention need not solve all the aforementioned objects and the other objects.

(1) One embodiment of the present invention is a semiconductor device including a shift register, a sample-and-hold circuit, a first buffer circuit, and a second buffer circuit. The sample-and-hold circuit includes a first input terminal, a second input terminal, and an output terminal. An output terminal of the first buffer circuit is electrically connected to the first input terminal. The shift register is electrically connected to the second input terminal. An input terminal of the second buffer circuit is electrically connected to the output terminal of the sample-and-hold circuit. An analog signal is input to an input terminal of the first buffer circuit. The sample-and-hold circuit is configured to receive the analog signal through the first input terminal when a signal from the shift register is transmitted to the second input terminal and is configured to hold a potential corresponding to the analog signal.

(2) Another embodiment of the present invention is the semiconductor device in (1) in which the sample-and-hold circuit further includes a first transistor and a first capacitor.

A first terminal of the first transistor is electrically connected to the first input terminal. A second terminal of the first transistor is electrically connected to the output terminal of the sample-and-hold circuit. A gate of the first transistor is electrically connected to the second input terminal. A first terminal of the first capacitor is electrically connected to the second terminal of the first transistor.

(3) Another embodiment of the present invention is a semiconductor device including a shift register, a first demultiplexer, a second demultiplexer, a sample-and-hold circuit, a first buffer circuit, and a second buffer circuit. The sample-and-hold circuit includes a first input terminal, a second input terminal, and an output terminal. An output terminal of the first buffer circuit is electrically connected to an input terminal of the first demultiplexer. An output terminal of the first demultiplexer is electrically connected to the first input terminal. The shift register is electrically connected to an input terminal of the second demultiplexer. An output terminal of the second demultiplexer is electrically connected to the second input terminal. An input terminal of the second buffer circuit is electrically connected to the output terminal of the sample-and-hold circuit. The sample-and-hold circuit is configured to receive an analog signal through the first input terminal when a signal from the shift register is transmitted to the second input terminal and is configured to hold a potential corresponding to the analog signal.

(4) Another embodiment of the present invention is the semiconductor device in (3) in which the first demultiplexer and the second demultiplexer are controlled by the same signal.

(5) Another embodiment of the present invention is the semiconductor device in (3) or (4) in which the sample-and-hold circuit further includes a first transistor and a first capacitor. A first terminal of the first transistor is electrically connected to the first input terminal. A second terminal of the first transistor is electrically connected to the output terminal of the sample-and-hold circuit. A gate of the first transistor is electrically connected to the second input terminal. A first terminal of the first capacitor is electrically connected to the second terminal of the first transistor.

(6) Another embodiment of the present invention is the semiconductor device in any of (1) to (5) in which the first transistor contains a metal oxide in a channel formation region.

(7) Another embodiment of the present invention is an electronic device including the semiconductor device in any of (1) to (6) and an autoencoder. The autoencoder is electrically connected to the input terminal of the first buffer circuit in the semiconductor device. The autoencoder is configured to convert first image data into second image data obtained by feature extraction of the first image data, restore the second image data into the first image data, and output the first image data restored as a second analog signal, when a first analog signal based on the first image data is input to the autoencoder. The second analog signal is input to the input terminal of the first buffer circuit.

(8) Another embodiment of the present invention is the electronic device in (7) further including a display portion. The display portion includes a second transistor in a pixel. The second transistor contains hydrogenated amorphous silicon in a channel formation region.

(9) Another embodiment of the present invention is the electronic device in (7) further including a display portion. The display portion includes a second transistor in a pixel. The second transistor contains a metal oxide in a channel formation region.

(10) Another embodiment of the present invention is an electronic device including an autoencoder, a source driver circuit, and a display portion. The autoencoder includes an encoder and a decoder. The display portion includes a plurality of pixel regions. The encoder is configured to convert first image data into second image data by feature extraction and output the second image data to the decoder. The decoder is configured to restore the second image data into the first image data and output the first image data to the source driver circuit. The source driver circuit is configured to output the first image data to the display portion. The encoder includes a neural network configured to perform convolution using a weight filter. The encoder includes a memory cell array and a shift register. The memory cell array is configured to store a filter value of the weight filter. The shift register is configured to output the first image data in each of the pixel regions to the memory cell array sequentially. The convolution includes a product-sum operation using the first image data and the filter value.

(11) Another embodiment of the present invention is the electronic device in (10) in which the display portion includes pixels arranged in n rows and m columns (n and m are each an integer greater than or equal to 1). The pixel regions each include pixels arranged in t rows and s columns (t is an integer greater than or equal to 1 and less than or equal to n, and s is an integer greater than or equal to 1 and less than or equal to m). The shift register includes t×m stages of retention circuits. The shift register is configured to output t×s sets of first image data to the memory cell array at a time.

One embodiment of the present invention can provide a novel semiconductor device. Another embodiment of the present invention can provide an electronic device including a novel semiconductor device.

Another embodiment of the present invention can provide a semiconductor device with a small circuit area. Another embodiment of the present invention can provide a semiconductor device with low power consumption. Another embodiment of the present invention can provide a semiconductor device capable of performing high-speed arithmetic processing.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF DRAWINGS

FIGS. 50A to 50C are a top view and cross-sectional views illustrating a structure example of a transistor.

FIGS. 54A to 54C are a top view and cross-sectional views illustrating a structure example of a transistor.

BEST MODE FOR CARRYING OUT THE INVENTION

In this specification and the like, an artificial neural network (ANN, hereinafter referred to as a neural network) is any type of model that resembles a biological neural network. In a general neural network, units that resemble neurons are connected to each other through a unit that resembles a synapse.

The connection strength of the synapse (or a weight coefficient) can be changed when the neural network is provided with existing information. The processing for determining a connection strength by providing a neural network with existing information in such a manner is called "learning" in some cases.

Furthermore, when a neural network in which "learning" is performed (or a connection strength is determined) is provided with some type of information, new information can be output on the basis of the connection strength. The processing for outputting new information on the basis of provided information and a connection strength in a neural network in such a manner is called "inference" or "recognition" in some cases.

Examples of models of a neural network include a hopfield neural network and a hierarchical neural network. In particular, in this specification and the like, a multilayer neural network is called a "deep neural network" (DNN), and machine learning using a deep neural network is called "deep learning."

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is called an oxide semiconductor in some cases. That is, a metal oxide included in a channel formation region of a transistor that has at least one of an amplifying function, a rectifying function, and a switching function can be referred to as a metal oxide semiconductor or shortly as an OS. An OS FET (or an OS transistor) refers to a transistor including a metal oxide or an oxide semiconductor.

Embodiment 1

In this embodiment, the configuration of a source driver circuit that is a semiconductor device of one embodiment of the present invention will be described.

Figure 1:
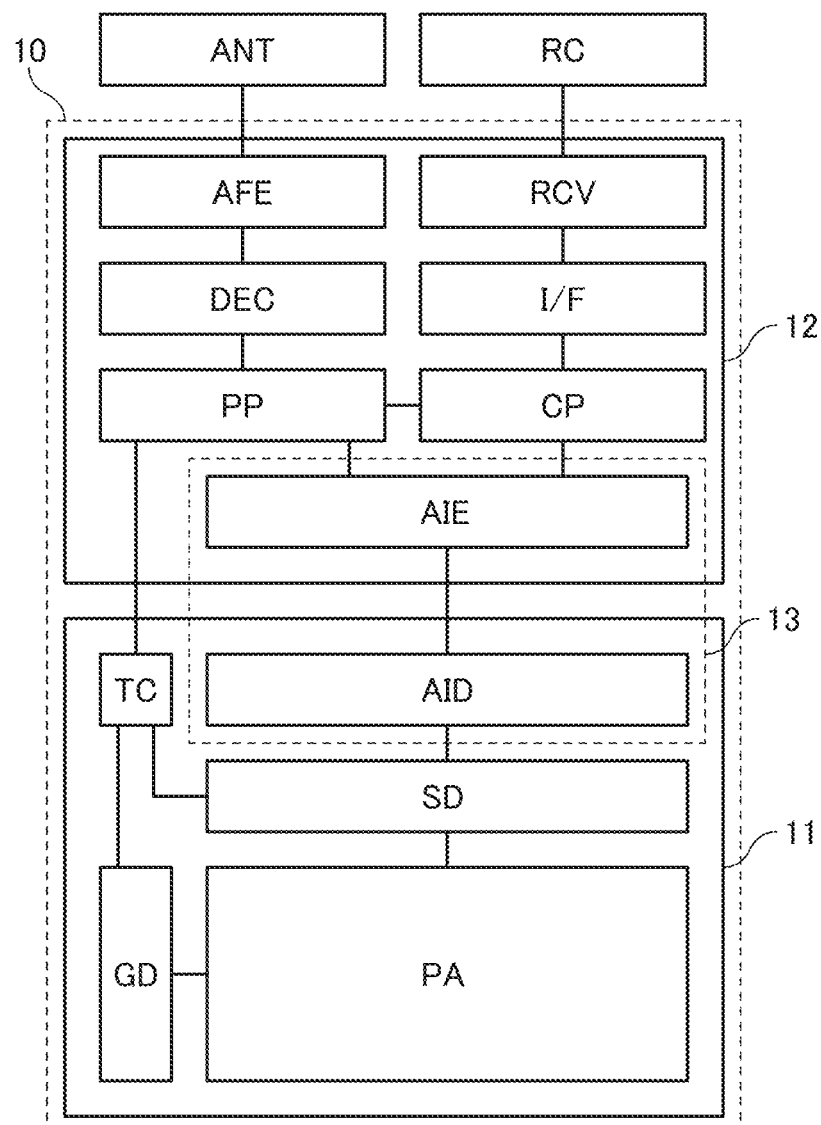
FIG. 1 is a block diagram illustrating a configuration example of an electronic device.

FIG. 1 is a block diagram of an electronic device including a display device, a receiver, and the like. An electronic device 10 includes a display device 11 and a receiver 12. FIG. 1 also illustrates an antenna ANT that receives a broadcast signal and a remote controller RC that is used for the control of the electronic device 10.

The display device 11 includes a display portion PA, a gate driver circuit GD, a source driver circuit SD, a timing controller TC, and an artificial intelligence (AI) decoder AID.

The receiver 12 includes a receive portion RCV, an interface I/F, a control portion CP, an analog front end AFE, a decoder DEC, an image processing portion PP, and an AI encoder AIE.

Note that in the electronic device 10, the AI decoder AID included in the display device 11 and the AI encoder AIE included in the receiver 12 compose an autoencoder 13.

The antenna ANT is electrically connected to the analog front end AFE in the receiver 12, and the analog front end AFE is electrically connected to the decoder DEC. The decoder DEC is electrically connected to the image processing portion PP, and the image processing portion PP is electrically connected to the control portion CP, the AI encoder AIE, and the timing controller TC. The receive portion RCV is electrically connected to the interface I/F, and the interface I/F is electrically connected to the control portion CP. The control portion CP is electrically connected to the AI encoder AIE, and the AI encoder AIE is electrically connected to the AI decoder AID.

The AI decoder AID is electrically connected to the source driver circuit SD. The timing controller TC is electrically connected to the source driver circuit SD and the gate driver circuit GD. The display portion PA is electrically connected to the source driver circuit SD and the gate driver circuit GD.

The antenna ANT has a function of receiving airwaves from a satellite or a radio tower and converting the airwaves into an electric signal. The antenna ANT also has a function of transmitting the electric signal to the analog front end AFE.

The analog front end AFE has a function of extracting a signal of a channel included in the electric signal and demodulating the signal to give a broadcast signal. The analog front end AFE also has a function of transmitting the broadcast signal to the decoder DEC.

The decoder DEC has a function of decoding and decompressing image data and audio data included in the broadcast signal. The image data, in particular, is transmitted from the decoder DEC to the image processing portion PP. The audio data is transmitted to an audio control portion, an audio output device, or the like included in the electronic device 10. Note that the audio control portion and the audio output device are not illustrated in FIG. 1.

The image processing portion PP has a function of performing a variety of kinds of image processing on the decompressed image data. The image processing portion PP can include, for example, a gamma correction circuit, a dimming circuit, and a toning circuit. In the case where the display portion PA includes an organic electroluminescent (EL) element and the source driver circuit SD includes a current detection circuit that detects current flowing in the organic EL element, the image processing portion PP can include an EL correction circuit. The corrected image data is transmitted to the AI encoder AIE.

The autoencoder 13, and the AI encoder AIE and the AI decoder AID included in the autoencoder 13 will be described later.

A user can operate the electronic device 10 by using the remote controller RC. The remote controller RC can transmit a control signal to the electronic device 10 in response to the operation by the user. Examples of the control signal are as follows: a signal for selecting one from programs of broadcasting stations on the broadcast signal received from the antenna ANT; a signal for adjusting the tone, brightness, or the like of an image displayed on the display device; and, in the case where the electronic device 10 has a function of recording and reproducing image data, a signal for reproducing, rewinding, fast-forwarding, or stopping the image data. The control signal transmitted from the remote controller RC is, for example, an infrared ray or an electric wave.

The user does not need to use the components illustrated in FIG. 1 for the operation of the electronic device 10, and can use an input key or the like provided for the electronic device 10 to directly operate the electronic device 10, for example.

The receive portion RCV has a function of receiving the control signal from the remote controller RC. The receive portion RCV has a function of transmitting the control signal to the interface I/F after receiving the control signal.

The interface I/F has a function of converting the control signal into an electric signal and transmitting the signal to the control portion CP.

The control portion CP has a function of decoding the electric signal transmitted from the interface I/F, and a function of generating data necessary for controlling the image processing, updating a weight coefficient for the autoencoder 13, and changing the configuration of a neural network in the autoencoder 13, on the basis of the electric signal. Then, the data is transmitted to the image processing portion PP, the autoencoder 13, and the like as a control signal.

The timing controller TC has a function of generating a timing signal (e.g., a clock signal CLK described later) that is used in the source driver circuit SD or the gate driver circuit GD. The timing signal is generated on the basis of, although not limited thereto, a frame rate or the like included in the image data transmitted from the image processing portion PP.

The source driver circuit SD has a function of receiving image data output from the AI decoder AID included in the autoencoder 13, and a function of transmitting the image data to the display portion PA. Note that the image data is transmitted to the display portion PA in response to the timing signal transmitted from the timing controller TC. The details of the source driver circuit SD will be described later.

The gate driver circuit GD has a function of transmitting a selection signal to pixels included in the display portion PA. Note that the selection signal is transmitted to the pixels in response to the timing signal transmitted from the timing controller TC.

At least one of the AI decoder AID, the timing controller TC, the source driver circuit SD, and the gate driver circuit GD included in the display device 11 can be formed over a substrate over which the display portion PA is formed, in some cases. Alternatively, at least one of the AI decoder AID, the timing controller TC, the source driver circuit SD, and the gate driver circuit GD included in the display device 11 can be mounted on the substrate over which the display portion PA is formed, as an integrated circuit (IC) by a chip on glass (COG) method, in some cases. Further alternatively, at least one of the AI decoder AID, the timing controller TC, the source driver circuit SD, and the gate driver circuit GD included in the display device 11 can be mounted on a flexible printed circuit (FPC) that is connected to the substrate over which the display portion PA is formed, as an IC by a chip on film (COF) method, in some cases.

The display portion PA includes display elements. Transmissive liquid crystal elements, reflective liquid crystal elements, or organic EL elements can be used as the display elements, for example. The display elements can be arranged in a matrix, for example.

<Autoencoder>

Next, the autoencoder 13 will be described.

Figure 2:
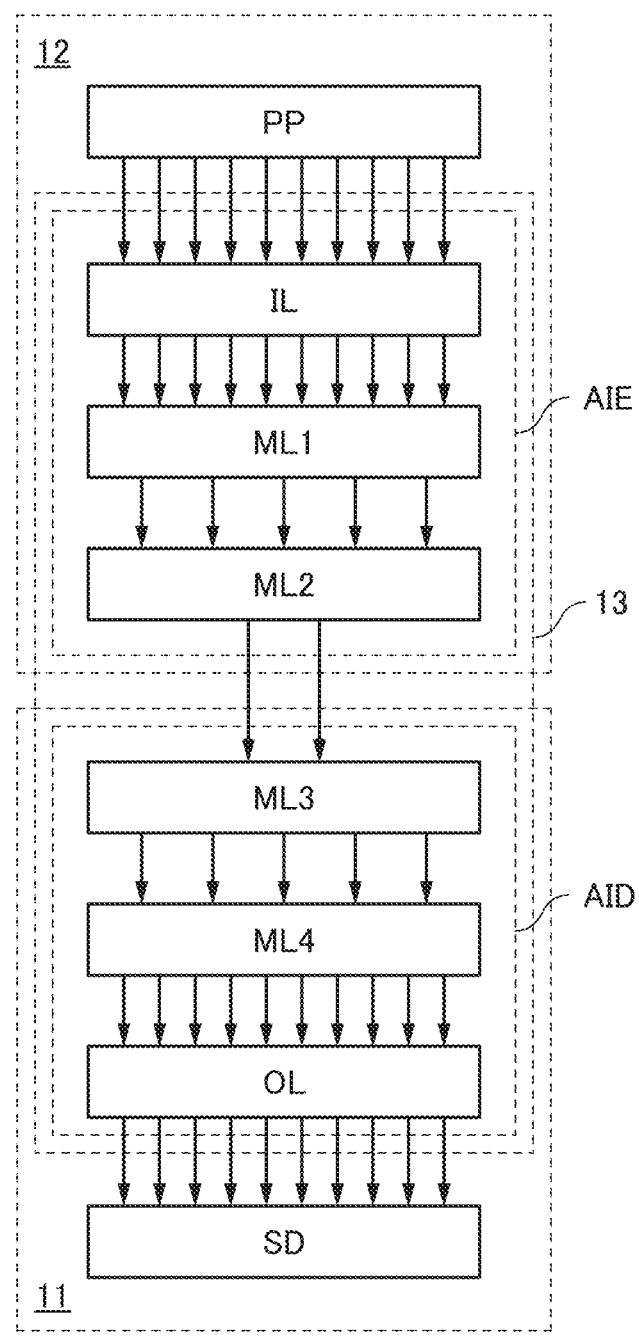
FIG. 2 is a block diagram illustrating a configuration example of an autoencoder.

The autoencoder 13 is a circuit utilizing a neural network. FIG. 2 illustrates an example of the autoencoder 13. In addition to the autoencoder 13, the image processing portion PP and the source driver circuit SD are illustrated in FIG. 2.

The AI encoder AIE of the autoencoder 13 includes an input layer IL, an intermediate layer ML1, and an intermediate layer ML2. The AI decoder AID of the autoencoder 13 includes an intermediate layer ML3, an intermediate layer ML4, and an output layer OL. This means that in the autoencoder 13, the input layer IL, the intermediate layers ML1 to ML4, and the output layer OL compose a hierarchical neural network.

The image data transmitted from the image processing portion PP is input to the input layer IL of the AI encoder AIE in the autoencoder 13. This means that the image data serves as input data of the hierarchical neural network. The hierarchical neural network will be described in Embodiment 4.

In the hierarchical neural network in the AI encoder AIE, the number of neurons decreases as the depth of the hierarchy becomes deeper. That is, the intermediate layer ML1 has fewer neurons than the input layer IL does, and the intermediate layer ML2 has fewer neurons than the intermediate layer ML1 does.

In the hierarchical neural network in the AI decoder AID, the number of neurons increases as the depth of the hierarchy becomes deeper. That is, the intermediate layer ML4 has more neurons than the intermediate layer ML3 does, and the output layer OL has more neurons than the intermediate layer ML4 does.

In the above configuration, the intermediate layer ML2 has the fewest neurons in the AI encoder AIE, and the intermediate layer ML3 has the fewest neurons in the AI decoder AID. Thus, the number of wirings for connecting the neurons of the intermediate layer ML2 and the neurons of the intermediate layer ML3 can be small. In other words, the number of wirings for electrically connecting the AI decoder AID of the display device 11 and the AI encoder AIE of the receiver 12 can be small.

When an analog signal corresponding to image data is transmitted from the image processing portion PP to the AI encoder AIE of the autoencoder 13, the AI encoder AIE performs processing for converting the image data into feature extracted image data. Meanwhile, the AI decoder AID of the autoencoder 13 performs processing for restoring the feature extracted image data into the original image data and outputting the original image data as an analog signal from the output layer OL.

The restored image data that is output from the output layer OL of the AI decoder AID in the autoencoder 13 is transmitted to the source driver circuit SD.

Note that the layers in the hierarchical neural network of the autoencoder 13 can be fully connected or partially connected.

Although the hierarchical neural network in the autoencoder 13 illustrated in FIG. 2 is composed of the input layer IL, the intermediate layers ML1 to ML4, and the output layer OL, one embodiment of the present invention is not limited thereto. For example, the hierarchical neural network may have a larger or smaller number of intermediate layers than the autoencoder 13 illustrated in FIG. 2.

<Source Driver Circuit 1>

Here, a configuration example of the source driver circuit SD will be described.

Figure 3:
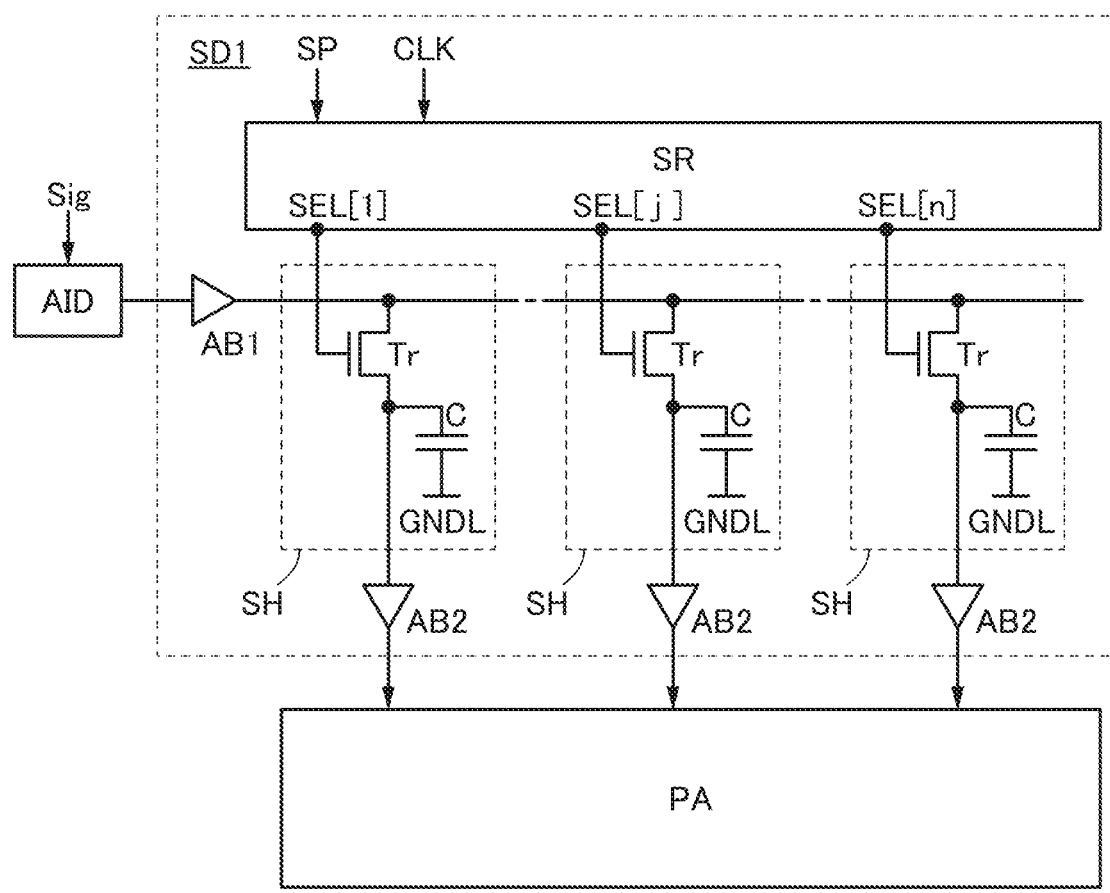
FIG. 3 is a block diagram illustrating a configuration example of a shift register.

FIG. 3 is a block diagram illustrating the AI decoder AID, the display portion PA, and a source driver circuit SD1 that is applicable to the source driver circuit SD. Note that FIG. 3 illustrates part of the circuit configuration of the source driver circuit SD1.

The source driver circuit SD1 includes a shift register SR, an analog buffer circuit AB1, analog buffer circuits AB2, and sample-and-hold circuits SH. In this embodiment, the pixels (display elements) included in the display portion PA are arranged in a matrix. Accordingly, the number of the analog buffer circuits AB2 and that of the sample-and-hold circuits SH included in the source driver circuit SD1 correspond to the number of pixels in one row.

The shift register SR includes a terminal through which a start pulse signal SP is input, a terminal through which the clock signal CLK is input, and output terminals SEL[1] to SEL[n], where n is an integer greater than or equal to 1. In the case where the pixels (display elements) included in the display portion PA are arranged in a matrix, n corresponds to the number of pixels in one row. FIG. 3 illustrates the output terminal SEL[j], where j is an integer greater than or equal to 1 and less than or equal to n.

The sample-and-hold circuits SH each include a transistor Tr and a capacitor C.

Next, the connection structure between the source driver circuit SD1 and each of the AI decoder AID and the display portion PA illustrated in FIG. 3, and the circuit configuration of the source driver circuit SD1 will be described. Note that the description of the circuit configuration of the source driver circuit SD1 will be made with a focus on the j-th column.

The output layer OL in the AI decoder AID is electrically connected to an input terminal of the analog buffer circuit AB1.

An output terminal of the analog buffer circuit AB1 is electrically connected to a first terminal of the transistor Tr included in the sample-and-hold circuit SH. A second terminal of the transistor Tr is electrically connected to an input terminal of the analog buffer circuit AB2. A gate of the transistor Tr is electrically connected to the output terminal SEL[j].

A first terminal of the capacitor C is electrically connected to the second terminal of the transistor Tr, and a second terminal of the capacitor C is electrically connected to a wiring GNDL. The wiring GNDL is used for supplying reference potential.

An output terminal of the analog buffer circuit AB2 is electrically connected to the display portion PA. Specifically, an electric signal output through the output terminal of the analog buffer circuit AB2 is transmitted to the pixels (display elements) in one row included in the display portion PA.

Next, the operation of the source driver circuit SD1 illustrated in FIG. 3 will be described.

When the image data from the image processing portion PP is input to the autoencoder 13, the AI encoder AIE performs processing for converting the image data into feature extracted image data (a signal Sig in FIG. 3) and the AI decoder AID performs processing for restoring the feature extracted image data into the original image data. The restored image data is transmitted to the input terminal of the analog buffer circuit AB1 from the output layer OL in the AI decoder AID as an analog signal.

The analog buffer circuit AB1 outputs the analog signal input through its input terminal from its output terminal. Thus, the image data transmitted to the input terminal of the analog buffer circuit AB1 is output from the output terminal of the analog buffer circuit AB1 as it is. Note that the analog buffer circuit AB2 has a function similar to that of the analog buffer circuit AB1.

The analog signal output from the output terminal of the analog buffer circuit AB1 is transmitted to the first terminal of the transistor Tr. When the transistor Tr is in an off state, the analog signal does not pass through the transistor Tr. By contrast, when the transistor Tr is in an on state, the analog signal reaches the second terminal of the transistor Tr.

The on/off state of the transistor Tr depends on an output signal from the output terminal SEL[j] of the shift register SR. The shift register SR outputs an output signal sequentially from the output terminals SEL[1] to SEL[n] in response to the start pulse signal SP, the clock signal CLK, or the like transmitted from the timing controller TC.

Figure 5A:
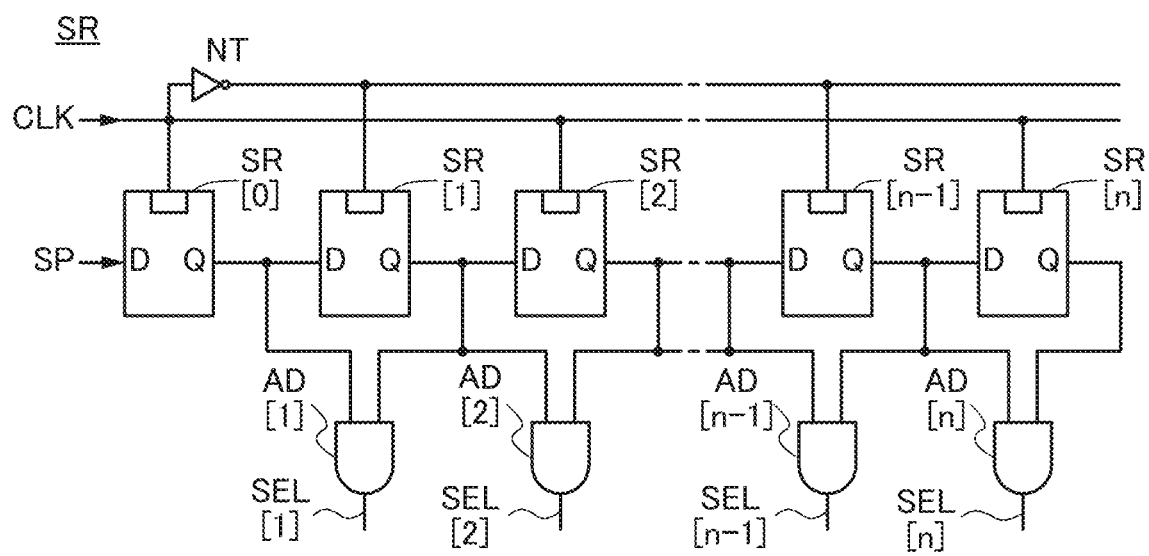
FIGS. 5A and 5B are circuit diagrams illustrating a configuration example of a shift register.

The shift register SR may have a configuration illustrated in FIG. 5A, for example. The shift register SR illustrated in FIG. 5A includes latch circuits SR[0] to SR[n] (here, n is an integer greater than or equal to 1), AND circuits AD[1] to AD[n], and a NOT circuit NT. Note that FIG. 5A illustrates only the latch circuits SR[0], SR[1], SR[2], SR[n−1], and SR[n], the AND circuits AD[1], AD[2], AD[n−1], and AD[n], and the NOT circuit NT, and the other circuits are not illustrated.

An input terminal D of the latch circuit SR[0] is electrically connected to a wiring for supplying the start pulse signal SP. An output terminal Q of the latch circuit SR[H] (here, j is an integer greater than or equal to 1 and less than or equal to n) is electrically connected to an input terminal D of the latch circuit SR[j]. A clock input terminal of the latch circuit SR[$h_{even}$] ($h_{even}$ is an even integer greater than or equal to 0 and less than or equal to n) is electrically connected to the wiring through which the clock signal CLK is input, and an input terminal of the NOT circuit NT is electrically connected to the wiring. A clock input terminal of the latch circuit SR[$h_{odd}$] ($h_{odd}$ is an odd integer greater than or equal to 1 and less than or equal to n) is electrically connected to an output terminal of the NOT circuit NT. Note that in the configuration example in FIG. 5A, (n−1) is an odd number and n is an even number.

A first input terminal of the AND circuit AD[j] is electrically connected to the output terminal Q of the latch circuit SR[j−1], and a second input terminal of the AND circuit AD[j] is electrically connected to an output terminal Q of the latch circuit SR[j]. An output terminal of the AND circuit AD[j] is electrically connected to the gate of the transistor Tr in the sample-and-hold circuit SH in the corresponding column, as the output terminal SEL[j] of the shift register SR. Note that FIG. 5A illustrates the output terminals SEL[1], SEL[2], SEL[n−1], and SEL[n], and the other output terminals SEL are not illustrated.

The start pulse signal SP is transmitted to the input terminal D of the first-stage latch circuit SR[0] in the shift register SR. In the shift register SR, a signal transmitted to the input terminal D of a latch circuit in the previous stage is transmitted to the input terminal D of a latch circuit in the subsequent stage in synchronization with the input clock signal CLK. In other words, an output signal from the output terminal Q of the latch circuit in the previous stage is output from the output terminal Q of the latch circuit in the subsequent stage every time the clock signal CLK is transmitted.

In the case where a signal output from the output terminal Q of the adjacent latch circuit in the shift register SR has a logic value "1," the logic value "1" is output from the output terminals of the AND circuits electrically connected to the output terminal Q of the adjacent latch circuit. In other words, when the logic value "1" is input as the start pulse signal SP and the clock signal CLK is input once, the logic value "1" can be sequentially output from the output terminals SEL[1] to SEL[n] of the shift register SR.

The gate of the transistor Tr is electrically connected to one of the output terminals SEL[1] to SEL[n] of the shift register SR. Thus, when the start pulse signal SP is input to the shift register SR and the clock signal CLK is input a predetermined number of times, the potential of a signal corresponding to the logic value "1" is applied to the gate of the transistor Tr. In this manner, the transistor Tr can be turned on.

When the transistor Tr is turned on, the analog signal (image data) output from the output terminal of the analog buffer circuit AB1 is transmitted to the second terminal of the transistor Tr. In the case of transmitting analog signals (image data) for the corresponding column, in the shift register SR, the output terminal from which the logic value "1" is output is changed in response to the clock signal CLK; thus, the electronic device 10 is configured so that the analog signals (image data) are input to the source driver circuit SD1 (the input terminal of the analog buffer circuit AB1) in synchronization with the clock signal CLK.

The potential of the analog signal (image data) transmitted to the second terminal of the transistor Tr is retained in the capacitor C. That is, the sample-and-hold circuit SH has a function of retaining image data transmitted from the autoencoder 13.

It is preferable that the transistor Tr be an OS transistor. It is particularly preferable to use an OS transistor that includes an oxide containing at least one of indium, an element M (the element M is aluminum, gallium, yttrium, or tin), and zinc in a channel formation region. The use of such an OS transistor as the transistor Tr enables the off-state current of the transistor to be extremely low. Accordingly, the effect of deterioration due to the off-state current on the image data retained in the capacitor C can be reduced.

Then, the image data transmitted to the second terminal of the transistor Tr is transmitted to the input terminal of the analog buffer circuit AB2. As a result, the image data is amplified by the analog buffer circuit AB2 at an amplification degree of 1 and is output from the output terminal of the analog buffer circuit AB2. The image data output from the output terminal of the analog buffer circuit AB2 is transmitted to the display portion PA. When the image data is written to the corresponding pixel in the display portion PA, an image is displayed on the display device 11.

Note that the source driver circuit SD1 can have a configuration with which the analog buffer circuit AB2 is power gated until image data for one row are stored in the sample-and-hold circuit SH, and the operation of the analog buffer circuit AB2 is restarted when the row is selected by the gate driver circuit. Such a configuration can reduce power consumed to operate the source driver circuit SD1.

Note that one embodiment of the present invention is not limited to the circuit configuration of the source driver circuit SD1 illustrated in FIG. 3. Depending on circumstances or conditions or as needed, the circuit configuration of the source driver circuit SD1 can be changed.

<Source Driver Circuit 2>

Next, a configuration example of the source driver circuit SD that is different from the source driver circuit SD1 will be described.

Figure 4:
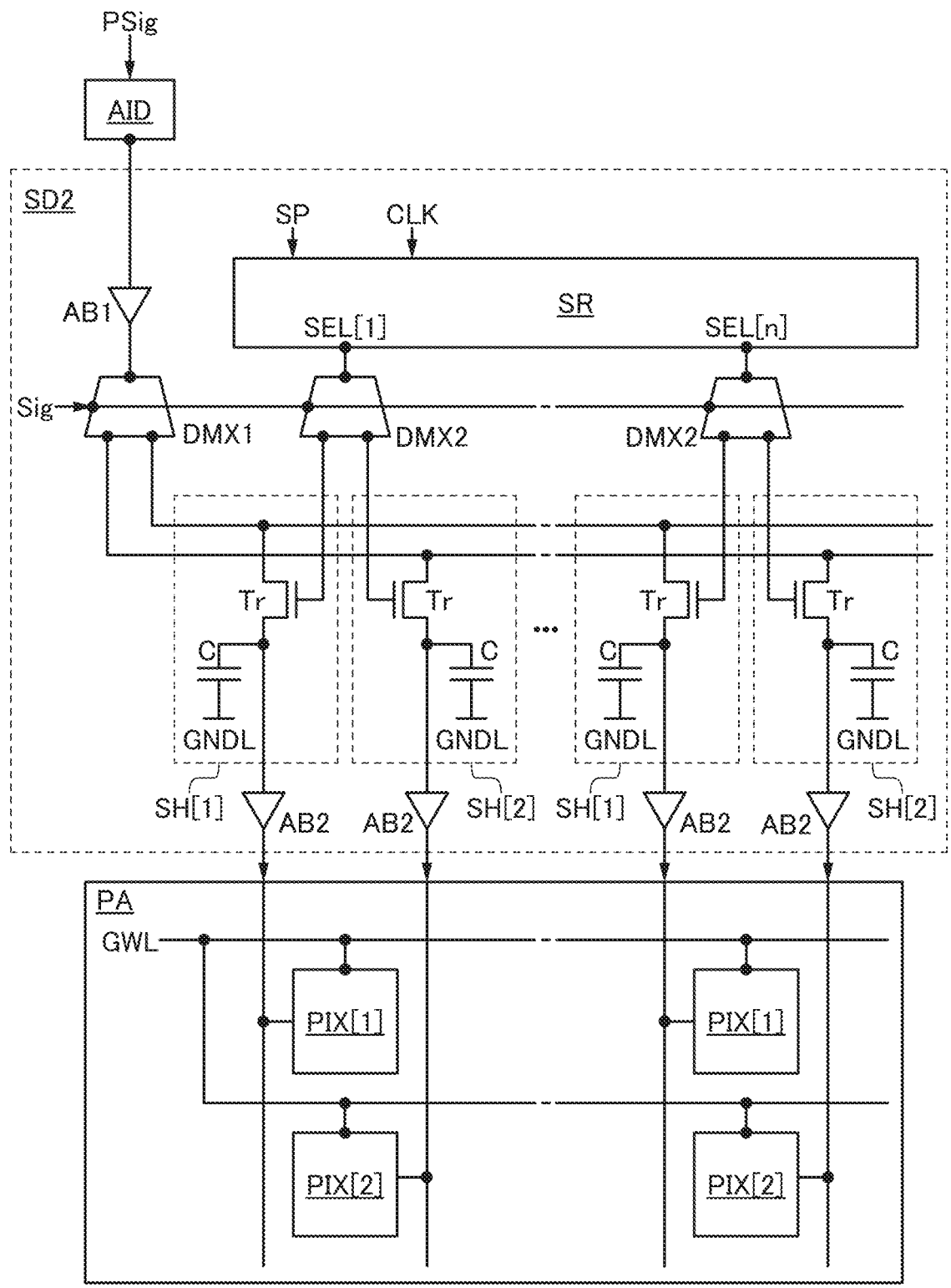
FIG. 4 is a block diagram illustrating a configuration example of a semiconductor device.

FIG. 4 is a block diagram illustrating the AI decoder AID, the display portion PA, and a source driver circuit SD2 that is applicable to the source driver circuit SD. Note that FIG. 4 illustrates part of the circuit configuration of the source driver circuit SD2.

The source driver circuit SD2 includes the shift register SR, the analog buffer circuit AB1, the analog buffer circuits AB2, a demultiplexer DMX1, demultiplexers DMX2, sample-and-hold circuits SH[1], and sample-and-hold circuits SH[2]. In this embodiment, the pixels (display elements) included in the display portion PA are arranged in a matrix. Accordingly, the number of the analog buffer circuits AB2, that of the sample-and-hold circuits SH[1], that of the sample-and-hold circuits SH[2], and that of the demultiplexers DMX2 included in the source driver circuit SD2 correspond to the number of pixels in one row.

The shift register SR includes a terminal through which the start pulse signal SP is input, a terminal through which the clock signal CLK is input, and the output terminals SEL[1] to SEL[n], where n is an integer greater than or equal to 1. In the case where the pixels (display elements) included in the display portion PA are arranged in a matrix, n corresponds to the number of pixels in one row.

The sample-and-hold circuits SH[1] and SH[2] each include the transistor Tr and the capacitor C.

Next, the connection structure between the source driver circuit SD2 and each of the AI decoder AID and the display portion PA illustrated in FIG. 4, and the circuit configuration of the source driver circuit SD2 will be described. Note that the description of the circuit configuration of the source driver circuit SD2 will be made with a focus on the j-th column (here, j is an integer greater than or equal to 1 and less than or equal to n).

The output layer OL in the AI decoder AID is electrically connected to an input terminal of the analog buffer circuit AB1.

An output terminal of the analog buffer circuit AB1 is electrically connected to an input terminal of the demultiplexer DMX1. A first output terminal of the demultiplexer DMX1 is electrically connected to a first terminal of the transistor Tr included in the sample-and-hold circuit SH[1], and a second output terminal of the demultiplexer DMX1 is electrically connected to a first terminal of the transistor Tr included in the sample-and-hold circuit SH[2]. Second terminals of the transistors Tr included in the sample-and-hold circuits SH[1] and SH[2] are each electrically connected to an input terminal of the corresponding analog buffer circuit AB2. A gate of the transistor Tr included in the sample-and-hold circuit SH[1] is electrically connected to a first output terminal of the demultiplexer DMX2, and a gate of the transistor Tr included in the sample-and-hold circuit SH[2] is electrically connected to a second output terminal of the demultiplexer DMX2. An input terminal of the demultiplexer DMX2 is electrically connected to the output terminal SEL[j].

In the sample-and-hold circuit SH[1] or SH[2], a first terminal of the capacitor C is electrically connected to the second terminal of the transistor Tr, and a second terminal of the capacitor C is electrically connected to the wiring GNDL. The wiring GNDL is used for supplying reference potential.

An output terminal of the analog buffer circuit AB2 is electrically connected to the display portion PA. Specifically, an electric signal output through the output terminal of the analog buffer circuit AB2 that is electrically connected to the sample-and-hold circuit SH[1] is transmitted to a pixel PIX[1] in the display portion PA, and an electric signal output through an output terminal of the analog buffer circuit AB2 that is electrically connected to the sample-and-hold circuit SH[2] is transmitted to a pixel PIX[2] in the display portion PA. Note that the pixels PIX[1] and PIX[2] in the display portion PA are in the same column.

The demultiplexers DMX1 and DMX2 each include a terminal through which the signal Sig is input. The demultiplexers DMX1 and DMX2 each have a function of outputting a signal transmitted to its input terminal to its first output terminal or second output terminal depending on the signal Sig. Since the output terminals used in the demultiplexers DMX1 and DMX2 are switched depending on the signal Sig as illustrated in FIG. 4, the demultiplexers DMX1 and DMX2 operate in synchronization with each other. In the source driver circuit SD2 illustrated in FIG. 4, the first output terminal is selected in the demultiplexers DMX2 when the first output terminal is selected in the demultiplexer DMX1, whereas the second output terminal is selected in the demultiplexers DMX2 when the second output terminal is selected in the demultiplexer DMX1.

Note that FIG. 4 illustrates only the AI decoder AID, the source driver circuit SD2, the display portion PA, the shift register SR, the demultiplexers DMX1 and DMX2, the sample-and-hold circuits SH[1] and SH[2], the analog buffer circuits AB1 and AB2, the pixels PIX[1] and PIX[2], the output terminals SEL[1] and SEL[n], a wiring GWL, the transistors Tr, the capacitors C, the wirings GNDL, the signal Sig, a signal PSig, the start pulse signal SP, and the clock signal CLK, and the other circuits, wirings, elements, and reference numerals thereof are not illustrated.

Next, the operation of the source driver circuit SD2 illustrated in FIG. 4 will be described.

When the image data from the image processing portion PP is input to the autoencoder 13, the AI encoder AIE performs processing for converting the image data into feature extracted image data (the signal PSig in FIG. 4) and the AI decoder AID performs processing for restoring the feature extracted image data into the original image data. The restored image data is transmitted to the input terminal of the analog buffer circuit AB1 from the output layer OL in the AI decoder AID as an analog signal.

The analog buffer circuit AB1 outputs the analog signal input through its input terminal from its output terminal. Thus, the image data transmitted to the input terminal of the analog buffer circuit AB1 is output from the output terminal of the analog buffer circuit AB1 as it is. Note that the analog buffer circuit AB2 has a function similar to that of the analog buffer circuit AB1.

The analog signal output from the output terminal of the analog buffer circuit AB1 is input to the demultiplexer DMX1. The demultiplexer DMX1 outputs the analog signal to its first output terminal or second output terminal depending on the signal Sig. That is, the analog signal is input to one of the sample-and-hold circuits SH[1] and SH[2].

In the sample-and-hold circuit SH[1] or SH[2], the analog signal is transmitted to the first terminal of the transistor Tr. When the transistor Tr is in an off state, the analog signal does not pass through the transistor Tr. Meanwhile, when the transistor Tr is in an on state, the analog signal reaches the second terminal of the transistor Tr.

The on/off state of the transistor Tr depends on an output signal from the first or second output terminal of the demultiplexer DMX2. The output signal is a signal transmitted from the output terminal SEL[j] of the shift register SR to the input terminal of the demultiplexer DMX2. The signal is output to the first output terminal or the second output terminal depending on the signal Sig input to the demultiplexer DMX2. The shift register SR can have the configuration illustrated in FIG. 5A as in the case of the shift register SR in the source driver circuit SD1 illustrated in FIG. 3.

The input terminal of the demultiplexer DMX2 is electrically connected to one of the output terminals SEL[1] to SEL[n] of the shift register SR. Thus, when the start pulse signal SP is input to the shift register SR and the clock signal CLK is input a predetermined number of times, the potential of a signal corresponding to the logic value "1" is applied to the input terminal of the demultiplexer DMX2.

Figure 5B:
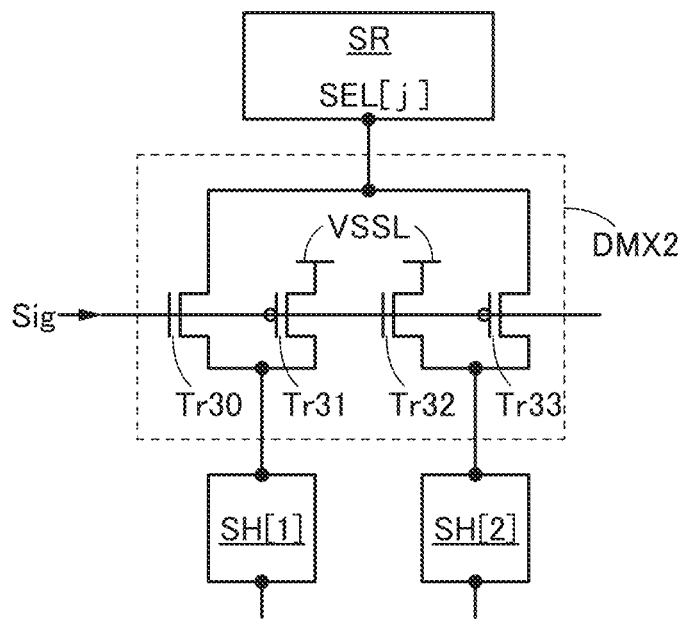

FIG. 5B illustrates an example of the circuit configuration of the demultiplexer DMX2. Note that FIG. 5B illustrates not only the demultiplexer DMX2 but also the shift register SR and the sample-and-hold circuits SH[1] and SH[2].

The demultiplexer DMX2 includes transistors Tr30 to Tr33. The transistors Tr30 and Tr32 are n-channel transistors and the transistors Tr31 and Tr33 are p-channel transistors.

A first terminal of the transistor Tr30 is electrically connected to the output terminal SEL[j] of the shift register SR through the input terminal of the demultiplexer DMX2. A second terminal of the transistor Tr30 is electrically connected to the gate of the transistor Tr in the sample-and-hold circuit SH[1] (not illustrated) through the first output terminal of the demultiplexer DMX2. A first terminal of the transistor Tr31 is electrically connected to a wiring VSSL. A second terminal of the transistor Tr31 is electrically connected to the gate of the transistor Tr in the sample-and-hold circuit SH[1] through the first output terminal of the demultiplexer DMX2. A first terminal of the transistor Tr32 is electrically connected to the wiring VSSL. A second terminal of the transistor Tr32 is electrically connected to the gate of the transistor Tr in the sample-and-hold circuit SH[2] (not illustrated) through the second output terminal of the demultiplexer DMX2. A first terminal of the transistor Tr33 is electrically connected to the output terminal SEL[j] of the shift register SR through the input terminal of the demultiplexer DMX2. A second terminal of the transistor Tr33 is electrically connected to the gate of the transistor Tr in the sample-and-hold circuit SH[2] through the second output terminal of the demultiplexer DMX2. Gates of the transistors Tr30 to Tr33 are each electrically connected to the wiring through which the signal Sig is supplied.

Note that the wiring VSSL supplies a low-level potential.

Owing to such a configuration, one of the first output terminal and the second output terminal can be selected depending on the signal Sig and a signal input through the input terminal can be output from the selected output terminal. In addition, a low-level potential can be output from the non-selected output terminal. This means that, since the first and second output terminals of the demultiplexer DMX2 are each electrically connected to the gate of the corresponding transistor Tr, a low-level potential can be applied to the gate of the transistor Tr that is electrically connected to the non-selected output terminal. For example, in the case where the first output terminal of the demultiplexer DMX2 is selected and a high-level potential is applied to the gate of the transistor Tr in the sample-and-hold circuit SH[1], a low-level potential can be applied to the gate of the transistor Tr when the output of the demultiplexer DMX2 is switched from the first output terminal to the second output terminal by the signal Sig. Thus, charges can be prevented from remaining in the gate of the transistor Tr. That is, the on/off state of the transistor Tr can be controlled accurately.

Note that the configuration example of the demultiplexer DMX2 illustrated in FIG. 5B is applicable to the configuration of the demultiplexer DMX1.

When a high-level potential is input as the signal Sig, each of the demultiplexers DMX1 and DMX2 outputs the signal input through the input terminal from the first output terminal. At this time, the signal corresponding to the logic value "1" is input from the first output terminal of the demultiplexer DMX2 to the gate of the transistor Tr in the sample-and-hold circuit SH[1], so that the transistor Tr in the sample-and-hold circuit SH[1] becomes an on state. Then, the analog signal (image data) output from the output terminal of the analog buffer circuit AB1 is transmitted to the second terminal of the transistor Tr in the sample-and-hold circuit SH[1] through the input terminal and the first output terminal of the demultiplexer DMX1.

Next, when the potential of the signal Sig is switched from the high level to the low level, each of the demultiplexers DMX1 and DMX2 outputs the signal input through the input terminal from the second output terminal. At this time, the signal corresponding to the logic value "1" is input from the second output terminal of the demultiplexer DMX2 to the gate of the transistor Tr in the sample-and-hold circuit SH[2], so that the transistor Tr in the sample-and-hold circuit SH[2] becomes an on state. Then, the analog signal (image data) output from the output terminal of the analog buffer circuit AB1 is transmitted to the second terminal of the transistor Tr in the sample-and-hold circuit SH[2] through the input terminal and the second output terminal of the demultiplexer DMX1.

In each of the sample-and-hold circuits SH[1] and SH[2], the potential of the analog signal (image data) transmitted to the second terminal of the transistor Tr is retained in the capacitor C. That is, the sample-and-hold circuits SH[1] and SH[2] each have a function of retaining image data transmitted from the autoencoder 13.

It is preferable that the transistor Tr in each of the sample-and-hold circuits SH[1] and SH[2] be an OS transistor. It is particularly preferable to use an OS transistor that includes an oxide containing at least one of indium, an element M (the element M is aluminum, gallium, yttrium, or tin), and zinc in a channel formation region. The use of such an OS transistor as the transistor Tr enables the off-state current of the transistor to be extremely low. Accordingly, the effect of deterioration due to the off-state current on the image data retained in the capacitor C can be reduced.

Then, the image data transmitted to the second terminal of the transistor Tr in each of the sample-and-hold circuits SH[1] and SH[2] is transmitted to the input terminal of the analog buffer circuit AB2. As a result, the image data is amplified by the analog buffer circuit AB2 at an amplification degree of 1 and is output from the output terminal of the analog buffer circuit AB2. The image data output from the output terminal of the analog buffer circuit AB2 is transmitted to the display portion PA. When the image data is written to the corresponding pixel in the display portion PA, an image is displayed on the display device 11.

Note that in FIG. 4, image data input from the sample-and-hold circuit SH[1] in the j-th column to the display portion PA through the analog buffer circuit AB2 is stored in the pixel PIX[1] in the j-th column, and image data input from the sample-and-hold circuit SH[2] in the j-th column to the display portion PA through the analog buffer circuit AB2 is stored in the pixel PIX[2] in the j-th column. Accordingly, the display portion PA illustrated in FIG. 4 has a configuration in which two source signal lines are provided in one column; thus, image data can be written to pixels in two rows using one start pulse signal SP. In this specification, the structure of a display portion (display device) in which two source signal lines are provided in one column is called a dual source structure.

According to the above, in the case of transmitting analog signals (image data) for the corresponding columns of the pixels in two rows in the display portion PA, the output terminal of the shift register SR from which the logic value "1" is output is changed in response to the clock signal CLK and the output terminals used in the demultiplexers DMX1 and DMX2 are switched in response to the signal Sig; thus, the electronic device 10 is configured so that the analog signals (image data) are input to the source driver circuit SD2 (the input terminal of the analog buffer circuit AB1) in synchronization with the clock signal CLK and the signal Sig.

Note that the source driver circuit SD2 can have a configuration with which the analog buffer circuits AB2 are power gated until image data for two rows are stored in the sample-and-hold circuits SH[1] and SH[2], and the operation of the analog buffer circuits AB2 is restarted when the rows are selected by the gate driver circuit. Such a configuration can reduce power consumed to operate the source driver circuit SD2.

Furthermore, when all of the analog buffer circuits AB2 included in the source driver circuit SD2 are driven at the same time, image data can be written to the pixels in two rows in the display portion PA at the same time. Thus, the same selection signal can be input to the pixels in two rows. In FIG. 4, for example, the display portion PA has a configuration in which the wiring GWL is electrically connected to the pixels in two rows so that a selection signal is supplied to the pixels in two rows.

Note that one embodiment of the present invention is not limited to the circuit configuration of the source driver circuit SD2 illustrated in FIG. 4. Depending on circumstances or conditions or as needed, the circuit configuration of the source driver circuit SD2 can be changed.

Figure 7:
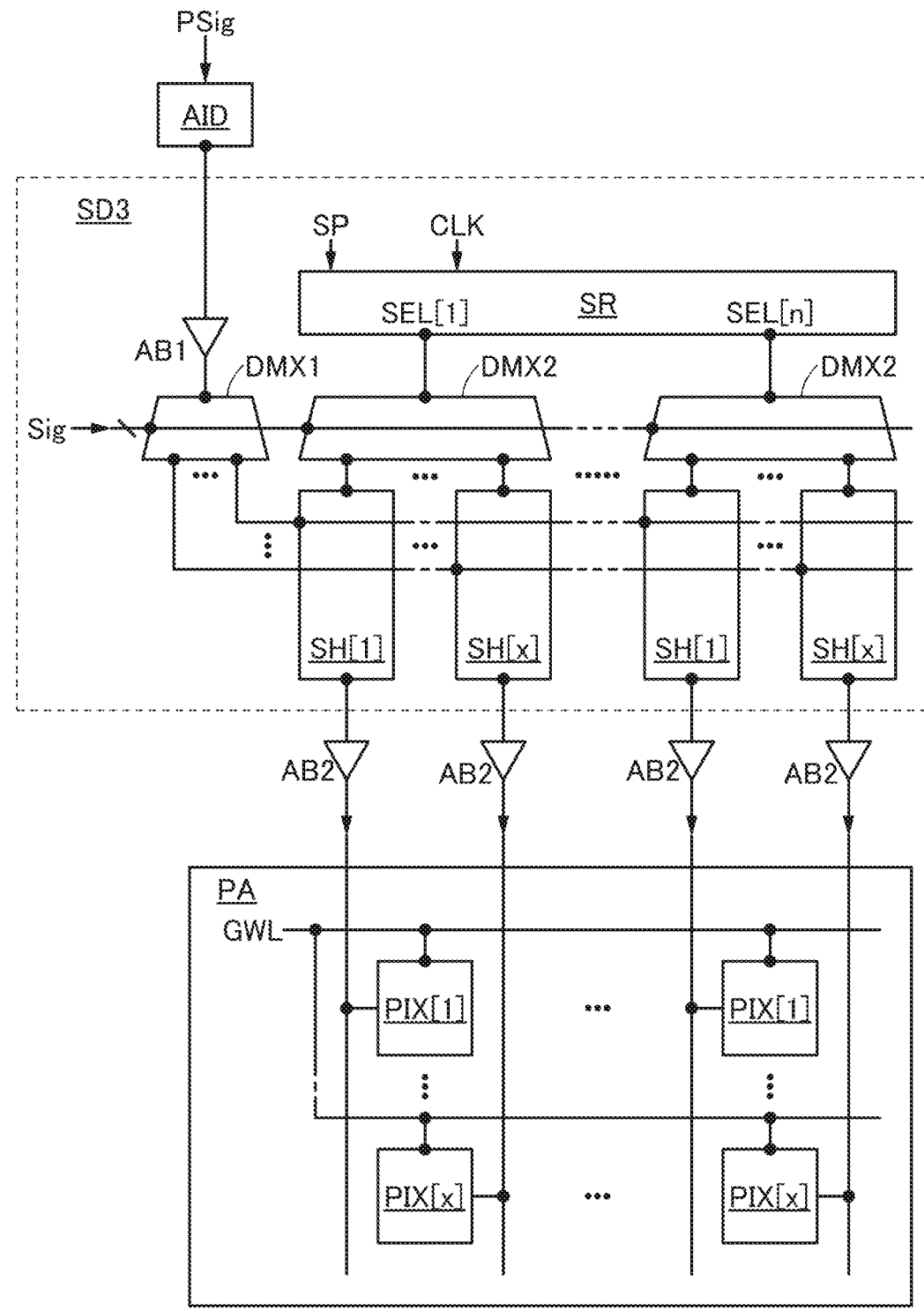
FIG. 7 is a block diagram illustrating a configuration example of a semiconductor device.

Although each of the demultiplexers DMX1 and DMX2 in the source driver circuit SD2 illustrated in FIG. 4 has two output terminals, each of the demultiplexers DMX1 and DMX2 in the source driver circuit SD2 may have three or more output terminals, for example. FIG. 7 illustrates the configuration of the source driver circuit SD in that case.

A source driver circuit SD3 illustrated in FIG. 7 is different from the source driver circuit SD2 illustrated in FIG. 4 in that each of the demultiplexers DMX1 and DMX2 has three or more output terminals and in that the number of the sample-and-hold circuits SH for the pixels in one column in the display portion PA is three or more.

Each of the demultiplexers DMX1 and DMX2 in the source driver circuit SD3 illustrated in FIG. 7 includes an input terminal and first to x-th output terminals (x is an integer greater than or equal to 3). Furthermore, the source driver circuit SD3 illustrated in FIG. 7 includes sample-and-hold circuits SH[1] to SH[x]. The sample-and-hold circuits SH[1] to SH[x] illustrated in FIG. 7 may have the same configuration as the sample-and-hold circuits SH[1] and SH[2] illustrated in FIG. 4. Note that the description below is made on the assumption that the sample-and-hold circuits SH[1] to SH[x] illustrated in FIG. 7 have the same configuration as the sample-and-hold circuits SH[1] and SH[2] illustrated in FIG. 4.

Next, the connection structure between the source driver circuit SD3 and the display portion PA illustrated in FIG. 7, and the circuit configuration of the source driver circuit SD3 will be described. Note that the description of the same portions as those in the source driver circuit SD2 in FIG. 4 will be omitted. The description of the circuit configuration of the source driver circuit SD3 will be made with a focus on the k-th column (here, k is an integer greater than or equal to 1 and less than or equal to n).

The k-th output terminal of the demultiplexer DMX1 is electrically connected to a first terminal of the transistor Tr in the sample-and-hold circuit SH[k] (not illustrated). The k-th output terminal of the demultiplexer DMX2 is electrically connected to a gate of the transistor Tr in the sample-and-hold circuit SH[k] (not illustrated). A second terminal of the transistor Tr in the sample-and-hold circuit SH[k] (not illustrated) is electrically connected to an input terminal of the analog buffer circuit AB2 in the k-th column.

An output terminal of the analog buffer circuit AB2 is electrically connected to the display portion PA. Specifically, an electric signal output through the output terminal of the analog buffer circuit AB2 that is electrically connected to the sample-and-hold circuit SH[k] is transmitted to a pixel PIX[k] in the display portion PA. Note that pixels PIX[1] to PIX[x] in the display portion PA are in the same column.

Since each of the demultiplexers DMX1 and DMX2 includes three or more output terminals, the signal Sig for selecting an output terminal is preferably a digital signal transmitted through a plurality of signal lines. In FIG. 7, the signal Sig input to the demultiplexers DMX1 and DMX2 is supplied through a plurality of signal lines.

Note that FIG. 7 illustrates only the AI decoder AID, the source driver circuit SD3, the display portion PA, the shift register SR, the demultiplexers DMX1 and DMX2, the sample-and-hold circuits SH[1] and SH[x], the analog buffer circuits AB1 and AB2, the pixels PIX[1] and PIX[x], the output terminals SEL[1] and SEL[n], the wiring GWL, the signal Sig, the signal PSig, the start pulse signal SP, and the clock signal CLK, and the other circuits, wirings, elements, and reference numerals thereof are not illustrated.

With the source driver circuit SD3 illustrated in FIG. 7, image data can be supplied to the display portion PA including x source signal lines in each column. Furthermore, with the source driver circuit SD3 illustrated in FIG. 7, as with the source driver circuit SD2 illustrated in FIG. 4, image data can be written to pixels in x rows using one start pulse signal SP. When x is 4, in particular, the display portion PA includes four source signal lines in one column; such a structure is called a quad source structure in this specification and the like.

According to the above, in the case of transmitting analog signals (image data) for the corresponding columns of the pixels in x rows in the display portion PA, the output terminal of the shift register SR from which the logic value "1" is output is changed in response to the clock signal CLK and the output terminals used in of the demultiplexers DMX1 and DMX2 are switched in response to the signal Sig; thus, the electronic device 10 is configured so that the analog signals (image data) are input to the source driver circuit SD3 (the input terminal of the analog buffer circuit AB1) in synchronization with the clock signal CLK and the signal Sig.

Note that the source driver circuit SD3 can have a configuration with which the analog buffer circuits AB2 are power gated until image data for x rows are stored in the sample-and-hold circuits SH[1] to SH[x], and the operation of the analog buffer circuits AB2 is restarted when the rows are selected by the gate driver circuit. Such a configuration can reduce power consumed to operate the source driver circuit SD3.

Furthermore, when all of the analog buffer circuits AB2 included in the source driver circuit SD3 are driven at the same time, image data can be written to the pixels in x rows in the display portion PA at the same time. Thus, the same selection signal can be input to the pixels in x rows. In FIG. 7, for example, the display portion PA has a configuration in which the wiring GWL is electrically connected to the pixels in x rows so that a selection signal is supplied to the pixels in x rows.

Note that in each of the source driver circuits SD1 to SD3, image data can be retained for a long time when OS transistors are used in the pixels in the display portion PA. As a result, a still image can be displayed with less frequent image data rewriting or at a low frame rate. In this specification, a method for operating a display device at a low frame rate is called idling stop (IDS) driving. The detail of the IDS driving will be described in Embodiment 7.

No image data is supplied to the display portion PA during the IDS driving; thus, each of the circuits can be power gated. Accordingly, the power consumption of the electronic device 10 can be reduced.

<Source Driver Circuit 3>

Figure 6:
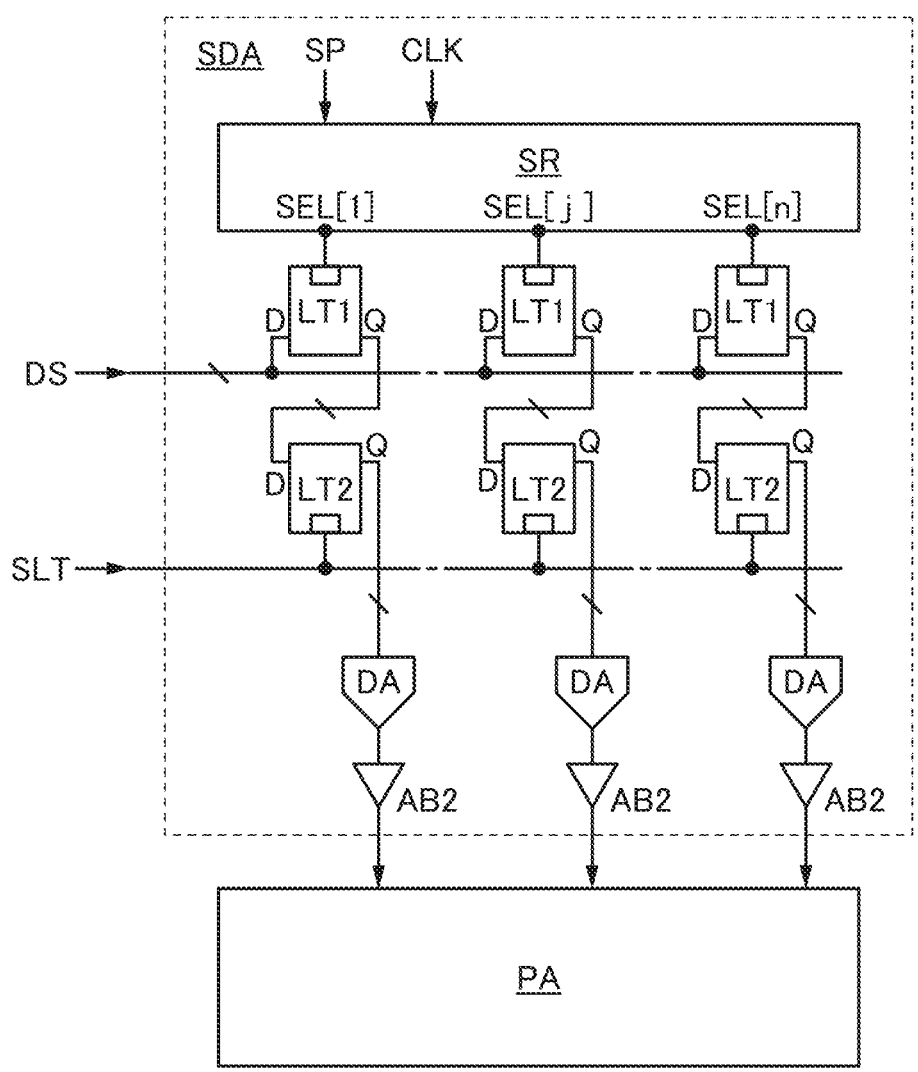
FIG. 6 is a block diagram illustrating a configuration example of a semiconductor device.

FIG. 6 is a block diagram of a general source driver circuit. A source driver circuit SDA includes the shift register SR, latch circuits LT1, latch circuits LT2, digital-to-analog converter circuits DA, and the analog buffer circuits AB2. Note that the number of the analog buffer circuits AB2, that of the latch circuits LT1, and that of the latch circuits LT2 included in the source driver circuit SD correspond to, in the case where pixels (display elements) in the display portion PA are arranged in a matrix, the number of pixels in one row.

The circuit configuration of the source driver circuit SDA illustrated in FIG. 6 will be described. Note that the description will be made with a focus on one column in the source driver circuit SDA.

An output terminal of the shift register SR is electrically connected to a clock input terminal of the latch circuit LT1, and an output terminal Q of the latch circuit LT1 is electrically connected to an input terminal D of the latch circuit LT2. An output terminal Q of the latch circuit LT2 is electrically connected to an input terminal of the digital-to-analog converter circuit DA, and an output terminal of the digital-to-analog converter circuit DA is electrically connected to an input terminal of the analog buffer circuit AB2. An output terminal of the analog buffer circuit AB2 is electrically connected to the display portion PA. Specifically, an electric signal output through the output terminal of the analog buffer circuit AB2 is transmitted to the pixels (display elements) in one column included in the display portion PA.

As illustrated in FIG. 6, image data DS, which is a digital signal, is transmitted to an input terminal D of the latch circuit LT1. In that case, the image data DS is stored in the latch circuit LT1 in the corresponding column sequentially owing to the shift register SR. Accordingly, the latch circuits LT1 retain the image data DS for one row.

After that, a signal SLT is transmitted to clock input terminals of the latch circuits LT2, whereby the image data DS for one row retained in the latch circuits LT1 is stored in the latch circuits LT2 at a time.

The image data DS stored in the latch circuits LT2 is converted into analog signals by the digital-to-analog converter circuits DA and transmitted to the display portion PA through the analog buffer circuits AB2. When the image data is written to the corresponding pixel in the display portion PA, an image is displayed on the display device 11.

By comparison with the source driver circuits SD1 to SD3, the source driver circuit SDA has a large circuit area and consumes high power because the source driver circuit SDA includes the same number of digital-to-analog converter circuits DA as the columns in the display portion PA. Meanwhile, since each of the source driver circuits SD1 to SD3 does not include the digital-to-analog converter circuits DA, the circuit area and the power consumption can be reduced. This is because, in the signal processing from the image processing portion PP to the autoencoder 13, image data is subjected to processing as an analog signal without digital conversion, and the image data is transmitted to any of the source driver circuits SD1 to SD3 as an analog signal.

Note that one embodiment of the present invention is not limited to the circuit configuration of the source driver circuit SD1 illustrated in FIG. 3. Depending on circumstances or conditions or as needed, the circuit configuration of the source driver circuit SD1 can be changed.

Note that this embodiment can be combined with any of the other embodiments in this specification as appropriate.

Embodiment 2

In this embodiment, a configuration example of the autoencoder described in the above embodiment will be described. Specifically, a configuration example in which a convolutional neural network (CNN) is used for the feature extraction in the AI encoder will be described.

<Convolutional Neural Network>

Figure 8:
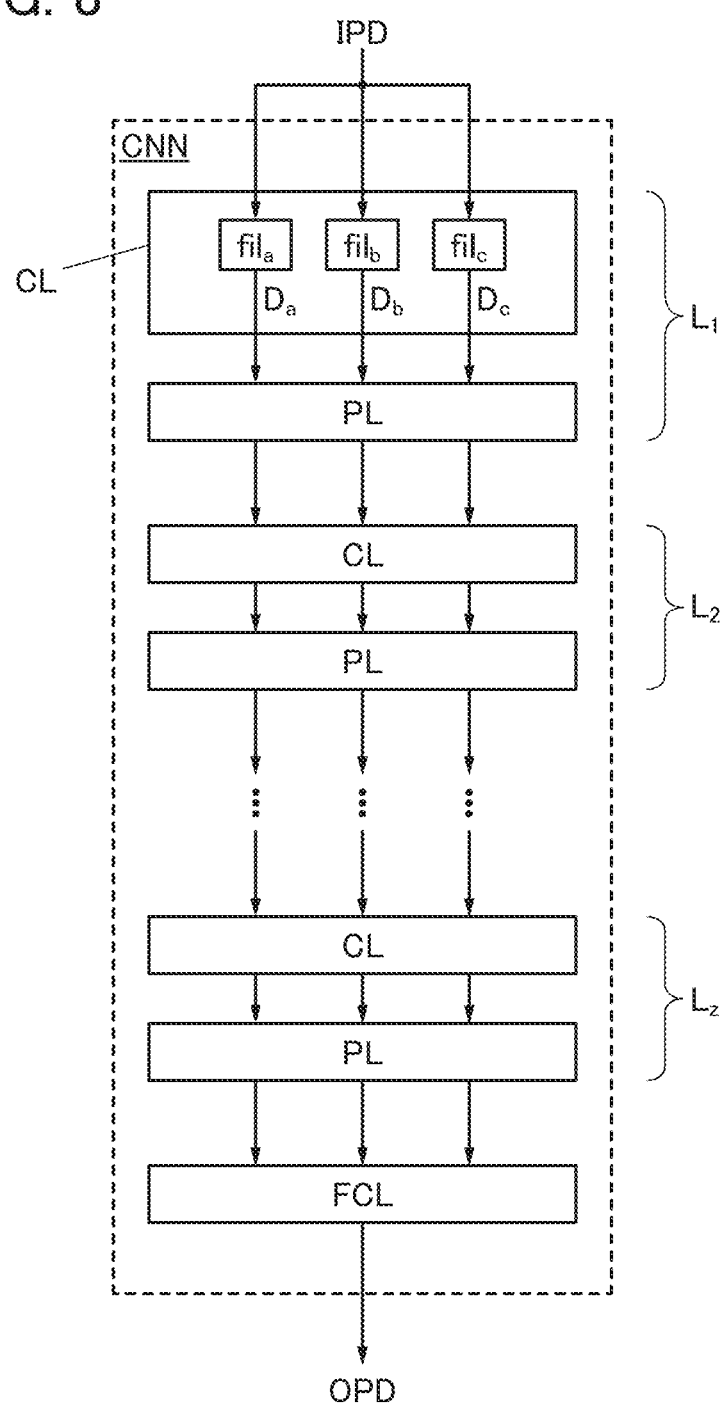
FIG. 8 illustrates a configuration example of a CNN.

FIG. 8 illustrates a configuration example of the CNN. The CNN includes a convolution layer CL, a pooling layer PL, and a fully connected layer FCL. In the case of using the CNN in the AI encoder AIE, image data IPD output from the image processing portion PP is input to the CNN and then the feature extraction is performed.

The convolution layer CL has a function of performing convolution on the image data. In the convolution, the product-sum operation using part of the image data and the filter value of a weight filter is repeatedly performed. As a result of the convolution by the convolution layer CL, a feature of an image is extracted.

For the convolution, one weight filter or a plurality of weight filters can be used. In the case of using a plurality of weight filters, a plurality of features of the image data can be extracted. FIG. 8 illustrates an example where three weight filters (filters $fil_a$, $fil_b$, and $fil_c$) are used. The image data input to the convolution layer CL is subjected to filter processing using the filters $fil_a$, $fil_b$, and $fil_c$, so that image data $D_a$, image data $D_b$, and image data $D_c$ are generated.

The image data $D_a$, the image data $D_b$, and the image data $D_c$ subjected to the convolution are converted using an activation function, and then output to the pooling layer PL. As the activation function, a rectified linear unit (ReLU) or the like can be used. The ReLU is a function that produces an output "0" when a negative value is input and returns the input value as it is when a value greater than or equal to 0 is input. As the activation function, a sigmoid function, a tan h function, or the like can be used.

The pooling layer PL has a function of performing pooling on the image data input from the convolution layer CL. In the pooling, the image data is partitioned into a plurality of regions, and predetermined data is extracted from each of the regions and the data are arranged in a matrix. The pooling can reduce the image data without losing the feature extracted in the convolution layer CL. As the pooling, max pooling, average pooling, Lp pooling, or the like can be used.

In the CNN, the feature extraction is performed using the convolution and the pooling. Note that the CNN can include a plurality of convolution layers CL and a plurality of pooling layers PL. FIG. 8 illustrates a structure including z layers $L_1$ to $L_z$ (here, z is an integer greater than or equal to 1) each of which consists of one convolution layer CL and one pooling layer PL; in the structure, the convolution and the pooling are performed z times. With such a structure, feature extraction can be performed in each layer L, which enables more advanced feature extraction.

The fully connected layer FCL has a function of determining an image using the image data obtained through the convolution and the pooling. All nodes in the fully connected layer FCL are connected to all nodes in the preceding layer of the fully connected layer FCL (here, the pooling layer PL). The image data output from the convolution layer CL or the pooling layer PL is in a form of a two-dimensional feature map and is converted into a one-dimensional feature map when input to the fully connected layer FCL. Then, image data OPD obtained as a result of the inference by the fully connected layer FCL is output.

Note that the structure of the CNN is not limited to that illustrated in FIG. 8. For example, each pooling layer PL may be provided for a plurality of convolution layers CL. In the case of retaining the positional information of the extracted feature as much as possible, the pooling layer PL can be omitted.

To classify images using the data output from the fully connected layer FCL, an output layer electrically connected to the fully connected layer FCL may be provided. The output layer can output a classification class using a softmax function or the like as a likelihood function.

The CNN can be used for supervised learning using image data as training data and labeled data. In the supervised learning, backpropagation can be used, for example. Owing to the learning in the CNN, the filter value of the weight filter, the weight coefficient of the fully connected layer, or the like can be optimized.

<Convolution>

Next, a specific example of the convolution performed by the convolution layer CL will be described.

Figure 9A:
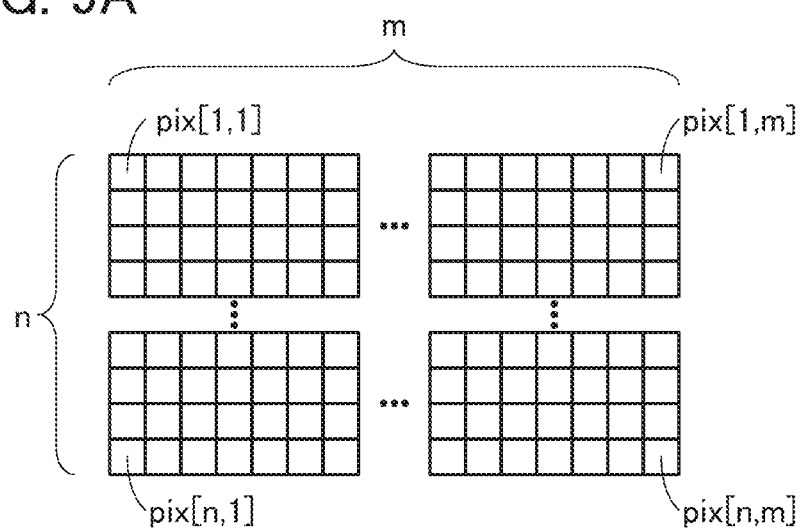
FIGS. 9A and 9B illustrate a configuration example of a pixel filter.

FIG. 9A illustrates a plurality of pixels pix arranged in a matrix of n rows and m columns (here, n and m are each an integer greater than or equal to 1) in the display portion PA. Image data $g[1, 1]$ to $g[n, m]$ are stored in pixels $pix[1, 1]$ to $pix[n, m]$, respectively.

Figure 9B:
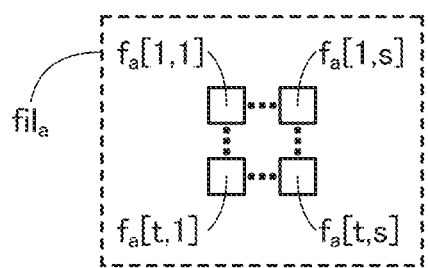

In the convolution, the product-sum operation using image data g and the filter value of a weight filter is performed. FIG. 9B illustrates the filter $fil_a$ composed of addresses in t rows and s columns (here, t is an integer greater than or equal to 1 and less than or equal to n, and s is an integer greater than or equal to 1 and less than or equal to m). Note that filter values $f_a[1, 1]$ to $f_a[t, s]$ are assigned to the addresses of the filter $fil_a$.

In the case of performing feature extraction using the convolution, data showing certain features (referred to as feature data) can be stored as the filter values $f_a[1, 1]$ to $f_a[t, s]$. In the feature extraction, the data and image data are compared with each other. In the case of performing image processing such as edge processing or blurring processing using the convolution, parameters necessary for the image processing can be stored as the filter values $f_a[1, 1]$ to $f_a[s, t]$. As an example, the operation in the case of performing feature extraction will be described in detail below.

Figure 10A:
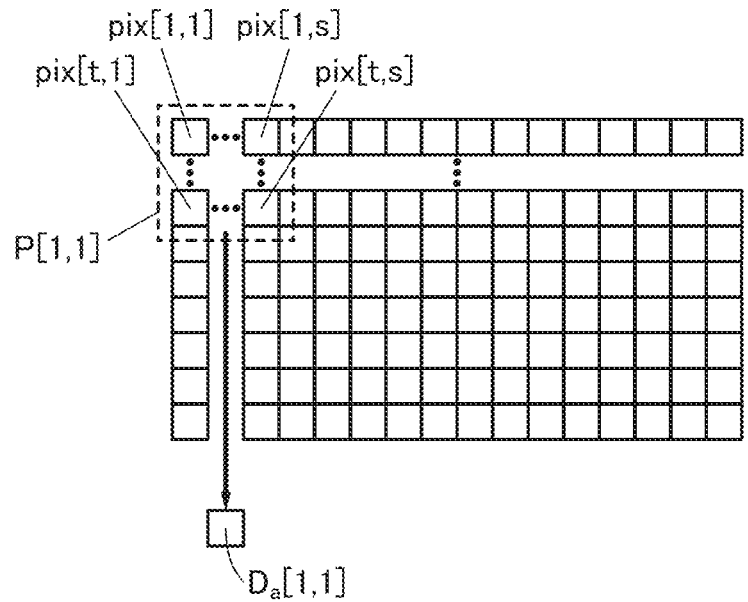
FIGS. 10A and 10B illustrate a configuration example of a convolution filter.
Figure 10B:
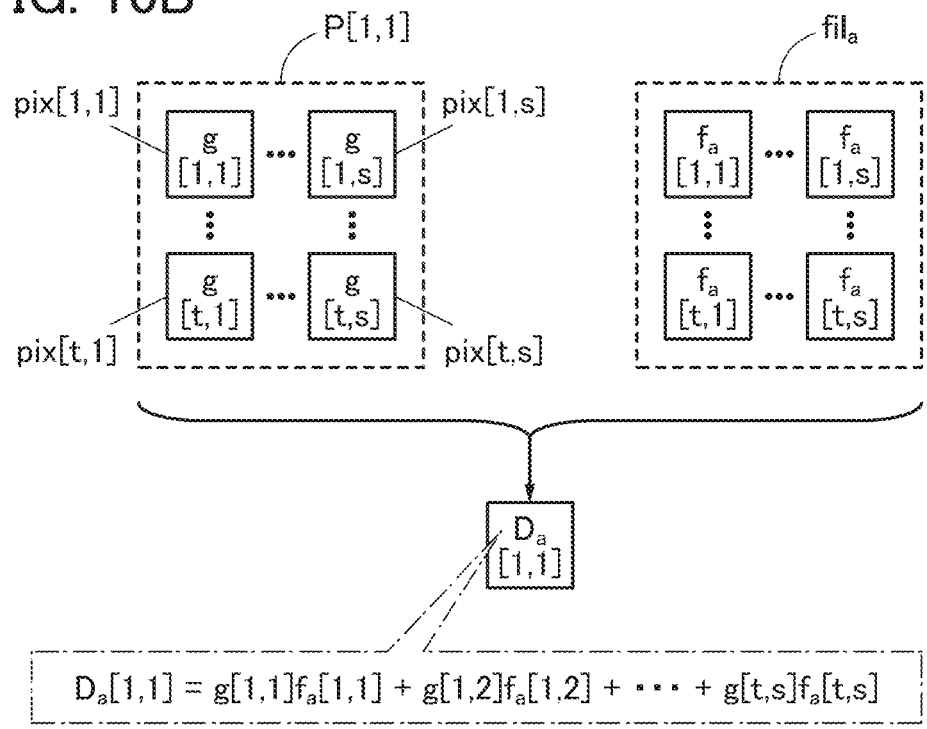

FIG. 10A illustrates a state where filter processing using the filter $fil_a$ is performed on a pixel region $P[1, 1]$ whose corners are the pixels $pix[1, 1]$, $pix[1, s]$, $pix[t, 1]$, and $pix[t, s]$ to obtain data $D_a[1, 1]$. In this filter processing, as illustrated in FIG. 10B, image data of each pixel pix in the pixel region $P[1, 1]$ is multiplied by the filter value $f_a$ of the filter $fil_a$ that corresponds to the address of the pixel pix, and the multiplication results for all pixels pix are added up together. In other words, the product-sum operation using the image data $g[v, w]$ (here, v is an integer greater than or equal to 1 and less than or equal to t, and w is an integer greater than or equal to 1 and less than or equal to s) and the filter value $f_a[v, w]$ is performed in all pixels pix in the pixel region $P[1, 1]$. The data $D_a[1, 1]$ can be expressed by the following formula.

$$D_a[1, 1] = \sum_{v=1}^{t} \sum_{w=1}^{s} g[v, w] \cdot f_a[v, w] \quad \text{[Formula 1]}$$

Figure 11:
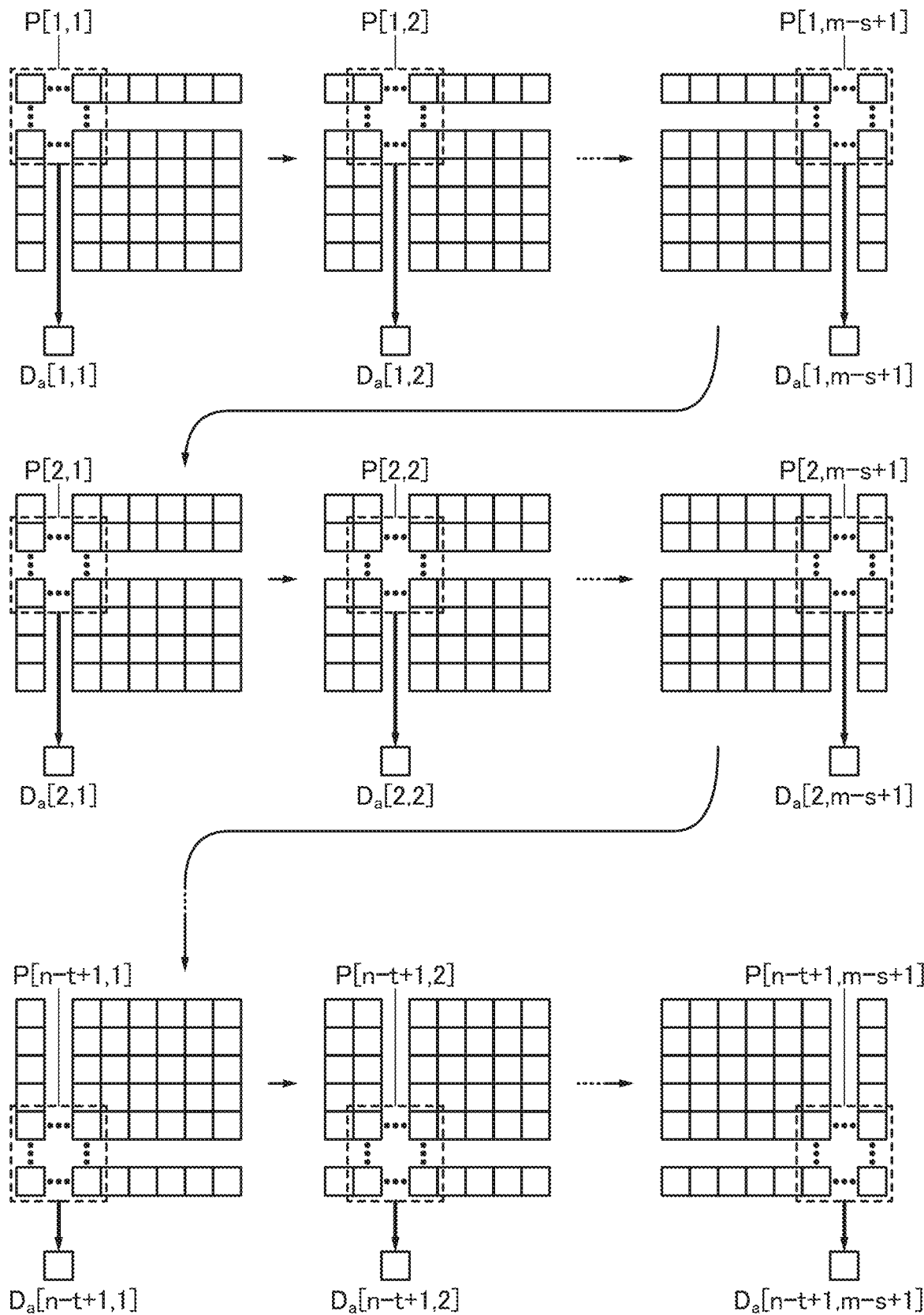
FIG. 11 illustrates an example of convolution.

After that, the product-sum operation is sequentially performed in other pixel regions. Specifically, the filter processing is performed on a pixel region $P[1, 2]$ whose corners are the pixels $pix[1, 2]$, $pix[1, s+1]$, $pix[t, 2]$, and $pix[t, s+1]$ to obtain data $D_a[1, 2]$, as illustrated in FIG. 11. Subsequently, the data $D_a$ is obtained from each pixel region P in a similar manner while the pixel region P is slid column by column.

Then, data $D_a[1, m-s+1]$ is obtained from a pixel region $P[1, m-s+1]$ whose corners are the pixels $pix[1, m-s+1]$, $pix[1, m]$, $pix[t, m-s+1]$, and $pix[t, m]$. After the acquisition of data $D_a$ in one row is completed, the pixel region P is slid by one pixel row and the acquisition of data $D_a$ is sequentially performed in the next row in a similar manner. FIG. 11 illustrates a state where data $D_a[2, 1]$ to $D_a[2, m-s+1]$ are obtained from pixel regions $P[2, 1]$ to $P[2, m-s+1]$.

When the above operation is repeated until data $D_a[n-t+1, m-s+1]$ is obtained from a pixel region $P[n-t+1, m-s+1]$ whose corners are the pixels $pix[n-t+1, m-s+1]$, $pix[n-t+1, m]$, $pix[n, m-s+1]$, and $pix[n, m]$, the filter processing using the filter $fil_a$ on all pixel regions P is completed.

In such a manner, a pixel region P having t×s pixels is selected from a region having the pixels $pix[1, 1]$ to $pix[n, m]$ and the filter processing using the filter $fil_a$ is performed on the pixel region P. The data $D_a[x, y]$ (here, x is an integer greater than or equal to 1 and less than or equal to (n−t+1), and y is an integer greater than or equal to 1 and less than or equal to (m−s+1)) that is obtained through the filter processing using the filter $fil_a$ performed on the pixel region P whose corners are the pixels $pix[x, y]$, $pix[x, y+s−1]$, $pix[x+t−1, y]$, and $pix[x+t−1, y+s−1]$ can be expressed by the following formula.

$$D_a[x, y] = \sum_{v=1}^{t} \sum_{w=1}^{s} g[x+v-1, y+w-1] \cdot f_a[v, w] \quad \text{[Formula 2]}$$

Figure 12:
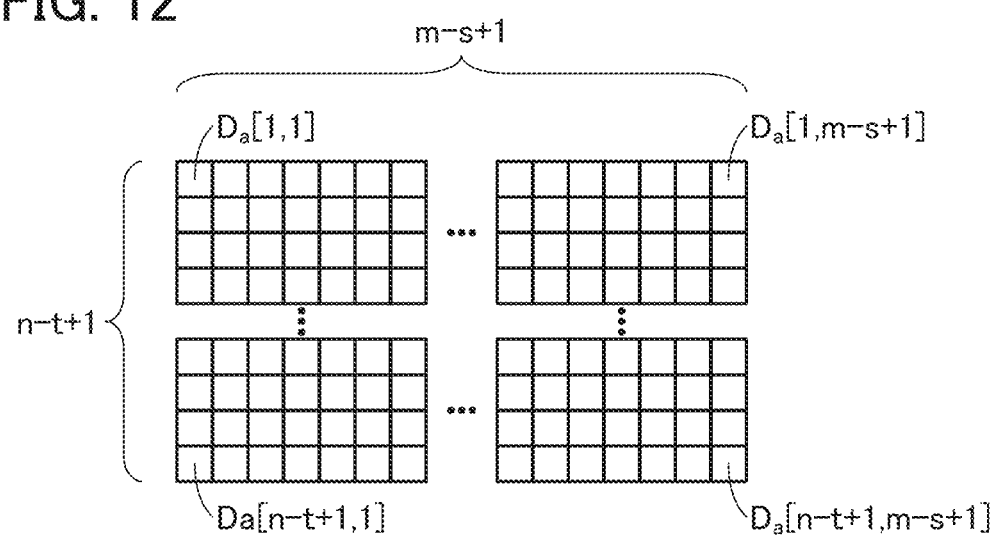
FIG. 12 illustrates a structure example of a feature map.

As described above, the data $D_a[1, 1]$ to $D_a[n-t+1, m-s+1]$ can be obtained when the filter processing using the filter $fil_a$ is performed on all pixel regions having t×s pixels that can be selected from a display region having the pixels pix[1, 1] to pix[n, m]. Then, the data $D_a[1, 1]$ to $D_a[n-t+1, m-s+1]$ are arranged in a matrix using the addresses, so that a feature map illustrated in FIG. 12 can be obtained.

In the above-described manner, the convolution is performed by the product-sum operation using the image data and the filter values to extract the feature of an image.

In the case where the convolution layer CL has a plurality of filters fil as illustrated in FIG. 8, the convolution is performed for each filter fil. Although described here is an example in which the pixel region P is slid by one pixel column when the pixel region P is in any of the first to (m−s)-th columns and returns to the first column and slid by one pixel row when the pixel region P is in the (m−s+1)-th column, the sliding distance of the pixel region P can be set freely.

<Semiconductor Device>

Figure 13:
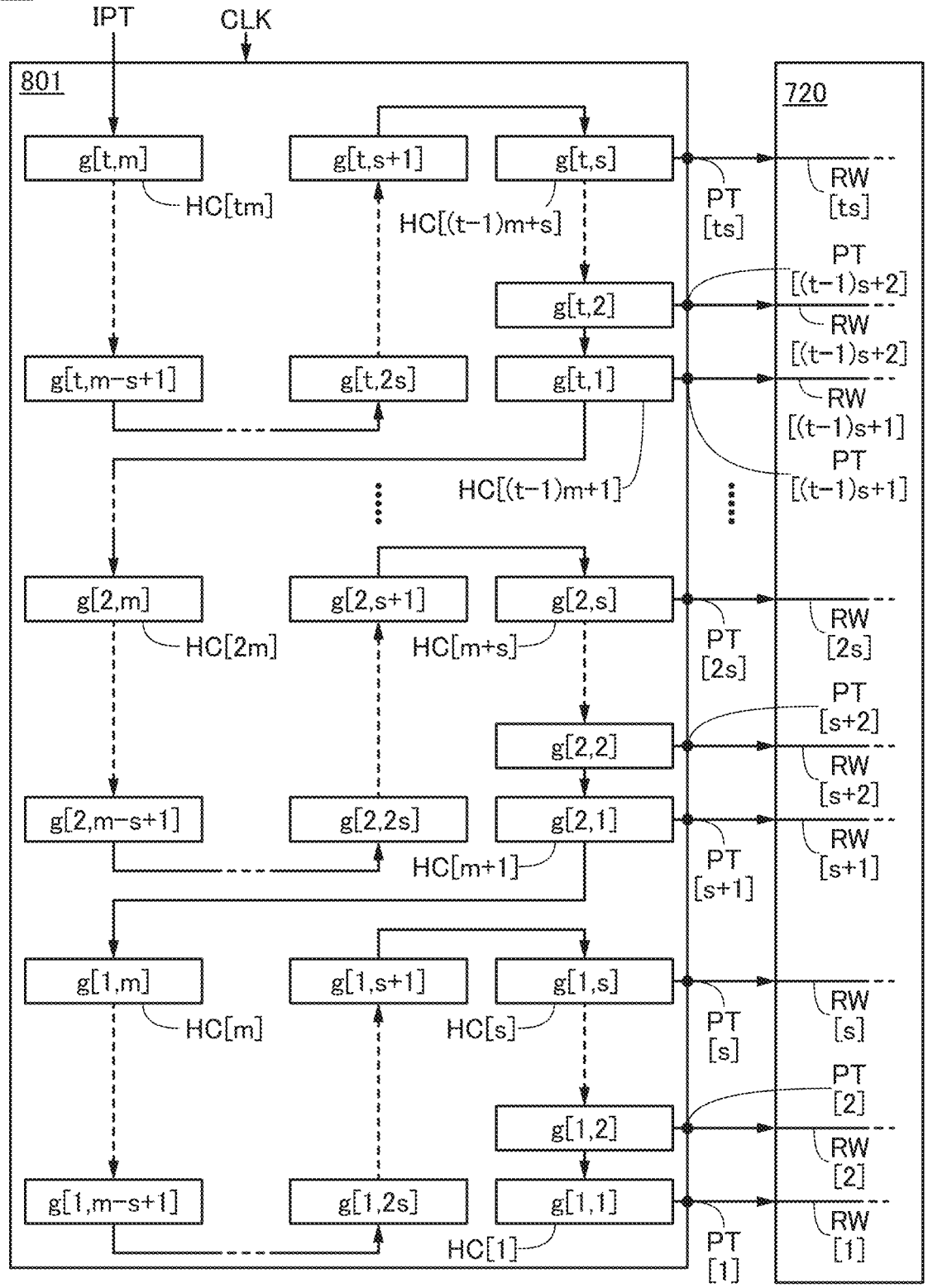
FIG. 13 illustrates an example of a semiconductor device.

Next, a configuration example of a semiconductor device having a function of performing the above convolution will be described. FIG. 13 illustrates a configuration example of a semiconductor device 800. The semiconductor device 800 includes a memory cell array 720 and a shift register 801.

In the semiconductor device 800 described here as an example, the above-described convolution is performed using the filter $fil_a$ having t×s filter values on the display portion including n×m pixels pix.

The shift register 801 includes t×m stages of retention circuits HC, an input terminal IPT, t×s output terminals PT, and a terminal through which the clock signal CLK is input. Note that in this specification and the like, the t×m stages of retention circuits HC are described as retention circuits HC[1] to HC[tm], and the t×s output terminals PT are described as output terminals PT[1] to PT[ts]. Among the retention circuits HC[1] to HC[tm], only the retention circuits HC[1], HC[s], HC[m], HC[m+1], HC[m+s], HC[2*m*], HC[(t−1)m+1], HC[(t−1)m+s], and HC[tm] are illustrated in FIG. 13.

Among the retention circuits HC[1] to HC[tm], the retention circuits HC[dm+1] to HC[dm+s] (here, d is an integer greater than or equal to 0 and less than or equal to (t−1)) are electrically connected to the output terminals PT[ds+1] to PT[(d+1)s]. That is, in FIG. 13, the retention circuits HC[1] to HC[s] are electrically connected to the output terminals PT[1] to PT[s], respectively, the retention circuits HC[m+1] to HC[m+s] are electrically connected to the output terminals PT[s+1] to PT[2*s*], respectively, and the retention circuits HC[(t−1)m+1] to HC[(t−1)m+s] are electrically connected to the output terminals PT[(t−1)s+1] to PT[ts], respectively.

The memory cell array 720 includes wirings RW[1] to RW[ts]. The wirings RW[1] to RW[ts] are electrically connected to the output terminals PT[1] to PT[ts].

The memory cell array 720 also includes is rows of memory cells (not illustrated in FIG. 13). The memory cells retain the filter values $f_a[1, 1]$ to $f_a[t, s]$ of the filter $fil_a$ used in the convolution. For the specific configuration of the memory cell array 720, refer to Embodiment 4.

As will be described in Embodiment 4, the memory cell array 720 is a component of a product-sum operation circuit 700. The product-sum operation circuit 700 can perform the product-sum operation using data retained in the memory cells (e.g., filter values or weight coefficients) and data input to the wirings RW (e.g., image data).

The image data g[1, 1] to g[n, m] stored in the pixels pix[1, 1] to pix[n, m] in the display portion PA are sequentially input to the shift register 801 through the input terminal IPT. The shift register 801 transmits image data stored in the retention circuits HC to the retention circuits HC in the next stages every time the clock signal CLK is input. FIG. 13 illustrates a state where the image data g[1, 1] is transmitted to the retention circuit HC[1] and the image data g[t, m] is transmitted to the retention circuit HC[tm].

At this time, image data retained in the retention circuits HC[dm+1] to HC[dm+s] are output from the output terminals PT[ds+1] to PT[(d+1)s]. Thus, FIG. 13 illustrates a state where the image data g[1, 1] to g[1, s] are output from the output terminals PT[1] to PT[s], respectively, the image data g[2, 1] to g[2, s] are output from the output terminals PT[s+1] to PT[2*s*], respectively, and the image data g[t, 1] to g[t, s] are output from the output terminals PT[(t−1)s+1] to PT[ts], respectively.

Accordingly, image data retained in the retention circuits HC[dm+1] to HC[dm+s] are transmitted to the wirings RW[ds+1] to RW[(d+1)s] of the memory cell array 720. Note that the image data transmitted to the wirings RW[1] to RW[ts] at this time correspond to the image data in the pixel region P[1, 1] illustrated in FIGS. 10A and 10B.

The image data in the pixel region P[1, 1] output to the wirings RW[1] to RW [ts] are supplied to memory cells in one column in the memory cell array 720. Since the filter values $f_a[1, 1]$ to $f_a[t, s]$ are retained in the memory cells in one column, the product-sum operation using the image data and the filter values $f_a$ is performed. For the details of the product-sum operation, refer to Embodiment 4.

Through the product-sum operation using the image data in the pixel region P[1, 1] and the filter $fil_a$, the data $D_a[1, 1]$ illustrated in FIGS. 10A and 10B can be obtained. In this manner, the shift register 801 can output t×s sets of image data to the memory cell array 720 at a time; thus, the convolution can be performed at high speed.

In the case of increasing the number of filters used in the convolution, the number of columns of the memory cell array 720 is set equal to the number of the filters. In the case of using the filters $fil_a$, $fil_b$, and $fil_c$ illustrated in FIG. 8 in the convolution, for example, the filter values of the filter $fil_a$ can be stored in the memory cells in the first column of the memory cell array 720, the filter values of the filter $fil_b$ can be stored in the memory cells in the second column of the memory cell array 720, and the filter values of the filter file can be stored in the memory cells in the third column of the memory cell array 720. When the filter values of a plurality of filters are stored in the memory cell array 720 as described above, the product-sum operations for the filters can be performed in parallel by simply outputting image data in the pixel region P from the shift register 801 once. Thus, a plurality of sets of convolution can be performed at the same time.

Figure 14:
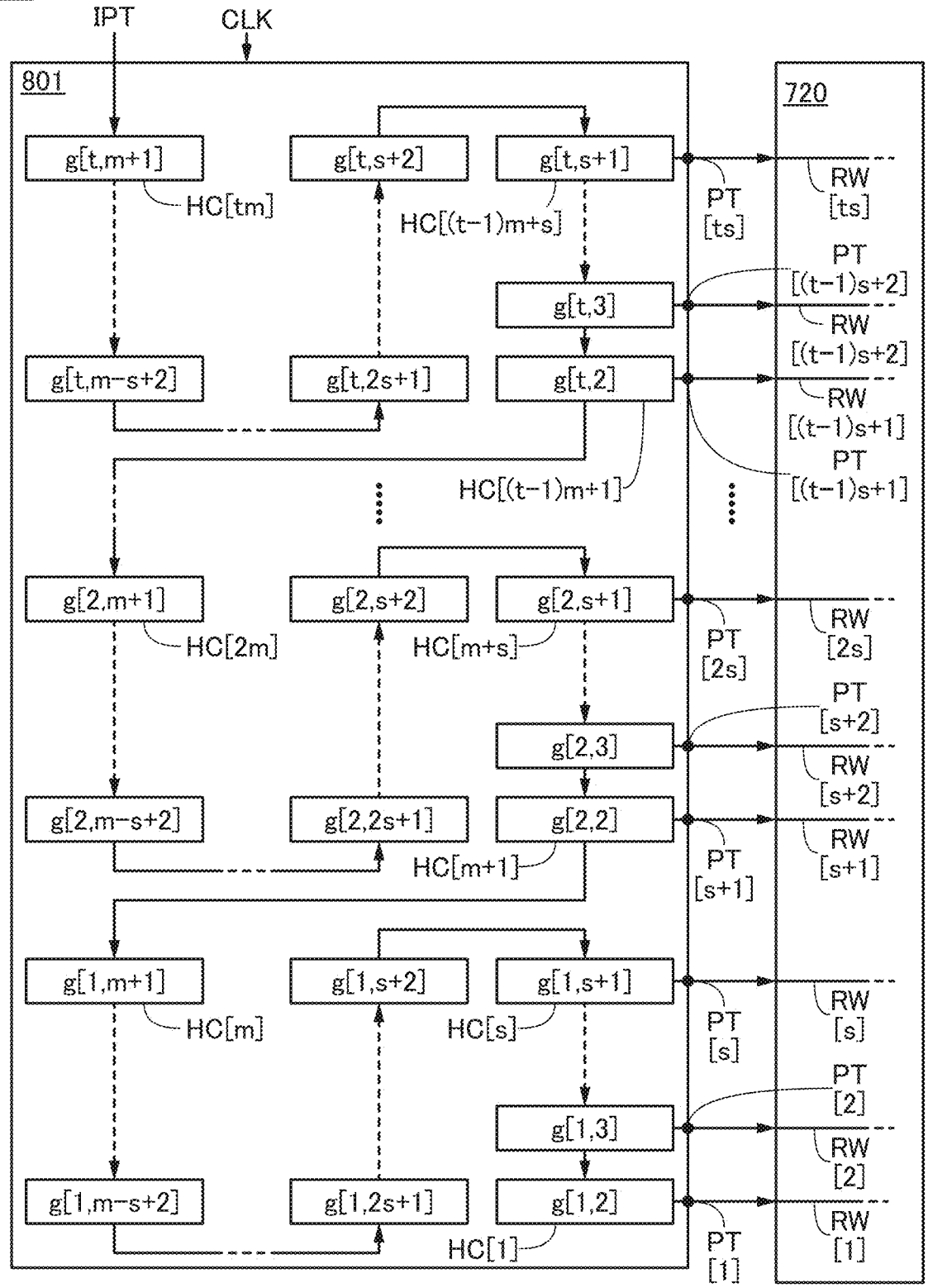
FIG. 14 illustrates an example of a semiconductor device.

When the next pulse of the clock signal CLK is input to the shift register 801 in the semiconductor device 800 illustrated in FIG. 13, the image data g[1, 2] to g[t, m] stored in the retention circuits HC[1] to HC[tm] of the shift register 801 are transmitted to their next retention circuits HC, as illustrated in FIG. 14. Since there is no retention circuit in the next stage of the retention circuit HC[1] in the shift register 801, the image data g[1, 1] is not retained. The retention circuit HC[1] retains the image data g[1, 2] transmitted from the retention circuit HC[2] in the previous stage. The retention circuit HC[tm] retains the image data g[t, m+1] transmitted from the input terminal IPT.

At this time, image data retained in the retention circuits HC[dm+1] to HC[dm+s] are output from the output terminals PT[ds+1] to PT[(d+1)s]. Thus, FIG. 14 illustrates a state where the image data g[1, 2] to g[1, s+1] are output from the output terminals PT[1] to PT[s], respectively, the image data g[2, 2] to g[2, s+1] are output from the output terminals PT[s+1] to PT[2s], respectively, and the image data g[t, 2] to g[t, s+1] are output from the output terminals PT[(t−1)s+1] to PT[ts], respectively.

Accordingly, image data retained in the retention circuits HC[dm+1] to HC[dm+s] are transmitted to the wirings RW[ds+1] to RW[(d+1)s] of the memory cell array 720. Note that the image data transmitted to the wirings RW[1] to RW[ts] at this time correspond to the image data in the pixel region P[1, 2] illustrated in FIG. 11.

The image data in the pixel region P[1, 2] transmitted to the wirings RW[1] to RW[ts] are subjected to the filter processing using the filter $fil_a$ as with the case of the pixel region P[1, 1]. Specifically, the data $D_a$[1, 2] illustrated in FIG. 11 can be obtained through the product-sum operation using the image data in the pixel region P[1, 2] and the filter values $f_a$[1, 1] to $f_a$[t, s] retained in the memory cells in one column.

As described above, when new image data from the input terminal IPT and the clock signal CLK are input to the shift register 801, image data in the pixel region P slid by one pixel row can be sequentially input to the memory cell array 720.

Figure 15:
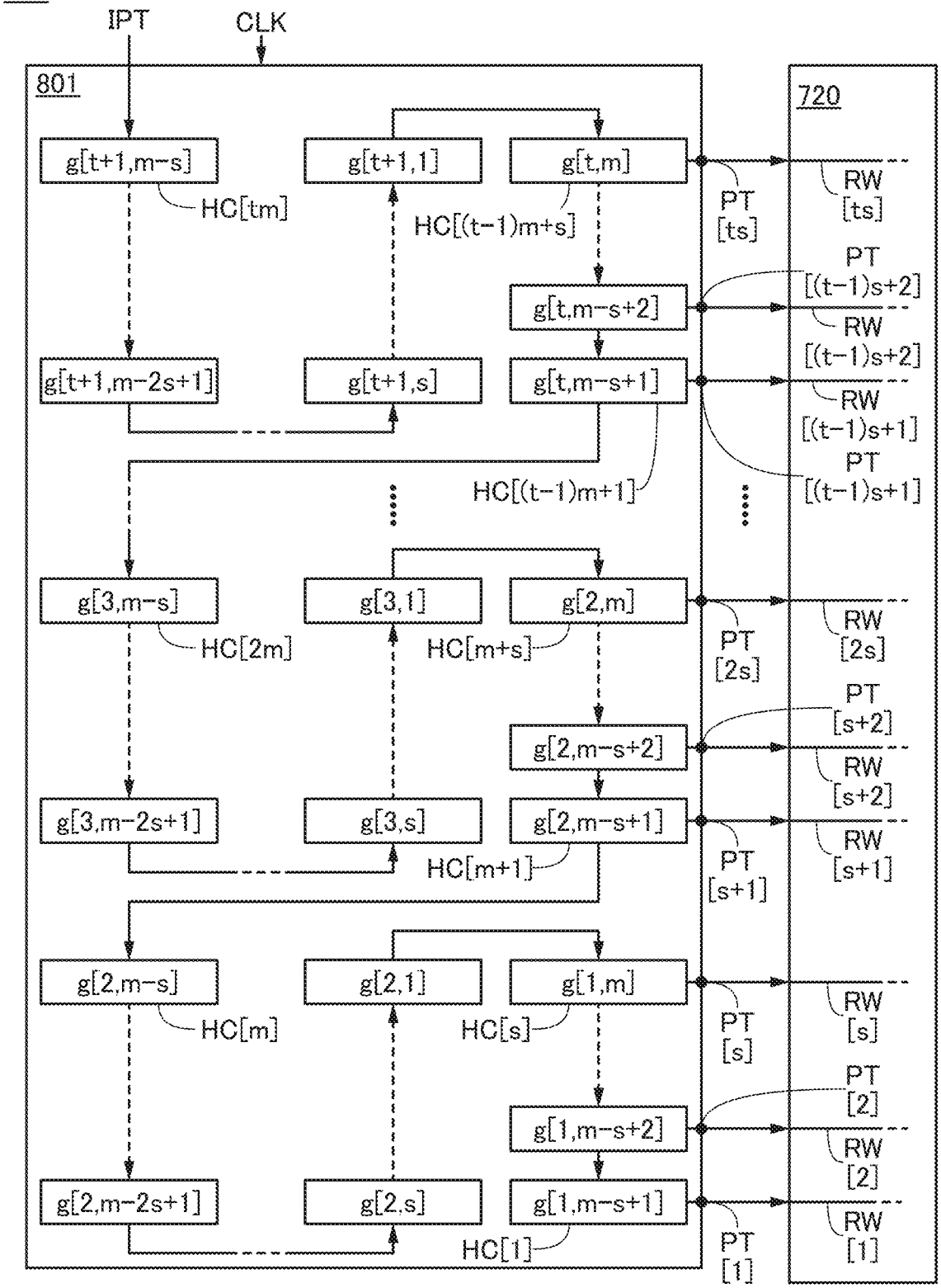
FIG. 15 illustrates an example of a semiconductor device.

FIG. 15 illustrates the semiconductor device 800 after (m−s−1) pulses of the clock signal CLK and image data g from the input terminal IPT are sequentially input to the semiconductor device 800 illustrated in FIG. 14. Thus, FIG. 15 illustrates a state where the image data g[1, m−s+1] to g[1, m] are output from the output terminals PT[1] to PT[s], respectively, the image data g[2, m−s+1] to g[2, m] are output from the output terminals PT[s+1] to PT[2s], respectively, and the image data g[t, m−s+1] to g[t, m] are output from the output terminals PT[(t−1)s+1] to PT[ts], respectively.

Accordingly, image data retained in the retention circuits HC[dm+1] to HC[dm+s] are transmitted to the wirings RW[ds+1] to RW[(d+1)s] of the memory cell array 720. Note that the image data transmitted to the wirings RW[1] to RW[ts] at this time correspond to the image data in the pixel region P[1, m−s+1] illustrated in FIG. 11.

The image data in the pixel region P[1, m−s+1] transmitted to the wirings RW[1] to RW[ts] are subjected to the filter processing using the filter $fil_a$ as with the cases of the pixel regions P[1, 1] and P[1, 2]. Specifically, the data $D_a$[1, m−s+1] illustrated in FIG. 11 can be obtained through the product-sum operation using the image data in the pixel region P[1, m−s+1] and the filter values $f_a$[1, 1] to $f_a$[t, s] retained in the memory cells in one column.

As described above, when the image data g and the clock signal CLK are sequentially input and the convolution is performed on each of the pixel regions P[1, 1] to P[1, m−s+1], the data $D_a$ in one row can be obtained.

In the case of performing the convolution after the state illustrated in FIG. 15, the pixel region P[2, 1] is subjected to the convolution next. The image data in the pixel region P[2, 1] can be input to the memory cell array 720 when s pulses of the clock signal CLK and the image data g are input to the shift register 801 in the state illustrated in FIG. 15.

Figure 16:
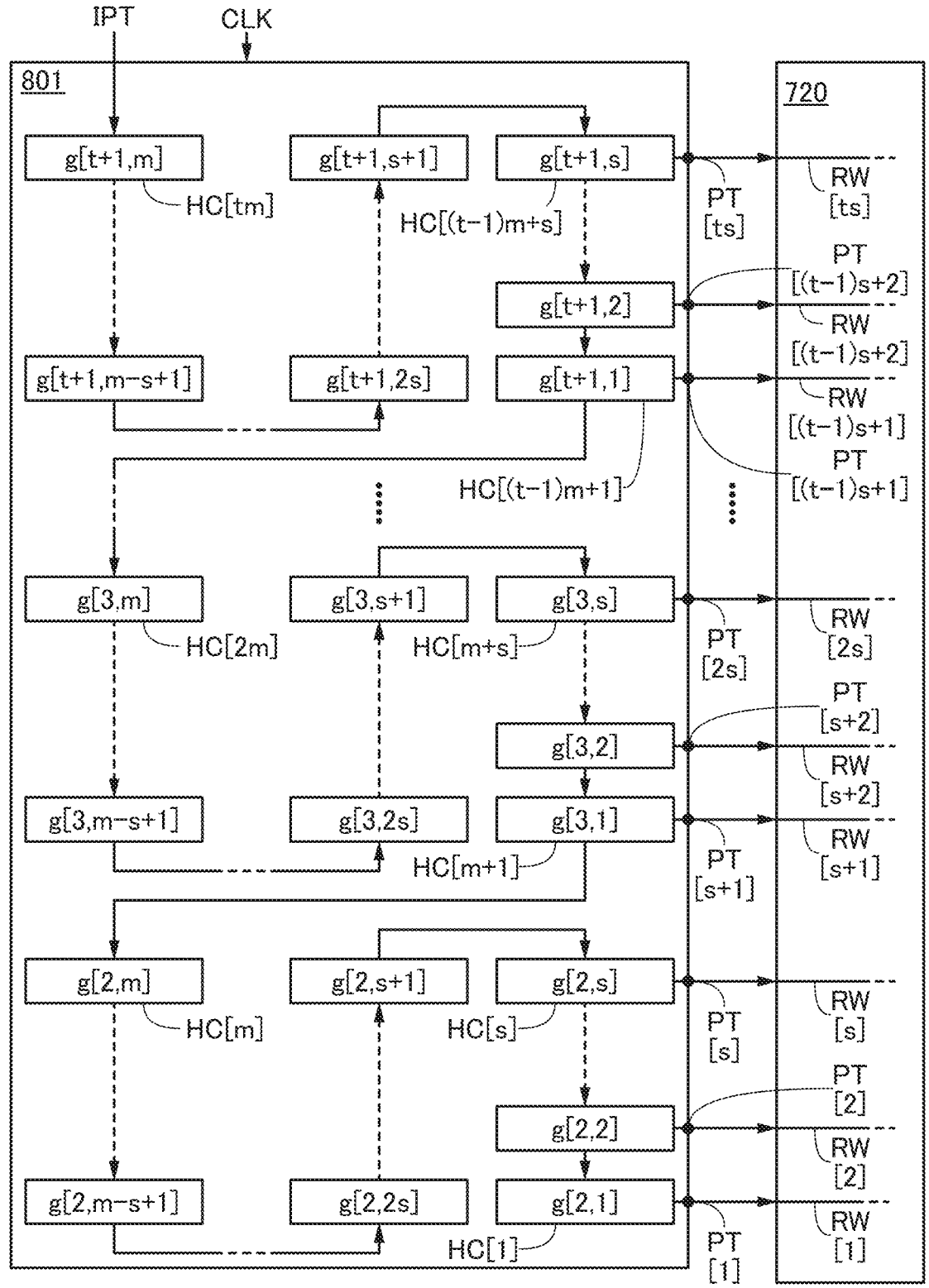
FIG. 16 illustrates an example of a semiconductor device.

FIG. 16 illustrates a state where s pulses of the clock signal CLK and the image data g are input to the shift register 801 in the state illustrated in FIG. 15. FIG. 16 illustrates a state where the image data g[2, 1] to g[2, s] are output from the output terminals PT[1] to PT[s], the image data g[3, 1] to g[3, s] are output from the output terminals PT[s+1] to PT[2s], and the image data g[t+1, 1] to g[t+1, s] are output from the output terminals PT[(t−1)s+1] to PT[ts].

Accordingly, image data retained in the retention circuits HC[dm+1] to HC[dm+s] are transmitted to the wirings RW[ds+1] to RW[(d+1)s] of the memory cell array 720. Note that the image data transmitted to the wirings RW[1] to RW[ts] at this time correspond to the image data in the pixel region P[2, 1] illustrated in FIG. 11.

The image data in the pixel region P[2, 1] transmitted to the wirings RW[1] to RW[ts] are subjected to the filter processing using the filter $fil_a$ as with the cases of the pixel regions P[1, 1] to P[1, m−s+1]. Specifically, the data $D_a$[2, 1] illustrated in FIG. 11 can be obtained through the product-sum operation using the image data in the pixel region P[2, 1] and the filter values $f_a$[1, 1] to $f_a$[t, s] retained in the memory cells in one column.

When the above operation is repeated until data $D_a$[n−t+1, m−s+1] is obtained from a pixel region P[n−t+1, m−s+1], the filter processing using the filter $fil_a$ on all pixel regions P is completed.

As described above, the shift register 801 included in the semiconductor device 800 has a function of outputting image data in each pixel region to the memory cell array 720 sequentially. Thus, the use of the semiconductor device 800 enables a high-speed product-sum operation in the CNN.

Note that one embodiment of the present invention is not limited to the semiconductor device 800 illustrated in FIGS. 13 to 16. Depending on circumstances or conditions, the circuit configuration of the semiconductor device 800 can be changes as appropriate.

Embodiment 3

In this embodiment, a configuration example of a display panel including the semiconductor device described in Embodiment 1 will be described.

Figure 17:
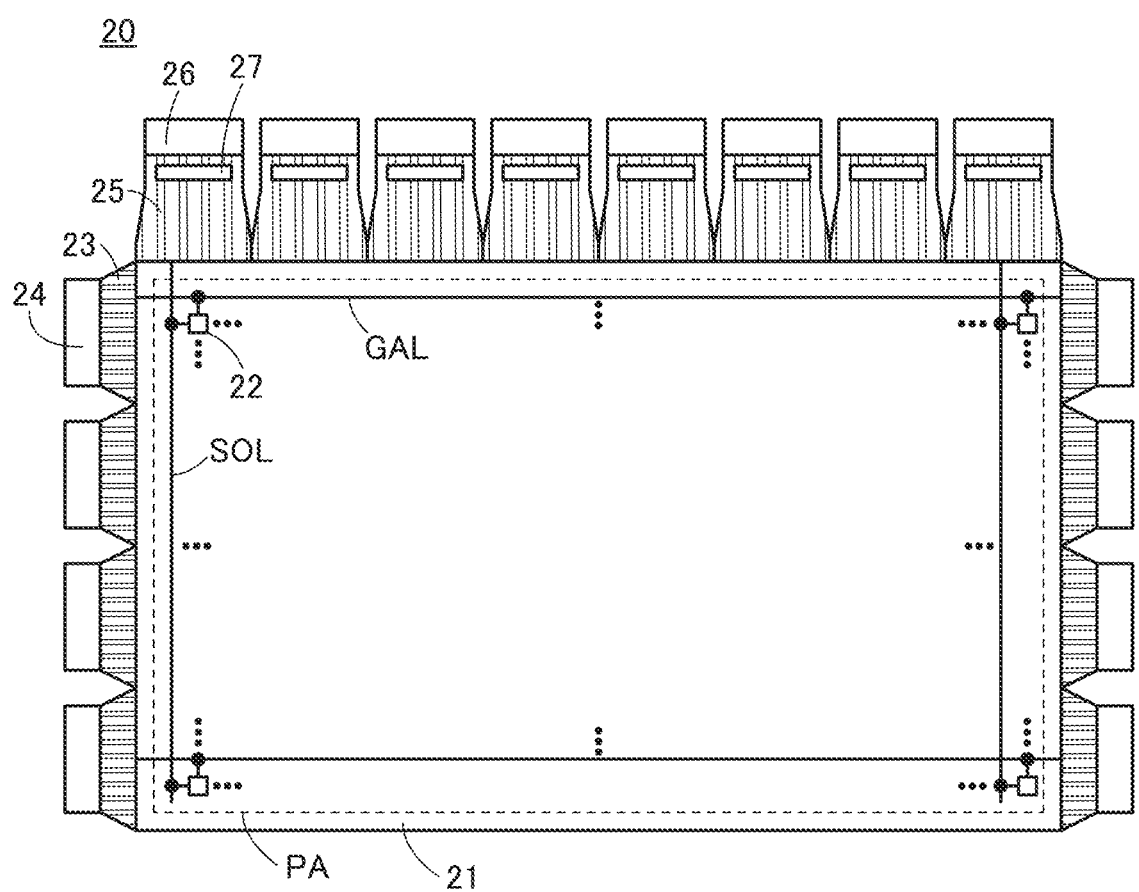
FIG. 17 is a schematic diagram illustrating a configuration example of a display panel.

FIG. 17 illustrates a configuration example of a display panel including the source driver circuit SD described in Embodiment 1. In a display panel 20, the display portion PA is formed over a substrate 21. The display portion PA includes a plurality of pixels 22 electrically connected to wirings GAL and wirings SOL.

Note that the pixels 22 correspond to the pixels included in the display portion PA illustrated in FIG. 3, the pixels PIX[1] and PIX[2] illustrated in FIG. 4, or the pixels PIX[1] to PIX[x] illustrated in FIG. 7, which are described in Embodiment 1. In the case where one wiring GAL is electrically connected to pixels in a plurality of rows, the wiring GAL corresponds to the wiring GWL, which is illustrated in FIG. 4 and FIG. 7 and described in Embodiment 1.

The display panel 20 is provided with a plurality of FPCs 23 and a plurality of FPCs 25.

The FPCs 23 are electrically connected to printed circuit boards 24 and the wirings GAL. The printed circuit boards 24 can have a function of distributing signals input from the outside to the FPCs 23 and a function of generating selection signals, for example. In particular, selection signals generated using the latter function can be transmitted to the pixels 22 through the wirings GAL.

The FPCs 25 are electrically connected to printed circuit boards 26 and the wirings SOL. In addition, integrated circuits 27 are mounted on the FPCs 25 by a tape automated bonding (TAB) method. The printed circuit boards 26 can have, for example, a function of distributing signals input from the outside to the FPCs 25. Each of the printed circuit boards 26 can include the AI decoder described in Embodiment 1, for example. Each of the integrated circuits 27 can include, for example, the source driver circuit SD described in Embodiment 1, in which case image signals can be transmitted from the FPCs 25 to the pixels 22 through the wirings SOL.

To manufacture a high-resolution display panel, for example, a large display panel that is compatible with 2K, 4K, or 8K broadcasting or the like, it is preferable to provide the plurality of printed circuit boards 24 and 26 as illustrated in FIG. 17. In that case, image data can be easily input to the display panel 20.

Although FIG. 17 illustrates the FPCs 23 and 25 as electrical paths connected to the printed circuit boards 24 and 26 and the integrated circuits 27, the FPCs 23 and/or 25 may be wirings formed over the substrate 21. In that case, the printed circuit boards 24 and 26 and the integrated circuits 27 may also be circuits formed over the substrate 21.

A driver circuit used for driving the display panel 20 may be provided over the substrate 21. In the case of using OS transistors as transistors included in the pixels 22, in particular, an OS transistor included in the driver circuit or the like can be formed over the substrate 21 at the same time as the transistors. Because of its high field-effect mobility, an OS transistor can be included in the driver circuit or the like, in which case the integrated circuits 27 are not necessary.

In the case of using an amorphous semiconductor for the transistors included in the pixels 22, it is preferable that the driver circuit or the like be mounted separately using the integrated circuits 27 as illustrated in FIG. 17. A driver circuit may be mounted on the FPCs 23 by a COF method. Accordingly, the operation speed of the display panel 20 can be improved.

Figure 18:
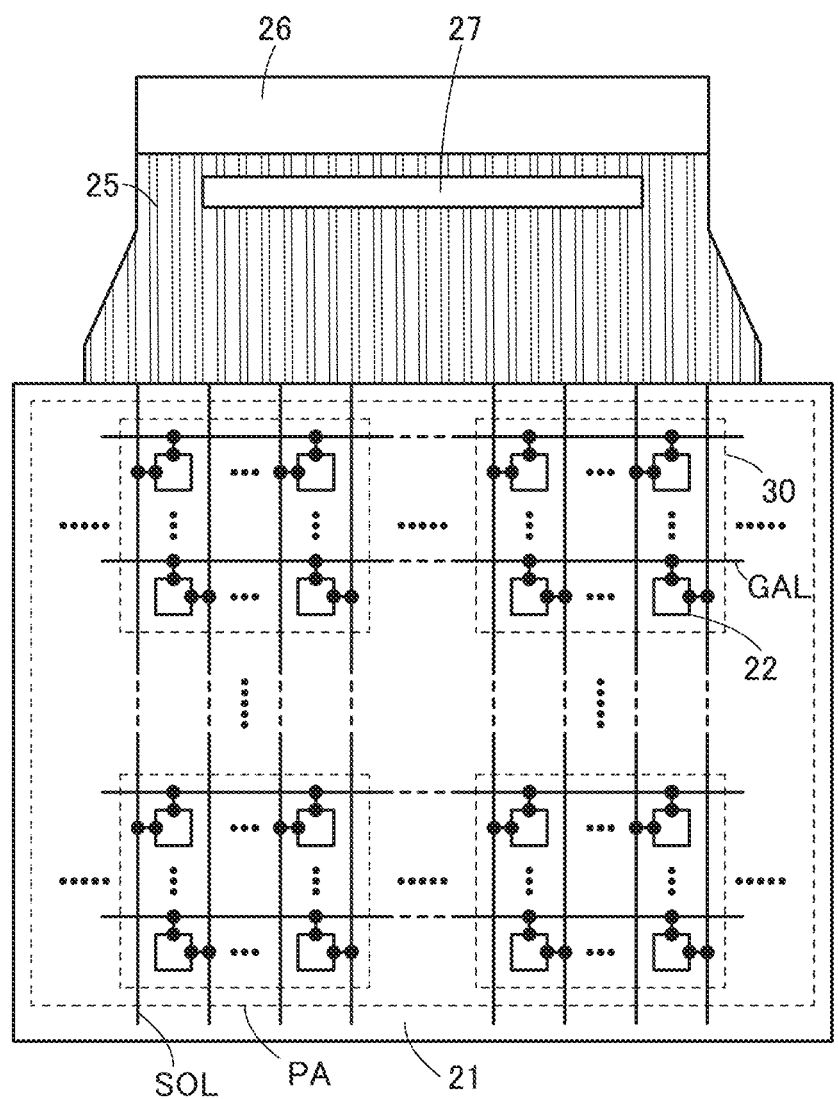
FIG. 18 is a schematic diagram illustrating a configuration example of a display panel.

Next, a configuration example of the display panel 20 that includes the source driver circuit SD3 in FIG. 7 described in Embodiment 1 will be described. FIG. 18 illustrates one of the FPCs 25 included in the display panel 20 illustrated in FIG. 17 and a plurality of pixels 22 electrically connected to the FPC 25.

The AI decoder AID illustrated in FIG. 7 is included in the printed circuit board 26, and the source driver circuit SD3 illustrated in FIG. 7 is included in the integrated circuit 27.

The display portion PA includes a plurality of display regions 30. Note that the display regions 30 are arranged in a matrix in the display portion PA.

The number of columns of the display regions 30 electrically connected to one FPC 25 corresponds to the number of the source driver circuits SD3 included in the integrated circuit 27. The number of rows of the display regions 30 electrically connected to one FPC 25 can be determined depending on the resolution.

A plurality of pixels 22 are included in each of the display regions 30. The number of the pixels 22 in each of the display regions 30 is determined by the number of the output terminals of the demultiplexer DMX2 and that of the output terminals of the shift register SR illustrated in FIG. 7. Specifically, the number of the output terminals of the demultiplexer DMX2 corresponds to the number of the pixels 22 in one column in the display region 30, and the number of the output terminals of the shift register SR corresponds to the number of the pixels 22 in one row in the display region 30.

Furthermore, the number of the wirings SOL used for the pixels in one column in the display region 30 corresponds to the number of the output terminals of the demultiplexer DMX2. In addition, the number of the wirings GAL used for the pixels in one row in the display region 30 corresponds to the number of the output terminals of the shift register SR.

As described in Embodiment 1, with the use of the source driver circuit SD3 in FIG. 7, image data can be written to pixels in a plurality of rows, that is, pixels included in the display regions 30 in one row in FIG. 18 at a time. In addition, the same selection signal can be supplied to the pixels included in the display regions 30 in one row. In other words, with the use of the source driver circuit SD3 in FIG. 7, image data can be written to pixels in each of the display regions 30 at a time; thus, the number of times of transmitting a selection signal can be reduced.

Note that this embodiment can be combined with any of the other embodiments in this specification as appropriate.

Embodiment 4

In this embodiment, a hierarchical neural network and a configuration example of a product-sum operation circuit that can be applied to the hierarchical neural network will be described.

<Hierarchical Neural Network>

A hierarchical neural network will be described as a kind of neural network that can be used for the semiconductor device of one embodiment of the present invention.

Figure 19:
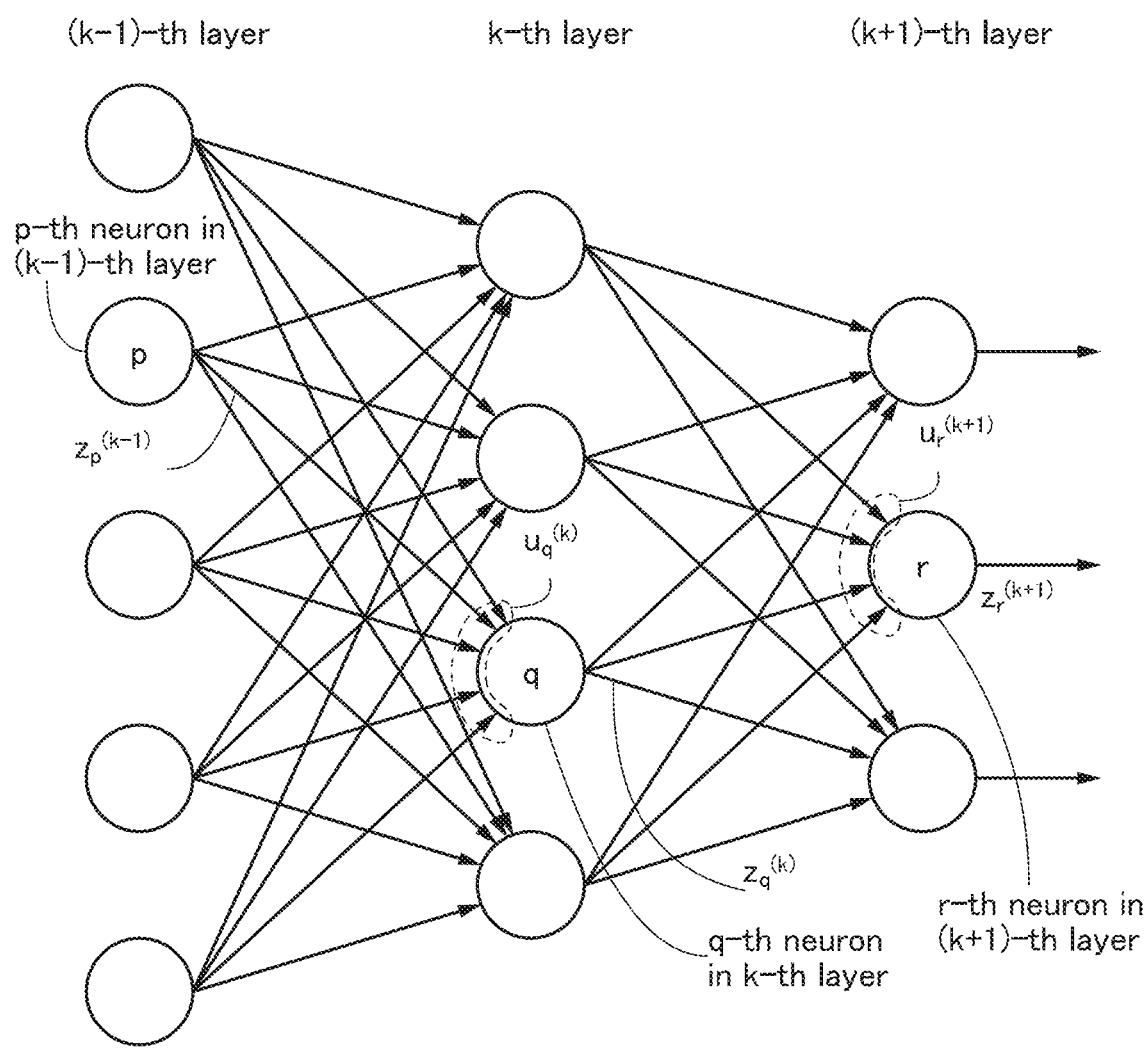
FIG. 19 illustrates an example of a hierarchical artificial neural network.

FIG. 19 is a diagram showing an example of a hierarchical neural network. A (k−1)-th layer (here, k is an integer greater than or equal to 2) includes P neurons (here, P is an integer greater than or equal to 1). A k-th layer includes Q neurons (here, Q is an integer greater than or equal to 1). A (k+1)-th layer includes R neurons (here, R is an integer greater than or equal to 1).

The product of an output signal $z_p^{(k-1)}$ of the p-th neuron (here, p is an integer greater than or equal to 1 and less than or equal to P) in the (k−1)-th layer and a weight coefficient $w_{qp}^{(k)}$ is input to the q-th neuron (here, q is an integer greater than or equal to 1 and less than or equal to Q) in the k-th layer. The product of an output signal $z_q^{(k)}$ of the q-th neuron in the k-th layer and a weight coefficient $w_{rq}^{(k+1)}$ is input to the r-th neuron (r is an integer greater than or equal to 1 and less than or equal to R) in the (k+1)-th layer. The output signal of the r-th neuron in the (k+1)-th layer is $z_r^{(k+1)}$.

In this case, the summation $u_q^{(k)}$ of signals input to the q-th neuron in the k-th layer is expressed by the following formula.

[Formula 3]

$$u_q^{(k)} = \Sigma w_{qp}^{(k)} z_p^{(k-1)} \tag{D1}$$

The output signal $z_q^{(k)}$ from the q-th neuron in the k-th layer is expressed by the following formula.

[Formula 4]

$$z_q^{(k)} = f(u_q^{(k)}) \tag{D2}$$

Figure 22A:
FIGS. 22A to 22D illustrate circuit configuration examples.

A function $f(u_q^{(k)})$ is an activation function. A step function, a linear ramp function, a sigmoid function, or the like can be used as the function $f(u_q^{(k)})$. Product-sum operation of Formula 3 (D1) can be performed with a product-sum operation circuit 700 to be described later. Formula 4 (D2) can be calculated with a circuit 161 illustrated in FIG. 22A, for example.

Note that the activation function may be the same among all neurons or may be different among neurons. Furthermore, the activation function in one layer may be the same as or different from that in another layer.

Figure 20:
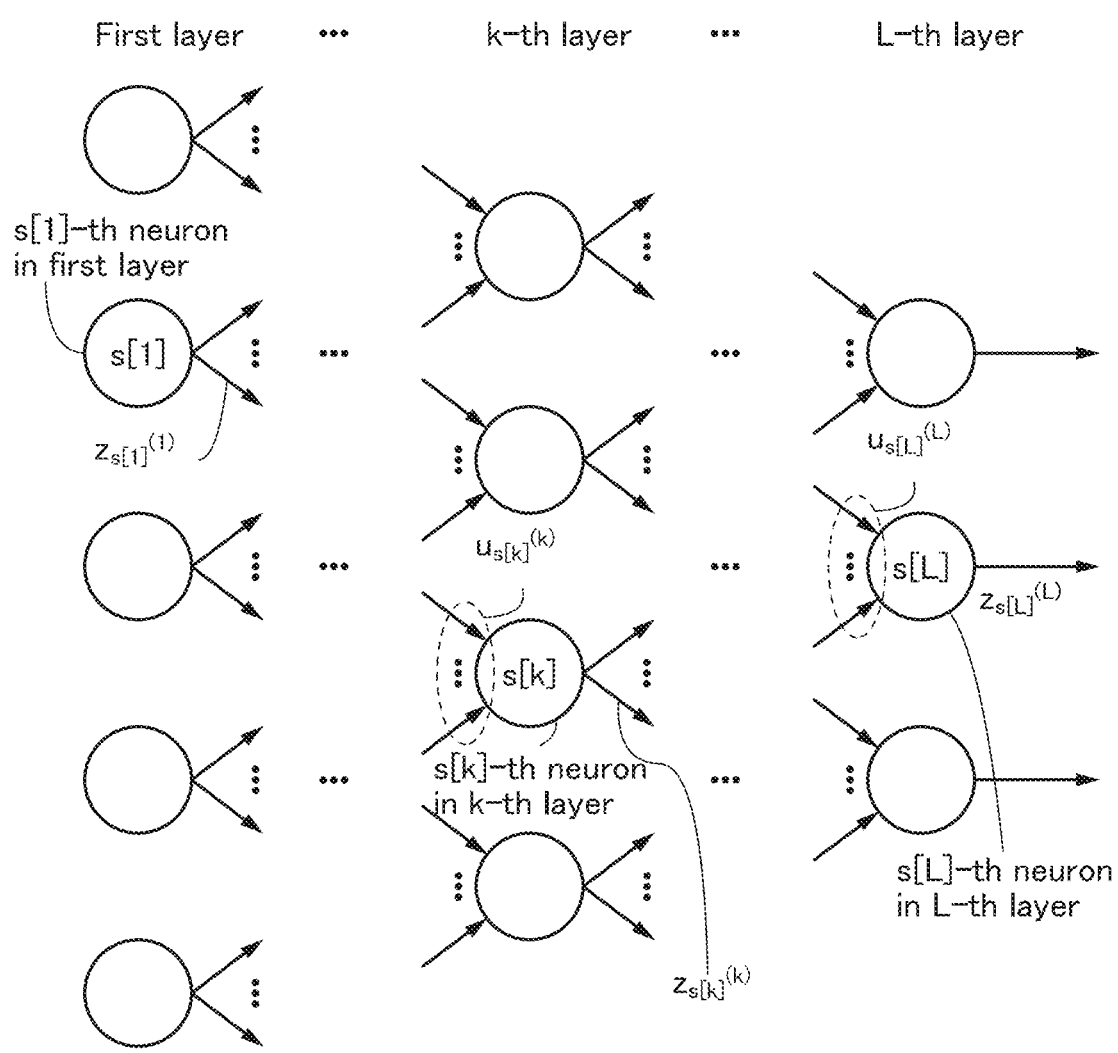
FIG. 20 illustrates an example of a hierarchical artificial neural network.

Here, a hierarchical neural network including L layers (here, L is an integer greater than or equal to 3) in total shown in FIG. 20 is described (that is, here, k is an integer greater than or equal to 2 and less than or equal to (L−1)). The first layer is an input layer of the hierarchical neural network, the L-th layer is an output layer of the hierarchical neural network, and the second to (L−1)-th layers are hidden layers of the hierarchical neural network.

The first layer (input layer) includes P neurons, the k-th layer (hidden layer) includes Q[k] neurons (here, Q[k] is an integer greater than or equal to 1), and the L-th layer (output layer) includes R neurons.

An output signal of the s[1]-th neuron in the first layer (here, s[1] is an integer greater than or equal to 1 and less than or equal to P) is $z_{s[1]}^{(1)}$, an output signal of the s[k]-th neuron in the k-th layer (here, s[k] is an integer greater than or equal to 1 and less than or equal to Q[k]) is $z_{s[k]}^{(k)}$, and an output signal of the s[L]-th neuron in the L-th layer (here, s[L] is an integer greater than or equal to 1 and less than or equal to R) is $z_{s[L]}^{(L)}$.

The product $u_{s[k]}^{(k)}$ of an output signal $z_{s[k-i]}^{(k-1)}$ of the s[k−1]-th neuron in the (k−1)-th layer and a weight coefficient $w_{s[k]s[k-1]}^{(k)}$ (here, s[k−1] is an integer greater than or equal to 1 and less than or equal to Q[k−1]) is input to the s[k]-th neuron in the k-th layer. The product $u_{s[L]}^{(L)}$ of an output signal $z_{s[L]s[L-1]}^{(L)}$ of the s[L−1]-th neuron in the (L−1)-th layer and a weight coefficient $w_{s[L]s[L-1]}^{(L)}$ (here, s[L−1] is an integer greater than or equal to 1 and less than or equal to Q[L−1]) is input to the s[L]-th neuron in the L-th layer.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other, in functions of the hierarchical neural network.

Figure 21:
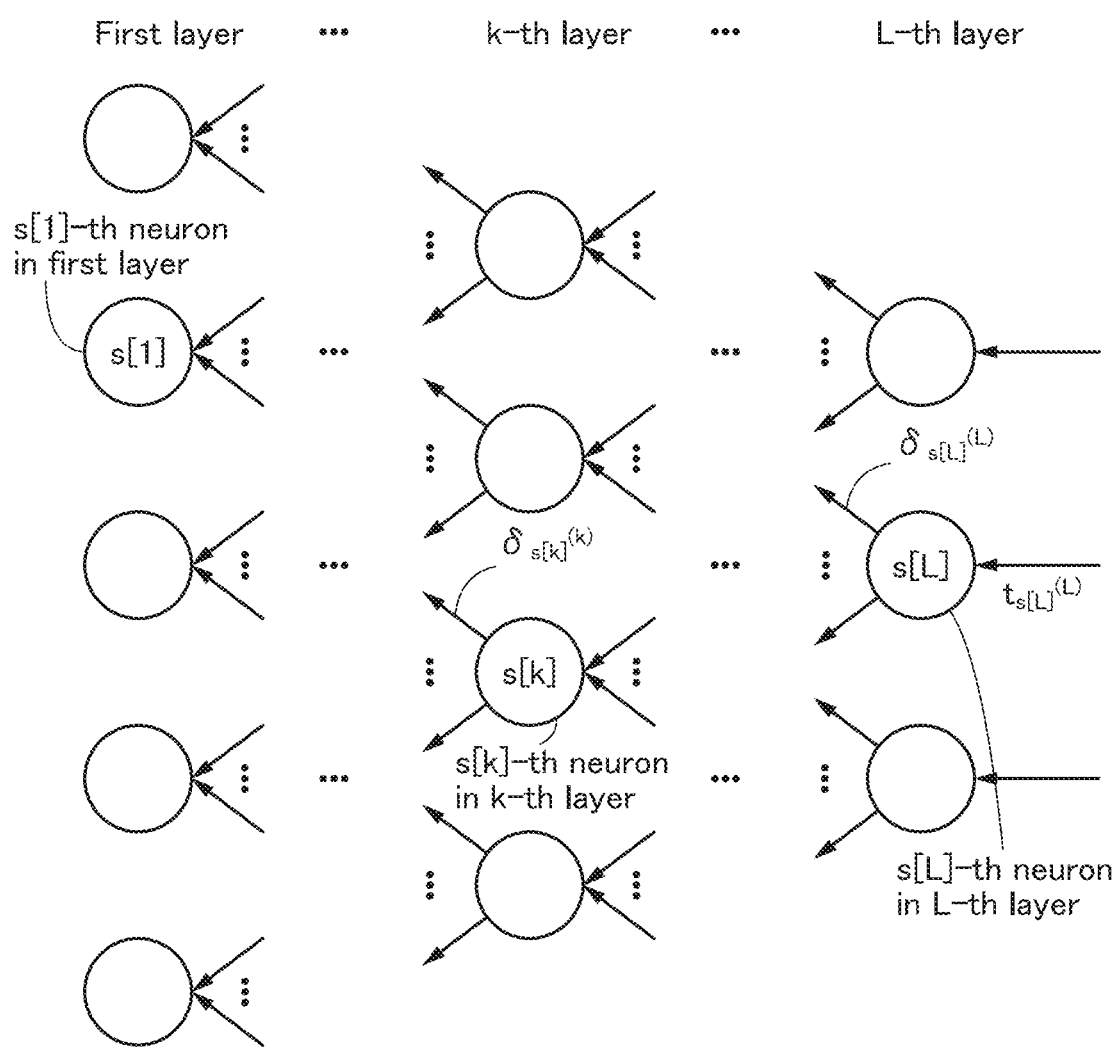
FIG. 21 illustrates an example of a hierarchical artificial neural network.

A learning method using backpropagation will be described as a specific example of supervised learning. FIG. 21 is a diagram illustrating a learning method using backpropagation. Backpropagation is a method for changing a weight coefficient so that an error between an output of a hierarchical neural network and teacher data becomes small.

For example, assume that input data is input to the s[1]-th neuron in the first layer and output data $z_{s[L]}^{(L)}$ is output from the s[L]-th neuron in the L-th layer. Here, error energy E can be expressed using output data $z_{s[L]}^{(L)}$ and a teacher signal $t_{s[L]}^{(L)}$, when a teacher signal for the output data $z_{s[L]}^{(L)}$ is $t_{s[L]}^{(L)}$.

The update amount of a weight coefficient $w_{s[k]s[k-1]}^{(k)}$ of the s[k]-th neuron in the k-th layer with respect to the error energy E is set to $\partial E/\partial w_{s[k]s[k-1]}^{(k)}$, whereby the weight coefficient can be updated. Here, when an error $\delta_{s[k]}^{(k)}$ of the output value $z_{s[k]}^{(k)}$ of the s[k]-th neuron in the k-th layer is defined as $\partial E/\partial u_{s[k]}^{(k)}$, $\delta_{s[k]}^{(k)}$ and $\partial E/\partial w_{s[k]s[k-1]}^{(k)}$ can be expressed by the following respective formulae.

[Formula 5]

$$\delta_{s[k]}^{(k)} = \sum_{s[k+1]} \delta_{s[k+1]}^{(k+1)} \cdot w_{s[k+1]s[k]}^{(k+1)} \cdot f'\left(u_{s[k]}^{(k)}\right) \quad (D3)$$

[Formula 6]

$$\frac{\partial E}{\partial w_{s[k]s[k-1]}^{(k)}} = \delta_{s[k]}^{(k)} \cdot z_{s[k-1]}^{(k-1)} \quad (D4)$$

Figure 22B:
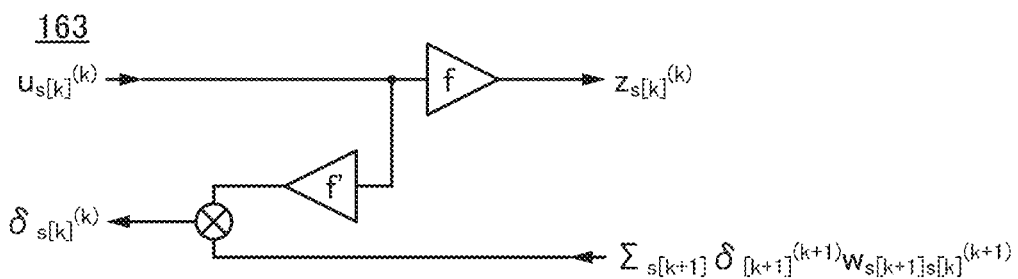
Figure 22C:
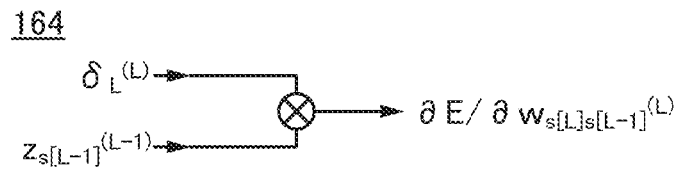

A function $f'(u_{s[k]}^{(k)})$ is the derivative of an activation function. Formula 5 (D3) can be calculated with a circuit 163 illustrated in FIG. 22B, for example. Formula 6 (D4) can be calculated with a circuit 164 illustrated in FIG. 22C, for example. The derived function of the activation function can be obtained by connecting an arithmetic circuit, which can execute a desired derived function, to an output terminal of an operational amplifier.

For example, $\Sigma \delta_{s[k+1]}^{(k+1)} \cdot w_{s[k+1] \cdot s[k]}^{(k+1)}$ in Formula 5 (D3) can be calculated with the product-sum operation circuit 700 to be described later.

Here, when the (k+1)-th layer is an output layer, or the L-th layer, $\delta_{s[L]}^{(L)}$ and $\partial E/\partial w_{s[L]s[L-1]}^{(L)}$ can be expressed by the following respective formulae.

[Formula 7]

$$\delta_{s[L]}^{(L)} = (z_{s[L]}^{(L)} - t_{s[L]}) \cdot f'(u_{s[L]}^{(L)}) \quad (D5)$$

[Formula 8]

$$\frac{\partial E}{\partial w_{s[L]s[L-1]}^{(L)}} = \delta_{s[L]}^{(L)} \cdot z_{s[L-1]}^{(L-1)} \quad (D6)$$

Figure 22D:
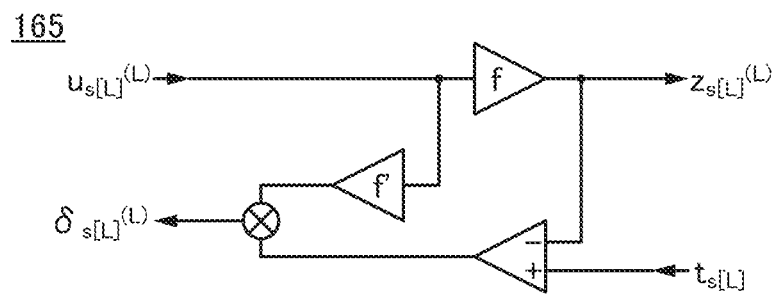

Formula 7 (D5) can be calculated with a circuit 165 illustrated in FIG. 22D. Formula 8 (D6) can be calculated with the circuit 164 illustrated in FIG. 22C.

That is to say, the errors $\delta_{s[k]}^{(k)}$ and $\delta_{s[L]}^{(L)}$ of all neuron circuits can be calculated by Formula 3 (D1) to Formula 8 (D6). Note that the update amounts of weight coefficients are set on the basis of the errors $\delta_{s[k]}^{(k)}$ and $\delta_{s[L]}^{(L)}$, predetermined parameters, and the like.

As described above, by using the circuits illustrated in FIGS. 22A to 22D and the product-sum operation circuit 700 to be described later, calculation of the hierarchical neural network using supervised learning can be performed.

<Circuit Configuration Example of Hierarchical Neural Network>

Figure 23:
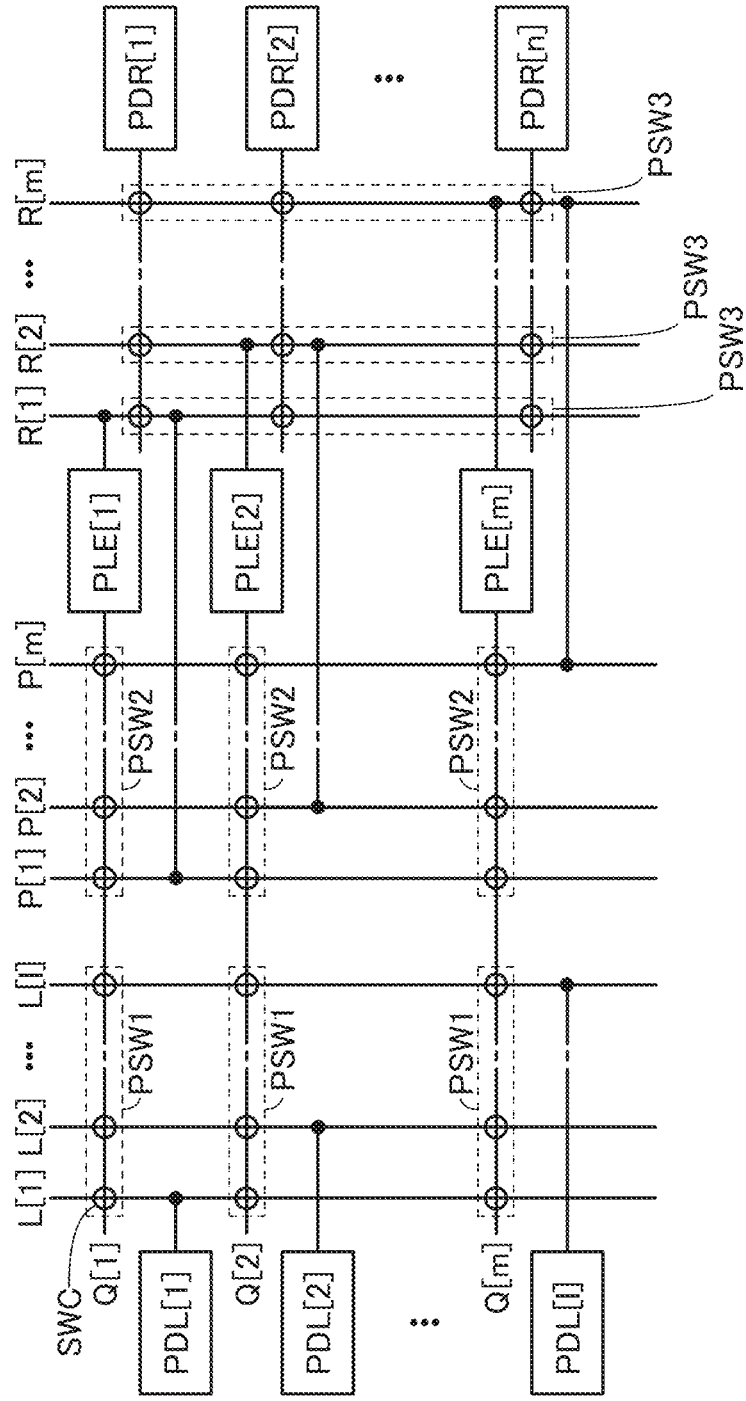
FIG. 23 is a block diagram illustrating a circuit configuration example.

FIG. 23 is a block diagram illustrating a circuit configuration example of a hierarchical neural network.

A neural network (NN) circuit 100 includes input terminals PDL[1] to PDL[l] (here, l is an integer greater than or equal to 1), output terminals PDR[1] to PDR[n] (here, n is an integer greater than or equal to 1), programmable logic elements PLE[1] to PLE[m], wirings L[1] to L[l], wirings P[1] to P[m], wirings R[1] to R[m], wirings Q[1] to Q[m], a plurality of programmable switches PSW1, a plurality of programmable switches PSW2, and a plurality of programmable switches PSW3.

Note that FIG. 23 illustrates only the input terminal PDL[1], the input terminal PDL[2], the input terminal PDL[l], the output terminal PDR[1], the output terminal PDR[2], the output terminal PDR[n], the programmable logic element PLE[1], the programmable logic element PLE[2], the programmable logic element PLE[m], the wiring L[1], the wiring L[2], the wiring L[l], the wiring P[1], the wiring P[2], the wiring P[m], the wiring R[1], the wiring R[2], the wiring R[m], the wiring Q[1], the wiring Q[2], the wiring Q[m], the programmable switches PSW1 to PSW3, and later-described switch circuits SWC in the NN circuit 100, and the other circuits, elements, wirings, and reference numerals thereof are not shown.

The NN circuit 100 is a multi-context programmable arithmetic processing device including the programmable logic elements PLE[1] to PLE[m] and the programmable switches PSW1 to PSW3. As specifically described later, the arithmetic processing device includes a hierarchical artificial neural network in which each network connection between layers corresponds to a context, and can perform artificial neural network arithmetic processing by sequentially changing contexts.

The input terminal PDL[i] (here, i is an integer greater than or equal to 1 and less than or equal to 1) is electrically connected to the wiring L[i]. The output terminal PDR[k] (here, k is an integer greater than or equal to 1 and less than or equal to n) is electrically connected to each of the wirings R[1] to R[m] through the programmable switch PSW3. A first terminal of the programmable logic element PLE[j] (here, j is an integer greater than or equal to 1 and less than or equal to m) is electrically connected to the wiring Q[j], and the wiring Q[j] is electrically connected to each of the wirings L[1] to L[l] through the programmable switch PSW1. The wiring Q[j] is also electrically connected to each of the wirings P[1] to P[m] through the programmable switches PSW2. A second terminal of the programmable logic element PLE[j] is electrically connected to the wiring R[j]. The wirings P[1] to P[m] are electrically connected to the wirings R[1] to R[m], respectively.

Each of the programmable switches PSW1 to PSW3 included in the NN circuit 100 can be turned on or off, depending on configuration data stored in a configuration memory CMS to be described later. Note that each of the programmable switches PSW1 to PSW3 includes the switch circuits SWC. The details of the program switches PSW1 to PSW3 will be described later.

Figure 24A:
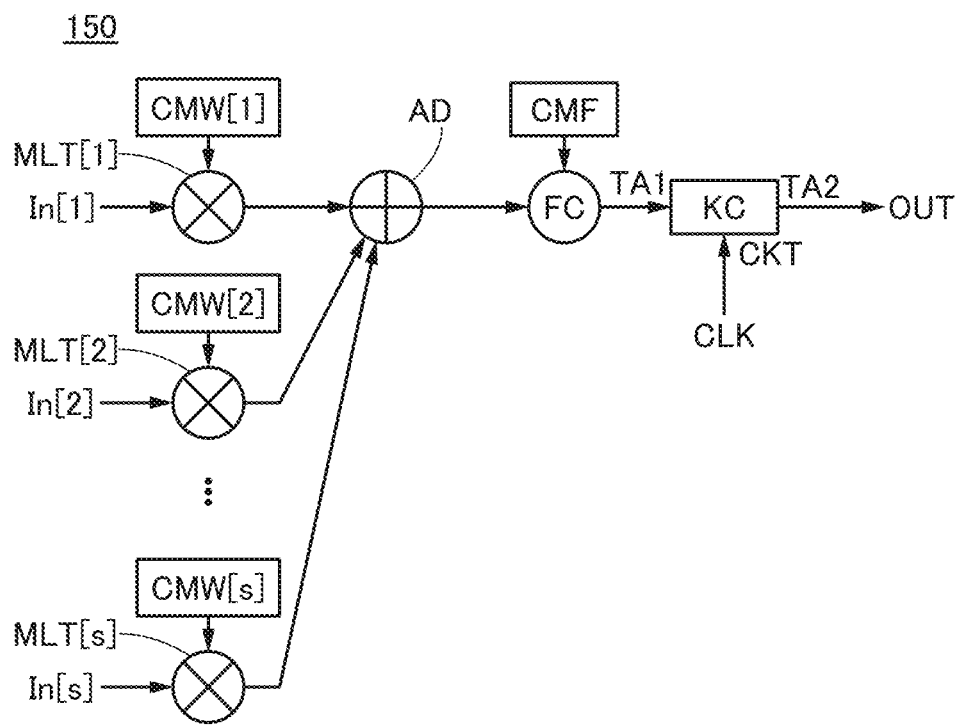
FIGS. 24A and 24B are block diagrams illustrating a configuration example of a product-sum operation circuit.

Each of the programmable logic elements PLE includes an arithmetic processing circuit illustrated in FIG. 24A. An arithmetic processing circuit 150 includes input terminals In[1] to In[s] (here, s is an integer greater than or equal to 1), an output terminal OUT, multiplier circuits MLT[1] to MLT[s], an adder circuit AD, an activation function circuit FC, a retention circuit KC, configuration memories CMW[1] to CMW[s], and a configuration memory CMF. Note that the configuration memories CMW[1] to CMW[s] may be one configuration memory. The configuration memories CMW[1] to CMW[s] and the configuration memory CMF may be one configuration memory.

The input terminal In[h] (here, h is an integer greater than or equal to 1 and less than or equal to s) is electrically connected to an input terminal of the multiplier circuit MLT[h], and an output terminal of the multiplier circuit MLT[h] is electrically connected to an input terminal of the adder circuit AD. An output terminal of the adder circuit AD is electrically connected to an input terminal of the activation function circuit FC. An output terminal of the activation function circuit FC is electrically connected to a terminal TA1 of the retention circuit KC. A terminal TA2 of the retention circuit KC is electrically connected to the output terminal OUT.

The multiplier circuit MLT[h] performs multiplication using data retained in the configuration memory CMW[h] (such data is hereinafter referred to as a weight coefficient) as a multiplier and an input signal input to the input terminal In[h] as a multiplicand. The adder circuit AD calculates the sum of multiplication results output from the multiplier circuits MLT[1] to MLT[s]. In other words, the multiplier circuits MLT[1] to MLT[s] and the adder circuit AD constitute a product-sum operation circuit.

The activation function circuit FC performs an operation on a signal input through the input terminal, i.e., the result of the product-sum operation, using a function system defined by data retained in the configuration memory CMF. For example, a sigmoid function, a tan h function, a softmax function, a ReLU function, a threshold function, or the like can be used as the function system.

The retention circuit KC has a function of obtaining an operation result output from the activation function circuit FC through the terminal TA1 and temporarily retaining the operation result and a function of outputting the temporarily retained operation result to the terminal TA2. In addition, the retention circuit KC can switch the above-described two functions in accordance with a clock signal CLK input through a terminal CKT.

For example, the retention circuit KC can hold a potential input through the terminal TA1 when the clock signal CLK has a high-level potential, and the retention circuit KC can output the potential to the output terminal OUT through the terminal TA2 when the clock signal CLK has a low-level potential.

In the case where the arithmetic processing circuit 150 is configured to handle digital data, a flip-flop circuit can be used as the retention circuit KC, for example.

Figure 24B:
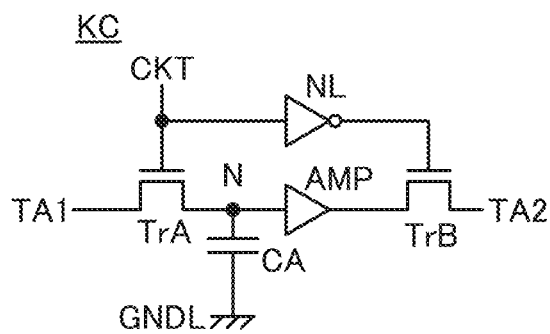

In the case where the arithmetic processing circuit 150 is configured to handle analog data, a retention circuit KC illustrated in FIG. 24B can be used, for example. The retention circuit KC illustrated in FIG. 24B is a sample-and-hold circuit including a transistor TrA, a transistor TrB, a capacitor CA, an amplifier AMP, and a NOT circuit NL.

A first terminal of the transistor TrA is electrically connected to the terminal TA1, a second terminal of the transistor TrA is electrically connected to a first terminal of the capacitor CA, and a gate of the transistor TrA is electrically connected to the terminal CKT. An input terminal of the amplifier AMP is electrically connected to the second terminal of the transistor TrA, and an output terminal of the amplifier AMP is electrically connected to a first terminal of the transistor TrB. A second terminal of the transistor TrB is electrically connected to the terminal TA2. An input terminal of the NOT circuit NL is electrically connected to the terminal CKT, and an output terminal of the NOT circuit NL is electrically connected to a gate of the transistor TrB. A second terminal of the capacitor CA is electrically connected to a wiring GNDL. Note that a connection point of the second terminal of the transistor TrA, the input terminal of the amplifier AMP, and the first terminal of the capacitor CA is referred to as a node N.

The amplifier AMP has a function of amplifying a signal input through the input terminal by a factor of 1 and outputting the amplified signal to the output terminal.

The wiring GNDL is used for supplying reference potential.

When the clock signal CLK input through the terminal CKT has a high-level potential, the transistor TrA is turned on and the transistor TrB is turned off. In that case, a signal input through the terminal TA1 is input to the amplifier AMP through the transistor TrA. Then, the amplifier AMP amplifies the signal and outputs the amplified signal through the output terminal of the amplifier AMP. Note that the amplified signal is not output through the terminal TA2 because the transistor TrB is turned off.

The potential of the node N is held by the capacitor CA. The potential of the node N in this case is equal to the potential of the signal input from the terminal TA1.

When the clock signal CLK input through the terminal CKT has a low-level potential, the transistor TrA is turned off and the transistor TrB is turned on. The potential of the node N does not change because the transistor TrA is turned off. The amplifier AMP outputs the potential of the node N to the first terminal of the transistor TrB. Since the transistor TrB is turned on, the potential of the node N, i.e., the potential of the signal input through the terminal TA1 when the clock signal CLK has a high-level potential is output through the terminal TA2.

It is preferable that the transistor TrA and the transistor TrB be OS transistors or that the transistor TrA or the transistor TrB be an OS transistor, which will be described in Embodiment 9. It is particularly preferable to use an OS transistor that includes an oxide containing at least one of indium, an element M (the element M is aluminum, gallium, yttrium, or tin), and zinc in a channel formation region, in which case the off-state current of the transistor(s) can be extremely low. Thus, the influence of charge leakage due to the off-state current of a transistor can be reduced.

Note that FIG. 24A illustrates only the input terminal In[1], the input terminal In[2], the input terminal In[s], the multiplier circuit MLT[1], the multiplier circuit MLT[2], the multiplier circuit MLT[s], the configuration memory CMW[1], the configuration memory CMW[2], the configuration memory CMW[s], the configuration memory CMF, the adder circuit AD, the activation function circuit FC, the retention circuit KC, the terminal TA1, the terminal TA2, the terminal CKT, the output terminal OUT, and the clock signal CLK, and the other circuits, elements, wirings, and reference numerals thereof are not shown.

Note that the configuration of the retention circuit KC of the arithmetic processing circuit 150 included in the semiconductor device of one embodiment of the present invention is not limited to the one described above. Depending on circumstances or conditions, the configuration of the retention circuit KC can be changed as appropriate.

Note that data writing to the configuration memories CMW[1] to CMW[s] and the configuration memory CMF included in the arithmetic processing circuit 150 and data writing to the later-described configuration memory CMS which sets the states of the programmable switches PSW1 to PSW3 may be performed by different driver circuits. In other words, it is possible to repeatedly update data in the configuration memories CMW[1] to CMW[s] and the configuration memory CMF in the arithmetic processing circuit 150 without updating data in the configuration memory CMS for the programmable switches PSW1 to PSW3. This enables efficient learning in an artificial neural network.

In addition, in the case where a multi-context system which includes a plurality of sets of configuration memories is used and a weight coefficient of the product-sum operation in each layer of the artificial neural network corresponds to configuration data of each context, it is possible to sequentially perform the product-sum operation in each layer with few circuit resources by changing contexts.

Although each programmable logic element includes the individual arithmetic processing circuit 150 in the above description, a plurality of programmable logic elements and a programmable switch connecting the programmable logic elements may constitute one product-sum operation circuit.

Figure 25A:
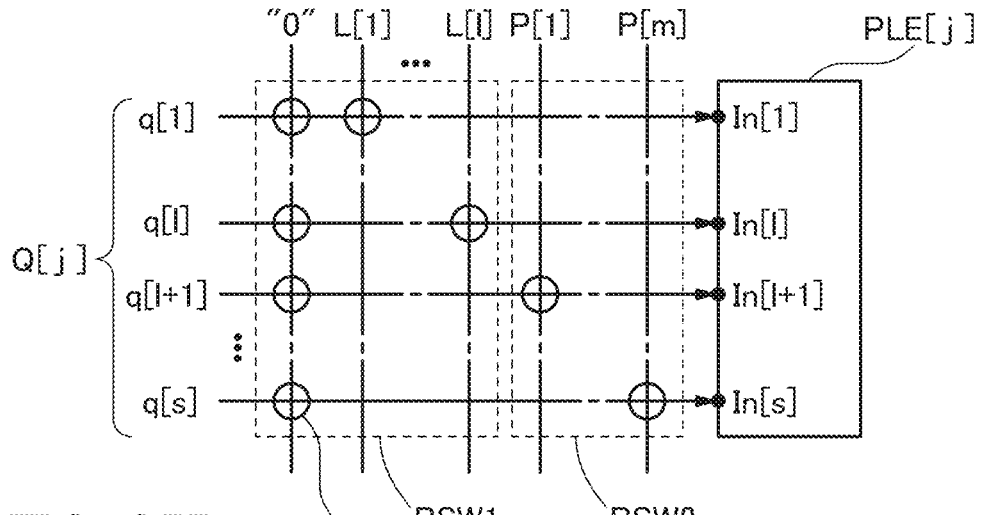
FIGS. 25A to 25C are block diagrams and a circuit diagram illustrating programmable switches.
Figure 25B:
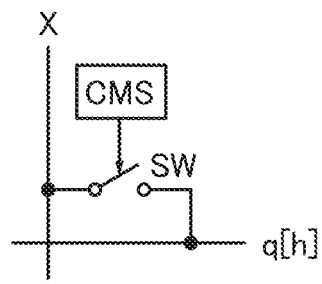

Next, the configurations of the programmable switches PSW1 to PSW3 will be described. FIG. 25A illustrates an example of connections of the wirings L[1] to L[l], the wirings P[1] to P[m], the wiring Q[j], the programmable switch PSW1, the programmable switch PSW2, and the programmable logic element PLE[j] in the NN circuit 100, and FIG. 25B illustrates a configuration example of the switch circuit SWC.

Note that the wiring Q[j] in FIG. 25A includes wirings q[1] to q[s]. In addition, the first terminal of the programmable logic element PLE[j] in FIG. 25A corresponds to the terminals In[1] to In[s] of the arithmetic processing circuit 150 described with FIG. 24A. That is, the wiring q[h] is electrically connected to the terminal In[h] in FIG. 25A.

In FIG. 25A, the wirings q[1] to q[s] are electrically connected to a wiring "0" through the programmable switch PSW1. The wiring "0" is used to supply a signal having a value 0 (the potential of the signal is a reference potential).

In the configuration example illustrated in FIG. 25A, the programmable switches PSW1 and PSW2 include the switch circuits SWC. The configuration example of the switch circuit SWC is illustrated in FIG. 25B. A first terminal of a switch SW is electrically connected to the wiring q[h], and a second terminal of the switch SW is electrically connected to a wiring X. Note that the wiring X is any one of the wirings "0", L[1] to L[l], and P[1] to P[m]. Whether the switch SW is turned on or off is determined by data retained by the configuration memory CMS.

In other words, each of the programmable switches PSW1 and PSW2 illustrated in FIG. 25A is turned on or off depending on the data in the configuration memory CMS. That is, whether each of the terminals In[1] to In[s] is connected to or disconnected from the wirings "0", L[1] to L[l], and P[1] to P[m] can be controlled by the data in the configuration memories CMS.

In the case where no signal is input to at least one of the terminals In[1] to In[s], the switch circuit SWC connecting that terminal and the wiring "0" is turned on. In that case, the power consumption of the multiplier circuit corresponding to that terminal can be reduced by power gating.

As the switch SW illustrated in FIG. 25B, a transistor, a diode, or a switch formed using a MEMS (microelectromechanical system) technology, such as a digital micromirror device (DMD), can be used, for example. Alternatively, the switch SW may be a logic circuit in which transistors are combined. In the case where one transistor is used as the switch SW, an OS transistor characterized by extremely low off-state current is preferably used.

Figure 25C:
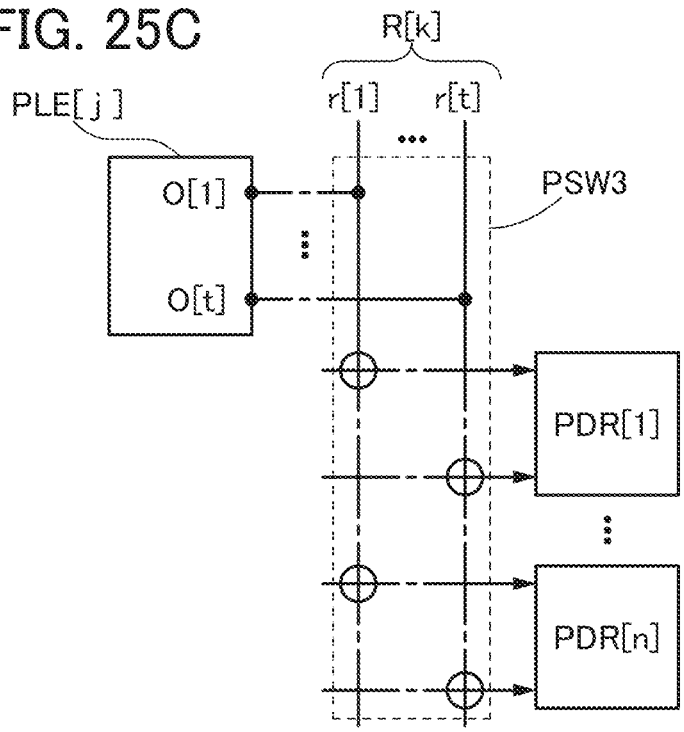

FIG. 25C illustrates an example of connections of the wiring R[k], the programmable switch PSW3, the programmable logic element PLE[j], and the output terminals PDR[1] to PDR[n] in the NN circuit 100.

Note that the wiring R[k] in FIG. 25C includes wirings r[1] to r[t] (here, t is an integer greater than or equal to 1). In addition, the second terminal of the programmable logic element PLE[j] is illustrated in FIG. 25C as terminals O[1] to O[t]. That is, the wiring r[u] (here, u is an integer greater than or equal to 1 and less than or equal to t) is electrically connected to the terminal O[u] in FIG. 25C. Note that the plurality of second terminals illustrated in FIG. 25C may be a single terminal. In that case, the wirings r[1] to r[t] can be a single wiring.

In the configuration example illustrated in FIG. 25C, the programmable switch PSW3 includes the switch circuits SWC. That is, as in the programmable switches PSW1 and PSW2, whether the switch SW included in the switch circuit SWC is turned on or off can be determined by data retained in the configuration memory CMS. Thus, whether each of the terminals O[1] to O[t] is connected to or disconnected from the output terminals PDR[1] to PDR[n] can be controlled by the data in the configuration memories CMS.

An SRAM, an MRAM, or the like, for example, can be used as the above-described configuration memories CMS, CMW[1] to CMW[s], and CMF. Alternatively, a memory device including an OS transistor (such a memory device is referred to as an OS memory in this specification) can be used. In particular, when an OS memory is used as each of the above-described configuration memories, an artificial neural network with low power consumption can be formed with a small number of elements.

When an analog product-sum operation circuit is used as each of the multiplier circuits MLT[1] to MLT[s] and the adder circuit AD described above, the number of transistors included in the product-sum operation circuit can be reduced. Note that the analog product-sum operation circuit will be described later in this embodiment.

<Example of Operation Method>

Next, an example of an operation method of the NN circuit 100 will be described with reference to FIGS. 26 to 28.

Note that the number of contexts for the NN circuit 100 is N in this operation method example. That is, each of the configuration memories CMS, CMW[1] to CMW[s], and CMF included in the NN circuit 100 contains N sets of configuration data.

The artificial neural network described in this operation method example is a hierarchical artificial neural network including an input layer and first to (N−1)-th intermediate layers. In particular, the (N−1)-th intermediate layer is an output layer of the hierarchical artificial neural network.

Figure 26:
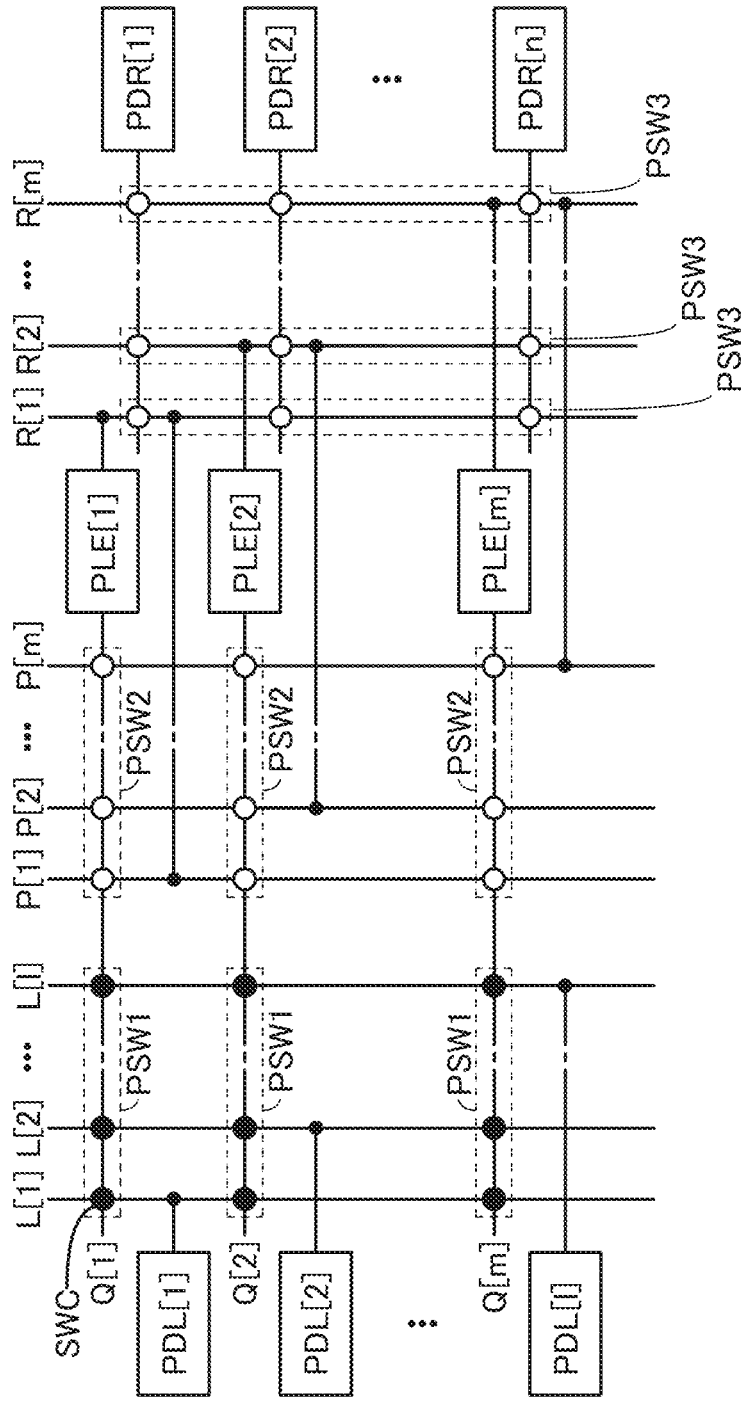
FIG. 26 is a block diagram illustrating a circuit configuration example.
Figure 27:
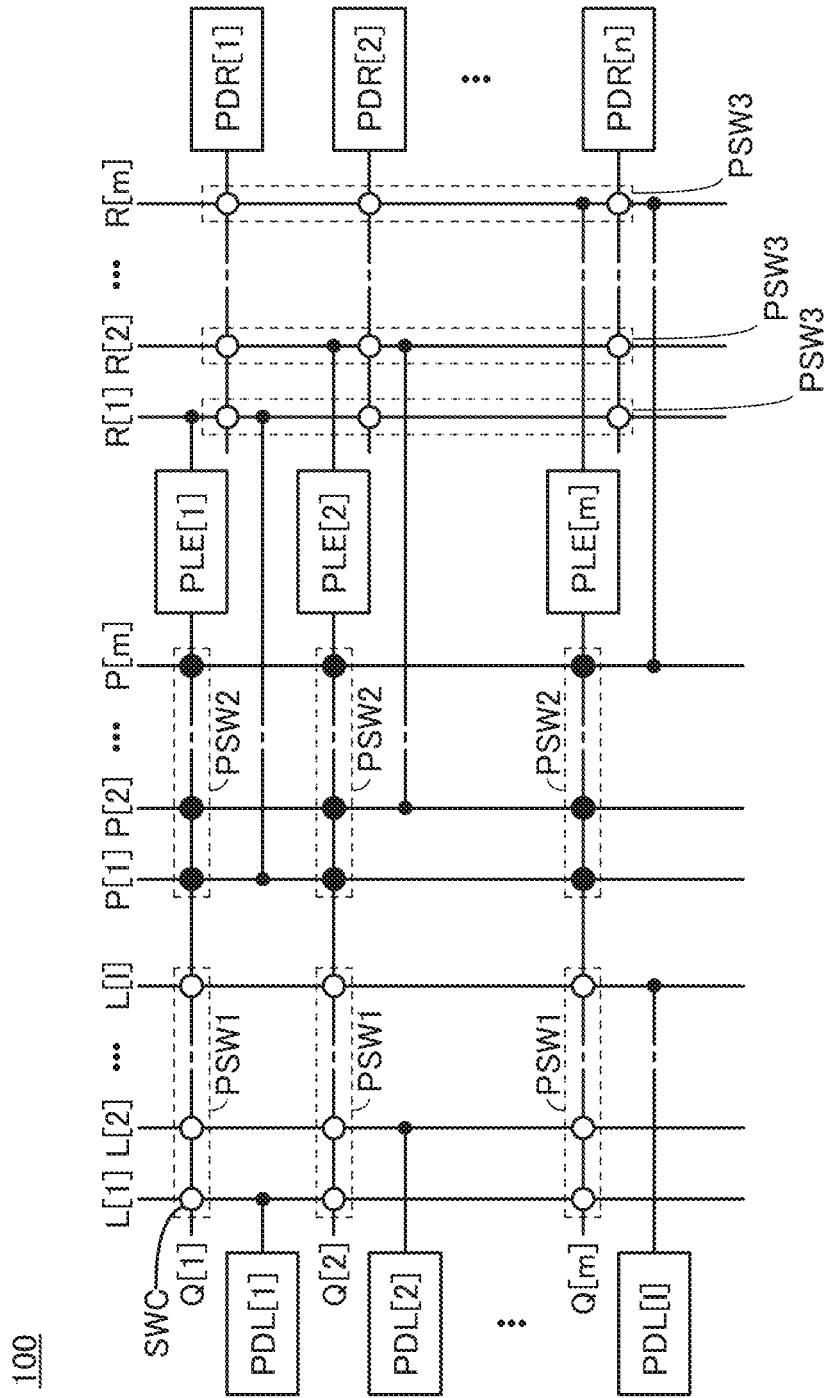
FIG. 27 is a block diagram illustrating a circuit configuration example.
Figure 28:
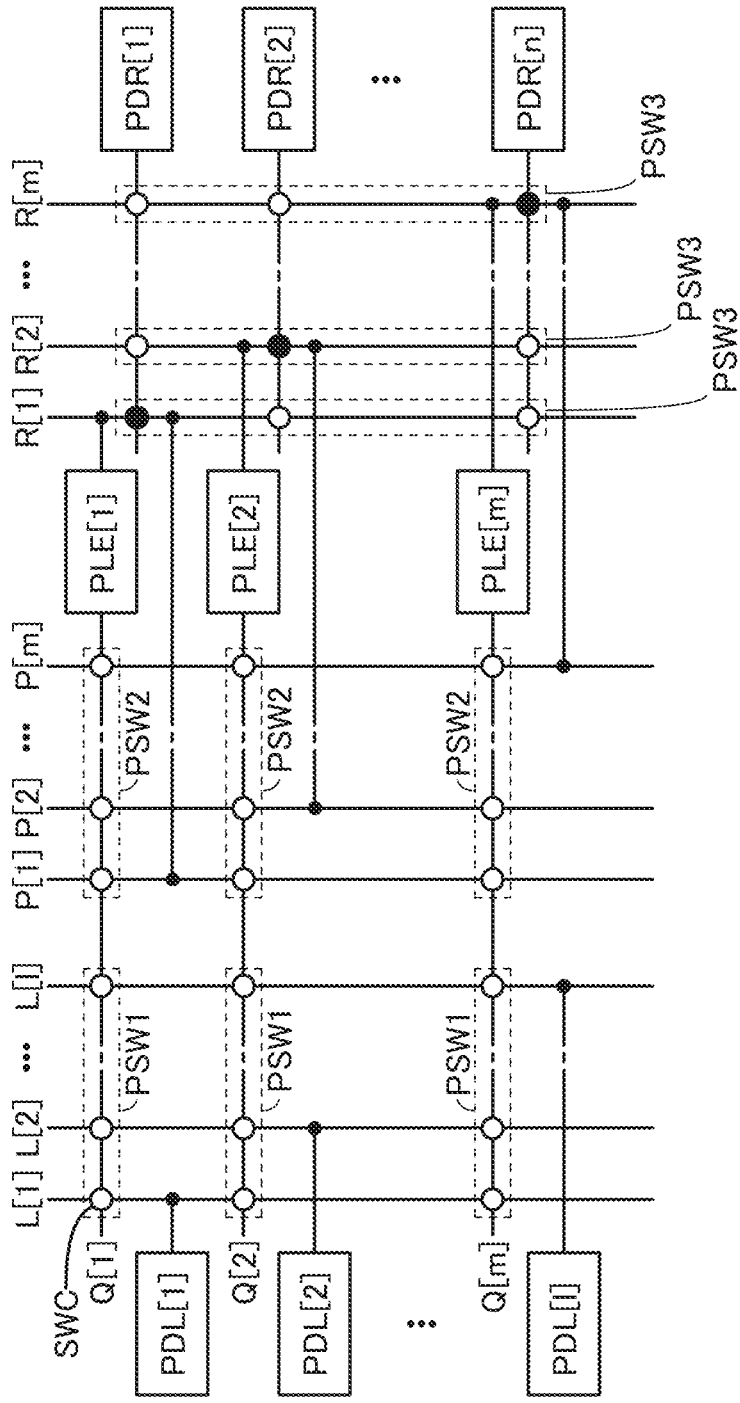
FIG. 28 is a block diagram illustrating a circuit configuration example.

In FIGS. 26 to 28, the switch circuit SWC which is turned on is indicated by a black circle, and the switch circuit SWC which is turned off is indicated by a white circle.

For the configuration of the wirings Q[1] to Q[m], the wirings R[1] to R[m], and the programmable switches PSW1 to PSW3, the description of FIGS. 25A to 25C can be referred to.

First, a context 1 is selected. The context 1 is a configuration corresponding to a network between the input layer and the first intermediate layer. The NN circuit 100 corresponding to the context 1 is illustrated in FIG. 26.

At that time, configuration data for the programmable switches PSW1 to PSW3 are set so that the programmable logic elements PLE[1] to PLE[m] are electrically connected to the wirings L[1] to L[l]. In addition, configuration data for the programmable logic elements PLE[1] to PLE[m] are set so that a weight coefficient for each neuron of the first intermediate layer with respect to an output signal of the neuron of the input layer is set in each of the programmable logic elements PLE[1] to PLE[m].

Signals input from the input layer to the first intermediate layer correspond to signals input from the input terminals PDL[1] to PDL[l]. A signal input from the input terminal PDL[i] is transmitted to each of the wirings Q[1] to Q[m] through the wiring L[i]. The signal transmitted to the wiring Q[j] is input to the first terminal of the programmable logic element PLE[j].

The plurality of signals input to the first terminals of the programmable logic elements PLE[1] to PLE[m] are subjected to arithmetic processing by the product-sum operation circuit and the activation function circuit of each programmable logic element. Specifically, product-sum operation using the plurality of signals and respective weight coefficients corresponding to the signals and activation function operation using the result of the product-sum operation as input information are performed. Note that the weight coefficient and the activation function are based on the configuration of the context 1, as described above.

The output result of the activation function operation is retained by the retention circuit KC illustrated in FIGS. 24A and 24B. Note that the data retention by the retention circuit KC is performed when the potential of the clock signal CLK changes from a low-level potential to a high-level potential. The data retained by the retention circuit KC is output when the potential of the clock signal CLK changes from the high-level potential to the low-level potential.

Next, a context 2 is selected. The context 2 is a configuration corresponding to a network between the first intermediate layer and the second intermediate layer. The NN circuit 100 corresponding to the context 2 is illustrated in FIG. 27.

At that time, configuration data for the programmable switches PSW1 to PSW3 are set so that the programmable logic elements PLE[1] to PLE[m] are electrically connected to the wirings P[1] to P[m]. In addition, configuration data for the programmable logic elements PLE[1] to PLE[m] are set so that a weight coefficient for each neuron of the second intermediate layer with respect to an output signal of the neuron of the first intermediate layer is set in each of the programmable logic elements PLE[1] to PLE[m].

In that configuration, data output from the second terminals of the programmable logic elements PLE[1] to PLE[m] are the above-described data stored in the retention circuits KC, i.e., the results of the activation function operation based on the context 1. The results are output from the second terminals of the programmable logic elements PLE[1] to PLE[m] when the potential of the clock signal CLK for the retention circuit KC changes from the high-level potential to the low-level potential. The result output from the second terminal of the programmable logic element PLE[j] is transmitted to each of the wirings Q[1] to Q[m] through the wiring P[j]. The signal transmitted to the wiring Q[j] is input to the first terminal of the programmable logic element PLE[j].

That is, the signals input from the first intermediate layer to the second intermediate layer correspond to the signals output from the second terminals of the programmable logic elements PLE[1] to PLE[m].

The plurality of signals input to the first terminals of the programmable logic elements PLE[1] to PLE[m] are subjected to arithmetic processing by the product-sum operation circuit and the activation function circuit of each programmable logic element. Specifically, product-sum operation using the plurality of signals and respective weight coefficients corresponding to the signals and activation function operation using the result of the product-sum operation as input information are performed. Note that the weight coefficient and the activation function are based on the configuration of the context 2, as described above.

The output result of the activation function operation is retained by the retention circuit KC illustrated in FIGS. 24A and 24B, as in the operation based on the context 1.

Subsequent steps of the operation of the NN circuit 100 are performed in a manner similar to that based on the context 2. For example, the case where a context g (here, g is an integer greater than or equal to 3 and less than or equal to (N−1)) is selected is considered. The context g is a configuration corresponding to a network between the (g−1)-th intermediate layer and the g-th intermediate layer. Note that the description of FIG. 27 can be referred to for connections in the NN circuit 100 corresponding to the context g.

At that time, configuration data for the programmable switches PSW1 to PSW3 are set so that the programmable logic elements PLE[1] to PLE[m] are electrically connected to the wirings P[1] to P[m]. In addition, configuration data for the programmable logic elements PLE[1] to PLE[m] are set so that a weight coefficient for each neuron of the g-th intermediate layer with respect to an output signal of a neuron of the (g−1)-th intermediate layer is set in each of the programmable logic elements PLE[1] to PLE[m].

In that configuration, data output from the second terminals of the programmable logic elements PLE[1] to PLE[m] are the above-described data stored in the retention circuits KC, i.e., the results of the activation function operation based on the context g−1. The results are output from the second terminals of the programmable logic elements PLE[1] to PLE[m] when the potential of the clock signal CLK for the retention circuit KC changes from the high-level potential to the low-level potential. The result output from the second terminal of the programmable logic element PLE[j] is transmitted to each of the wirings Q[1] to Q[m] through the wiring P[j]. The signal transmitted to the wiring Q[j] is input to the first terminal of the programmable logic element PLE[j].

That is, the signals input from the (g−1)-th intermediate layer to the g-th intermediate layer correspond to the signals output from the second terminals of the programmable logic elements PLE[1] to PLE[m].

The plurality of signals input to the first terminals of the programmable logic element PLE[1] to PLE[m] are subjected to arithmetic processing by the product-sum operation circuit and the activation function circuit of each programmable logic element. Specifically, product-sum operation using the plurality of signals and respective weight coefficients corresponding to the signals and activation function operation using the result of the product-sum operation as input information are performed. Note that the weight coefficient and the activation function are based on the configuration of the context g, as described above.

The output result of the activation function operation is retained by the retention circuit KC illustrated in FIGS. 24A and 24B, as in the operations based on the contexts 1 and 2.

Lastly, a context N is selected. The context N is a configuration corresponding to connections between the (N−1)-th intermediate layer (output layer) and the output terminals PDR[1] to PDR[n]. The NN circuit 100 corresponding to the context N is illustrated in FIG. 28.

At that time, configuration data for the programmable switches PSW1 to PSW3 are set so that the programmable logic elements PLE[1] to PLE[m] are electrically connected to the wirings R[1] to R[m].

In that configuration, data output from the second terminals of the programmable logic elements PLE[1] to PLE[m] are the above-described data stored in the retention circuits KC, i.e., the results of the activation function operation based on the context (N−1). The results are output from the second terminals of the programmable logic elements PLE[1] to PLE[m] when the potential of the clock signal CLK for the retention circuit KC changes from the high-level potential to the low-level potential. The results output from the second terminals of the programmable logic elements PLE[1] to PLE[m] are transmitted to the output terminals PDR[1] to PDR[n] through the wirings R[1] to R[m]. Note that the output terminal PDR[n] is the output terminal PDR[m].

That is, the output results of the hierarchical artificial neural network which are output from the (N−1)-th intermediate layer (output layer) correspond to the signals output from the second terminals of the programmable logic elements PLE[1] to PLE[m].

Note that the power consumption of the programmable logic elements that are not used as neurons in the input layer and the first to (N−1)-th intermediate layers can be reduced by the above-described power gating.

In the arithmetic processing circuit 150 in FIGS. 24A and 24B, the weight coefficient can be updated by learning. An effective configuration in that case is that which generates configuration data corresponding to a context for a desired artificial neural network configuration and repeatedly changes only configuration data on weight coefficients for the corresponding context. Note that the weight coefficient updating can be achieved with a dedicated circuit for executing the corresponding arithmetic processing.

The arithmetic processing circuit 150 in FIGS. 24A and 24B can be configured such that the corresponding arithmetic processing is executed on a server. For example, a possible neural network configuration is as follows. Examination and learning of a hierarchical configuration of an artificial neural network are performed on a server to generate configuration data for a context corresponding to the optimized hierarchical structure and weight coefficients which are acquired by learning. The configuration data is transmitted to the arithmetic processing circuit 150 included in an electronic device other than the server, and inference (recognition) is executed in the electronic device while the contexts for the arithmetic processing circuit 150 in FIGS. 24A and 24B are changed.

With the above-described configuration of the NN circuit 100, an artificial neural network arithmetic processing circuit which can be used for learning and inference can be obtained. In addition, a multi-context programmable neural network with a reduced circuit area owing to reductions in the numbers of elements and wirings can be provided.

Figure 29:
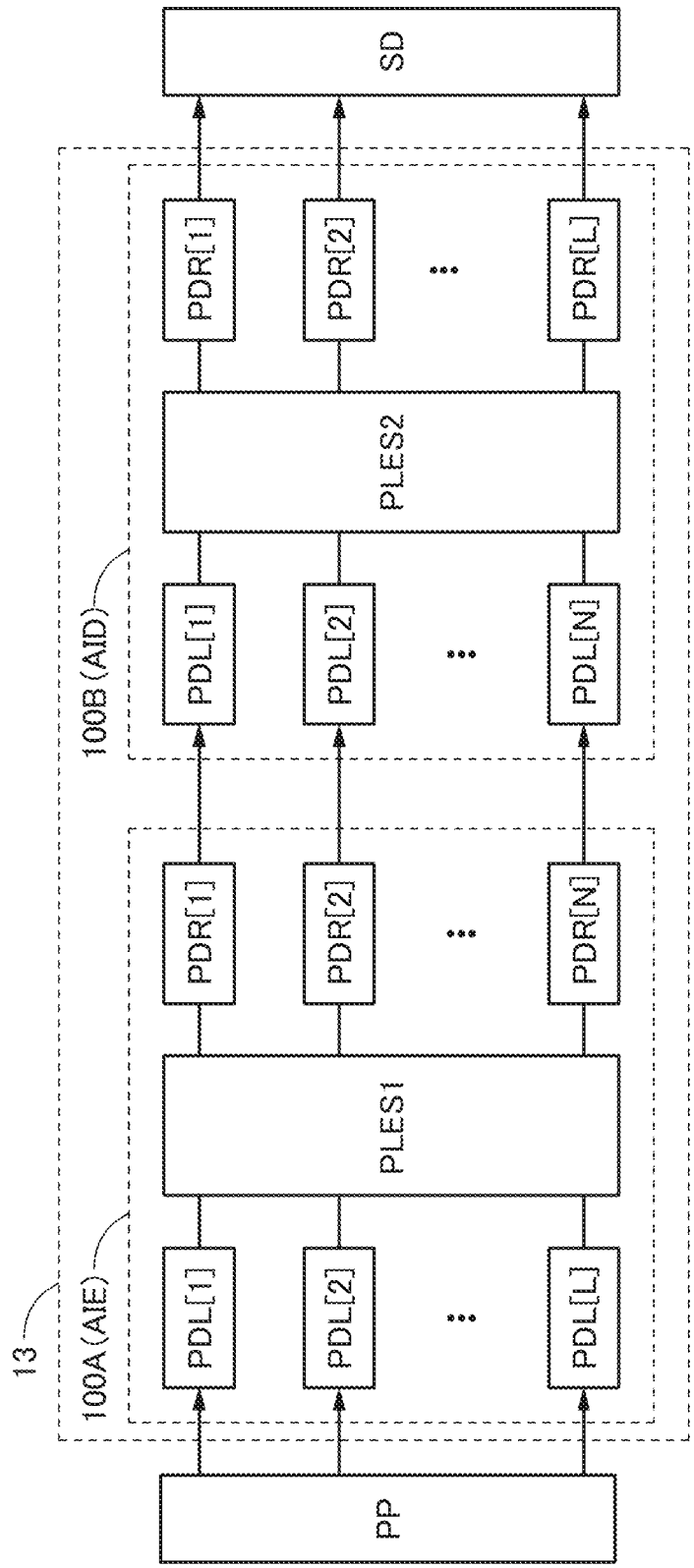
FIG. 29 is a block diagram illustrating a configuration example of an autoencoder.

Here, the case where the NN circuit 100 is used as each of the AI encoder AIE and the AI decoder AID of the autoencoder 13 described in Embodiment 1 will be considered. FIG. 29 illustrates a configuration example of the autoencoder 13 in which an NN circuit 100A is used as the NN circuit 100 for the AI encoder AIE and an NN circuit 100B is used as the NN circuit 100 for the AI decoder AID. In FIG. 29, the NN circuit 100A and the NN circuit 100B are electrically connected to each other. Note that the image processing portion PP and the source driver circuit SD are also illustrated in FIG. 29, in addition to the autoencoder 13.

The autoencoder 13 is configured to have few wirings that electrically connect the intermediate layer ML2 of the AI encoder AIE and the intermediate layer ML3 of the AI decoder AID, as illustrated in FIG. 2. In other words, the AI encoder AIE is configured to have few neurons in the intermediate layer ML2, and the AI decoder AID is configured to have few neurons in the intermediate layer ML3.

In view of this, the NN circuit 100A includes input terminals PDL[1] to PDL[L] (here, L is an integer greater than or equal to 1) and output terminals PDR[1] to PDR[N] (here, N is an integer greater than or equal to 1 and less than L), and the NN circuit 100B includes input terminals PDL[1] to PDL[N] and output terminals PDR[1] to PDR[L]. In FIG. 29, a plurality of programmable logic elements PLE included in the NN circuit 100A and those in the NN circuit 100B are denoted by a programmable logic element portion PLES1 and a programmable logic element portion PLES2, respectively.

As illustrated in FIG. 29, the autoencoder 13 can be formed using the NN circuit 100 as each of the AI encoder AIE and the AI decoder AID. Accordingly, image data transmitted from the image processing portion PP can be converted into feature-extracted image data by the NN circuit 100A. In addition, the feature-extracted image data can be restored to the original image data by the NN circuit 100B, and the restored image data can be transmitted to the source driver circuit SD.

Although the number of the input terminals PDL of the NN circuit 100A is equal to the number of the output terminals PDR of the NN circuit 100B in FIG. 29, the number of the input terminals PDL of the NN circuit 100A may differ from the number of the output terminals PDR of the NN circuit 100B depending on circumstances or conditions or as needed.

<Configuration Example of Product-Sum Operation Circuit>

Next, a configuration example of a product-sum operation circuit for constructing the above-described hierarchical neural network will be described.

Figure 30:
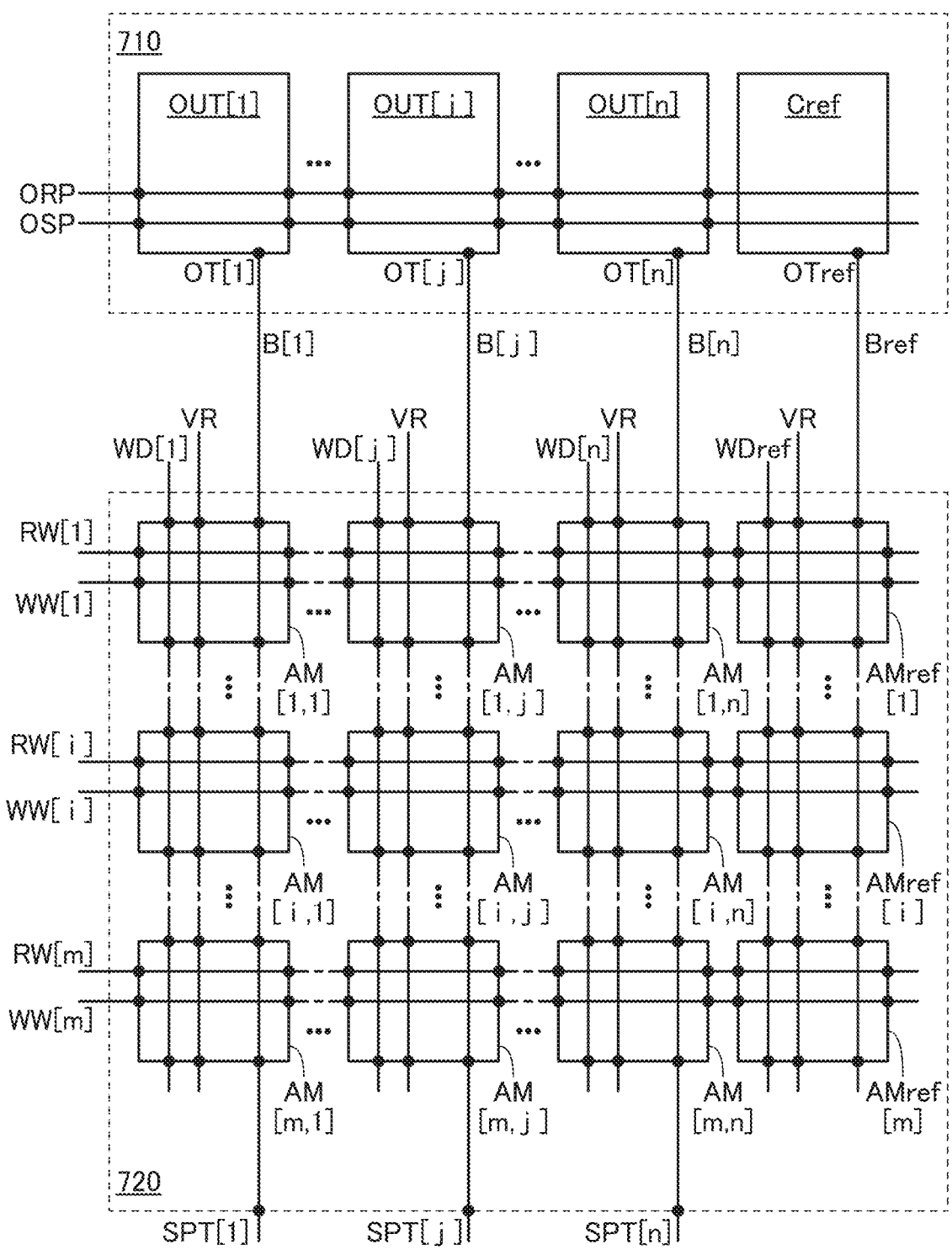
FIG. 30 is a block diagram illustrating an example of a product-sum operation circuit.

FIG. 30 illustrates an example of a product-sum operation circuit of one embodiment of the present invention. FIG. 30 is a block diagram of the product-sum operation circuit. The product-sum operation circuit 700 includes an offset circuit 710 and a memory cell array 720.

The offset circuit 710 includes column output circuits OUT[1] to OUT[n] (here, n is an integer greater than or equal to 1) and a reference column output circuit Cref.

In the memory cell array 720, m (here, m is an integer greater than or equal to 1) memory cells AM are arranged in the column direction and n memory cells AM are arranged in the row direction; that is, m×n memory cells AM are provided. In addition, m memory cells AMref are arranged in the column direction. The total number of the memory cells AM and the memory cells AMref arranged in a matrix in the memory cell array 720 is m×(n+1). In particular, in the memory cell array 720 in FIG. 30, the memory cell AM positioned in an i-th row and a j-th column is denoted by a memory cell AM[i, j] (here, i is an integer greater than or equal to 1 and less than or equal to m, and j is an integer greater than or equal to 1 and less than or equal to n), and the memory cell AMref positioned in the i-th row is denoted by a memory cell AMref[i].

The memory cell AM holds a potential corresponding to first analog data, and the memory cell AMref holds a predetermined potential. Note that the predetermined potential is a potential necessary for the product-sum operation, and in this specification, data corresponding to this predetermined potential is referred to as reference analog data in some cases.

The memory cell array 720 includes output terminals SPT[1] to SPT[n].

The column output circuit OUT[j] includes an output terminal OT[j], and the reference column output circuit Cref includes an output terminal OTref.

A wiring ORP is electrically connected to the column output circuits OUT[1] to OUT[n], and a wiring OSP is electrically connected to the column output circuits OUT[1] to OUT[n]. The wiring ORP and the wiring OSP are wirings for supplying a control signal to the offset circuit 710.

An output terminal SPT[j] of the memory cell array 720 is electrically connected to a wiring B[j].

The output terminal OT[j] of the column output circuit OUT[j] is electrically connected to the wiring B[j].

The output terminal OTref of the reference column output circuit Cref is electrically connected to a wiring Bref.

The memory cell AM[i, j] is electrically connected to a wiring RW[i], a wiring WW[i], a wiring WD[j], the wiring B[1], and a wiring VR.

The memory cell AMref[i] is electrically connected to the wiring RW[i], the wiring WW[i], a wiring WDref, the wiring Bref, and the wiring VR.

The wiring WW[i] functions as a wiring for supplying a selection signal to memory cells AM[i, 1] to AM[i, n] and the memory cell AMref[i]. The wiring RW[i] functions as a wiring for supplying either a reference potential or a potential corresponding to second analog data to the memory cells AM[i, 1] to AM[i, n] and the memory cell AMref[i]. The wiring WD[j] functions as a wiring for supplying writing data to the memory cells AM in the j-th column. The wiring VR functions as a wiring for supplying a predetermined potential to the memory cells AM or the memory cells AMref when data is read out from the memory cells AM or the memory cells AMref.

The wiring B[j] functions as a wiring for supplying a signal from the column output circuit OUT[j] to the memory cells AM in the j-th column in the memory cell array 720.

The wiring Bref functions as a wiring for supplying a signal from the reference column output circuit Cref to memory cells AMref[1] to AMref[m].

In the product-sum operation circuit 700 in FIG. 30, only the following components are shown: the offset circuit 710; the memory cell array 720; the column output circuit OUT [1]; the column output circuit OUT[j]; the column output circuit OUT[n]; the reference column output circuit Cref; an output terminal OT[1]; the output terminal OT[j]; an output terminal OT[n]; the output terminal OTref; the output terminal SPT[1]; the output terminal SPT[j]; the output terminal SPT[n]; a memory cell AM[1, 1]; the memory cell AM[i, 1]; a memory cell AM[m, 1]; a memory cell AM[1, j]; the memory cell AM[i, j]; a memory cell AM[m, j]; a memory cell AM[1, n]; the memory cell AM[i, n]; a memory cell AM[m, n]; the memory cell AMref[1]; the memory cell AMref[i]; the memory cell AMref[m]; the wiring OSP; the wiring ORP; a wiring B[1]; the wiring B[j]; a wiring B[n]; the wiring Bref; a wiring WD[1]; the wiring WD[j]; a wiring WD[n]; the wiring WDref; the wiring VR; a wiring RW[1]; the wiring RW[i]; a wiring RW[m]; a wiring WW[1]; the wiring WW[i]; and a wiring WW[m]. Other circuits, wirings, elements, and reference numerals thereof are not shown.

The configuration of the product-sum operation circuit 700 is not limited to that illustrated in FIG. 30. Depending on circumstances or conditions or as needed, the configuration of the product-sum operation circuit 700 can be changed. For example, depending on the circuit configuration of the product-sum operation circuit 700, one wiring may be provided to serve as the wiring WD[j] and the wiring VR. Alternatively, depending on the circuit configuration of the product-sum operation circuit 700, one wiring may be provided to serve as the wiring ORP and the wiring OSP.

<<Offset Circuit 710>>

Figure 31:
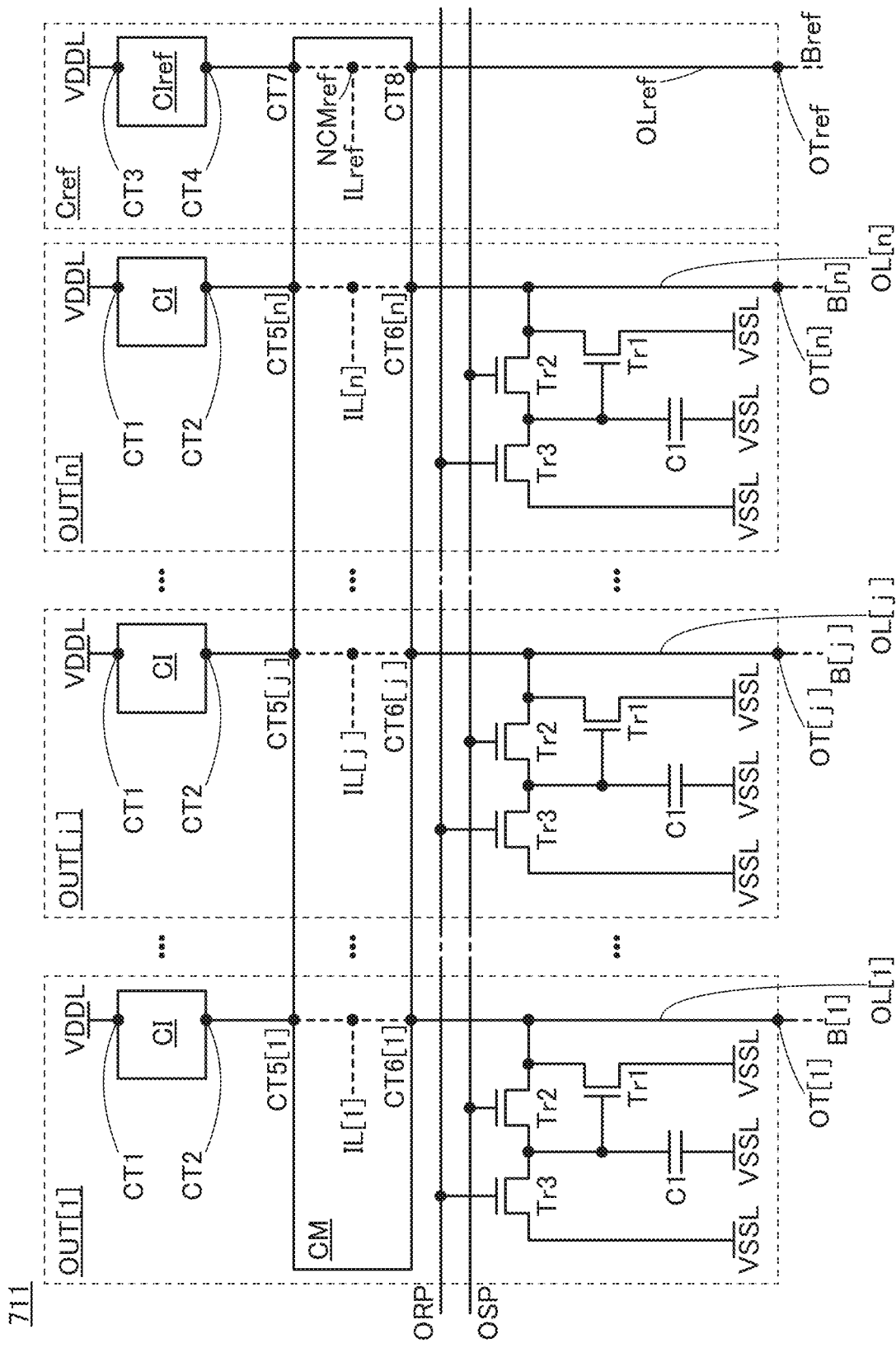
FIG. 31 is a circuit diagram illustrating an example of an offset circuit in the product-sum operation circuit illustrated in FIG. 30.

Next, examples of circuit configurations that can be applied to the offset circuit 710 will be described. FIG. 31 illustrates an offset circuit 711 as an example of the offset circuit 710.

The offset circuit 711 is electrically connected to a wiring VDDL and a wiring VSSL for supplying power supply voltages. Specifically, each of the column output circuits OUT[1] to OUT[n] is electrically connected to the wiring VDDL and the wiring VSSL, and the reference column output circuit Cref is electrically connected to the wiring VDDL. Note that a current mirror circuit CM to be described later is electrically connected to the wiring VSSL in some cases. The wiring VDDL supplies the high-level potential. The wiring VSSL supplies the low-level potential.

The internal circuit configuration of the column output circuit OUT[j] will be described below. The column output circuit OUT[j] includes a constant current circuit CI, transistors Tr1 to Tr3, a capacitor C1, and a wiring OL[j]. The current mirror circuit CM is shared between the column output circuits OUT[1] to OUT[n] and the reference column output circuit Cref.

The constant current circuit CI includes a terminal CT1 and a terminal CT2. The terminal CT1 functions as an input terminal of the constant current circuit CI, and the terminal CT2 functions as an output terminal of the constant current circuit CI. The current mirror circuit CM shared between the column output circuits OUT[1] to OUT[n] and the reference column output circuit Cref includes terminals CT5[1] to CT5[$n$], terminals CT6[1] to CT6[$n$], a terminal CT7, and a terminal CT8.

The constant current circuit CI has a function of keeping the amount of current flowing from the terminal CT1 to the terminal CT2 constant.

In the column output circuit OUT[j], a first terminal of the transistor Tr1 is electrically connected to the wiring OL[j], a second terminal of the transistor Tr1 is electrically connected to the wiring VSSL, and a gate of the transistor Tr1 is electrically connected to a first terminal of the capacitor C1. A first terminal of a transistor Tr2 is electrically connected to the wiring OL[j], a second terminal of the transistor Tr2 is electrically connected to the first terminal of the capacitor C1, and a gate of the transistor Tr2 is electrically connected to the wiring OSP. A first terminal of the transistor Tr3 is electrically connected to the first terminal of the capacitor C1, a second terminal of the transistor Tr3 is electrically connected to the wiring VSSL, and a gate of the transistor Tr3 is electrically connected to the wiring ORP. A second terminal of the capacitor C1 is electrically connected to the wiring VSSL.

Note that each of the transistors Tr1 to Tr3 is preferably an OS transistor. In addition, a channel formation region in each of the transistors Tr1 to Tr3 is preferably formed using an oxide containing at least one of indium, zinc, and the element M (the element M is aluminum, gallium, yttrium, or tin).

The OS transistor has a characteristic of an extremely low off-state current. Thus, when the OS transistor is in an off state, the amount of leakage current flowing between a source and a drain can be extremely small. In particular, when an OS transistor is used as the transistor Tr2, the electric charge held in the capacitor C1 can be prevented from flowing between a source and a drain of the transistor Tr2 that is off. Furthermore, when an OS transistor is used as the transistor Tr3, the electric charge held in the capacitor C1 can be prevented from flowing between a source and a drain of the transistor Tr3 that is off. Accordingly, the potential of the gate of the transistor Tr1 can be held for a long time; thus, a stable constant current can flow between a source and a drain of the transistor Tr1. As a result, the product-sum operation circuit can have high calculation accuracy in some cases.

In the column output circuit OUT[j], the terminal CT1 of the constant current circuit CI is electrically connected to the wiring VDDL, and the terminal CT2 of the constant current circuit CI is electrically connected to the terminal CT5[$j$] of the current mirror circuit CM. The terminal CT6[$j$] of the current mirror circuit CM is electrically connected to the output terminal OT[j].

Note that the wiring OL[j] is a wiring for electrically connecting the terminal CT2 of the constant current circuit CI to the output terminal OT[j] through the terminal CT5 [j] and the terminal CT6[$j$] of the current mirror circuit CM.

Next, the reference column output circuit Cref will be described. The reference column output circuit Cref includes a constant current circuit CIref and a wiring OLref. As described above, the reference column output circuit Cref includes the current mirror circuit CM that is shared with the column output circuits OUT[1] to OUT[n].

The constant current circuit CIref includes a terminal CT3 and a terminal CT4. The terminal CT3 functions as an input terminal of the constant current circuit CIref, and the terminal CT4 functions as an output terminal of the constant current circuit CIref.

The constant current circuit CIref has a function of keeping the amount of current flowing from the terminal CT3 to the terminal CT4 constant.

In the reference column output circuit Cref, the terminal CT3 of the constant current circuit CIref is electrically connected to the wiring VDDL, and the terminal CT4 of the constant current circuit CIref is electrically connected to the terminal CT7 of the current mirror circuit CM. The terminal CT8 of the current mirror circuit CM is electrically connected to the output terminal OTref.

Note that the wiring OLref is a wiring for electrically connecting the terminal CT4 of the constant current circuit CIref to the output terminal OTref through the terminal CT7 and the terminal CT8 of the current mirror circuit CM.

In the current mirror circuit CM, the terminal CT5[$j$] is electrically connected to the terminal CT6[$j$], and the terminal CT7 is electrically connected to the terminal CT8. In addition, a wiring IL[j] is electrically connected between the terminal CT5[$j$] and the terminal CT6[$j$], and a wiring ILref is electrically connected between the terminal CT7 and the terminal CT8. Furthermore, a connection portion of the wiring ILref between the terminal CT7 and the terminal CT8 is a node NCMref. The current mirror circuit CM has a function of equalizing the amount of current flowing in the wiring ILref and the amount of current flowing in each of wirings IL[1] to IL[n] with reference to the potential at the node NCMref.

In the offset circuit 711 in FIG. 31, only the following components are shown: the column output circuit OUT[1]; the column output circuit OUT[j]; the column output circuit OUT[n]; the reference column output circuit Cref; the constant current circuit CI; the constant current circuit Chef; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[$j$]; the terminal CT5[$n$]; the terminal CT6[1]; the terminal CT6[$j$]; the terminal CT6[$n$]; the terminal CT7; the terminal CT8; the transistor Tr1; the transistor Tr2; the transistor Tr3; the capacitor C1; a wiring OL[1]; the wiring OL[j]; a wiring OL[n]; the wiring OLref; the wiring ORP; the wiring OSP; the wiring B[1]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

Note that the configuration of the offset circuit 711 is not limited to that illustrated in FIG. 31. Depending on circumstances or conditions or as needed, the configuration of the offset circuit 711 can be changed.

[Constant Current Circuits CI and CIref]

Next, an example of internal configurations of the constant current circuit CI and the constant current circuit CIref will be described.

Figure 32:
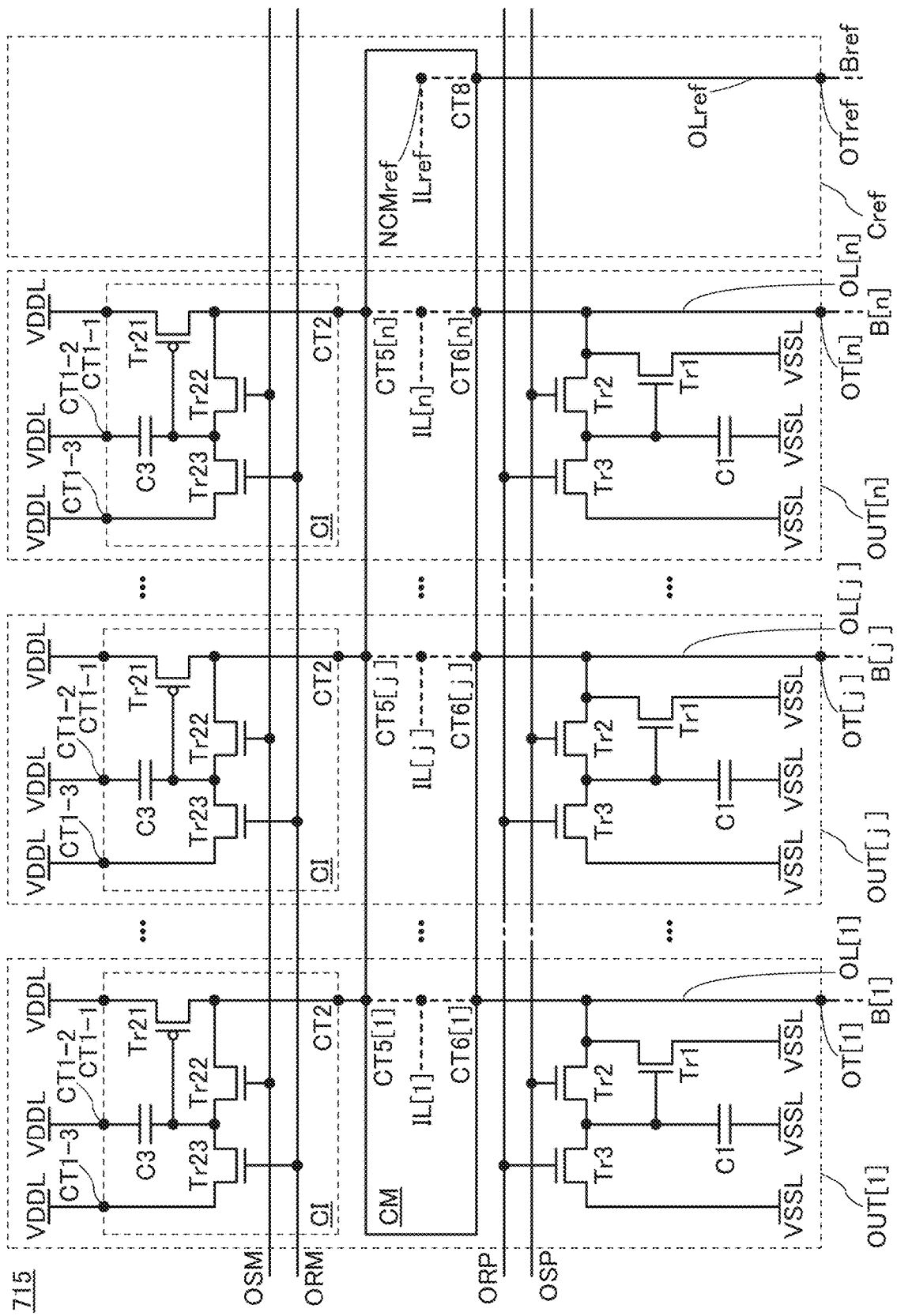
FIG. 32 is a circuit diagram illustrating an example of an offset circuit in the product-sum operation circuit illustrated in FIG. 30.

FIG. 32 illustrates an offset circuit 715 and is a circuit diagram illustrating an internal configuration example of the constant current circuit CI and the constant current circuit CIref included in the offset circuit 711 illustrated in FIG. 31.

In the column output circuit OUT[j], the constant current circuit CI includes a transistor Tr21, a transistor Tr22, a transistor Tr23, and a capacitor C3. The constant current circuits CI in the offset circuit 715 include terminals CT1-1, CT1-2, and CT1-3, instead of the terminals CT1 of the constant current circuits CI in the offset circuit 711. Furthermore, the offset circuit 715 is electrically connected to wirings OSM and ORM.

Note that the transistor Tr21 is a p-channel transistor, and the transistors Tr22 and Tr23 are n-channel transistors. In particular, the transistors Tr22 and Tr23 are preferably OS transistors. In addition, the channel formation region in each of the transistors Tr22 and Tr23 preferably includes an oxide containing at least one of indium, the element M, and zinc.

As described above, an OS transistor has a characteristic of an extremely small off-state current. In particular, when an OS transistor is used as the transistor Tr22, the electric charge held in the capacitor C3 can be prevented from flowing between a source and a drain of the transistor Tr22 that is off. In addition, when an OS transistor is used as the transistor Tr23, the electric charge held in the capacitor C3 can be prevented from flowing between a source and a drain of the transistor Tr23 that is off. Accordingly, the potential of a gate of the transistor Tr21 can be held for a long time; thus, a stable constant current can flow between a source and a drain of the transistor Tr21. As a result, the product-sum operation circuit can have high calculation accuracy in some cases.

A first terminal of the transistor Tr21 is electrically connected to the terminal CT1-1, a second terminal of the transistor Tr21 is electrically connected to the terminal CT2, and the gate of the transistor Tr21 is electrically connected to a first terminal of the capacitor C3. A first terminal of the transistor Tr22 is electrically connected to the terminal CT2, a second terminal of the transistor Tr22 is electrically connected to the first terminal of the capacitor C3, and a gate of the transistor Tr22 is electrically connected to the wiring OSM. A first terminal of the transistor Tr23 is electrically connected to the first terminal of the capacitor C3, a second terminal of the transistor Tr23 is electrically connected to the terminal CT1-3, and a gate of the transistor Tr23 is electrically connected to the wiring ORM. A second terminal of the capacitor C3 is electrically connected to the terminal CT1-2.

The terminals CT1-1 to CT1-3 are each electrically connected to the wiring VDDL.

In the offset circuit 715 illustrated in FIG. 32, the reference column output circuit Cref does not include the constant current circuit CIref. In a strict sense, in the reference column output circuit Cref, the current mirror circuit CM serves as a current source and supplies a current to the wiring OLref. In other words, the current mirror circuit CM in the reference column output circuit Cref can be regarded as the constant current circuit CIref for the wiring OLref. Note that the offset circuit 715 has a circuit configuration obtained by removing the constant current circuit CIref from the reference column output circuit Cref in the offset circuit 711 illustrated in FIG. 31.

In the offset circuit 715 illustrated in FIG. 32, only the following components are shown: the column output circuit OUT[1]; the column output circuit OUT[j]; the column output circuit OUT[n]; the reference column output circuit Cref; the constant current circuit CI; the current mirror circuit CM; the output terminal OT[1]; the output terminal OT[j]; the output terminal OT[n]; the output terminal OTref; the terminal CT1-1; the terminal CT1-2; the terminal CT1-3; the terminal CT2; the terminal CT5[1]; the terminal CT5[j]; the terminal CT5[n]; the terminal CT6[1]; the terminal CT6[j]; the terminal CT6[n]; the terminal CT8; the transistor Tr1; the transistor Tr2; the transistor Tr3; the transistor Tr21; the transistor Tr22; the transistor Tr23; the capacitor C1; the capacitor C3; the wiring OL[1]; the wiring OL[j]; the wiring OL[n]; the wiring OLref; the wiring ORP; the wiring OSP; the wiring OSM; the wiring ORM; the wiring B[1]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

The operation of the constant current circuit CI in the offset circuit 715 will be described below.

When the high-level potential is supplied to the wiring ORM and the low-level potential is supplied to the wiring OSM, the transistor Tr23 is turned on and the transistor Tr22 is turned off. At this time, the first terminal of the capacitor C3 is supplied with the high-level potential from the wiring VDDL via the transistor Tr23. The second terminal of the capacitor C3 is supplied with the high-level potential from the wiring VDDL; thus, the holding potential of the capacitor C3 becomes 0. That is, by supplying the wiring ORM with the high-level potential and supplying the wiring OSM with the low-level potential, electric charge held in the capacitor C3 is released, so that the constant current circuit CI can be initialized.

When the low-level potential is supplied to the wiring ORM and the high-level potential is supplied to the wiring OSM, the transistor Tr23 is turned off and the transistor Tr22 is turned on. At this time, the second terminal of the transistor Tr21 is electrically connected to the gate of the transistor Tr21 via the transistor Tr22. That is, the transistor Tr21 has a diode-connected structure. The potential of the first terminal of the capacitor C3 becomes equal to that of the second terminal of the transistor Tr21 over time.

In this state, by supplying the low-level potential to the wiring OSM to turn off the transistor Tr22, a potential equal to that of the second terminal of the transistor Tr21 is held in the capacitor C3. Accordingly, the potential is held at the gate of the transistor Tr21, and thus a constant current based on the potential flows through the transistor Tr21.

Note that the configurations of the constant current circuits CI and CIref in the offset circuit of one embodiment of the present invention are not limited to those in the offset circuit 715 in FIG. 32. For example, depending on circumstances or conditions or as needed, the component, such as a circuit, an element, or a wiring, of the offset circuit 715 can be removed; another component, such as a circuit, an element, or a wiring, can be added to the offset circuit 715; or the connection structure of the offset circuit 715 can be changed.

[Current Mirror Circuit CM]

Next, an internal configuration example of the current mirror circuit CM will be described.

Figure 33:
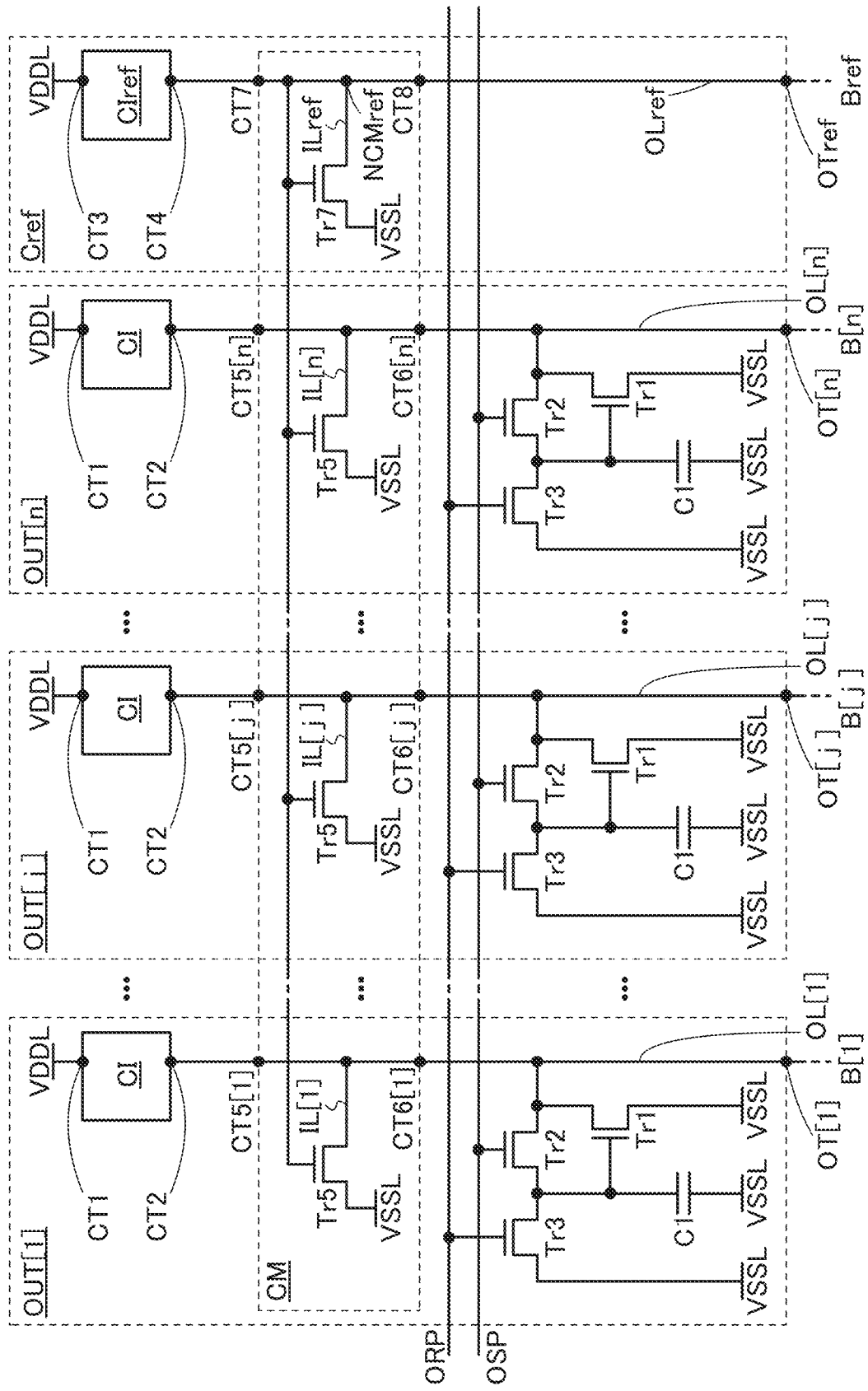
FIG. 33 is a circuit diagram illustrating an example of an offset circuit in the product-sum operation circuit illustrated in FIG. 30.

FIG. 33 illustrates an offset circuit 713 and is a circuit diagram of an internal configuration example of the current mirror circuit CM included in the offset circuit 711 in FIG. 31.

In the current mirror circuit CM, each of the column output circuits OUT[1] to OUT[n] includes a transistor Tr5, and the reference column output circuit Cref includes a transistor Tr7. Note that the transistors Tr5 and Tr7 are each an n-channel transistor.

A first terminal of the transistor Tr5 in the column output circuit OUT[j] is electrically connected to the terminal CT5[j] and the terminal CT6[j] of the current mirror circuit CM. A second terminal of the transistor Tr5 in the column output circuit OUT[j] is electrically connected to the wiring VSSL. A gate of the transistor Tr5 in the column output circuit OUT[j] is electrically connected to the terminal CT7 and the terminal CT8 of the current mirror circuit CM.

A first terminal of the transistor Tr7 in the reference column output circuit Cref is electrically connected to the terminal CT7 and the terminal CT8 of the current mirror circuit CM. A second terminal of the transistor Tr7 in the reference column output circuit Cref is electrically connected to the wiring VSSL. A gate of the transistor Tr7 in the reference column output circuit Cref is electrically connected to the terminal CT7 and the terminal CT8 of the current mirror circuit CM.

In the above connection structure, the potential of the node NCMref can be supplied to the gate of the transistor Tr5 in each of the column output circuits OUT[1] to OUT[n], and the amount of current flowing between a source and a drain of the transistor Tr7 can be equalized to the amount of current flowing between a source and a drain of the transistor Tr5 in each of the column output circuits OUT[1] to OUT[n]. Note that the transistors Tr5 and Tr7 of the current mirror circuit CM in the offset circuit 713 are n-channel transistors and are connected to the wiring VSSL to which the low-level potential is supplied, and thus the current mirror circuit CM function as a current sink.

Each of the transistors Tr5 and Tr7 is preferably an OS transistor. In addition, a channel formation region in each of the transistors Tr5 and Tr7 is preferably formed using an oxide containing at least one of indium, the element M, and zinc.

In the offset circuit 713 illustrated in FIG. 33, only the following components are shown: the column output circuit OUT[1]; the column output circuit OUT[j]; the column output circuit OUT[n]; the reference column output circuit Cref; the constant current circuit CI; the constant current circuit Chef; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Try; the transistor Tr7; the capacitor C1; the wiring OL[1]; the wiring OL[j]; the wiring OL[n]; the wiring OLref; the wiring ORP; the wiring OSP; the wiring B[1]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

Note that the configuration of the current mirror circuit CM of the offset circuit of one embodiment of the present invention is not limited to that of the offset circuit 713 in FIG. 33. For example, depending on circumstances or conditions or as needed, the component, such as a circuit, an element, or a wiring, of the offset circuit 713 can be removed; another component, such as a circuit, an element, or a wiring, can be added to the offset circuit 713; or the internal connection structure of the offset circuit 713 can be changed. For example, as illustrated in an offset circuit 716 of FIG. 34, the configuration of the current mirror circuit CM may be changed.

Figure 34:
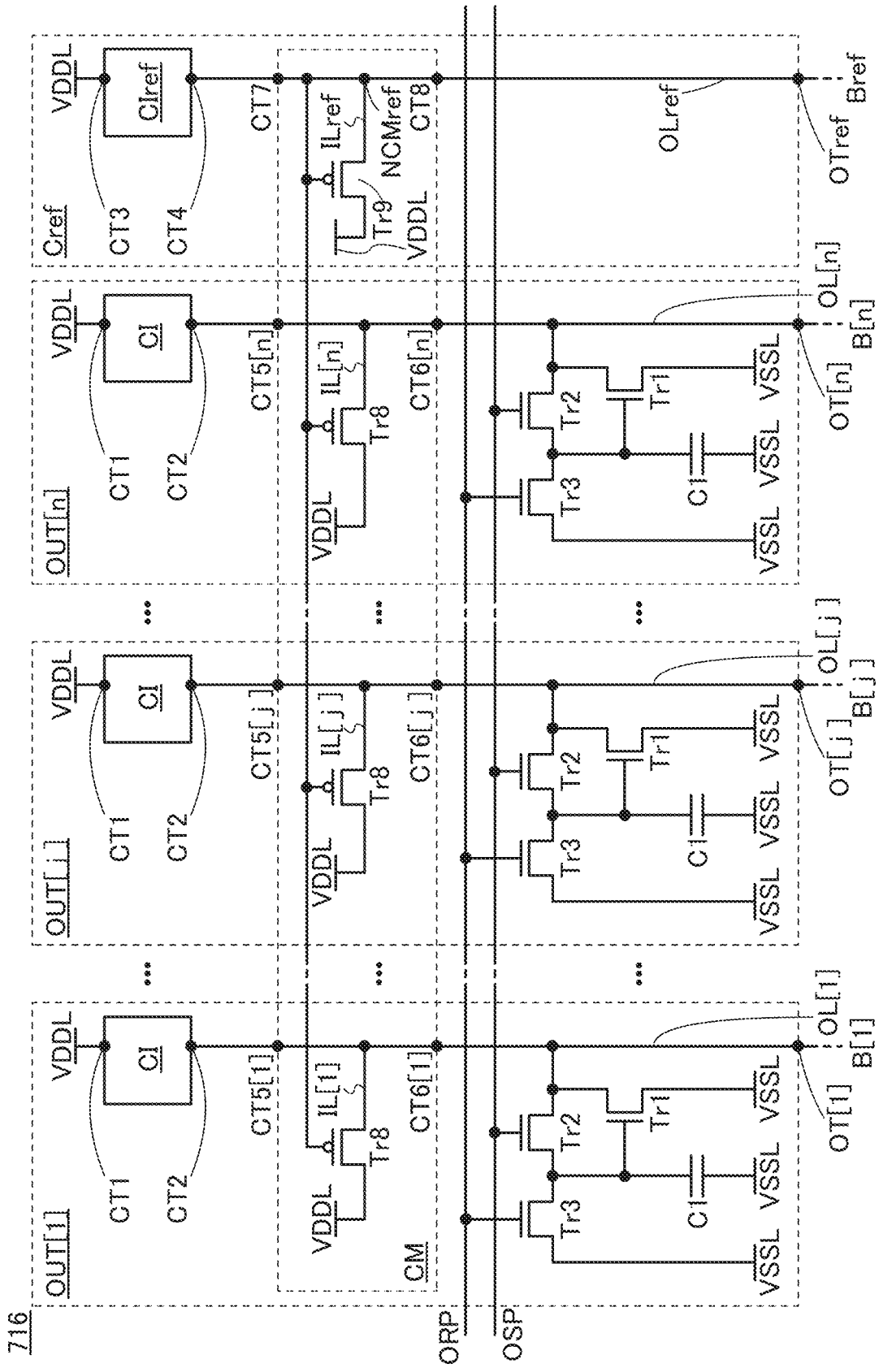
FIG. 34 is a circuit diagram illustrating an example of an offset circuit in the product-sum operation circuit illustrated in FIG. 30.

In the current mirror circuit CM of the offset circuit 716 illustrated in FIG. 34, each of the column output circuits OUT[1] to OUT[n] includes a transistor Tr8, and the reference column output circuit Cref includes a transistor Tr9. Note that the transistors Tr8 and Tr9 are each a p-channel transistor.

A first terminal of the transistor Tr8 in the column output circuit OUT[j] is electrically connected to the terminal CT5[j] and the terminal CT6[j] of the current mirror circuit CM. A second terminal of the transistor Tr8 in the column output circuit OUT[j] is electrically connected to the wiring VDDL. A gate of the transistor Tr8 in the column output circuit OUT[j] is electrically connected to the terminal CT7 and the terminal CT8 of the current mirror circuit CM.

A first terminal of the transistor Tr9 in the reference column output circuit Cref is electrically connected to the terminal CT7 and the terminal CT8 of the current mirror circuit CM. A second terminal of the transistor Tr9 in the reference column output circuit Cref is electrically connected to the wiring VDDL. A gate of the transistor Tr9 in the reference column output circuit Cref is electrically connected to the terminal CT7 and the terminal CT8 of the current mirror circuit CM.

In the above connection structure, the potential of the node NCMref can be supplied to the gate of the transistor Tr8 in each of the column output circuits OUT[1] to OUT[n], and the amount of current flowing between a source and a drain of the transistor Tr9 can be equalized to the amount of current flowing between a source and a drain of the transistor Tr8 in each of the column output circuits OUT[1] to OUT[n]. Note that the transistors Tr8 and Tr9 of the current mirror circuit CM in the offset circuit 716 are p-channel transistors and are connected to the wiring VDDL to which the high-level potential is supplied, and thus the current mirror circuit CM function as a current source.

In the offset circuit 716 illustrated in FIG. 34, only the following components are shown: the column output circuit OUT[1]; the column output circuit OUT[j]; the column output circuit OUT[n]; the reference column output circuit Cref; the constant current circuit CI; the constant current circuit Chef; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr8; the transistor Tr9; the capacitor C1; the wiring OL[1]; the wiring OL[j]; the wiring OL[n]; the wiring OLref; the wiring ORP; the wiring OSP; the wiring B[1]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

<<Memory Cell Array 720>>

Figure 35:
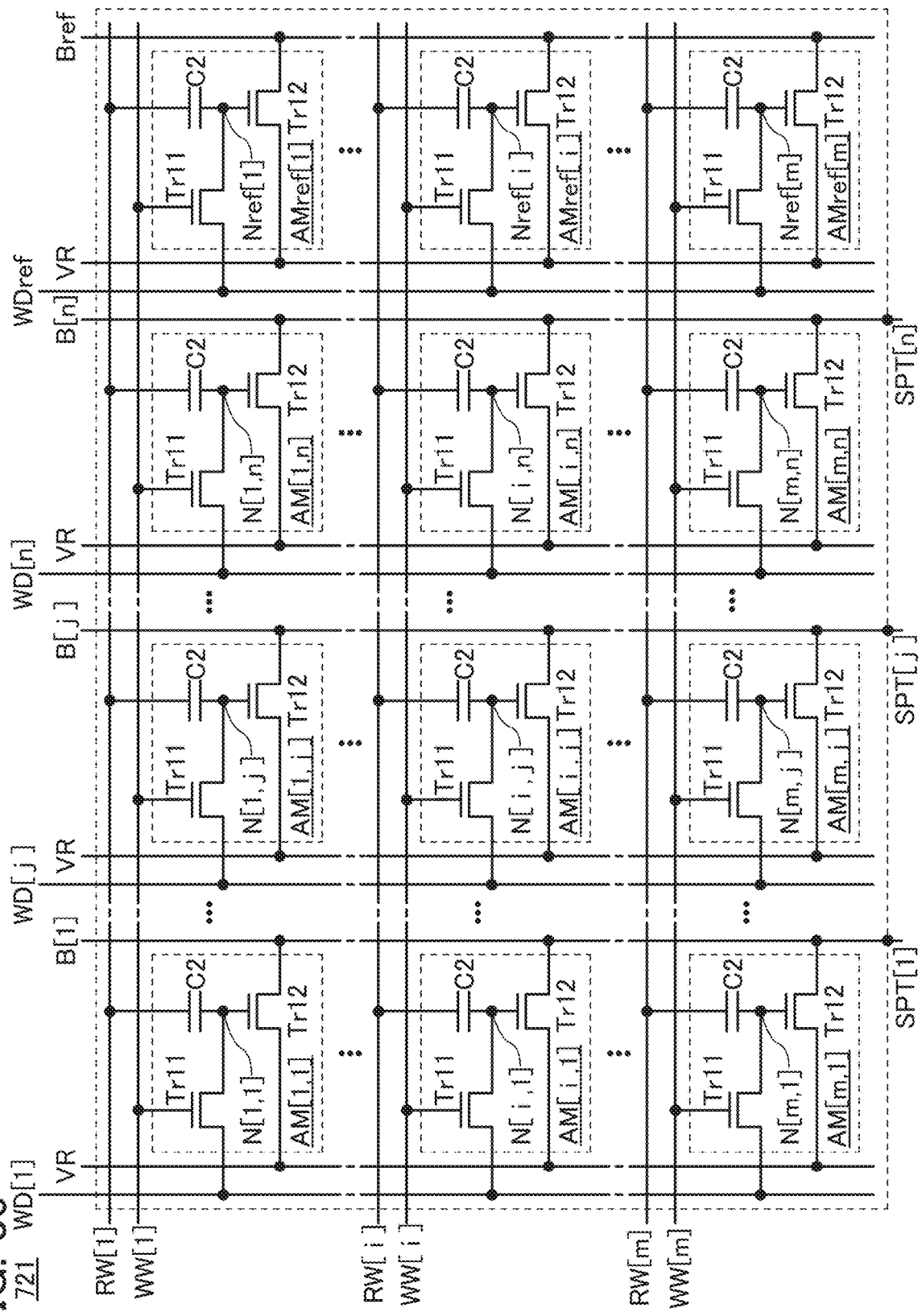
FIG. 35 is a circuit diagram illustrating an example of a memory cell array in the product-sum operation circuit illustrated in FIG. 30.

Next, a circuit configuration example that can be employed in the memory cell array 720 will be described. FIG. 35 illustrates a memory cell array 721 as an example of the memory cell array 720.

The memory cell array 721 includes the memory cells AM and the memory cells AMref Each of the memory cells AM included in the memory cell array 721 includes a transistor Tr11, a transistor Tr12, and a capacitor C2. The memory cells AMref[1] to AMref[m] each include the transistor Tr11, the transistor Tr12, and the capacitor C2.

The description of the connection structure in the memory cell array 721 will be made with a focus on the memory cell AM[i, j]. A first terminal of the transistor Tr11 is electrically connected to a gate of the transistor Tr12 and a first terminal of the capacitor C2. A second terminal of the transistor Tr11 is electrically connected to the wiring WD[j]. A gate of the transistor Tr11 is electrically connected to the wiring WW[i]. A first terminal of the transistor Tr12 is electrically connected to the wiring B[j], and a second terminal of the transistor Tr12 is electrically connected to the wiring VR. A second terminal of the capacitor C2 is electrically connected to the wiring RW[i].

In the memory cell AM[i, j], a connection portion of the first terminal of the transistor Tr11, the gate of the transistor Tr12, and the first terminal of the capacitor C2 is a node N[i, j]. In this embodiment, a potential corresponding to the first analog data is held at the node N[i, j].

Next, the description will be made with a focus on the memory cell AMref[i]. A first terminal of the transistor Tr11 is electrically connected to a gate of the transistor Tr12 and a first terminal of the capacitor C2. A second terminal of the transistor Tr11 is electrically connected to the wiring WDref. A gate of the transistor Tr11 is electrically connected to the wiring WW[i]. A first terminal of the transistor Tr12 is electrically connected to the wiring Bref A second terminal of the transistor Tr12 is electrically connected to the wiring VR. A second terminal of the capacitor C2 is electrically connected to the wiring RW[i].

In the memory cell AMref[i], a connection portion of the first terminal of the transistor Tr11, the gate of the transistor Tr12, and the first terminal of the capacitor C2 is a node Nref[i].

Note that each of the transistors Tr11 and Tr12 is preferably an OS transistor. In addition, a channel formation region in each of the transistors Tr11 and Tr12 is preferably formed using an oxide containing at least one of indium, the element M, and zinc.

With use of the OS transistors as the transistors Tr11 and Tr12, the leakage current of each of the transistors Tr11 and Tr12 can be inhibited, which enables the product-sum operation circuit to have high calculation accuracy in some cases. Furthermore, with use of the OS transistor as the transistor Tr11, the amount of leakage current from a holding node to a writing word line can be extremely small when the transistor Tr11 is in an off state. In other words, the frequency of refresh operation at the holding node can be reduced; thus, power consumption of the product-sum operation circuit can be reduced.

Furthermore, when all of the above-described transistors Tr1 to Tr3, Tr5, Tr7, Tr11, Tr12, Tr22, and Tr23 are OS transistors, a manufacturing process of the product-sum operation circuit can be shortened. Thus, time needed for manufacturing the product-sum operation circuit can be shortened, and the number of units manufactured in a certain time period can be increased.

Note that the transistors Tr1, Tr5, Tr7 to Tr9, Tr12, and Tr21 operate in a saturation region unless otherwise specified. In other words, the gate voltage, source voltage, and drain voltage of each of the transistors Tr1, Tr5, Tr7 to Tr9, Tr12, and Tr21 are appropriately biased so that the transistors operate in the saturation region. Note that even when the operations of the transistors Tr1, Tr5, Tr7 to Tr9, Tr12, and Tr21 are deviated from ideal operation in a saturation region, the gate voltage, source voltage, and drain voltage of each of the transistors are regarded as being appropriately biased as long as the accuracy of output data is within a desired range.

In the memory cell array 721 illustrated in FIG. 35, only the following components are shown: the memory cell AM[1, 1]; the memory cell AM[i, 1]; the memory cell AM[m, j]; the memory cell AM[1, j]; the memory cell AM[i, j]; the memory cell AM[m, j]; the memory cell AM[1, n]; the memory cell AM[i, n]; the memory cell AM[m, n]; the memory cell AMref[1]; the memory cell AMref[i]; the memory cell AMref[m]; the wiring RW[1]; the wiring RW[i]; the wiring RW[m]; the wiring WW[1]; the wiring WW[i]; the wiring WW[m]; the wiring WD[1]; the wiring WD[j]; the wiring WD[n]; the wiring WDref; the wiring B[1]; the wiring B[j]; the wiring B[n]; the wiring Bref; the wiring VR; the output terminal SPT[1]; the output terminal SPT[j]; the output terminal SPT[n]; a node N[1, 1]; a node N[i, 1]; a node N[m, 1]; a node N[1, j]; the node N[i, j]; a node N[m, j]; a node N[1, n]; a node N[i, n]; a node N[m, n]; a node Nref[1]; the node Nref[i]; a node Nref[m]; the transistor Tr11; the transistor Tr12; and the capacitor C2. Other circuits, wirings, elements, and reference numerals thereof are not shown.

Depending on circumstances or conditions or as needed, the product-sum operation circuit of this embodiment may have a combined structure of the above configuration examples.

Operation Example

An example of operation of the product-sum operation circuit 700 will be described. Note that the product-sum operation circuit 700 described in this operation example includes an offset circuit 751 illustrated in FIG. 36 as the offset circuit 710 and a memory cell array 721 illustrated in FIG. 35 as the memory cell array 720 of the product-sum operation circuit 700.

Figure 36:
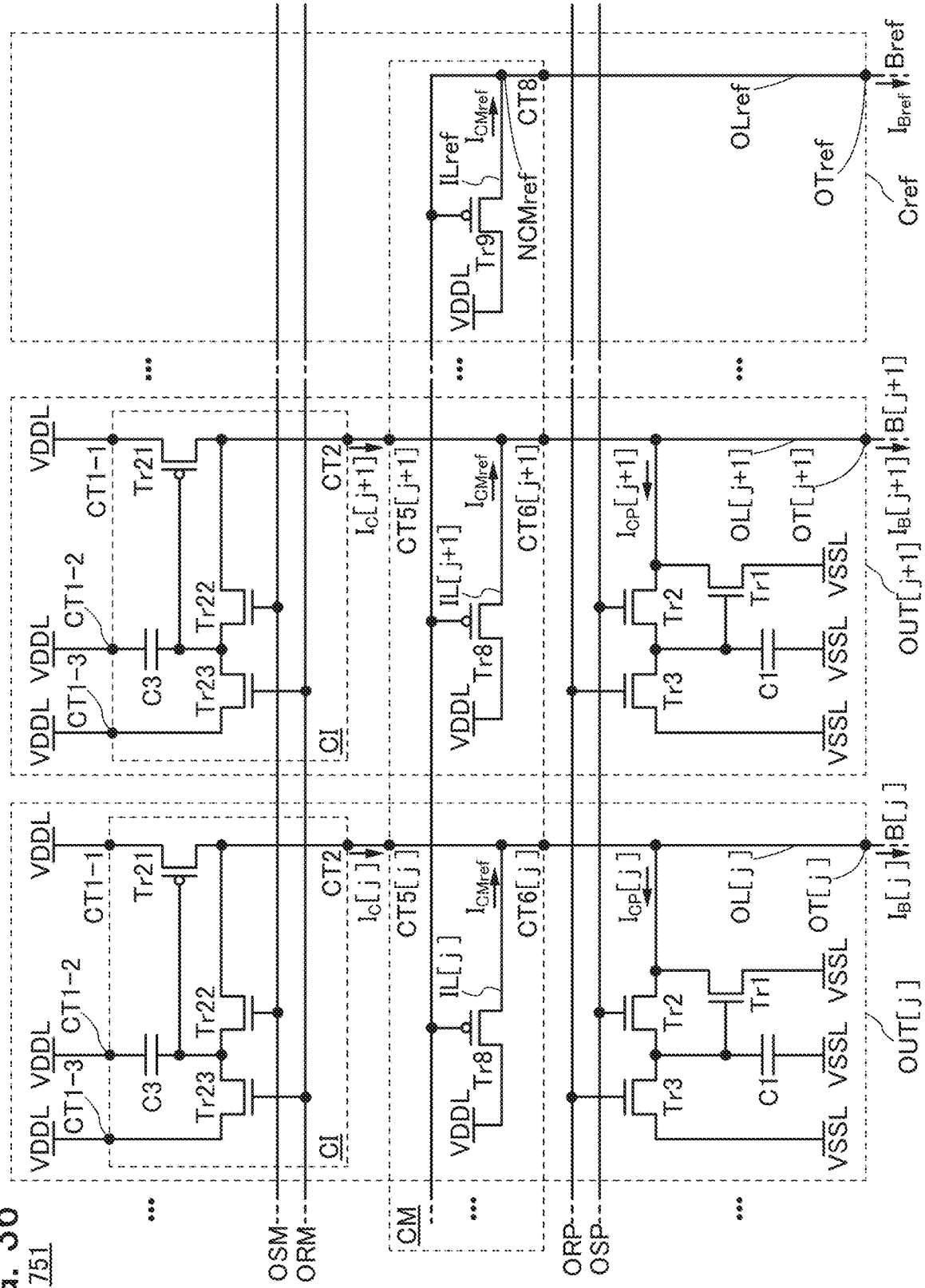
FIG. 36 is a circuit diagram illustrating an example of an offset circuit in the product-sum operation circuit illustrated in FIG. 30.

The offset circuit 751 illustrated in FIG. 36 has a circuit configuration where the constant current circuit CI of the offset circuit 715 in FIG. 32 and the current mirror circuit CM of the offset circuit 716 in FIG. 34 are used. For the description of this operation example, FIG. 36 illustrates the column output circuit OUT[j], a column output circuit OUT[j+1], and the reference column output circuit Cref.

Note that in FIG. 36, current flowing from the terminal CT2 of the constant current circuit CI to the terminal CT5[j] of the current mirror circuit CM in the column output circuit OUT[j] is denoted by $I_C[j]$, and current flowing from the terminal CT2 of the constant current circuit CI to the terminal CT5[j+1] of the current mirror circuit CM in the column output circuit OUT[j+1] is denoted by $I_C[j+1]$. Furthermore, in the current mirror circuit CM, current flowing from the first terminal of the transistor Tr8 to the wiring IL[j] in the column output circuit OUT[j], current flowing from the first terminal of the transistor Tr8 to the wiring IL[j+1] in the column output circuit OUT[j+1], and current flowing from the first terminal of the transistor Tr9 to the wiring ILref in the reference column output circuit Cref are denoted by $I_{CMref}$. That is, current that is the sum of $I_C[j]$ and $I_{CMref}$ is output to the terminal CT6[j], and current that is the sum of k[j+1] and $I_{CMref}$ is output to the terminal CT6[j+1]. Current flowing from the wiring OL[j] to the first terminal of the transistor Tr1 or the first terminal of the transistor Tr2 in the column output circuit OUT[j] is denoted by $I_{CP}[j]$, and current flowing from a wiring OL[j+1] to the first terminal of the transistor Tr1 or the first terminal of the transistor Tr2 in the column output circuit OUT[j+1] is denoted by $I_{CP}[j+1]$. Current output from the output terminal OT[j] to the wiring B[j] in the column output circuit OUT[j] is denoted by $I_B[j]$, current output from an output terminal OT[j+1] to the wiring B[j+1] in the column output circuit OUT[j+1] is denoted by $I_B[j+1]$, and current output from the output terminal OTref to the wiring Bref in the reference column output circuit Cref is denoted by $I_{Bref}$.

Figure 37:
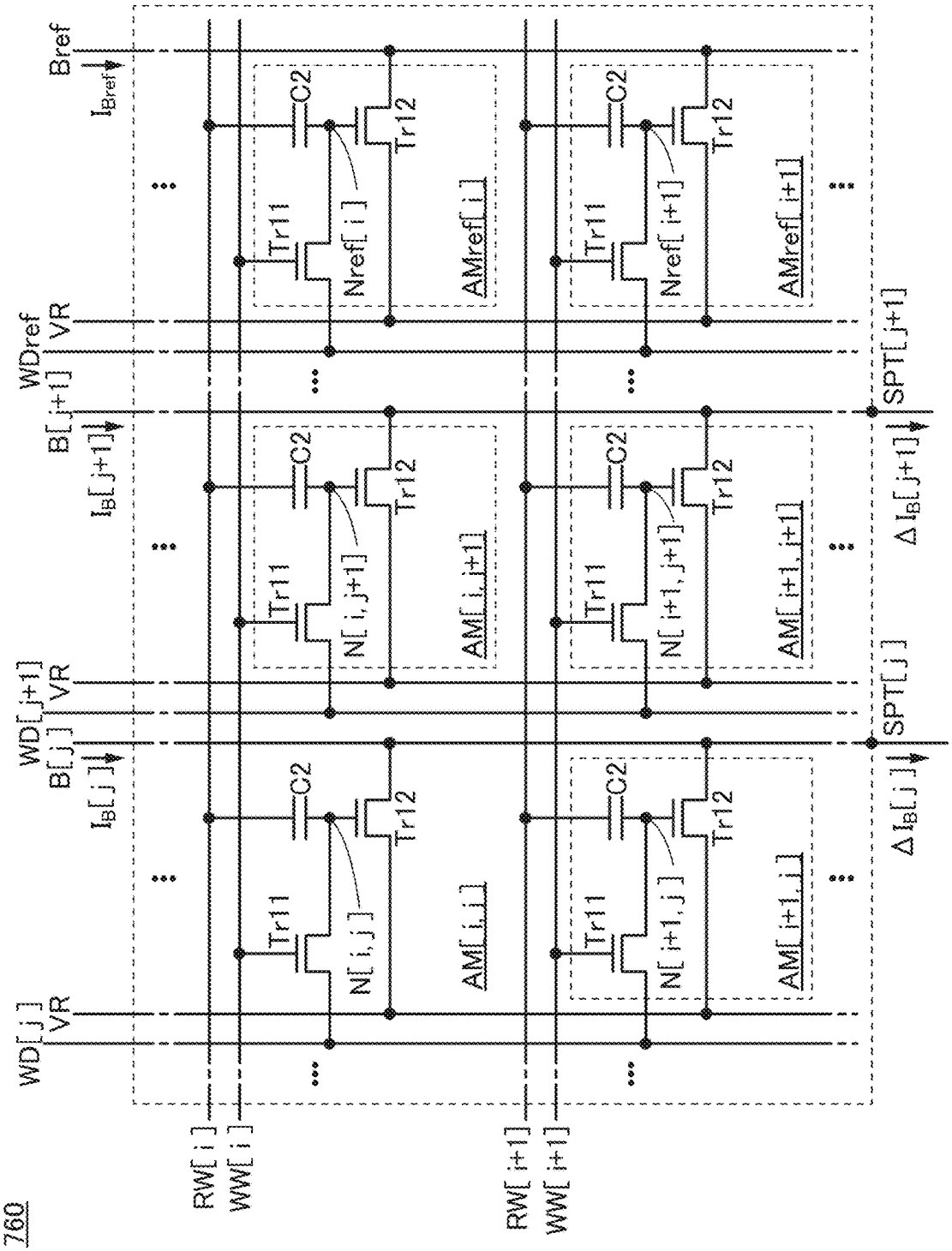
FIG. 37 is a circuit diagram illustrating an example of a memory cell array in the product-sum operation circuit illustrated in FIG. 30.

The memory cell array 760 illustrated in FIG. 37 has a structure similar to that of the memory cell array 721 illustrated in FIG. 35. For the description of this operation example, FIG. 37 illustrates the memory cell AM[i, j], a memory cell AM[i+1, j], a memory cell AM[i, j+1], a memory cell AM[i+1, j+1], the memory cell AMref[i], and a memory cell AMref[i+1].

In FIG. 37, $I_B[j]$ denotes a current that is input from the wiring B[j], $I_B[j+1]$ denotes a current that is input from the wiring B[j+1], and $I_{Bref}$ denotes a current that is input from the wiring Bref. In addition, $\Delta I_B[j]$ denotes a current that is output from the output terminal SPT[j] that is electrically connected to the wiring B[j], and $\Delta I_B[j+1]$ denotes a current that is output from an output terminal SPT[j+1] that is electrically connected to the wiring B[j+1].

Figure 38:
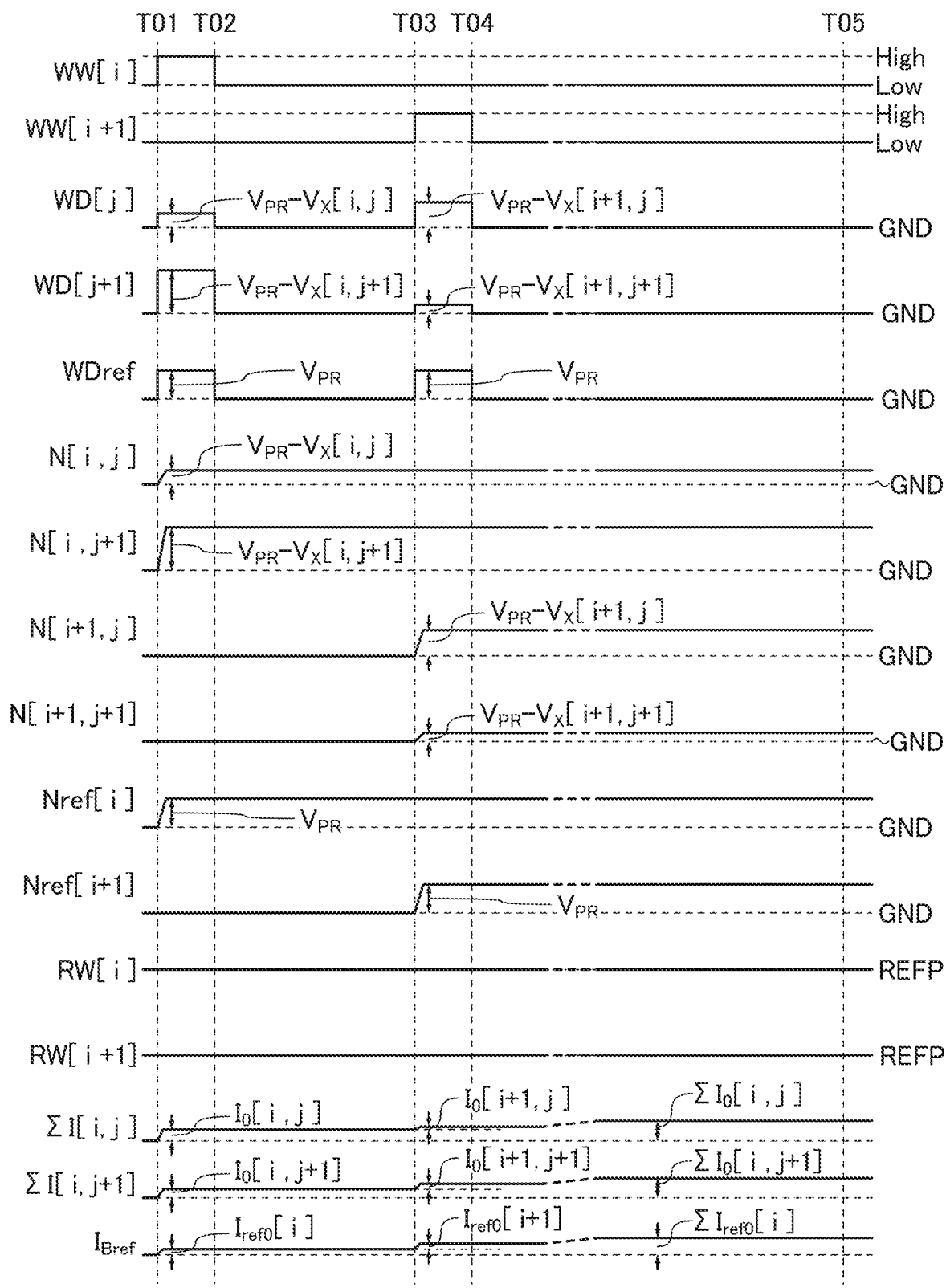
FIG. 38 is a timing chart showing an operation example of a product-sum operation circuit.
Figure 39:
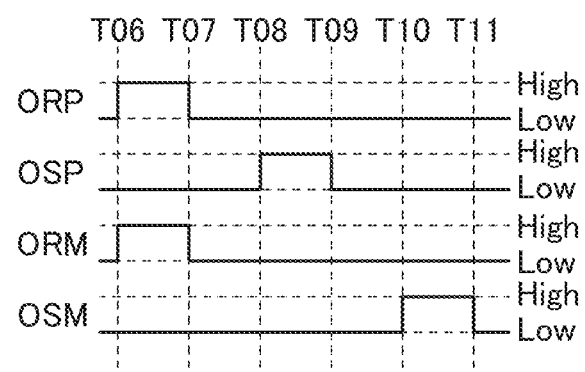
FIG. 39 is a timing chart showing an operation example of a product-sum operation circuit.
Figure 40:
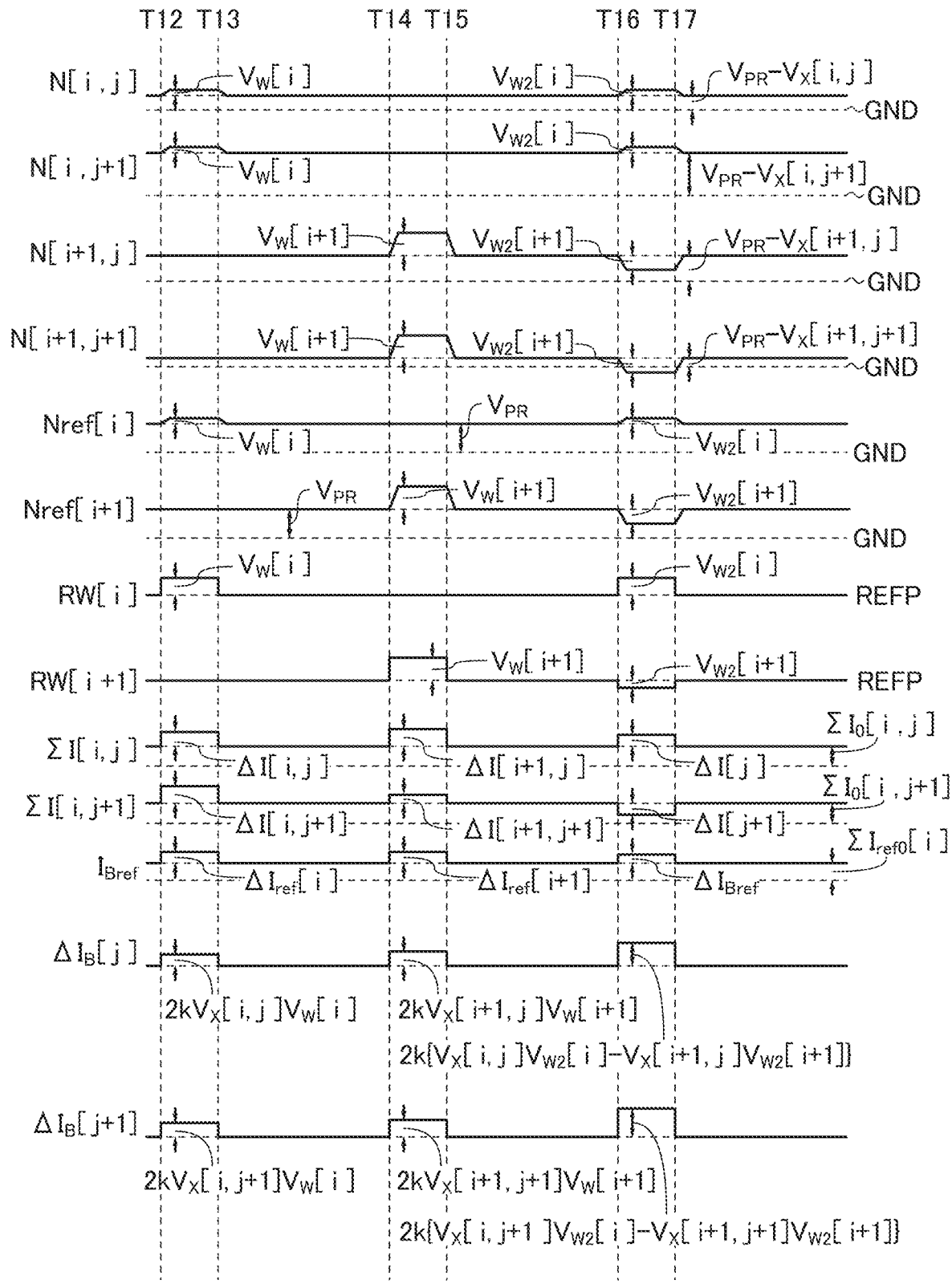
FIG. 40 is a timing chart showing an operation example of a product-sum operation circuit.

FIGS. 38 to 40 are timing charts showing the operation example of the product-sum operation circuit 700. The timing chart in FIG. 38 shows changes in potentials of the wiring WW[i], a wiring WW[i+1], the wiring WD[j], a wiring WD[j+1], the wiring WDref, the node N[i, j], a node N[i, j+1], a node N[i+1, j], a node N[i+1, j+1], the node Nref[i], a node Nref[i+1], the wiring RW[i], and a wiring RW[i+1] during a period from Time T01 to Time T05. This timing chart also shows the amount of changes in a current $\Sigma I[i, j]$, a current $\Sigma I[i, j+1]$, and a current $I_{Bref}$. Note that the current $\Sigma I[i, j]$ is the summation of current I[i, j] over i from 1 to m. Here, the current I[i, j] is current flowing in the transistor Tr12 in the memory cell AM[i, j]. The current $\Sigma I[i, j+1]$ is the summation of current I[i, j+1] over i from 1 to m. Here, the current I[i, j+1] is current flowing in the transistor Tr12 in the memory cell AM[i, j+1]. In the timing chart of FIG. 38, the potentials of the wirings ORP, OSP, ORM, and OSM are constantly low-level potentials (not shown).

The timing chart in FIG. 39 shows the operation during a period after Time T05, which is shown in the timing chart in FIG. 38, and shows the changes in potentials during a period from Time T06 to Time T11 of the wirings ORP, OSP, ORM, and OSM. Note that in the period from Time T06 to Time T11, the potentials of the wiring WW[i], the wiring WW[i+1], the wiring WD[j], the wiring WD[j+1], the wiring WDref, the node N[i, j], the node N[i, j+1], the node N[i+1, j], the node N[i+1, j+1], the node Nref[i], the node Nref[i+1], the wiring RW[i], and the wiring RW[i+1] and the amounts of the current $\Sigma I[i, j]$, the current $\Sigma I[i, j+1]$, and the current $I_{Bref}$ are not changed; thus, the changes in the potentials of the wirings and the nodes and in the currents are not shown in FIG. 39.

The timing chart in FIG. 40 shows the operation during a period after Time T11, which is shown in the timing chart in FIG. 39, and shows the changes in potentials of the node N[i, j], the node N[i, j+1], the node N[i+1, j], the node N[i+1, j+1], the node Nref[i], the node Nref[i+1], the wiring RW[i], and the wiring RW[i+1] and the amounts of the current $\Sigma I[i, j]$, the current $\Sigma I[i, j+1]$, and the current $I_{Bref}$ during a period from Time T12 to Time T17. Note that each of the potentials of the wirings WW[i], WW[i+1], ORP, OSP, ORM, and OSM remains the low-level potential, and each of the potentials of the wirings WD[j], WD[j+1], and WDref remains a ground potential; thus, the potential changes in the wirings WW[i], WW[i+1], WD[j], WD[j+1], WDref, ORP, OSP, ORM, and OSM are not shown in the timing chart in FIG. 40. The timing chart in FIG. 40 also shows the changes in the current $\Delta I_B[j]$ and the current $\Delta I_B[j+1]$, which will be described later.

<<Period from Time T01 to Time T02>>

During a period from Time T01 to Time T02, the high-level potential (denoted by High in FIG. 38) is supplied to the wiring WW[i], and the low-level potential (denoted by Low in FIG. 38) is supplied to the wiring WW[i+1]. Furthermore, a potential higher than the ground potential (denoted by GND in FIG. 38) by $V_{PR}-V_X[i, j]$ is supplied to the wiring WD[j], a potential higher than the ground potential by $V_{PR}-V_X[i, j+1]$ is supplied to the wiring WD[j+1], and a potential higher than the ground potential by $V_{PR}$ is supplied to the wiring WDref. Moreover, a reference potential (denoted by REFP in FIG. 38) is supplied to the wiring RW[i] and the wiring RW[i+1].

The potential $V_X[i, j]$ and the potential $V_X[i, j+1]$ each correspond to the first analog data. The potential $V_{PR}$ corresponds to the reference analog data.

In this period, the high-level potential is supplied to the gates of the transistors Tr11 in the memory cell AM[i, j], the memory cell AM[i, j+1], and the memory cell AMref[i]; accordingly, the transistors Tr11 in the memory cell AM[i, j], the memory cell AM[i, j+1], and the memory cell AMref[i] are turned on. Thus, in the memory cell AM[i, j], the wiring WD[j] and the node N[i, j] are electrically connected to each other, and the potential of the node N[i, j] is $V_{PR}-V_X[i, j]$. Similarly, in the memory cell AM[i, j+1], the wiring WD[j+1] and the node N[i, j+1] are electrically connected to each other, and the potential of the node N[i, j+1] is $V_{PR}-V_X[i, j+1]$. In the memory cell AMref[i], the wiring WDref and the node Nref[i] are electrically connected to each other, and the potential of the node Nref[i] is $V_{PR}$.

The current flowing from the first to second terminal of the transistor Tr12 in each of the memory cell AM[i, j], the memory cell AM[i, j+1], and the memory cell AMref[i] will be described. The current $I_0[i, j]$ flowing from the wiring B[j] to the second terminal of the transistor Tr12 through the first terminal thereof in the memory cell AM[i, j] can be expressed by the following formula.

[Formula 9]

$$I_0[i,j]=k(V_{PR}-V_X[i,j]-V_{th})^2 \quad (E1)$$

In the formula, k is a constant determined by the channel length, the channel width, the mobility, the capacitance of a gate insulating film, and the like of the transistor Tr12. Furthermore, $V_{th}$ is the threshold voltage of the transistor Tr12.

At this time, the current flowing from the output terminal OT[j] of the column output circuit OUT[j] to the wiring B[j] is $I_0[i, j]$.

Similarly, the current $I_0[i, j+1]$ flowing from the wiring B[j+1] to the second terminal of the transistor Tr12 through the first terminal thereof in the memory cell AM[i, j+1] can be expressed by the following formula.

[Formula 10]

$$I_0[i,j+1]=k(V_{PR}-V_X[i,j+1]-V_{th})^2$$

At this time, the current flowing from the output terminal OT[j+1] of the column output circuit OUT[j+1] to the wiring B[j+1] in the memory cell AM[i, j+1] is $I_0[i, j+1]$.

The current $I_{ref0}[i]$ flowing from the wiring Bref to the second terminal of the transistor Tr12 through the first terminal thereof in the memory cell AMref[i] can be expressed by the following formula.

[Formula 11]

$$I_{ref\,0}[i] = k(V_{PR} - V_{th})^2 \quad (E2)$$

At this time, the current flowing from the output terminal OTref of the reference column output circuit Cref to the wiring Bref is $I_{ref0}[i]$.

Note that since the low-level potential is supplied to the gates of the transistors Tr11 in the memory cell AM[i+1, j], the memory cell AM[i+1, j+1], and the memory cell AMref[i+1], the transistors Tr11 in the memory cell AM[i+1, j], the memory cell AM[i+1, j+1], and the memory cell AMref[i+1] are turned off. Thus, the potentials are not held at the node N[i+1, j], the node N[i+1, j+1], and the node Nref[i+1].

<<Period from Time T02 to Time T03>>

During a period from Time T02 to Time T03, the low-level potential is supplied to the wiring WW[i]. At this time, the low-level potential is supplied to the gates of the transistors Tr11 in the memory cell AM[i, j], the memory cell AM[i, j+1], and the memory cell AMref[i], and accordingly, the transistors Tr11 in the memory cells AM[i, j], AM[i, j+1], and AMref[i] are turned off.

The low-level potential has been supplied to the wiring WW[i+1] continuously since before Time T02. Thus, the transistors Tr11 in the memory cell AM[i+1, j], the memory cell AM[i+1, j+1], and the memory cell AMref[i+1] have been kept in an off state since before Time T02.

Since the transistors Tr11 in the memory cell AM[i, j], the memory cell AM[i, j+1], the memory cell AM[i+1, j], the memory cell AM[i+1, j+1], the memory cell AMref[i], and the memory cell AMref[i+1] are each in an off state as described above, the potentials at the node N[i, j], the node N[i, j+1], the node N[i+1, j], the node N[i+1, j+1], the node Nref[i], and the node Nref[i+1] are held in the period from Time T02 to Time T03.

In particular, when an OS transistor is used as each of the transistors Tr11 in the memory cell AM[i, j], the memory cell AM[i, j+1], the memory cell AM[i+1, j], the memory cell AM[i+1, j+1], the memory cell AMref[i], and the memory cell AMref[i+1] as mentioned in the description of the circuit configuration of the product-sum operation circuit 700, the amount of leakage current flowing between the source and the drain of each of the transistors Tr11 can be made small, which makes it possible to hold the potentials at the nodes for a long time.

During the period from Time T02 to Time T03, the ground potential is supplied to the wiring WD[j], the wiring WD[j+1], and the wiring WDref. Since the transistors Tr11 in the memory cell AM[i, j], the memory cell AM[i, j+1], the memory cell AM[i+1, j], the memory cell AM[i+1, j+1], the memory cell AMref[i], and the memory cell AMref[i+1] are each in an off state, the potentials held at the nodes in the memory cell AM[i, j], the memory cell AM[i, j+1], the memory cell AM[i+1, j], the memory cell AM[i+1, j+1], the memory cell AMref[i], and the memory cell AMref[i+1] are not rewritten by supplying potentials from the wiring WD[j], the wiring WD[j+1], and the wiring WDref.

<<Period from Time T03 to Time T04>>

During a period from Time T03 to Time T04, the low-level potential is supplied to the wiring WW[i], and the high-level potential is supplied to the wiring WW[i+1]. Furthermore, a potential higher than the ground potential by $V_{PR} - V_X[i+1, j]$ is supplied to the wiring WD[j], a potential higher than the ground potential by $V_{PR} - V_X[i+1, j+1]$ is supplied to the wiring WD[j+1], and the potential higher than the ground potential by $V_{PR}$ is supplied to the wiring WDref. Moreover, the reference potential has continuously been supplied to the wiring RW[i] and the wiring RW[i+1] since Time T02.

Note that the potential $V_X[i+1, j]$ and the potential $V_X[i+1, j+1]$ are each a potential corresponding to the first analog data.

In this period, the high-level potential is supplied to the gates of the transistors Tr11 in the memory cell AM[i+1, j], the memory cell AM[i+1, j+1], and the memory cell AMref[i+1], and accordingly, the transistors Tr11 in the memory cell AM[i+1, j], the memory cell AM[i+1, j+1], and the memory cell AMref[i+1] are each turned on. Thus, in the memory cell AM[i+1, j], the node N[i+1, j] and the wiring WD[j] are electrically connected to each other, and the potential of the node N[i+1, j] becomes $V_{PR} - V_X[i+1, j]$. Similarly, in the memory cell AM[i+1, j+1], the wiring WD[j+1] and the node N[i+1, j+1] are electrically connected to each other, and the potential of the node N[i+1, j+1] becomes $V_{PR} - V_X[i+1, j+1]$. In the memory cell AMref[i+1], the wiring WDref and the node Nref[i+1] are electrically connected to each other, and the potential of the node Nref[i+1] becomes $V_{PR}$.

The current flowing from the first to second terminal of the transistor Tr12 in each of the memory cell AM[i+1, j], the memory cell AM[i+1, j+1], and the memory cell AMref[i+1] is considered. The current $I_0[i+1, j]$ flowing from the wiring B[j] to the second terminal of the transistor Tr12 through the first terminal thereof in the memory cell AM[i+1, j] can be expressed by the following formula.

[Formula 12]

$$I_0[i+1,j] = k(V_{PR} - V_X[i+1,j] - V_{th})^2$$

At this time, the current flowing from the output terminal OT[j] to the column output circuit OUT[j] to the wiring B[j] is $I_0[i,j] + I_0[i+1, j]$.

Similarly, the current $I_0[i+1, j+1]$ flowing from the wiring B[j+1] to the second terminal of the transistor Tr12 through the first terminal thereof in the memory cell AM[i+1, j+1] can be expressed by the following formula.

[Formula 13]

$$I_0[i+1,j+1] = k(V_{PR} - V_X[i+1,j+1] - V_{th})^2$$

At this time, the current flowing from the output terminal OT[j+1] to the column output circuit OUT[j+1] to the wiring B[j+1] is $I_0[i, j+1] + I_0[i+1, j+1]$.

The current $I_{ref0}[i+1]$ flowing from the wiring Bref to the second terminal of the transistor Tr12 through the first terminal thereof in the memory cell AMref[i+1] can be expressed by the following formula.

[Formula 14]

$$I_{ref\,0}[i+1] = k(V_{PR} - V_{th})^2$$

At this time, the current flowing from the output terminal OTref of the reference column output circuit Cref to the wiring Bref is $I_{ref0}[i] + I_{ref0}[i+1]$.

<<Period from Time T04 to Time T05>>

During a period from Time T04 to Time T05, the potential corresponding to the first analog data is written to the rest of the memory cells AM, and the potential $V_{PR}$ is written to the rest of memory cells AMref, in a manner similar to that of the operation during the period from Time T01 to Time T02 or that of the operation during the period from Time T03 to Time T04. Thus, the total amount of currents flowing in the transistors Tr12 in all of the memory cells AM corresponds to the amount of current flowing from the output terminal OT[j] of the column output circuit OUT[j] to the wiring B[j] that is denoted by $\Sigma I_0[i,j]$ ($\Sigma I_0[i,j]$ represents the summation of the current $I_0[i,j]$ over i from 1 to m).

Here, the description will be made with a focus on the reference column output circuit Cref. The wiring OLref of the reference column output circuit Cref is electrically connected to the wiring Bref via the output terminal OTref; thus, current flowing through the wiring Bref is current flowing through the wiring OLref. The total amount of current flowing through the transistors Tr12 in the memory cells AMref[1] to AMref[m] flows into the wiring Bref That is, the current $I_{Bref}$, which is the current $\Sigma I_{ref0}[i]$, flows into the wiring Bref (here, $\Sigma I_{ref0}[i]$ is the summation of $I_{ref0}[i]$ over i from 1 to m); thus, the current also flows through the wiring OLref. In the current mirror circuit CM, the current is output in the direction from the first terminal of the transistor Tr9 to the node NCMref in accordance with the potential of the node NCMref.

Although the current flowing through the wiring ILref is denoted by $I_{CMref}$ in FIG. 36, the current flowing through the wiring ILref before Time T09 is denoted by $I_{CMref0}$ in this specification.

Thus, the current $I_{CMref0}$ flowing through the wiring ILref can be expressed by the following formula.

[Formula 15]

$$I_{CMref0} = I_{Bref} = \sum_i I_{ref0}[i] \qquad (E3)$$

Note that since the potential of the gate of the transistor Tr9 (the potential of the node NCMref) is used as a reference in the current mirror circuit CM, the current $I_{CMref0}$ also flows in the wirings IL[1] to IL[n] of the column output circuits OUT[1] to OUT[n].

<<Period from Time T06 to Time T07>>

A period from Time T06 to Time T11 will be described with reference to FIG. 39. During a period from Time T06 to Time T07, the wiring ORP is set at the high-level potential, and the wiring ORM is set at the high-level potential. At this time, the high-level potential is supplied to the gates of the transistors Tr3 in the column output circuits OUT[1] to OUT[n], so that the transistors Tr3 are turned on. Thus, the low-level potential is supplied to the first terminals of the capacitors C1 in the column output circuits OUT[1] to OUT[n], and thus the potentials of the capacitors C1 are initialized. Moreover, the high-level potential is supplied to the gates of the transistors Tr23 in the column output circuits OUT[1] to OUT[n], so that the transistors Tr23 are turned on. Thus, the high-level potential is supplied to the first terminals of the capacitors C3 in the column output circuits OUT[1] to OUT[n], and thus the potentials of the capacitors C3 are initialized. At Time T06, the low-level potential is supplied to the wiring OSP, so that the transistors Tr2 in the column output circuits OUT[1] to OUT[n] are turned off, and the low-level potential is supplied to the wiring OSM, so that the transistors Tr22 in the column output circuits OUT[1] to OUT[n] are turned off.

<<Period from Time T07 to Time T08>>

During a period from Time T07 to Time T08, the wirings ORP and ORM are each set at the low-level potential. At this time, the low-level potential is supplied to the gates of the transistors Tr3 in the column output circuits OUT[1] to OUT[n], so that the transistors Tr3 are turned off. Furthermore, the low-level potential is supplied to the gates of the transistors Tr23 in the column output circuits OUT[1] to OUT[n], so that the transistors Tr23 are turned off.

<<Period from Time T08 to Time T09>>

During a period from Time T08 to Time T09, the wiring OSP is set at the high-level potential. At this time, the high-level potential is supplied to the gates of the transistors Tr2 in the column output circuits OUT[1] to OUT[n], so that the transistors Tr2 are turned on. The current $I_B[j]$ output from the column output circuit OUT[j] is $\Sigma I_0[i, j]$ (here, $\Sigma I_0[i, j]$ is the summation of $I_0[i,j]$ over i from 1 to m). When the current $I_{CMref0}$ is larger than the current $I_B[j]$, current flows into the first terminals of the capacitors C1 from the first terminals of the transistors Tr2 through the second terminals of the transistors Tr2, and positive potentials are held in the capacitors C1. Thus, the potentials of the gates of the transistors Tr1 are held, so that the current depending on the potential of the gate of each of the transistors Tr1 flows between the source and the drain of the transistor Tr1.

At Time T09, the low-level potential is supplied to the wiring OSP, so that the transistors Tr2 in the column output circuits OUT[1] to OUT[n] are turned off. The potentials of the gates of the transistors Tr1 are held in the capacitors C1, so that even after Time T09, the same amount of current keeps flowing between the source and the drain of each of the transistors Tr1.

<<Period from Time T10 to Time T11>>

During a period from Time T10 to Time T11, the wiring OSM is set at the high-level potential. At this time, the high-level potential is supplied to the gates of the transistors Tr22 in the column output circuits OUT[1] to OUT[n], so that the transistors Tr22 are turned on. The current h[j] output from the column output circuit OUT[j] is $\Sigma I_0[i, j]$ (here, $\Sigma I_0[i, j]$ is the summation of $I_0[i, j]$ over i from 1 to m). When the current $I_{CMref0}$ is smaller than the current h[j], the current flows into the first terminals of the transistors Tr22 from the first terminals of the capacitors C3 through the second terminals of the transistors Tr22, and potentials are held in the capacitors C3. Thus, the potentials of the gates of the transistors Tr21 are held, so that the current depending on the potential of the gate of each of the transistors Tr21 flows between the source and the drain of the transistor Tr21.

At Time T11, the low-level potential is supplied to the wiring OSM, so that the transistors Tr22 in the column output circuits OUT[1] to OUT[n] are turned off. The potentials of the gates of the transistors Tr21 are held in the capacitors C3, so that even after Time T11, the same amount of current keeps flowing between the source and the drain of each of the transistors Tr21.

Note that in the timing chart in FIG. 39, the operation for switching the conducting and non-conducting states of the transistor Tr2 (during the period from Time T08 to Time T09) is performed before the operation for switching the conducting and non-conducting states of the transistor Tr22 (during the period from Time T10 to Time T11); however, the order of the operations of the offset circuit 751 is not limited thereto. For example, the operation for switching the conducting and non-conducting states of the transistor Tr22 (during the period from Time T10 to Time T11) may be performed first, and then the operation for switching the conducting and non-conducting states of the transistor Tr2 (during the period from Time T08 to Time T09) may be performed.

Here, the description will be made with a focus on the column output circuit OUT[j] during a period from Time T06 to Time T12 (shown in FIG. 40). In the column output circuit OUT[j], the current flowing between the source and the drain of the transistor Tr1 is denoted by $I_{CP}[j]$, and the current flowing between the source and the drain of the transistor Tr21 of the constant current circuit CI (current flowing from the terminal CT2 to the terminal CT5[j]) is denoted by $I_C[j]$. The current flowing between the source and the drain of the transistor Tr8 through the current mirror circuit CM is $I_{CMref0}$. On the assumption that the current is not output from the output terminal SPT[j] during the period from Time T01 to Time T12, the sum of the amounts of current flowing through each of the transistors Tr12 in the memory cells AM[1, j] to AM[m, j] flows in the wiring B[j] electrically connected to the column output circuit OUT[j]. During the period from Time T06 to Time T12, in the column output circuit OUT[j], the current $I_{CMref0}$ that is input is different from $\Sigma I_0[i, j]$ that is output, the current $I_C[j]$ flowing from the second terminal of the transistor Tr21 is supplied to the wiring OL[j], or the current $I_{CP}[j]$ flowing from the wiring OL[j] is supplied to the first terminal of the transistor Tr1. Thus, the above satisfies the following formula.

[Formula 16]

$$I_{CMref0} + I_C[j] - I_{CP}[j] = \sum_i I_0[i, j] \qquad (E4)$$

<<Period from Time T12 to Time T13>>

The operation after Time T12 will be described with reference to FIG. 40. During a period from Time T12 to Time T13, a potential higher than the reference potential (denoted by REFP in FIG. 40) by $V_W[i]$ is supplied to the wiring RW[i]. At this time, the potential $V_W[i]$ is supplied to the second terminals of the capacitors C2 in the memory cells AM[i, 1] to AM[i, n] and the memory cell AMref[i], so that the potentials of the gates of the transistors Tr12 increase.

Note that the potential $V_W[i]$ is a potential corresponding to the second analog data.

An increase in the potential of the gate of the transistor Tr12 corresponds to the potential obtained by multiplying a change in potential of the wiring RW[i] by a capacitive coupling coefficient determined by the memory cell configuration. The capacitive coupling coefficient is calculated on the basis of the capacitance of the capacitor C2, the gate capacitance of the transistor Tr12, and the parasitic capacitance. In this operation example, to avoid complexity of description, an increase in potential of the wiring RW[i] is equal to an increase in potential of the gate of the transistor Tr12, which corresponds to a case where the capacitive coupling coefficient in each of the memory cells AM and the memory cell AMref is set to 1.

When the potential $V_W[i]$ is supplied to the second terminals of the capacitors C2 in the memory cell AM[i, j], the memory cell AM[i, j+1], and the memory cell AMref[i] on the assumption that the capacitive coupling coefficient is 1, the potentials of the node N[i, j], the node N[i, j+1], and the node Nref[i] each increase by $V_W[i]$.

The current flowing from the first to second terminal of the transistor Tr12 in each of the memory cell AM[i, j], the memory cell AM[i, j+1], and the memory cell AMref[i] will be described. The current I[i, j] flowing from the wiring B[j] to the second terminal of the transistor Tr12 through the first terminal thereof in the memory cell AM[i, j] can be expressed by the following formula.

[Formula 17]

$$I[i,j]=k(V_{PR}-V_X[i,j]+V_W[i]-V_{th})^2 \qquad (E5)$$

In other words, by supplying the potential $V_W[i]$ to the wiring RW[i], the current flowing from the wiring B[j] to the second terminal of the transistor Tr12 through the first terminal thereof in the memory cell AM[i, j] increases by $I[i,j]-I_0[i, j]$ (denoted by M[i, j] in FIG. 40).

Similarly, the current I[i, j+1] flowing from the wiring B[j+1] to the second terminal of the transistor Tr12 through the first terminal thereof in the memory cell AM[i, j+1] can be expressed by the following formula.

[Formula 18]

$$I[i,j+1]=k(V_{PR}-V_X[i,j+1]+V_W[i]-V_{th})^2$$

In other words, by supplying the potential $V_W[i]$ to the wiring RW[i], the current flowing from the wiring B[j+1] to the second terminal of the transistor Tr12 through the first terminal thereof in the memory cell AM[i, j+1] increases by $I[i, j+1]-I_0[i, j+1]$ (denoted by $\Delta I[i, j+1]$ in FIG. 40).

Furthermore, the current $I_{ref}[i]$ flowing from the wiring Bref to the second terminal of the transistor Tr12 through the first terminal thereof in the memory cell AMref[i] can be expressed by the following formula.

[Formula 19]

$$I_{ref}[i]=k(V_{PR}+V_W[i]-V_{th})^2 \qquad (E6)$$

In other words, by supplying the potential $V_W[i]$ to the wiring RW[i], the current flowing from the wiring Bref to the second terminal of the transistor Tr12 through the first terminal thereof in the memory cell AMref[i] increases by $I_{ref}[i]-I_{ref0}[i]$ (denoted by $\Delta I_{ref}[i]$ in FIG. 40).

Here, the description will be made with a focus on the reference column output circuit Cref. The total amount of current flowing through the transistors Tr12 in the memory cells AMref[1] to AMref[m] flows into the wiring Bref. The wiring OLref is electrically connected to the wiring Bref via the output terminal OTref, and thus the current $I_{Bref}$ which is the current $\Sigma I_{ref}[i]$, flows through the wiring OLref. In the current mirror circuit CM, the current is output in the direction from the first terminal of the transistor Tr9 to the node NCMref in accordance with the potential of the node NCMref.

Thus, the current $I_{CMref}$ flowing from the wiring ILref through the terminal CT8 in the current mirror circuit CM can be expressed by the following formula.

[Formula 20]

$$I_{CMref} = \sum_i I_{ref}[i] \qquad (E7)$$

Here, the current $\Delta I_B[j]$ that is output from the output terminal SPT[j] electrically connected to the wiring B[j] will be described. During a period from Time T11 to Time T12, Formula 16 (E4) is satisfied, and the current $\Delta I_B[j]$ is not output from the output terminal SPT[j] that is electrically connected to the wiring B[j].

During the period from Time T12 to Time T13, a potential higher than the reference potential by $V_W[i]$ is supplied to the wiring RW[i], and the current flowing between the source and the drain of the transistor Tr12 in the memory cell AM[i, j] changes. Then, the current $\Delta I_B[j]$ is output from the output terminal SPT[j] that is electrically connected to wiring B[j]. Specifically, in the column output circuit OUT [j], the current $I_C[j]$ is output from the terminal CT2 of the constant current circuit CI, the current $I_{CMref}$ flows between the source and the drain of the transistor Tr8, and the current $I_{CP}[j]$ flows between the source and the drain of the transistor Tr1. Thus, the current $\Delta I_B[j]$ can be expressed by the following formula using $\Sigma I[i, j]$, which is the summation of current $I[i, j]$ over i from 1 to m. Here, the current $I[i, j]$ is current flowing between the source and the drain of the transistor Tr12 in the memory cell AM[i, j].

[Formula 21]

$$\Delta I_B[j] = (I_C[j] + I_{CMref} - I_{CP}[j]) - \sum_i I[i, j] \qquad (E8)$$

Formulae 9, 11, 15, 16, 17, 19, and 20 (E1 to E7) are used in Formula 21 (E8), so that the following formula can be obtained.

[Formula 22]

$$\Delta I_B[j] = 2k \sum_i (V_X[i, j]V_W[i]) \qquad (E9)$$

That is, according to Formula 22 (E9), the current $\Delta I_B[j]$ is a value corresponding to the sum of products of the potential $V_X[i, j]$ that is the first analog data and the potential $V_W[i]$ that is the second analog data. That is, when the current $\Delta I_B[j]$ is calculated, the value of the sum of products of the first analog data and the second analog data can be obtained.

During the period from Time T12 to Time T13, when all of the wirings RW[1] to RW[m] except the wiring RW[i] are set at a reference potential, $V_W[g]$ is equal to 0 (here, g is an integer that is greater than or equal to 1 and less than or equal to m and not i). Thus, according to Formula 22 (E9), $\Delta I_B[j]=2kV_X[i, j]V_W[i]$ is output. In other words, the data corresponding to the product of the first analog data stored in the memory cell AM[i, j] and the second analog data corresponding to a selection signal supplied to the wiring RW[i] is output from the output terminal SPT[j] that is electrically connected to the wiring B[j].

Furthermore, similarly, a differential current that is output from the output terminal SPT[j+1] electrically connected to the wiring B[j+1] is expressed as $\Delta I_B[j+1]=2kV_X[i, j+1]V_W[i]$. The data corresponding to the product of the first analog data stored in the memory cell AM[i, j+1] and the second analog data corresponding to a selection signal supplied to the wiring RW[i] is output from the output terminal SPT[j+1] that is electrically connected to the wiring B[j+1].

<<Period from Time T13 to Time T14>>

During a period from Time T13 to Time T14, the ground potential is supplied to the wiring RW[i]. The ground potential is supplied to the second terminals of the capacitors C2 in the memory cells AM[i, 1] to AM[i, n] and the memory cell AMref[i]. Thus, the potentials of the nodes N[i, 1] to N[i, n] and the node Nref[i] return to the potentials during the period from Time T11 to Time T12.

<<Period from Time T14 to Time T15>>

During a period from Time T14 to Time T15, the wirings RW[1] to RW[m] except the wiring RW[i+1] are set at the reference potential, and a potential higher than the reference potential by $V_W[i+1]$ is supplied to the wiring RW[i+1]. At this time, as in the operation during the period from Time T12 to Time T13, the potential $V_W[i+1]$ is supplied to the second terminals of the capacitors C2 in the memory cells AM[i+1, 1] to AM[i+1, n] and the memory cell AMref[i+1], so that the potentials of the gates of the transistors Tr12 increase.

The potential $V_W[i+1]$ corresponds to the second analog data.

As described above, the capacitive coupling coefficients of the memory cells AM and the memory cell AMref are each 1. When the potential $V_W[i+1]$ is supplied to the second terminals of the capacitors C2 in the memory cell AM[i+1, j], the memory cell AM[i+1, j+1], and the memory cell AMref[i+1], the potentials of the node N[i+1, j], the node N[i+1, j+1], and the node Nref[i+1] each increase by $V_W[i+1]$.

When the potentials of the node N[i+1, j], the node N[i+1, j+1], and the node Nref[i+1] increase by $V_W[i+1]$, the amount of current flowing in each of the transistors Tr12 in the memory cell AM[i+1, j], the memory cell AM[i+1, j+1], and the memory cell AMref[i+1] increases. When the current flowing in the transistor Tr12 in the memory cell AM[i+1, j] is denoted by I[i+1, j], the current flowing from the output terminal OT[j] of the column output circuit OUT[j] to the wiring B[j] increases by $I[i+1, j]-I_0[i+1, 1]$ (denoted by $\Delta I[i+1, j]$ in FIG. 40). Similarly, when the current flowing in the transistor Tr12 in the memory cell AM[i+1, j+1] is denoted by I[i+1, j+1], the current flowing from the output terminal OT[j+1] of the column output circuit OUT[j+1] to the wiring B[j+1] increases by $I[i+1, j+1]-I_0[i+1, j+1]$ (denoted by $\Delta I[i+1, j+1]$ in FIG. 40). When the current flowing in the transistor Tr12 in the memory cell AMref[i+1] is denoted by $I_{ref}[i+1]$, the current flowing from the output terminal OTref of the reference column output circuit Cref to the wiring Bref increases by $I_{ref}[i+1]-I_{ref0}[i+1]$ (denoted by $\Delta I_{ref}[i+1]$ in FIG. 40).

The operation during the period from Time T14 to Time T15 can be similar to the operation during the period from Time T12 to Time T13. Thus, when Formula 22 (E9) is applied to the operation during the period from Time T14 to Time T15, the differential current that is output from the wiring B[j] is expressed as $\Delta I_B[j]=2kV_X[i+1, j]V_W[i+1]$. In other words, the data corresponding to the product of the first analog data stored in the memory cell AM[i+1, j] and the second analog data corresponding to a selection signal supplied to the wiring RW[i+1] is output from the output terminal SPT[j] that is electrically connected to the wiring B[j].

Furthermore, similarly, the differential current that is output from the wiring B[j+1] is expressed as $\Delta I_B[j+1]=2kV_X[i+1, j+1]V_W[i+1]$. The data corresponding to the product of the first analog data stored in the memory cell AM[i+1, j+1] and the second analog data corresponding to a selection signal supplied to the wiring RW[i+1] is output from the output terminal SPT[j+1] that is electrically connected to the wiring B[j+1].

<<Period from Time T15 to Time T16>>

During a period from Time T15 to Time T16, the ground potential is supplied to the wiring RW[i+1]. In this period, the ground potential is supplied to the second terminals of the capacitors C2 in the memory cells AM[i+1, 1] to AM[i+1, n] and the memory cell AMref[i+1], and the potentials of nodes N[i+1, 1] to N[i+1, n] and the node Nref[i+1] return to the potentials in the period from Time T13 to Time T14.

<<Period from Time T16 to Time T17>>

During a period from Time T16 to Time T17, the wirings RW[1] to RW[m] except the wiring RW[i] and the wiring RW[i+1] are set at the reference potential, a potential higher than the reference potential by $V_{W2}[i]$ is supplied to the wiring RW[i], and a potential lower than the reference potential by $V_{W2}[i+1]$ is supplied to the wiring RW[i+1]. At this time, as in the operation during the period from Time T12 to Time T13, the potential $V_{W2}[i]$ is supplied to the second terminals of the capacitors C2 in the memory cells AM[i, 1] to AM[i, n] and the memory cell AMref[i], so that potentials of the gates of the transistors Tr12 in the memory cells AM[i, 1] to AM[i, n] and the memory cell AMref[i] increase. Concurrently, the potential $-V_{W2}[i+1]$ is supplied to the second terminals of the capacitors C2 in the memory cells AM[i+1, 1] to AM[i+1, n] and the memory cell AMref[i+1], so that the potentials of the gates of the transistors Tr12 in the memory cells AM[i+1, 1] to AM[i+1, n] and the memory cell AMref[i+1] decrease.

The potential $V_{W2}[i]$ and the potential $V_{W2}[i+1]$ are potentials each corresponding to the second analog data.

Note that the capacitive coupling coefficients of the memory cell AM and the memory cell AMref are each 1. When the potential $V_{W2}[i]$ is supplied to the second terminals of the capacitors C2 in the memory cell AM[i, j], the memory cell AM[i, j+1], and the memory cell AMref[i], the potentials of the node N[i,j], the node N[i, j+1], and the node Nref[i] each increase by $V_{W2}[i]$. When the potential $-V_{W2}[i+1]$ is supplied to the second terminals of the capacitors C2 in the memory cell AM[i+1, j], the memory cell AM[i+1, j+1], and the memory cell AMref[i+1], the potentials of the node N[i+1, j], the node N[i+1, j+1], and the node Nref[i+1] each decrease by $V_{W2}[i+1]$.

When each of the potentials of the node N[i, j], the node N[i, j+1], and the node Nref[i] increases by $V_{W2}[i]$, the amount of current flowing in each of the transistors Tr12 in the memory cell AM[i, j], the memory cell AM[i, j+1], and the memory cell AMref[i] increases. Here, the current flowing in the transistor Tr12 in the memory cell AM[i, j] is denoted by I[i,j], the current flowing in the transistor Tr12 in the memory cell AM[i, j+1] is denoted by I[i, j+1], and the current flowing in the transistor Tr12 in the memory cell AMref[i] is denoted by $I_{ref}[i]$.

When the potentials of the node N[i+1, j], the node N[i+1, j+1], and the node Nref[i+1] each decrease by $V_{W2}[i+1]$, the amount of current flowing in each of the transistors Tr12 in the memory cell AM[i+1, j], the memory cell AM[i+1, j+1], and the memory cell AMref[i+1] decreases. Here, the current flowing in the transistor Tr12 in the memory cell AM[i+1, j] is denoted by $I_2[i, j]$, the current flowing in the transistor Tr12 in the memory cell AM[i+1, j+1] is denoted by $I_2[i, j+1]$, and the current flowing in the transistor Tr12 in the memory cell AMref[i+1] is denoted by $I_{2ref}[i+1]$.

At this time, the current flowing from the output terminal OT[j] of the column output circuit OUT[j] to the wiring B[j] increases by $(I_2[i, j]-I_0[i, j])+(I_2[i+1, j]-I_0[i+1, j])$ (denoted by $\Delta I[j]$ in FIG. 40). The current flowing from the output terminal OT[j+1] of the column output circuit OUT[j+1] to the wiring B[j+1] increases by $(I_2[i, j+1]-I_0[i, j+1])+(I_2[i+1, j+1]-I_0[i+1, j+1])$ (denoted by $\Delta I[j+1]$ in FIG. 40, which is a negative current). The current flowing from the output terminal OTref of the reference column output circuit Cref to the wiring Bref increases by $(I_{2ref}[i, j]-I_{ref0}[i, j])+(I_{2ref}[i+1, j]-I_{ref0}[i+1, j])$ (denoted by $\Delta I_{Bref}$ in FIG. 40).

The operation during the period from Time T16 to Time T17 can be similar to the operation during the period from Time T12 to Time T13. When Formula 22 (E9) is applied to the operation during the period from Time T16 to Time T17, the differential current that is output from the wiring B[j] is expressed as $\Delta I_B[j]=2k\{V_X[i, j]V_{W2}[i]-V_X[i+1, j]V_{W2}[i+1]\}$. Thus, the data corresponding to the sum of products of the first analog data stored in each of the memory cell AM[i, j] and the memory cell AM[i+1, j] and the second analog data corresponding to a selection signal supplied to each of the wiring RW[i] and the wiring RW[i+1] is output from the output terminal SPT[j] that is electrically connected to the wiring B[j].

Furthermore, similarly, the differential current that is output from the wiring B[j+1] is expressed as $\Delta I_B[j+1]=2k\{V_X[i, j+1]V_{W2}[i]-V_X[i+1, j+1]V_{W2}[i+1]\}$. The data corresponding to the product of the first analog data stored in each of the memory cell AM[i, j+1] and the memory cell AM[i+1, j+1] and the second analog data corresponding to a selection signal supplied to each of the wiring RW[i] and the wiring RW[i+1] is output from the output terminal SPT[j+1] that is electrically connected to the wiring B[j+1].

<<After Time T17>>

After Time T17, the ground potential is supplied to the wiring RW[i] and the wiring RW[i+1]. At this time, the ground potential is supplied to the second terminals of the capacitors C2 in the memory cells AM[i, 1] to AM[i, n], the memory cells AM[i+1, 1] to AM[i+1, n], the memory cell AMref[i], and the memory cell AMref[i+1]. Thus, the potentials of the nodes N[i, 1] to N[i, n], the nodes N[i+1, 1] to N[i+1, n], the node Nref[i], and the node Nref[i+1] return to the potentials in the period from Time T15 to Time T16.

When the circuit illustrated in FIG. 30 is used as the product-sum operation circuit included in each of the programmable logic elements PLE[1] to PLE[m] of the NN circuit 100, a high-speed product-sum operation can be achieved.

Here, the first analog data serve as weight coefficients and the second analog data correspond to neuron outputs, whereby calculation of the weighted sums of the neuron outputs can be conducted concurrently. Thus, data corresponding to results of the calculation of the weighted sums, that is, synapse inputs can be obtained as the output signals. Specifically, weight coefficients $w_{s[k]\cdot 1}^{(k)}$ to $w_{s[k]\cdot Q[k-1]}^{(k)}$ of the s[k]-th neuron in the k-th layer are stored as the first analog data in the memory cells AM[1, j] to AM[m, j] and output signals $z_{1 \cdot s[k]}^{(k-1)}$ to $z_{Q[k-1] \cdot s[k]}^{(k-1)}$ of the neurons in the (k−1)-th layer are supplied as the second analog data to the wirings RW[1] to RW[m], whereby the summation $u_{s[k]}^{(k)}$ of signals inputted to the s[k]-th neuron in the k-th layer can be obtained. That is, the product-sum operation expressed by Formula 3 (D1) can be performed with the product-sum operation circuit 700.

In the case where weight coefficients are updated in supervised learning, weight coefficients $w_{1 \cdot s[k]}^{(k+1)}$ to $w_{Q[k+1]s[k]}^{(k+1)}$ multiplied when a signal is transmitted from the s[k]-th neuron in the k-th layer to neurons in the (k+1)-th layer are stored as the first analog data in the memory cells AM[1, j] to AM[m, j] and errors $\delta_1^{(k+1)}$ to $\delta_{Q[k+1]}^{(k+1)}$ of the neurons in the (k+1)-th layer are supplied as the second analog data to the wirings RW[1] to RW[m], whereby a value of $\Sigma w_{s[k+1] \cdot s[k]}^{(k+1)} \cdot \delta_{s[k+1]}^{(k+1)}$ in Formula 5 (D3) can be obtained from the differential current $\Delta I_B[j]$ flowing through the wiring B[j]. That is, part of the operation expressed by Formula 5 (D3) can be performed with the product-sum operation circuit 700.

When the product-sum operation circuit described above is used for the hidden layer of the hierarchical neural network, the weight coefficient $w_{s[k]s[k-1]}^{(k)}$ is the first analog data stored in the memory cell AM[i, j]; the output signal $z_{s[k-1]}^{(k-1)}$ from the s[k−1]-th neuron in the (k−1)-th layer is a potential (second analog data) supplied from the wiring RW[i]; and a signal with modification (corresponding to an output function) based on a current output to the wiring B[j]

of the product-sum operation circuit is the output signal $z_{s[k]}^{(k)}$ of the s[k]-th neuron in the k-th layer.

In addition, when the product-sum operation circuit described above is used for the hidden layer of the hierarchical neural network, the weight coefficient $w_{s[L]s[L-1]}^{(L)}$ is the first analog data stored in the memory cell AM[i, j]; the output signal $z_{s[L-1]}^{(L-1)}$ from the s[L-1]-th neuron in the (L-1)-th layer is a potential (second analog data) supplied from the wiring RW[i]; and a signal with modification (corresponding to an output function) based on a current output to the wiring B[j] of the product-sum operation circuit is the output signal $z_{s[L]}^{(L)}$ of the s[L]-th neuron in the L-th layer.

Note that the input layer of the hierarchical neural network may function as a buffer circuit that outputs an input signal to the second layer.

Note that the memory cell array 720 illustrated in FIG. 30, the memory cell array 721 illustrated in FIG. 35, and the memory cell array 760 illustrated in FIG. 37 can each be used as the memory cell array 720 in FIGS. 13 to 16. In that case, a filter value of a weight filter is stored as the first analog data in each of the memory cells AM, and image data is supplied as the second analog data to each of the wirings RW, whereby the product-sum operation of the convolutional operation in a CNN can be performed. In the case where a plurality of weight filters are used for the convolutional operation, filter values of the filters are stored in the memory cells AM in the respective columns. Accordingly, a plurality of filter operations can be performed in parallel, and feature extraction can be performed at high speed.

Note that this embodiment can be combined with any of the other embodiments in this specification as appropriate.

Embodiment 5

In this embodiment, a specific structure example of a display device including the semiconductor device described in any of the above embodiments will be described. Specifically, a display device in which a liquid crystal element is used as a display element will be described here.

<Structure Example 1 of Display Device>

Figure 41:
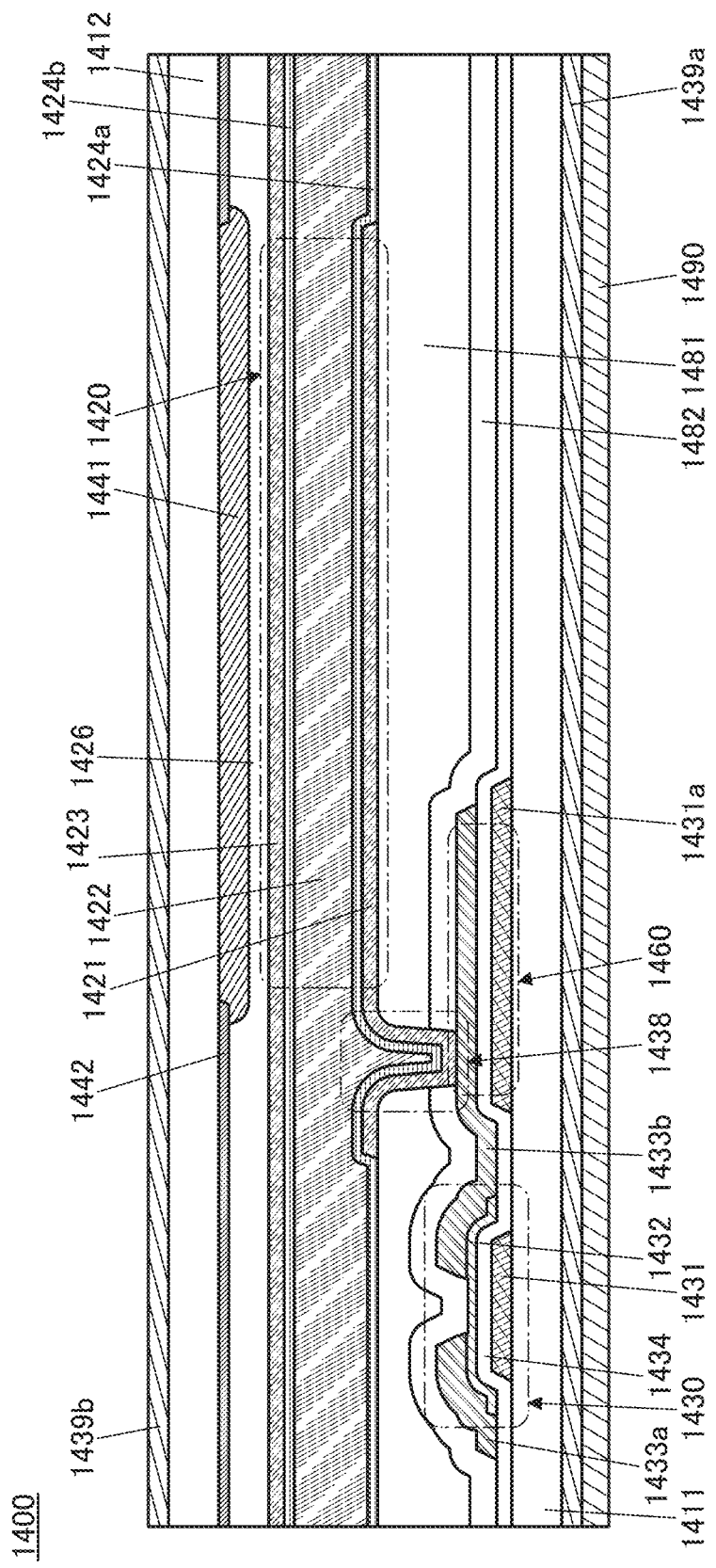
FIG. 41 illustrates a structure example of a display device.

FIG. 41 illustrates an example of a cross-sectional structure of a display device 1400. An example where a transmissive liquid crystal element 1420 is used as a display element is described here. In FIG. 41, the substrate 1412 side is the display surface side.

In the display device 1400, a liquid crystal 1422 is provided between a substrate 1411 and the substrate 1412. The liquid crystal element 1420 includes a conductive layer 1421 provided on the substrate 1411 side, a conductive layer 1423 provided on the substrate 1412 side, and the liquid crystal 1422 provided between the conductive layers 1421 and 1423. Furthermore, an alignment film 1424a is provided between the liquid crystal 1422 and the conductive layer 1421 and an alignment film 1424b is provided between the liquid crystal 1422 and the conductive layer 1423.

The conductive layer 1421 functions as a pixel electrode. The conductive layer 1423 functions as a common electrode or the like. The conductive layer 1421 and the conductive layer 1423 each have a function of transmitting visible light. Thus, the liquid crystal element 1420 is a transmissive liquid crystal element.

A coloring layer 1441 and a light-blocking layer 1442 are provided on a surface of the substrate 1412 on the substrate 1411 side. An insulating layer 1426 is provided to cover the coloring layer 1441 and the light-blocking layer 1442, and the conductive layer 1423 is provided to cover the insulating layer 1426. The coloring layer 1441 is provided in a region overlapping with the conductive layer 1421. The light-blocking layer 1442 is provided to cover a transistor 1430 and a connection portion 1438.

A polarizing plate 1439a is located outward from the substrate 1411, and a polarizing plate 1439b is located outward from the substrate 1412. Furthermore, a backlight unit 1490 is located outward from the polarizing plate 1439a. The display surface of the display device 1400 illustrated in FIG. 41 is on the substrate 1412 side.

The transistor 1430, a capacitor 1460, and the like are provided over the substrate 1411. The transistor 1430 functions as a selection transistor of a pixel. The transistor 1430 is connected to the liquid crystal element 1420 through the connection portion 1438.

The transistor 1430 illustrated in FIG. 41 is what is called a channel-etched bottom-gate transistor. The transistor 1430 includes a conductive layer 1431 functioning as a gate electrode, an insulating layer 1434 functioning as a gate insulating layer, a semiconductor layer 1432, and a pair of conductive layers 1433a and 1433b functioning as a source electrode and a drain electrode. A region of the semiconductor layer 1432 overlapping with the conductive layer 1431 functions as a channel formation region. The semiconductor layer 1432 is connected to the conductive layers 1433a and 1433b.

The capacitor 1460 includes a conductive layer 1431a, the insulating layer 1434, and the conductive layer 1433b.

An insulating layer 1482 and an insulating layer 1481 are stacked to cover the transistor 1430 and the like. The conductive layer 1421 functioning as a pixel electrode is provided over the insulating layer 1481. In the connection portion 1438, the conductive layer 1421 is electrically connected to the conductive layer 1433b through an opening in the insulating layers 1481 and 1482. The insulating layer 1481 preferably functions as a planarization layer. The insulating layer 1482 preferably functions as a protective film that inhibits diffusion of impurities or the like to the transistor 1430 and the like. The insulating layer 1482 can be formed using an inorganic insulating material, and the insulating layer 1481 can be formed using an organic insulating material, for example.

<Structure Example 2 of Display Device>

Figure 42:
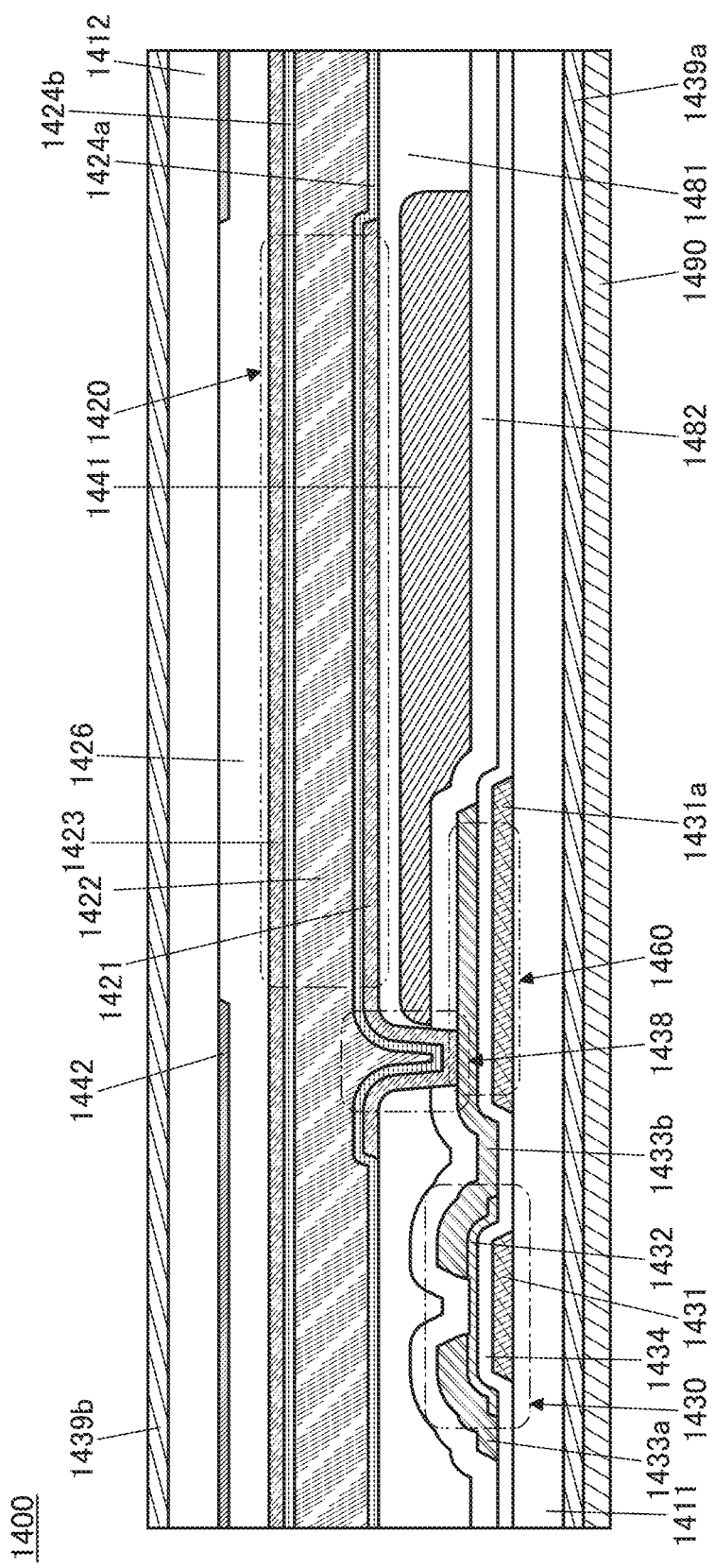
FIG. 42 illustrates a structure example of a display device.

FIG. 42 illustrates an example where the coloring layer 1441 is provided on the substrate 1411 side. Thus, the structure on the substrate 1412 side can be simplified.

Note that in the case where the coloring layer 1441 is a planarization film, the insulating layer 1481 is not necessarily provided.

<Structure Example 3 of Display Device>

In each of the above examples, a vertical electric field mode liquid crystal element in which a pair of electrodes are provided over and under a liquid crystal is used as the liquid crystal element: the structure of the liquid crystal element is not limited thereto and any of a variety of liquid crystal elements can be used.

Figure 43:
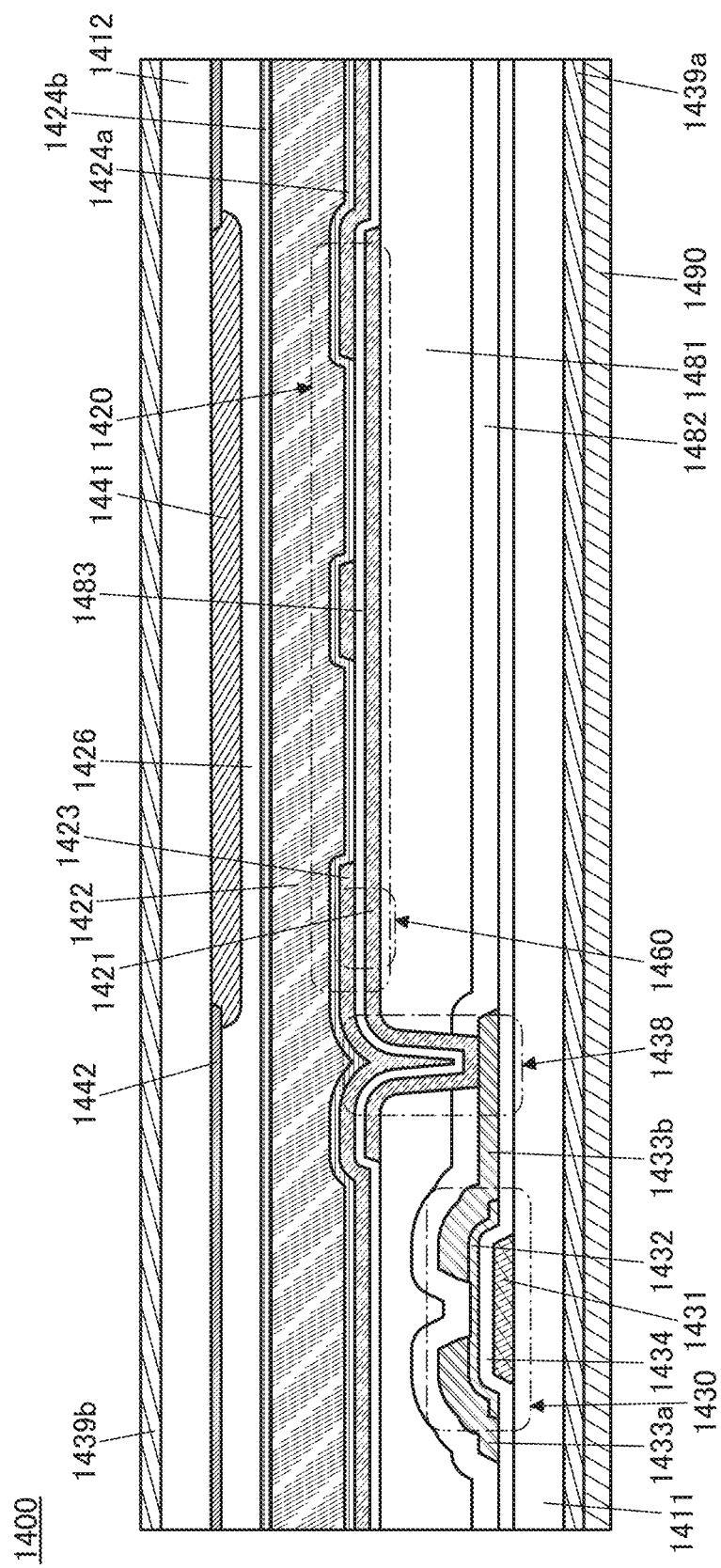
FIG. 43 illustrates a structure example of a display device.

FIG. 43 is a schematic cross-sectional view of a display device including a liquid crystal element using a fringe field switching (FFS) mode.

The liquid crystal element 1420 includes the conductive layer 1421 functioning as a pixel electrode and the conductive layer 1423 overlapping with the conductive layer 1421 with an insulating layer 1483 provided therebetween. The conductive layer 1423 has a slit-like or comb-like top surface.

In such a structure, a capacitor, which can be used as the capacitor 1460, is formed in a region where the conductive layer 1421 and the conductive layer 1423 overlap with each other. Thus, the area occupied by a pixel can be reduced, leading to a high-resolution display device.

Figure 44:
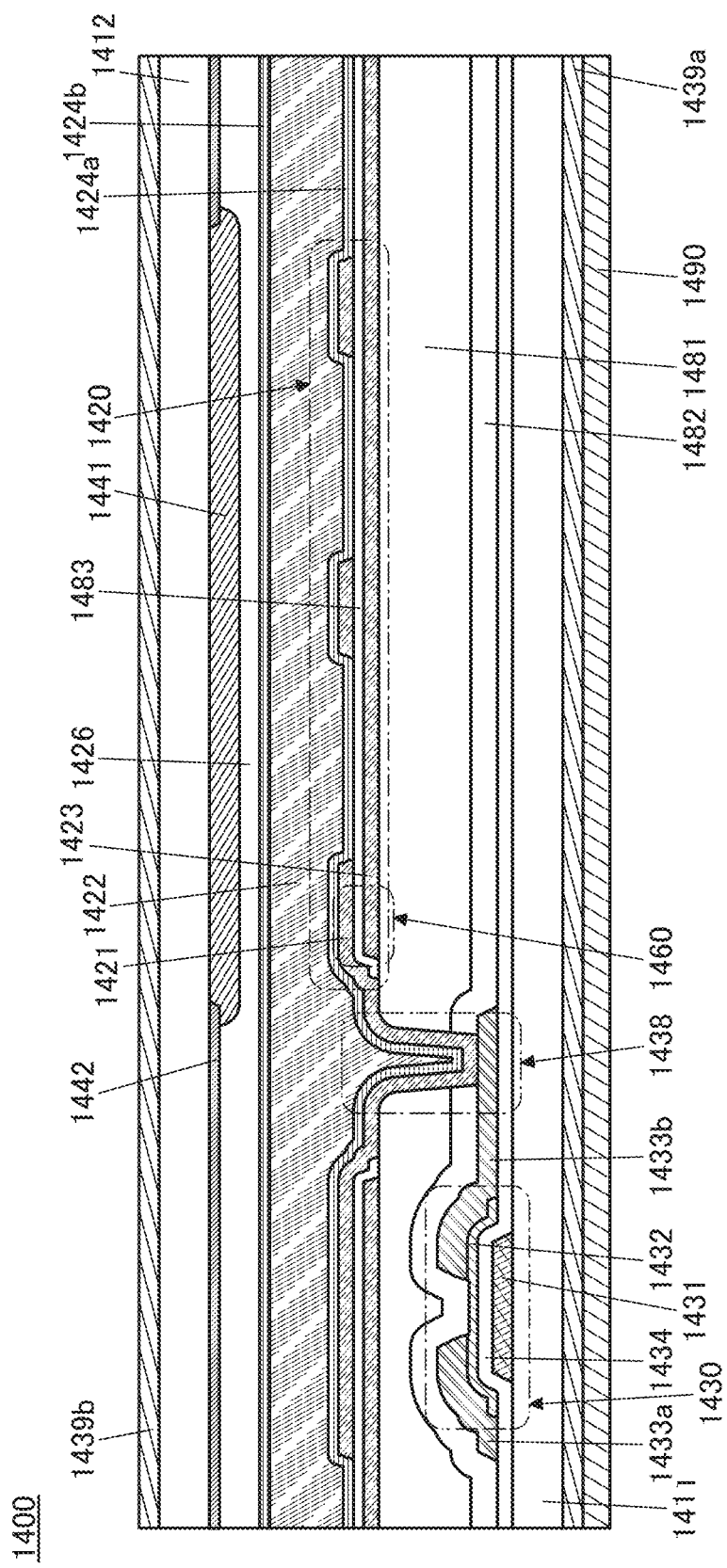
FIG. 44 illustrates a structure example of a display device.

Although FIG. 43 illustrates the structure in which the conductive layer 1423 functioning as a common electrode is on the liquid crystal 1422 side, a structure in which the conductive layer 1421 functioning as a pixel electrode is on the liquid crystal 1422 side may be employed as illustrated in FIG. 44. In such a structure, the conductive layer 1421 has a slit-like or comb-like top surface.

Here, the smaller the number of photolithography steps in a manufacturing process of a display device is, i.e., the smaller the number of photomasks is, the lower the manufacturing cost can be.

For example, the display device having the structure illustrated in FIG. 41 can be manufactured through five photolithography steps, i.e., a formation step of the conductive layer 1431 and the like, a formation step of the semiconductor layer 1432, a formation step of the conductive layer 1433a and the like, a formation step of the opening to be the connection portion 1438, and a formation step of the conductive layer 1421, among steps on the substrate 1411 side. That is, a back plane substrate can be manufactured with five photomasks. On the other hand, on the substrate 1412 (counter substrate) side, an ink-jet method, a screen printing method, or the like is preferably used as the formation methods of the coloring layer 1441 and the light-blocking layer 1442, in which case a photomask becomes unnecessary. For example, in the case where three-color coloring layers 1441 and the light-blocking layer 1442 are provided, four photomasks can be reduced compared with the case where these are formed by a photolithography process.

<Structure Example of Transistor>

Next, a specific structure example of the transistor 1430 will be described. A semiconductor containing silicon can be used for the semiconductor layer 1432 of the transistor described below. For example, hydrogenated amorphous silicon, microcrystalline silicon, or polycrystalline silicon can be used as the semiconductor containing silicon. Hydrogenated amorphous silicon is particularly preferable because it can be formed over a large substrate with a high yield. The display device of one embodiment of the present invention can display an image favorably even when a transistor containing amorphous silicon that has relatively low field-effect mobility is used.

Figure 45A:
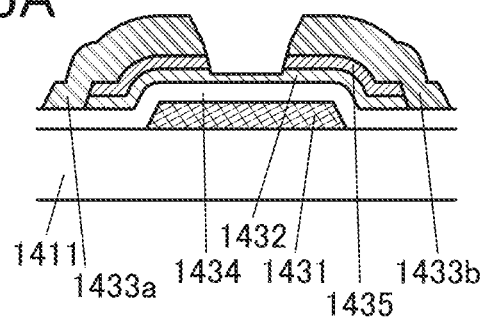
FIGS. 45A to 45G each illustrate a structure example of a transistor.

A transistor illustrated in FIG. 45A includes a pair of impurity semiconductor layers 1435 functioning as a source region and a drain region. The impurity semiconductor layers 1435 are provided between the semiconductor layer 1432 and each of the conductive layers 1433a and 1433b. The semiconductor layer 1432 and the impurity semiconductor layers 1435 are provided in contact with each other. Each of the impurity semiconductor layers 1435 is provided in contact with the conductive layer 1433a or the conductive layer 1433b.

The impurity semiconductor film to form the impurity semiconductor layer 1435 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Note that the impurity semiconductor layer may be formed using an amorphous semiconductor or a crystalline semiconductor such as a microcrystalline semiconductor.

Figure 45B:
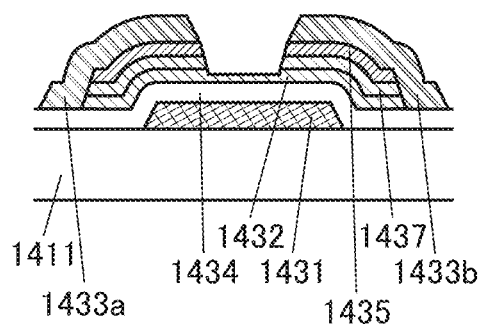

A transistor illustrated in FIG. 45B includes a semiconductor layer 1437 between the semiconductor layer 1432 and the impurity semiconductor layer 1435.

The semiconductor layer 1437 may be formed using the same semiconductor film as the semiconductor layer 1432. The semiconductor layer 1437 can function as an etching stopper for preventing the semiconductor layer 1432 from being removed at the time of etching of the impurity semiconductor layer 1435. Although FIG. 45A illustrates an example where the semiconductor layer 1437 is divided into a right portion and a left portion, part of the semiconductor layer 1437 may cover a channel formation region of the semiconductor layer 1432.

Furthermore, the semiconductor layer 1437 may contain an impurity at a concentration lower than the impurity semiconductor layer 1435. Thus, the semiconductor layer 1437 can function as a lightly doped drain (LDD) region and can inhibit hot-carrier degradation caused when the transistor is driven.

Figure 45C:
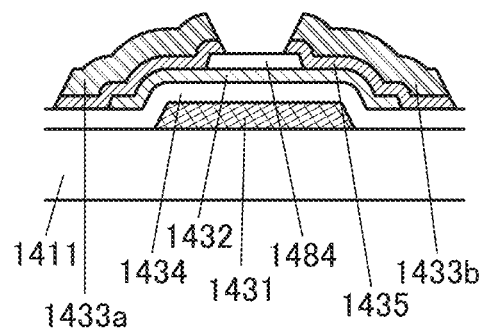

In a transistor illustrated in FIG. 45C, an insulating layer 1484 is provided over a channel formation region of the semiconductor layer 1432. The insulating layer 1484 functions as an etching stopper that prevents the semiconductor layer 1432 from being etched at the time of etching of the impurity semiconductor layer 1435.

Figure 45D:
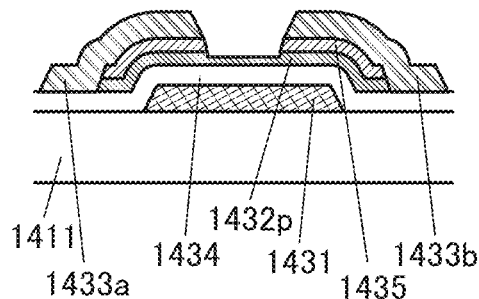

A transistor illustrated in FIG. 45D includes a semiconductor layer 1432p instead of the semiconductor layer 1432. The semiconductor layer 1432p includes a semiconductor film having high crystallinity. For example, the semiconductor layer 1432p includes a polycrystalline semiconductor or a single crystal semiconductor. Thus, a transistor having high field-effect mobility can be provided.

Figure 45E:
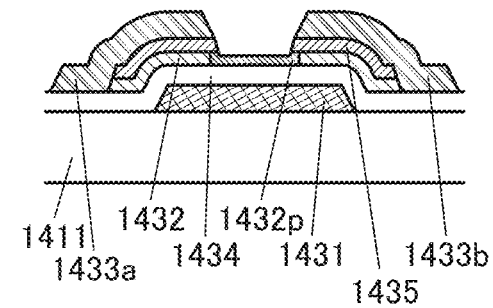

A transistor illustrated in FIG. 45E includes the semiconductor layer 1432p in a channel formation region of the semiconductor layer 1432. For example, the transistor illustrated in FIG. 45E can be formed by irradiating a semiconductor film to be the semiconductor layer 1432 with laser light or the like so that crystallization is caused locally. Thus, a transistor having high field-effect mobility can be provided.

Figure 45F:
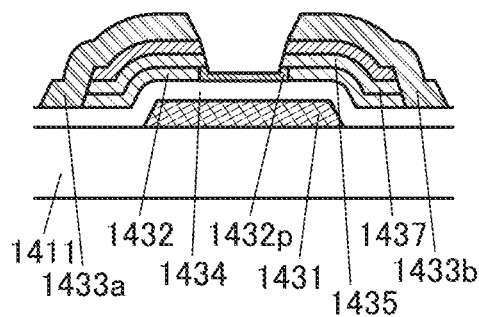

A transistor illustrated in FIG. 45F includes the semiconductor layer 1432p having crystallinity in a channel formation region of the semiconductor layer 1432 of the transistor illustrated in FIG. 45B.

Figure 45G:
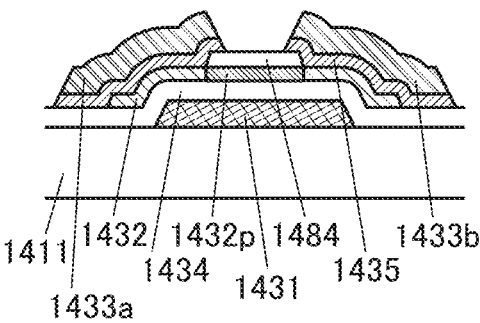

A transistor illustrated in FIG. 45G includes the semiconductor layer 1432p having crystallinity in a channel formation region of the semiconductor layer 1432 of the transistor illustrated in FIG. 45C.

<Components>

The above-described components will be described below.

[Substrate]

A material having a flat surface can be used as the substrate included in the display device. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility. Alternatively, glass or the like that is thin enough to have flexibility can be used as the substrate. Alternatively, a composite material where glass and a resin material are attached to each other with an adhesive layer may be used.

[Transistor]

The transistor includes a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be inhibited.

Silicon can be used as a semiconductor in which a channel of the transistor is formed, for example. It is particularly preferable to use amorphous silicon, in which case a transistor can be formed over a large substrate with a high yield, resulting in excellent mass productivity.

Furthermore, silicon having crystallinity such as microcrystalline silicon, polycrystalline silicon, or single-crystal silicon can be used. In particular, polycrystalline silicon can be formed at a lower temperature than single-crystal silicon and has higher field-effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In some cases, the top-gate transistor is particularly preferable when polycrystalline silicon, single-crystal silicon, or the like is employed.

[Conductive Layer]

As materials for the gates, the source, and the drain of a transistor, and the conductive layers functioning as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because it increases controllability of a shape by etching.

As a light-transmitting conductive material that can be used for the gate, source, and drain of the transistor and the conductive layers such as the wirings and electrodes included in the display device, a conductive oxide such as indium oxide, an indium tin oxide, an indium zinc oxide, zinc oxide, or zinc oxide to which gallium is added or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. In the case of using the metal material or the alloy material (or the nitride thereof), the thickness is set small enough to be able to transmit light. A stacked film of any of the above materials can be used for the conductive layers. For example, a stacked film of an indium tin oxide and an alloy of silver and magnesium is preferably used because it can increase the conductivity. They can also be used for conductive layers such as wirings and electrodes included in the display device, and conductive layers (e.g., a conductive layer functioning as a pixel electrode or a common electrode) included in a display element.

[Insulating Layer]

Examples of an insulating material that can be used for the insulating layers include a resin such as acrylic or epoxy resin, a resin having a siloxane bond such as silicone, and an inorganic insulating material such as silicon oxide, silicon oxynitride, silicon nitride oxide, silicon nitride, or aluminum oxide.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode can be used.

The liquid crystal element controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

Examples of the liquid crystal element include a transmissive liquid crystal element, a reflective liquid crystal element, and a semi-transmissive liquid crystal element.

In one embodiment of the present invention, a transmissive liquid crystal element is particularly suitable.

In the case where a transmissive or semi-transmissive liquid crystal element is used, two polarizing plates are provided such that a pair of substrates are sandwiched therebetween. Furthermore, a backlight is provided on the outer side of the polarizing plate. The backlight may be a direct-below backlight or an edge-light backlight. The direct-below backlight including a light-emitting diode (LED) is preferably used because local dimming is easily performed to improve contrast. The edge-light backlight is preferably used because the thickness of a module including the backlight can be reduced.

When the edge-light backlight is turned off, one embodiment of the present invention can be used as a see-through display.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure including a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Although the liquid crystal element is used as the display element of the display device described in this embodiment, a light-emitting element can also be used as the display element.

This embodiment can be combined with any of the other embodiments as appropriate.

Embodiment 6

In this embodiment, examples of a method of crystallization for polycrystalline silicon which can be used for a semiconductor layer of a transistor and a laser crystallization apparatus will be described.

To form polycrystalline silicon layers having favorable crystallinity, it is preferable that an amorphous silicon layer be provided over a substrate and crystallized by laser irradiation. For example, the substrate is moved while the amorphous silicon layer is irradiated with a linear laser beam, so that the polycrystalline silicon layers can be formed in desired regions over the substrate.

The throughput of the method using a linear beam is relatively preferable. On the other hand, the method tends to produce variations in crystallinity owing to a change in the output of laser light and a change in beam profile caused by the output change because the laser light is moved relative to a region and is emitted to the region a plurality of times. For example, when a semiconductor layer crystallized by the above method is used for a transistor included in a pixel of a display device, a random stripe pattern due to the variation in the crystallinity is seen in some cases at the time of displaying an image.

The length of the linear beam is ideally greater than or equal to the length of a side of the substrate; however, the length of the linear beam is limited by an output of a laser oscillator and the structure of an optical system. Thus, it is practical to irradiate a large substrate with the laser light by turning back the laser light in a substrate plane. Consequently, there is a region irradiated with the laser light a plurality of times. Since the crystallinity of such a region is likely to be different from that of the other region, display unevenness is sometimes caused in the region.

To avoid such a problem, an amorphous silicon layer formed over a substrate may be crystallized by local laser irradiation. Local laser irradiation easily forms polycrystalline silicon layers with small variation in crystallinity.

Figure 46A:
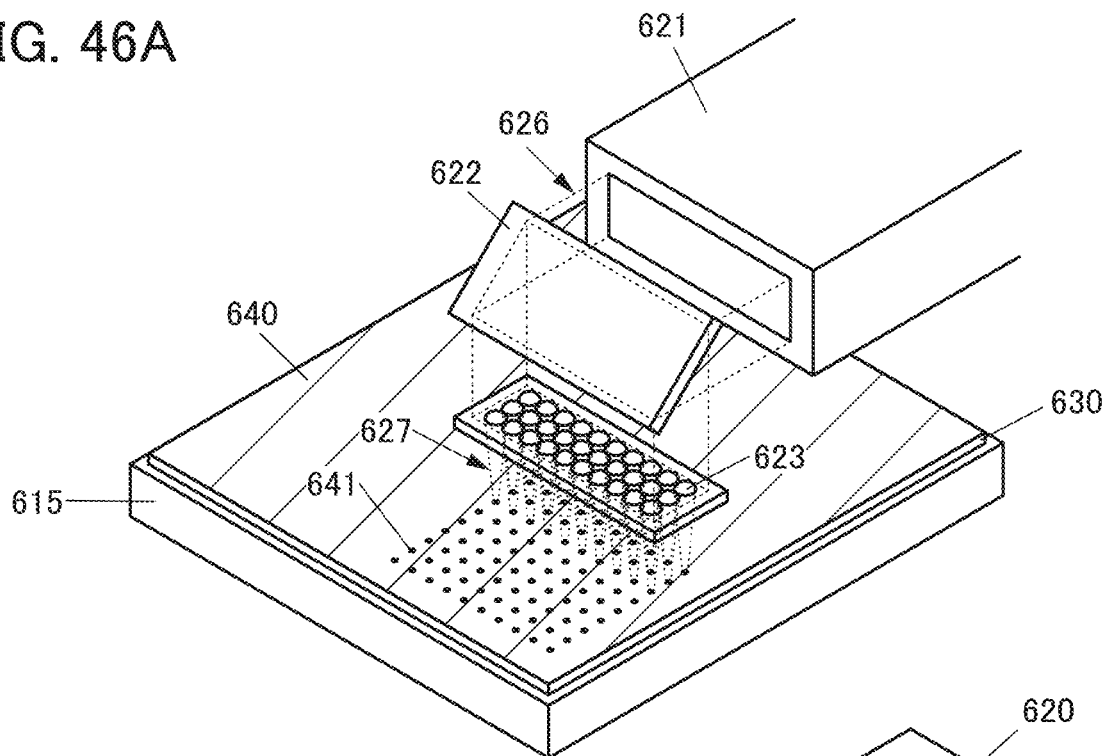
FIGS. 46A and 46B illustrate a laser irradiation method and a laser crystallization apparatus.

FIG. 46A illustrates a method of locally irradiating an amorphous silicon layer formed over a substrate with laser light.

Laser light 626 emitted from an optical system unit 621 is reflected by a mirror 622 and enters a microlens array 623. The microlens array 623 condenses the laser light 626 to form a plurality of laser beams 627.

A substrate 630 over which an amorphous silicon layer 640 is formed is fixed to a stage 615. The amorphous silicon layer 640 is irradiated with the plurality of laser beams 627, so that a plurality of polycrystalline silicon layers 641 can be formed at the same time.

Microlenses of the microlens array 623 are preferably provided with a pixel pitch of a display device. Alternatively, they may be provided at intervals of an integral multiple of the pixel pitch. In either of the cases, polycrystalline silicon layers can be formed in regions corresponding to all pixels by repeating laser irradiation and movement of the stage 615 in the X direction or the Y direction.

For example, when the microlens array 623 includes I rows and J columns (I and J are natural numbers) of microlenses arranged with a pixel pitch, laser irradiation is performed at a predetermined start position first, so that I rows and J columns of polycrystalline silicon layers 641 can be formed. Then, the stage 615 is moved by J columns in the row direction and laser irradiation is performed, so that I rows and J columns of polycrystalline silicon layers 641 can be further formed. Consequently, I rows and 2J columns of polycrystalline silicon layers 641 can be obtained. By repeating the steps, a plurality of polycrystalline silicon layers 641 can be formed in desired regions. In the case where laser irradiation is performed by turning back the laser light, the following steps are repeated: the stage 615 is moved by J columns in the row direction; laser irradiation is performed; the stage 615 is moved by I rows in the column direction; and laser irradiation is performed.

Note that even when a method of performing laser irradiation while the stage 615 is moved in one direction is employed, polycrystalline silicon layers can be formed with a pixel pitch by adjusting the oscillation frequency of the laser light and the moving speed of the stage 615 properly.

The size of the laser beam 627 can be an area in which an entire semiconductor layer of a transistor is included, for example. Alternatively, the size can be an area in which an entire channel region of a transistor is included. Further alternatively, the size can be an area in which part of a channel region of a transistor is included. The size can be selected from them depending on required electrical characteristics of a transistor.

Note that in the case of a display device including a plurality of transistors in a pixel, the size of the laser beam 627 can be an area in which an entire semiconductor layer of each transistor in a pixel is included. Alternatively, the size of the laser beam 627 may be an area in which entire semiconductor layers of transistors in a plurality of pixels are included.

Figure 47A:
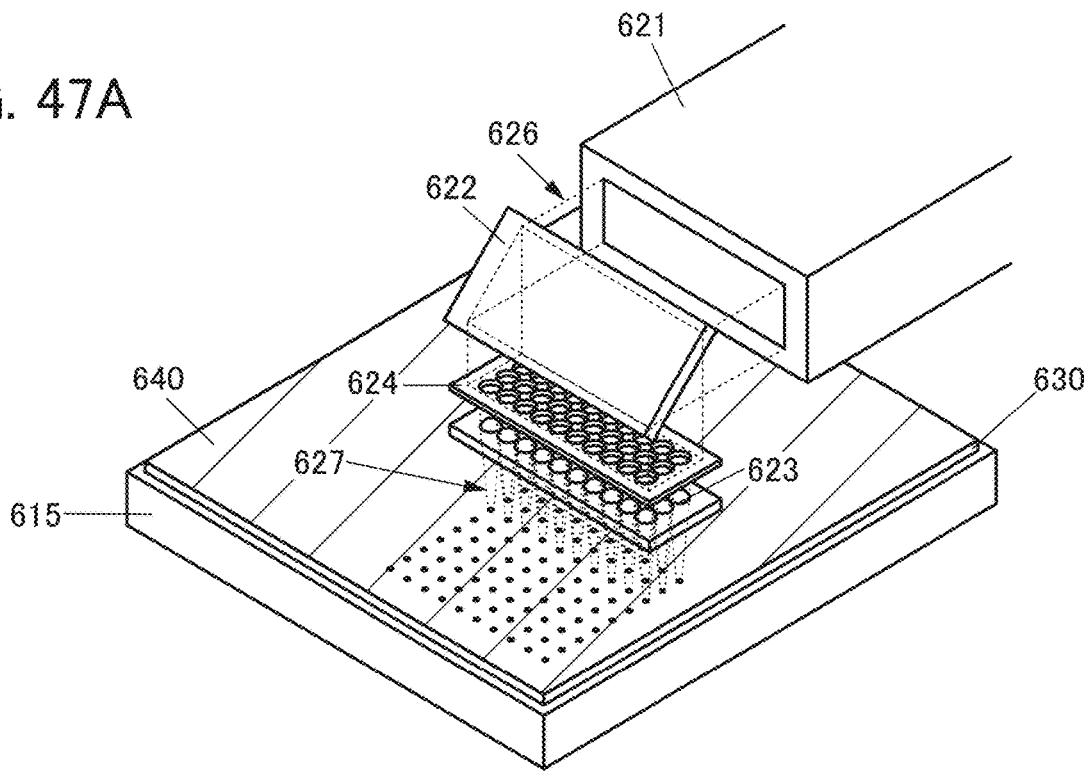
FIGS. 47A and 47B illustrate a laser irradiation method.
Figure 47B:
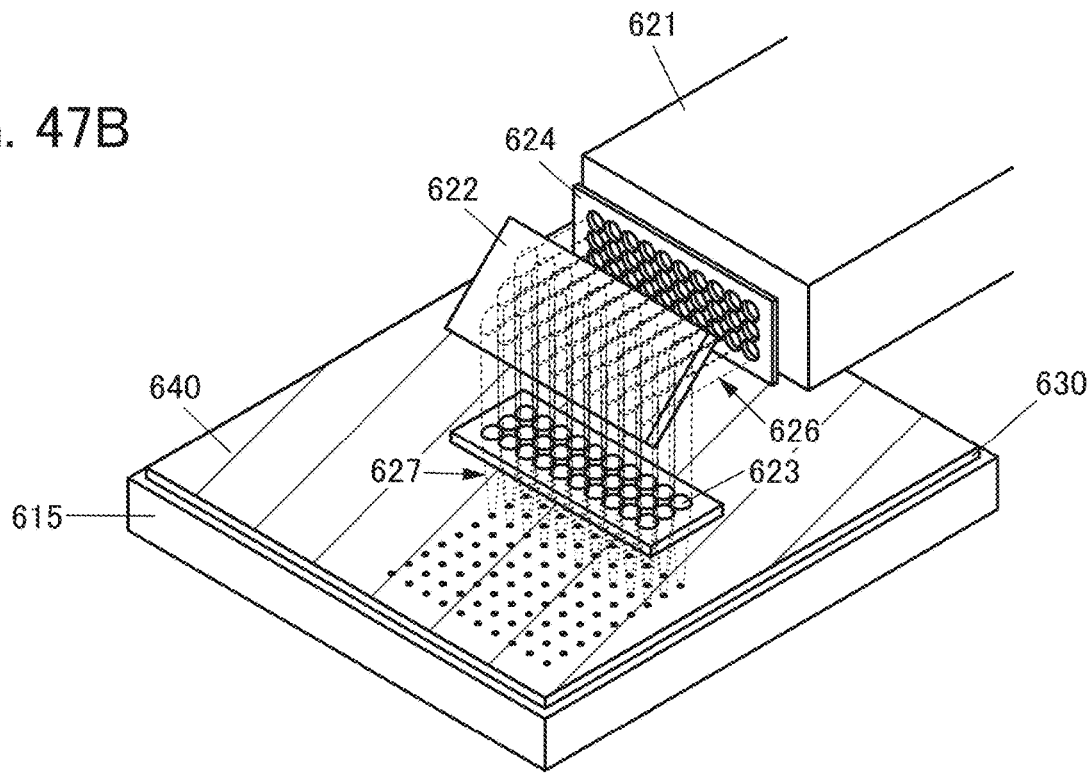

As illustrated in FIG. 47A, a mask 624 may be provided between the mirror 622 and the microlens array 623. The mask 624 includes a plurality of openings corresponding to respective microlenses. The shape of each opening can affect the shape of the laser beam 627; as illustrated in FIG. 47A, the laser beam 627 having a circular shape can be obtained in the case where the mask 624 includes circular openings. The laser beam 627 having a rectangular shape can be obtained in the case where the mask 624 includes rectangular openings. The mask 624 is effective in the case where only a channel region of a transistor is crystallized, for example. Note that the mask 624 may be provided between the optical system unit 621 and the mirror 622 as illustrated in FIG. 47B.

Figure 46B:
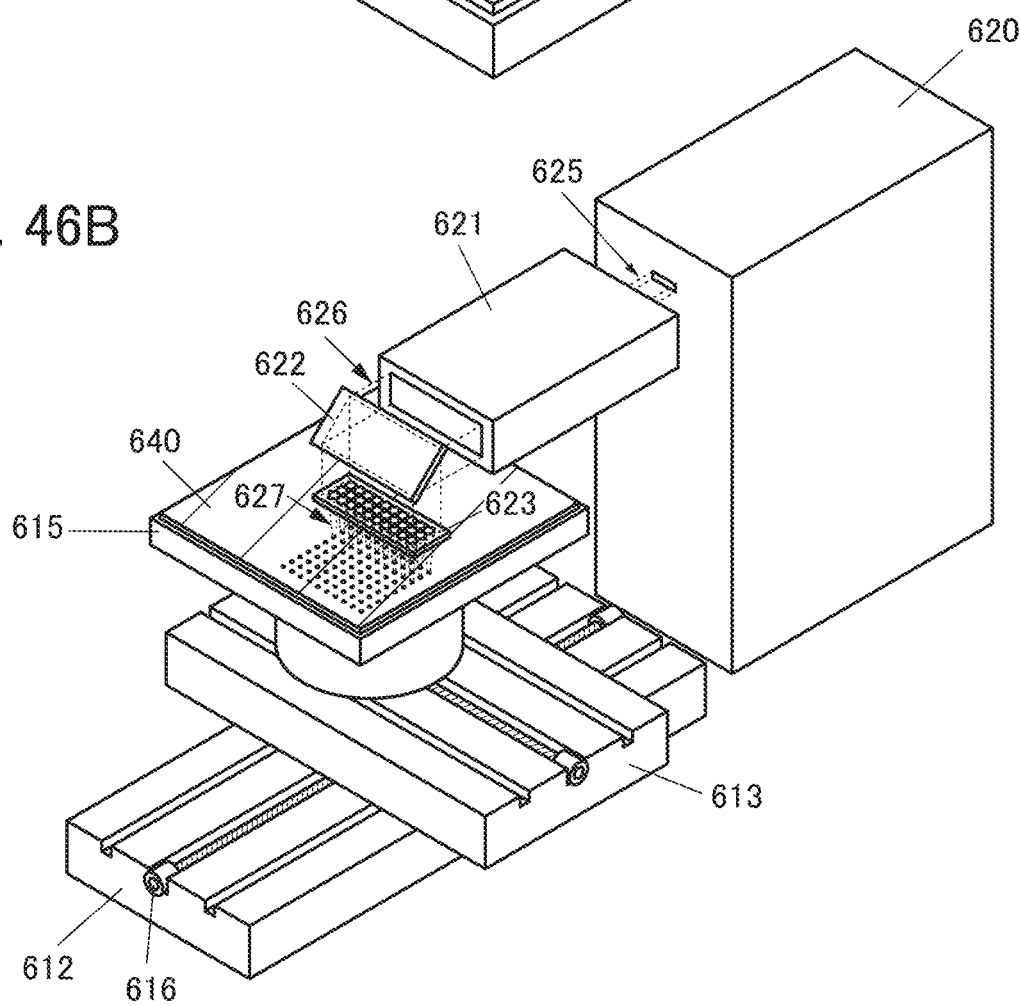

FIG. 46B is a perspective view illustrating a main structure of a laser crystallization apparatus which can be used in the above local laser irradiation step. The laser crystallization apparatus includes a moving mechanism 612, a moving mechanism 613, and the stage 615 which are components of an XY stage. The crystallization apparatus further includes a laser oscillator 620, the optical system unit 621, the mirror 622, and the microlens array 623 to shape the laser beam 627.

The moving mechanism 612 and the moving mechanism 613 each have a function of performing reciprocating linear motion in the horizontal direction. As a mechanism for powering the moving mechanism 612 and the moving mechanism 613, a ball screw mechanism 616 driven by a motor can be used, for example. The moving directions of the moving mechanism 612 and the moving mechanism 613 cross orthogonally; thus, the stage 615 fixed to the moving mechanism 613 can be moved in the X direction and in the Y direction freely.

The stage 615 includes a fixing mechanism such as a vacuum suction mechanism and can fix the substrate 630 or the like to itself. Furthermore, the stage 615 may include a heating mechanism as needed. Although not illustrated, the stage 615 may include a pusher pin and a vertical moving mechanism thereof, and the substrate 630 or the like can be moved up and down when being transferred.

The laser oscillator 620 is preferably a pulsed laser, but may be a CW laser as long as it outputs light with a wavelength and intensity suitable for the purpose of processing. Typically, an excimer laser that emits ultraviolet light with a wavelength of 351-353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser such as a YAG laser or a fiber laser may be used. A plurality of laser oscillators 620 may be provided.

The optical system unit 621 includes a mirror, a beam expander, a beam homogenizer, or the like, for example, and can homogenize and expand the energy in-plane distribution of the laser light 625 emitted from the laser oscillator 620.

As the mirror 622, a dielectric multilayer mirror can be used, for example, and is provided so that the incident angle of the laser light is substantially 45°. The microlens array 623 can have a shape such that a plurality of convex lenses are provided on the top surface or on the top and bottom surfaces of a quartz board, for example.

With the above-described laser crystallization apparatus, polycrystalline silicon layers with small variation in crystallinity can be formed.

This embodiment can be combined with any of the other embodiments as appropriate.

Embodiment 7

In this embodiment, a display element included in the display portion PA described in Embodiment 1 and Embodiment 3 will be described.

Figure 48A:
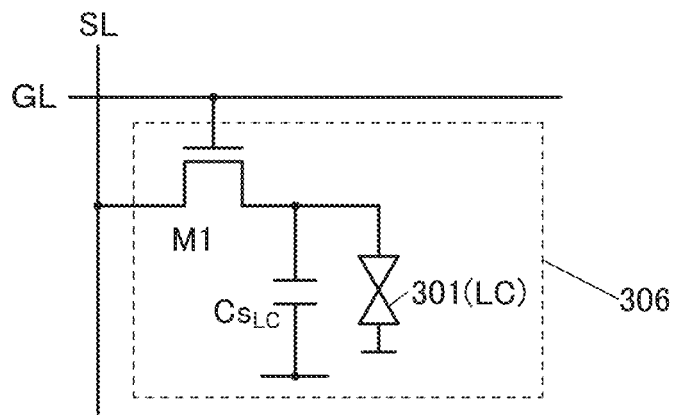
FIGS. 48A to 48D are circuit diagrams and timing charts illustrating a configuration example of a pixel circuit.

FIG. 48A illustrates a pixel circuit in which a liquid crystal element is used as a display element. A pixel circuit 306 includes a display element 301, a transistor M1, and a capacitor $C_{S_{LC}}$. Note that a first terminal and a second terminal of the display element 301 correspond to a pixel electrode and a common electrode, respectively. FIG. 48A also illustrates a signal line SL and a gate line GL that are electrically connected to the pixel circuit 306.

A first terminal of the transistor M1 is electrically connected to the first terminal of the display element 301. A second terminal of the transistor M1 is electrically connected to the signal line SL. A gate of the transistor M1 is electrically connected to the gate line GL. A first terminal of the capacitor $C_{S_{LC}}$ is electrically connected to the first terminal of the transistor M1.

The second terminal of the display element 301 is electrically connected to a wiring through which common potential that is used for driving the display element 301 is applied. In addition, a second terminal of the capacitor $C_{S_{LC}}$ is electrically connected to a wiring through which reference potential is applied.

An OS transistor is preferably used as the transistor M1. As a typical example of the transistor, a transistor including an oxide semiconductor which is a kind of metal oxide (OS transistor) will be described. The OS transistor has an extremely low leakage current in a non-conduction state (off-state current); therefore, by turning off the OS transistor, charge can be retained in a pixel electrode of the liquid crystal element.

Owing to the characteristics of the OS transistor, that is, an extremely low off-state current, a display device including the pixel circuit 306 can operate at a frame frequency lower than a normal frame frequency (typified by 60 Hz or higher and 240 Hz or lower). A normal driving mode (normal mode) with a normal frame frequency and an idling stop (IDS) driving mode with a low frame frequency will be described below, for example.

Note that the idling stop (IDS) driving mode refers to a driving method in which after image data is written, rewriting of image data is stopped. This increases the interval between writing of image data and subsequent writing of image data, thereby reducing the power that would be consumed by writing of image data in that interval. The idling stop (IDS) driving mode can be performed at a frame frequency, which is about 1/100 to 1/10 of that of the normal driving mode, for example.

Figure 48B:
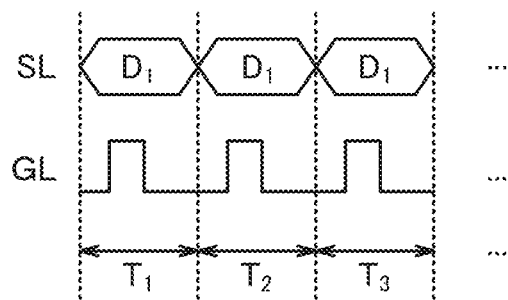
Figure 48C:
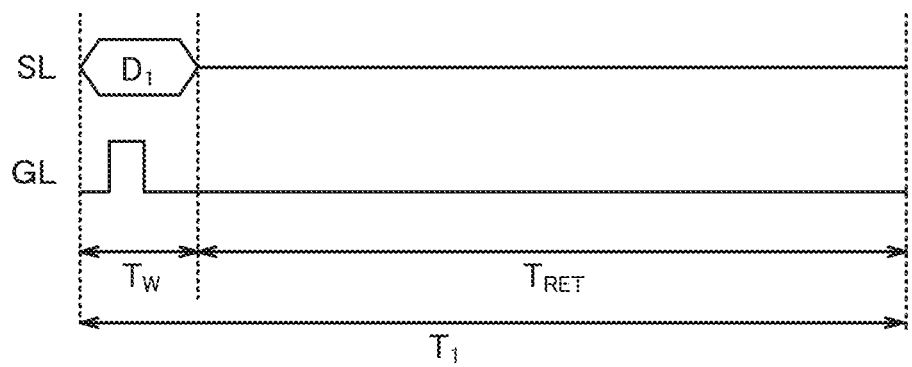

FIGS. 48B and 48C are timing charts showing the normal driving mode and the idling stop (IDS) driving mode.

FIG. 48B is a timing chart showing signals supplied to the signal line SL and the gate line GL in the normal driving mode. In the normal driving mode, a normal frame frequency (e.g., 60 Hz) is used for operation. A scanning signal is supplied to the gate line GL in each frame period (each of periods $T_1$ to $T_3$) and data $D_1$ from the signal line SL is written. This operation is also performed to write the same data $D_1$ in the periods $T_1$ to $T_3$ and to write different data in the periods $T_1$ to $T_3$.

FIG. 48C is a timing chart showing signals supplied to the signal line SL and the gate line GL in the idling stop (IDS) driving mode. In the idling stop (IDS) driving mode, a low frame frequency (e.g., 1 Hz) is used for operation. One frame period is shown as the period $T_1$, which includes a data writing period $T_W$ and a data retention period $T_{RET}$. In the idling stop (IDS) driving mode, a scanning signal is supplied to the gate line GL and the data $D_1$ of the signal line SL is written in the period $T_W$, and the gate line GL is fixed to a low-level voltage so that the transistor M1 is turned off and the written data $D_1$ is retained in the period $T_{RET}$.

The idling stop (IDS) driving mode requires a small number of times of image data writing to the pixel circuit 306 as compared with the normal driving mode, which leads to low power consumption.

Figure 48D:
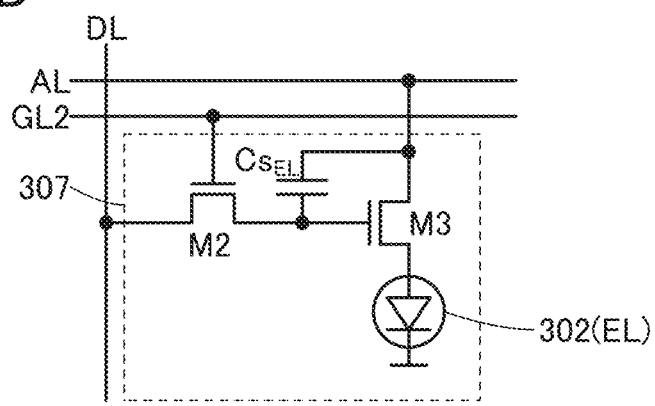

FIG. 48D illustrates a pixel circuit in which an organic EL element is used as a display element. A pixel circuit 307 includes a display element 302, a transistor M2, a transistor M3, and a capacitor $C_{S_{EL}}$. FIG. 48D also illustrates a signal line DL, a gate line GL2, and a current supply line AL that are electrically connected to the pixel circuit 307.

The transistor M2 is preferably an OS transistor like the transistor M1. The OS transistor has an extremely low leakage current in a non-conduction state (off-state current); therefore, charge accumulated in the capacitor $C_{S_{EL}}$ can be retained by turning off the OS transistor. In other words, the gate-drain voltage of the transistor M3 can be kept constant, whereby the emission intensity of the display element 302 can be constant.

Therefore, as in the IDS driving of the display element 301, the IDS driving of the display element 302 is performed as follows: a scanning signal is supplied to the gate line GL2, data is written from the signal line DL, and then, the gate line GL2 is fixed to a low-level voltage to turn off the transistor M2 and retain the written data.

As with the pixel circuit 306, the use of the OS transistor as the transistor M2 enables the pixel circuit 307 to operate in the idling stop (IDS) driving mode. Thus, the number of times of image data writing to the pixel circuit 307 can be small as compared with the case of the normal driving mode, which leads to low power consumption.

The transistor M3 is preferably formed using a material similar to that of the transistor M2. The use of the same material for the transistor M3 and the transistor M2 can shorten the fabrication process of the pixel circuit 307.

A material that can be used for semiconductor layers of the transistors M1, M2, and M3 preferably contains an amorphous semiconductor, particularly hydrogenated amorphous silicon (a-Si:H), other than a metal oxide. Because a transistor including an amorphous semiconductor can be easily formed over a large substrate, the manufacturing process of a large-screen display device which is compatible with 2K, 4K, or 8K broadcasting or the like can be simplified, for example.

Note that this embodiment can be combined with any of the other embodiments in this specification as appropriate.

Embodiment 8

In this embodiment, examples of a product using the display device described in the above embodiment can be used will be described.

Figure 49A:
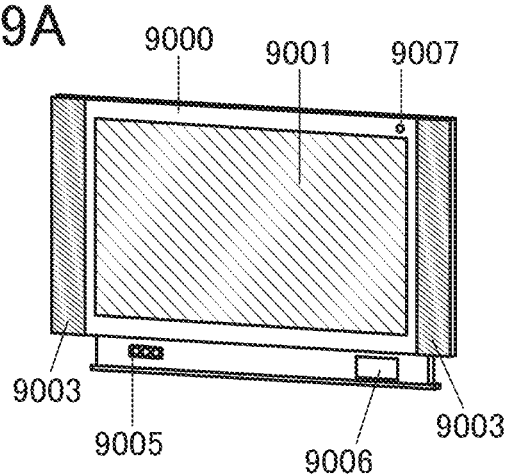
FIGS. 49A to 49C each illustrate an example of an electronic device.

FIG. 49A is a perspective view illustrating a television device. The television device includes a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and the like. The television device can include the display portion 9001 having a large screen size of, for example, 50 inches or more or 100 inches or more.

Figure 49B:
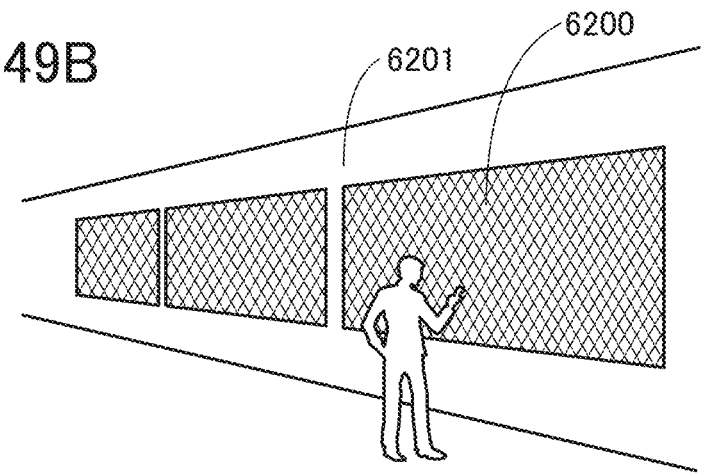

FIG. 49B illustrates an example of a digital signage that can be attached to a wall. In FIG. 49B, a digital signage 6200 is attached to a wall 6201.

Figure 49C:
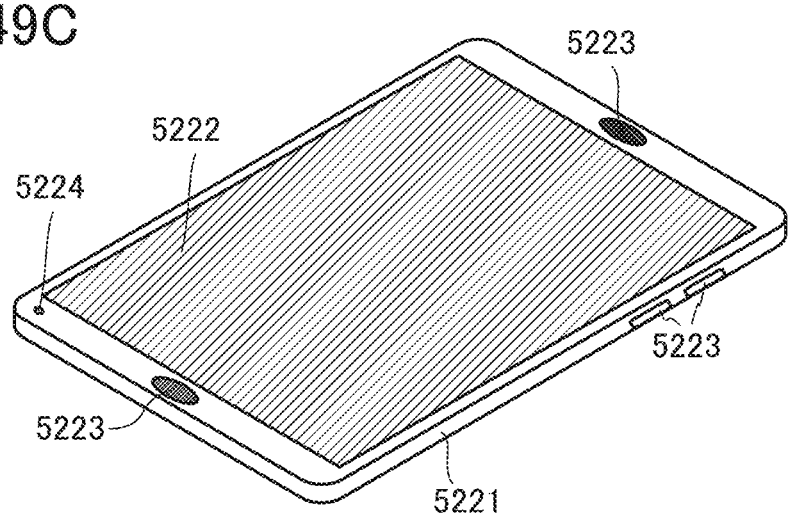

FIG. 49C illustrates a tablet information terminal, which includes a housing 5221, a display portion 5222, operation buttons 5223, and a speaker 5224. A display device with a position input function may be used for a display portion 5222. Note that the position input function can be added by provision of a touch panel in a display device. Alternatively, the position input function can be added by providing a photoelectric conversion element called a photosensor in a pixel area of a display device. As the operation buttons 5223, any one of a power switch for starting the information terminal, a button for operating an application of the information terminal, a volume control button, a switch for turning on or off the display portion 5222, and the like can be provided. Although the number of the operation buttons 5223 is four in the information terminal illustrated in FIG. 49C, the number and position of operation buttons included in the information terminal is not limited to this example. Although not illustrated, the information terminal illustrated in FIG. 49C may include a camera. Although not illustrated, the information terminal illustrated in FIG. 49C may include a light-emitting device for use as a flashlight or a lighting device. Although not illustrated, the information terminal illustrated in FIG. 49C may include a sensor (which measures force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, infrared rays, or the like) inside the housing 5221. In particular, when a sensing device including a sensor for sensing inclination such as a gyroscope sensor or an acceleration sensor is provided, display on the screen of the display portion 5222 can be automatically changed in accordance with the orientation of the information terminal illustrated in FIG. 49C by determining the orientation of the information terminal (the orientation of the information terminal with respect to the vertical direction).

In this specification and the like, for example, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an electroluminescence (EL) element (e.g., an EL element including organic and inorganic materials, an organic EL element, or an inorganic EL element), a light-emitting diode (LED) chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulation (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by electric or magnetic action may be included in the display element, the display device, the light-emitting element, or the light-emitting device. Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including microelectromechanical systems (MEMS), a dry agent may be provided in a space where the display element is sealed (e.g., between an element substrate over which the display element is placed and a counter substrate opposed to the element substrate). Providing a dry agent can prevent MEMS and the like from becoming difficult to move or deteriorating easily because of moisture or the like.

Note that this embodiment can be combined with any of the other embodiments in this specification as appropriate.

Embodiment 9

In this embodiment, the details of a transistor 200 and a transistor 201 that are applicable to the transistors described in this specification and the like will be described with reference to FIGS. 50A to 50C, FIGS. 51A and 51B, FIGS. 52A and 52B, FIGS. 53A to 53C, and FIGS. 54A to 54C.

<The Transistor 200>

First, the details of the transistor 200 will be described.

FIG. 50A is a plan view of a semiconductor device including the transistor 200. FIG. 50B is a cross-sectional view of a portion indicated by a dashed-dotted line A1-A2 in FIG. 50A, illustrating a cross section of the transistor 200 in a channel length direction. FIG. 50C is a cross-sectional view of a portion indicated by a dashed-dotted line A3-A4 in FIG. 50A, illustrating a cross section of the transistor 200 in a channel width direction. In the top view of FIG. 50A, some components are not illustrated for simplification of the drawing.

As illustrated in FIGS. 50A to 50C, the transistor 200 includes an insulator 224 over a substrate (not illustrated), a metal oxide 406*a* over the insulator 224, a metal oxide 406*b* in contact with at least part of the top surface of the metal oxide 406*a*, an insulator 412 over the metal oxide 406*b*, a conductor 404*a* over the insulator 412, a conductor 404*b* over the conductor 404*a*, an insulator 419 over the conductor 404*b*, an insulator 418 in contact with side surfaces of the insulators 412 and 419 and the conductors 404*a* and 404*b*, and an insulator 225 in contact with the top surface of the metal oxide 406*b* and a side surface of the insulator 418. Here, as illustrated in FIG. 50B, the top surface of the insulator 418 is preferably substantially aligned with the top surface of the insulator 419. Furthermore, the insulator 225 is preferably provided to cover the insulator 419, the conductor 404, the insulator 418, and the metal oxide 406.

In the following description, the metal oxide 406a and the metal oxide 406b are collectively referred to as the metal oxide 406 in some cases. Although the metal oxide 406a and the metal oxide 406b are stacked in the transistor 200, the structure of the present invention is not limited to this structure. For example, only the metal oxide 406b may be provided. Furthermore, the conductor 404a and the conductor 404b are collectively referred to as the conductor 404 in some cases. Although the conductor 404a and the conductor 404b are stacked in the transistor 200, the structure of the present invention is not limited to this structure. For example, only the conductor 404b may be provided.

A conductor 440 includes a conductor 440a that is in contact with an inner wall of an opening of an insulator 384 and a conductor 440b that is located inward from the conductor 440a. Here, the top surfaces of the conductors 440a and 440b can be positioned at substantially the same level as the top surface of the insulator 384. Although the conductors 440a and 440b are stacked in the transistor 200, the structure of the present invention is not limited to this structure. For example, only the conductor 440b may be provided.

A conductor 310 includes a conductor 310a that is in contact with an inner wall of an opening of the insulators 214 and 216, and a conductor 310b that is located inward from the conductor 310a. Thus, a structure in which the conductor 310a is in contact with the conductor 440b is preferable. Here, the top surfaces of the conductors 310a and 310b can be positioned at substantially the same level as the top surface of the insulator 216. Although the conductors 310a and 310b are stacked in the transistor 200, the structure of the present invention is not limited to this structure. For example, only the conductor 310b may be provided.

The conductor 404 can function as a top gate, and the conductor 310 can function as a back gate. The potential of the back gate can be the same as the potential of the top gate, the ground potential, or given potential. By changing the potential of the back gate independently of the potential of the top gate, the threshold voltage of the transistor can be changed.

The conductor 440 extends in the channel width direction in a manner similar to that of the conductor 404, and functions as the conductor 310, which is a wiring through which potential is applied to the back gate. When the conductor 310 is stacked over the conductor 440 functioning as the wiring for the back gate so as to be embedded in the insulators 214 and 216, the insulators 214 and 216 and the like are positioned between the conductor 440 and the conductor 404, reducing the parasitic capacitance between the conductor 440 and the conductor 404 and thereby increasing the withstand voltage. The reduction in the parasitic capacitance between the conductor 440 and the conductor 404 can improve the switching speed of the transistor, so that the transistor can have high frequency characteristics. The increase in the withstand voltage between the conductor 440 and the conductor 404 can improve the reliability of the transistor 200. Therefore, the thicknesses of the insulators 214 and 216 are preferably large. Note that the extending direction of the conductor 440 is not limited to this example; for example, the conductor 440 may extend in the channel length direction of the transistor 200.

Here, it is preferable to use conductive materials that have a function of inhibiting the passage of impurities such as water or hydrogen or conductive materials that are relatively impermeable to such impurities for the conductor 310a and the conductor 440a. For example, a single layer or a stacked layer of tantalum, tantalum nitride, ruthenium, ruthenium oxide, or the like is preferably used. Owing to this, diffusion of impurities such as water or hydrogen from a lower layer into an upper layer through the conductors 440 and 310 can be inhibited. Note that it is preferable that the conductors 310a and 440a have a function of inhibiting the passage of at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom and oxygen (e.g., an oxygen atom or an oxygen molecule). Furthermore, in the following description, the same applies to a conductive material having a function of inhibiting the passage of impurities. When the conductors 310a and 440a have a function of inhibiting the passage of oxygen, the conductivity of the conductors 310b and 440b can be prevented from being lowered because of oxidation.

Moreover, the conductor 310b is preferably formed using a conductive material including tungsten, copper, or aluminum as its main component. Although not illustrated, the conductor 310b may have a stacked structure and be, for example, stacked layers of titanium, titanium nitride, and the above-described conductive material.

The conductor 440b, which serves as a wiring, is preferably formed using a conductor having a higher conductivity than the conductor 310b; a conductive material including copper or aluminum as its main component can be used, for example. Although not illustrated, the conductor 440b may have a stacked structure and be, for example, stacked layers of titanium, titanium nitride, and the above-described conductive material.

The insulator 214 can function as a barrier insulating film for preventing impurities such as water or hydrogen from entering the transistor from a lower layer. The insulator 214 is preferably formed using an insulating material having a function of inhibiting the passage of impurities such as water or hydrogen. For example, the insulator 214 is preferably formed using silicon nitride or the like. This can inhibit diffusion of impurities such as hydrogen and water to a layer positioned over the insulator 214. Note that it is preferable that the insulator 214 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material having a function of inhibiting the passage of impurities.

Furthermore, for the insulator 214, an insulating material having a function of inhibiting the passage of oxygen (e.g., an oxygen atom or an oxygen molecule) is preferably used. With this material, oxygen contained in the insulator 224 or the like can be inhibited from diffusing into lower layers.

Furthermore, with the structure in which the conductor 310 is stacked over the conductor 440, the insulator 214 can be provided between the conductor 440 and the conductor 310. Here, even when a metal that is easily diffused, such as coper, is used as the conductor 440b, silicon nitride or the like provided as the insulator 214 can prevent diffusion of the metal to a layer positioned above the insulator 214.

An insulator 222 is preferably formed using an insulating material having a function of inhibiting the passage of impurities such as water or hydrogen and oxygen, and for example, is preferably formed using aluminum oxide or hafnium oxide. Accordingly, diffusion of impurities such as water or hydrogen from a layer under the insulator 222 to a layer over the insulator 222 can be inhibited. Furthermore, oxygen contained in the insulator 224 or the like can be inhibited from diffusing into lower layers.

Furthermore, the concentration of impurities such as water, hydrogen, or nitrogen oxide in the insulator 224 is preferably lowered. The amount of hydrogen released from the insulator 224 that is converted into hydrogen molecules per unit area of the insulator 224 is less than or equal to $2 \times 10^{15}$ molecules/cm$^2$, preferably less than or equal to $1 \times 10^{15}$ molecules/cm$^2$, further preferably $5 \times 10^{14}$ molecules/cm$^2$ in thermal desorption spectroscopy (TDS) analysis in the range from 50° C. to 500° C., for example. Moreover, the insulator 224 is preferably formed using an insulator from which oxygen is released by heating.

The insulator 412 can function as a first gate insulating film, and an insulator 220, the insulator 222, and the insulator 224 can function as a second gate insulating film. Although the insulator 220, the insulator 222, and the insulator 224 are stacked in the transistor 200, the present invention is not limited to this structure. For example, any two of the insulators 220, 222, and 224 may be stacked, or any one of the insulators may be used.

The metal oxide 406 is preferably formed using a metal oxide functioning as an oxide semiconductor. The metal oxide preferably has an energy gap of 2 eV or more, preferably 2.5 eV or more. With the use of a metal oxide having such a wide energy gap, the off-state current of the transistor can be reduced.

A transistor formed using a metal oxide has an extremely low leakage current in an off state; thus, a semiconductor device with low power consumption can be provided. A metal oxide can be formed by a sputtering method or the like and thus can be used in a transistor included in a highly integrated semiconductor device.

The metal oxide 406 preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, or the like may be contained.

Here, a case where the metal oxide 406 is an In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, the atomic ratio of the element M to constituent elements in the metal oxide used as the metal oxide 406a is preferably greater than that in the metal oxide used as the metal oxide 406b. Moreover, the atomic ratio of the element M to In in the metal oxide used as the metal oxide 406a is preferably greater than that in the metal oxide used as the oxide 406b. Furthermore, the atomic ratio of In to the element M in the metal oxide used as the metal oxide 406b is preferably greater than that in the metal oxide used as the metal oxide 406a.

By using the above metal oxide as the metal oxide 406a, it is preferable that the conduction band minimum of the metal oxide 406a be higher than the conduction band minimum of a region of the metal oxide 406b where the conduction band minimum is low. In other words, the electron affinity of the metal oxide 406a is preferably smaller than the electron affinity of the region of the metal oxide 406b where the conduction band minimum is low.

Here, the conduction band minimum gradually changes in the metal oxides 406a and 406b. In other words, the conduction band minimum continuously changes or is continuously connected. To obtain such an energy level, the density of defect states in a mixed layer formed at an interface between the metal oxides 406a and 406b is preferably made low.

Specifically, when the metal oxides 406a and 406b contain the same element (as a main component) in addition to oxygen, a mixed layer with a low density of defect states can be formed. For example, in the case where the metal oxide 406b is an In—Ga—Zn oxide, it is preferable to use an In—Ga—Zn oxide, a Ga—Zn oxide, gallium oxide, or the like as the metal oxide 406a.

At this time, a narrow-gap portion formed in the metal oxide 406b serves as a main carrier path. Since the density of defect states at the interface between the metal oxides 406a and 406b can be made low, the influence of interface scattering on carrier conduction is small, and high on-state current can be obtained.

Furthermore, the metal oxide 406 includes a region 426a, a region 426b, and a region 426c. The region 426a is sandwiched between the region 426b and the region 426c as illustrated in FIG. 50B. The region 426b and the region 426c are regions having reduced resistance owing to the formation of the insulator 225 and thereby have higher conductivity than the region 426a. An impurity element such as hydrogen or nitrogen included in the atmosphere for forming the insulator 225 is added to the region 426b and the region 426c. Thus, owing to the added impurity element, oxygen vacancies are generated mainly in the regions of the metal oxide 406b that overlap with the insulator 225, and furthermore the impurity element enters the oxygen vacancies, which increases the carrier density and decreases the resistance.

Therefore, the region 426b and the region 426c preferably have a higher concentration of at least one of hydrogen and nitrogen than the region 426a. The concentration of hydrogen or nitrogen can be measured by secondary ion mass spectrometry (SIMS) or the like. Here, the concentration of hydrogen or nitrogen in the middle of the region of the metal oxide 406b that overlaps with the insulator 412 (e.g., a portion in the metal oxide 406b which is located equidistant from both side surfaces in the channel length direction of the insulator 412) is measured as the concentration of hydrogen or nitrogen in the region 426a.

Note that the resistance of the region 426b and the region 426c is reduced by addition of an element that generates oxygen vacancies or an element that is bonded to oxygen vacancies. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon. Thus, the region 426b and the region 426c include one or more of the above-described elements.

Furthermore, it is preferable in the metal oxide 406a that the atomic ratio of In to the element M in the regions 426b and 426c be substantially the same as that in the metal oxide 406b. In other words, in the metal oxide 406a, the atomic ratio of In to the element M in the region 426b and the region 426c is preferably larger than that in the region 426a. Here, when the indium content in the metal oxide 406 is increased, the carrier density is increased and the resistance can be decreased. With this structure, even when the thickness of the metal oxide 406b is small and electric resistance of the metal oxide 406b is high in the manufacturing process of the transistor 200, the region 426b and the region 426c in the metal oxide 406 can function as a source region and a drain region owing to the sufficiently reduced resistance of the metal oxide 406a in the region 426b and the region 426c.

Figure 51A:
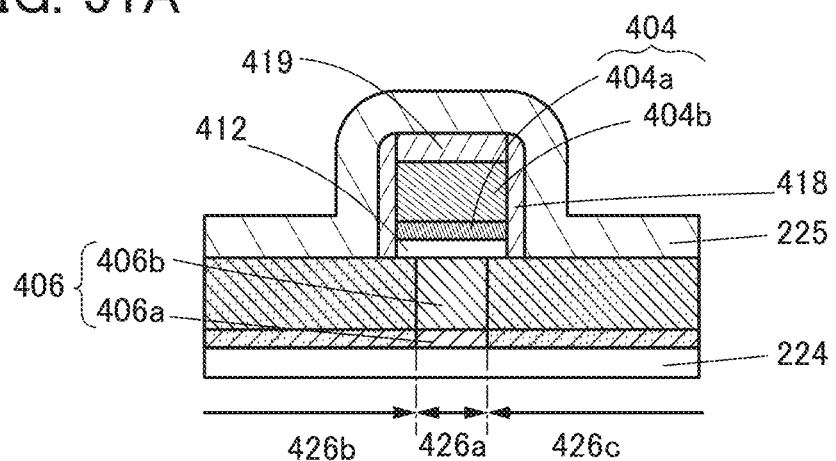
FIGS. 51A and 51B are cross-sectional views each illustrating a structure example of a transistor.

FIG. 51A is an enlarged view of the region 426a and the vicinity in FIG. 50B. As illustrated in FIG. 51A, the region 426b and the region 426c are formed in at least the regions overlapping with the insulator 225 in the metal oxide 406. Here, one of the region 426b and the region 426c in the metal oxide 406b can function as a source region, and the other can function as a drain region. Moreover, the region 426a in the metal oxide 406b can function as a channel formation region.

Although the regions 426a, 426b, and 426c are formed in the metal oxides 406b and 406a in FIG. 50B and FIG. 51A, it is acceptable as long as these regions are formed in the metal oxide 406b. Furthermore, although a boundary between the region 426a and the region 426b and a boundary between the region 426a and the region 426c are illustrated as being substantially perpendicular to the top surface of the metal oxide 406 in FIG. 50B and the like, this embodiment is not limited to this structure. For example, in some cases, the region 426b and the region 426c project to the conductor 404 side in the vicinity of the surface of the metal oxide 406b and are recessed to the insulator 225 side in the vicinity of a bottom surface of the metal oxide 406a.

In the transistor 200, as illustrated in FIG. 51A, the region 426b and the region 426c are formed in the regions where the metal oxide 406 is in contact with the insulator 225 and the regions overlapping with the vicinity of the both end portions of the insulators 418 and 412. At this time, portions of the regions 426b and 426c which overlap with the conductor 404 function as what is called "overlap regions (Lov regions)." Because a high-resistance region is not formed between the channel formation region and the source or drain region of the metal oxide 406 in the structure including the Lov region, the on-state current and the mobility of the transistor can be increased.

Figure 51B:
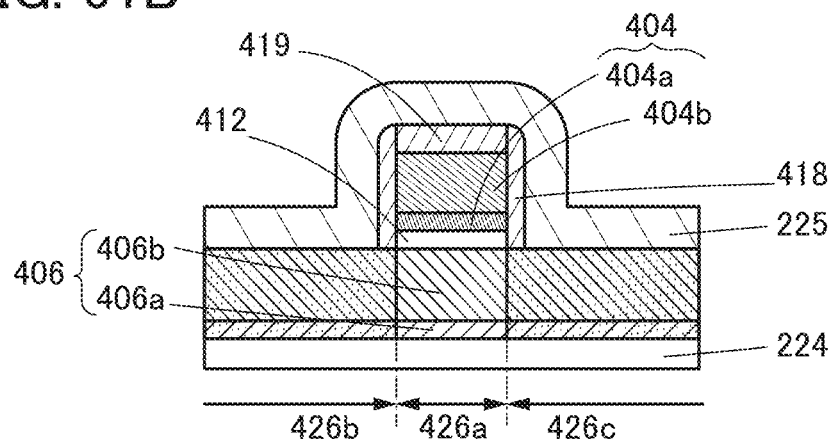

Note that the semiconductor device of this embodiment is not limited to this example. For example, as illustrated in FIG. 51B, the region 426b and the region 426c may be formed in regions where the metal oxide 406 overlaps with the insulator 225 and the insulator 418. The structure illustrated in FIG. 51B can be rephrased as the structure in which the width of the conductor 404 in the channel length direction is substantially the same as the width of the region 426a. Because a high-resistance region is not formed between the channel formation region and the source and drain regions in the structure illustrated in FIG. 51B, the on-state current of the transistor can be increased. Since the gate does not overlap with the source and drain regions in the channel length direction in the structure illustrated in FIG. 51B, formation of unnecessary capacitance can be inhibited.

Thus, by appropriately selecting the areas of the region 426b and the region 426c, a transistor having electric characteristics necessary for the circuit design can be easily provided.

The insulator 412 is preferably provided in contact with the top surface of the metal oxide 406b. The insulator 412 is preferably formed using an insulator from which oxygen is released by heating. When the insulator 412 formed using the insulator is formed in contact with the top surface of the metal oxide 406b, oxygen can be supplied to the metal oxide 406b effectively. Furthermore, like the insulator 224, the concentration of impurities such as water or hydrogen in the insulator 412 is preferably lowered. The thickness of the insulator 412 is preferably more than or equal to 1 nm and less than or equal to 20 nm, and may be approximately 1 nm, for example.

The insulator 412 preferably includes oxygen. For example, the amount of released oxygen molecules per unit area of the insulator 412 is more than or equal to $1 \times 10^{14}$ molecules/cm$^2$, preferably more than or equal to $2 \times 10^{14}$ molecules/cm$^2$, further preferably more than or equal to $4 \times 10^{14}$ molecules/cm$^2$ in thermal desorption spectroscopy (TDS) analysis in the range of a surface temperature from 100° C. to 700° C. or from 100° C. to 500° C.

The insulator 412, the conductor 404, and the insulator 419 each include a region overlapping with the metal oxide 406b. In addition, side surfaces of the insulator 412, the conductor 404a, the conductor 404b, and the insulator 419 are preferably aligned with each other.

As the conductor 404a, a conductive oxide is preferably used. For example, the metal oxide that can be used as the metal oxide 406a or the metal oxide 406b can be used. In particular, an In—Ga—Zn-based oxide with an atomic ratio of In:Ga:Zn=4:2:3 to 4:2:4.1 or in the neighborhood thereof, which has high conductivity, is preferably used. When the conductor 404a is formed using such a material, oxygen can be prevented from entering the conductor 404b, and an increase in electric resistance value of the conductor 404b due to oxidation can be prevented.

When such a conductive oxide is formed by a sputtering method, oxygen can be added to the insulator 412, so that oxygen can be supplied to the metal oxide 406b. Thus, oxygen vacancies in the region 426a of the metal oxide 406 can be reduced.

The conductor 404b can be formed using a metal such as tungsten, for example. As the conductor 404b, a conductor that can add impurities such as nitrogen to the conductor 404a to improve the conductivity of the conductor 404a may be used. For example, titanium nitride or the like is preferably used for the conductor 404b. Furthermore, the conductor 404b may have a structure in which a metal such as tungsten is stacked over a metal nitride such as titanium nitride.

Here, the conductor 404 functioning as a gate electrode is provided to cover the top surface of the region 426a and its periphery and the side surface, which is in the channel width direction, of the metal oxide 406b with the insulator 412 interposed therebetween. Thus, the electric field of the conductor 404 functioning as a gate electrode can electrically surround the top surface of the region 426a and its periphery and the side surface, which is in the channel width direction, of the metal oxide 406b. The structure of the transistor in which the channel formation region is electrically surrounded by the electric field of the conductor 404 is referred to as a surrounded channel (s-channel) structure. Thus, a channel can be formed in the top surface of the region 426a and its periphery and the side surface, which is in the channel width direction, of the metal oxide 406b; therefore, a large amount of current can flow between the source and the drain, and a current in an on state (on-state current) can be large. Moreover, since the top surface of the region 426a and its periphery and the side surface, which is in the channel width direction, of the metal oxide 406b are surrounded by the electric field of the conductor 404, a leakage current in an off state (off-state current) can be small.

The insulator 419 is preferably provided over the conductor 404b. Side surfaces of the insulator 419, the conductor 404a, the conductor 404b, and the insulator 412 are preferably aligned with each other. The insulator 419 is preferably formed by an atomic layer deposition (ALD) method, in which case the thickness of the insulator 419 can be approximately more than or equal to 1 nm and less than or equal to 20 nm, preferably more than or equal to 5 nm and less than or equal to 10 nm. Here, like the insulator 418, the insulator 419 is preferably formed using an insulating material having a function of inhibiting the passage of impurities such as water or hydrogen and oxygen; aluminum oxide, hafnium oxide, or the like is preferably used, for example.

When the insulator 419 is provided, the insulator 419 and the insulator 418 which have a function of inhibiting the passage of impurities such as water or hydrogen and oxygen can cover top and side surfaces of the conductor 404. This can prevent entry of impurities such as water or hydrogen into the metal oxide 406 through the conductor 404. Thus, the insulator 418 and the insulator 419 have a function of a gate cap that protects the gate.

The insulator 418 is provided in contact with the side surfaces of the insulator 412, the conductor 404, and the insulator 419. Furthermore, the top surface of the insulator 418 is preferably aligned with the top surface of the insulator 419. The insulator 418 is preferably formed by an ALD method, in which case the thickness of the insulator 418 can be approximately more than or equal to 1 nm and less than or equal to 20 nm, preferably more than or equal to 1 nm and less than or equal to 3 nm, and for example, 1 nm.

As described above, the region 426b and the region 426c of the metal oxide 406 are formed by the impurity element added in the formation of the insulator 225. In the case where the transistor is miniaturized to have a channel length of approximately 10 nm to 30 nm, the impurity element contained in the source region or the drain region might be diffused to bring electrical connection between the source region and the drain region. In this embodiment, however, the insulator 418 can increase the distance between regions of the metal oxide 406 that are in contact with the insulator 225; accordingly, electrical connection between the source region and the drain region can be prevented. Furthermore, by using an ALD method, the insulator 418 can be formed to have a thickness that is as small as or smaller than the length of the miniaturized channel. Accordingly, an excessive increase of the distance between the source region and the drain region is not caused and thereby an increase in the resistance can be prevented.

Here, the insulator 418 is preferably formed using an insulating material having a function of inhibiting the passage of impurities such as water or hydrogen and oxygen, and for example, is preferably formed using aluminum oxide or hafnium oxide. Accordingly, diffusion of oxygen from the insulator 412 to the outside can be inhibited. Furthermore, entry of impurities such as hydrogen or water to the metal oxide 406 from an end portion or the like of the insulator 412 can be prevented.

The insulator 418 is preferably formed in the following manner: an insulating film is deposited by an ALD method and then subjected to anisotropic etching so as to remain in a portion in contact with the side surfaces of the insulator 412, the conductor 404, and the insulator 419. Thus, an insulator having a small thickness as described above can be easily formed. At this time, even when the insulator 419 provided over the conductor 404 is partly removed by the anisotropic etching, portions of the insulator 418 in contact with the insulator 412 and the conductor 404 can be left sufficiently.

The insulator 225 is provided to cover the insulator 419, the insulator 418, the metal oxide 406, and the insulator 224. Here, the insulator 225 is provided in contact with the top surfaces of the insulators 419 and 418 and the side surface of the insulator 418. As described above, impurities such as hydrogen or nitrogen are added from the insulator 225 to the metal oxide 406, so that the region 426b and the region 426c are formed. Thus, the insulator 225 preferably includes at least one of hydrogen and nitrogen.

Furthermore, the insulator 225 is preferably provided in contact with side surfaces of the metal oxides 406b and 406a as well as the top surface of the metal oxide 406b. This enables a resistance reduction to the side surfaces of the metal oxides 406b and 406a in the region 426b and the region 426c.

Moreover, the insulator 225 is preferably formed using an insulating material having a function of inhibiting the passage of impurities such as water or hydrogen and oxygen. For example, as the insulator 225, silicon nitride, silicon nitride oxide, silicon oxynitride, aluminum nitride, aluminum nitride oxide, or the like is preferably used. Such an insulator 225 can prevent oxygen from passing through the insulator 225 and being supplied to oxygen vacancies in the region 426b and the region 426c, so that a reduction in carrier density can be prevented. Furthermore, impurities such as water or hydrogen can be prevented from passing through the insulator 225 and excessively enlarging the region 426b and the region 426c to the region 426a side.

An insulator 280 is preferably provided over the insulator 225. Furthermore, the concentration of impurities such as water or hydrogen in the insulator 280 is preferably lowered as in the insulator 224.

In openings formed in the insulator 280 and the insulator 225, a combination of a conductor 450a and a conductor 451a and a combination of a conductor 450b and a conductor 451b are provided. The combination of the conductor 450a and the conductor 451a and the combination of the conductor 450b and the conductor 451b are preferably provided with the conductor 404 sandwiched therebetween.

Here, the conductor 450a is formed in contact with an inner wall of the opening provided in the insulator 280 and the insulator 225, and the conductor 451a is located inward from the conductor 450a. The region 426b of the metal oxide 406 is positioned in at least part of a bottom portion of the opening, and the conductor 450a is in contact with the region 426b. Similarly, the conductor 450b is formed in contact with an inner wall of the opening provided in the insulator 280 and the insulator 225, and the conductor 451b is located inward from the conductor 450b. The region 426c of the metal oxide 406 is positioned in at least part of a bottom portion of the opening, and the conductor 450b is in contact with the region 426c.

Figure 52A:
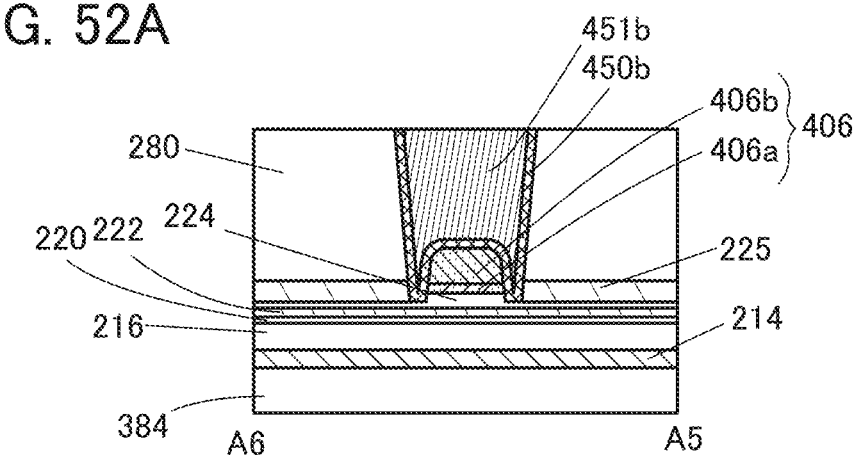
FIGS. 52A and 52B are cross-sectional views each illustrating a structure example of a transistor.

Here, FIG. 52A is a cross-sectional view of a portion indicated by a dashed-dotted line A5-A6 in FIG. 50A. Note that although the cross-sectional view of only the conductors 450b and 451b is illustrated in FIG. 52A, the conductors 450a and 451a have a similar structure.

As illustrated in FIG. 50B and FIG. 52A, the conductor 450b is in contact with at least the top surface of the metal oxide 406 and is preferably in contact with the side surface of the metal oxide 406. Specifically, as illustrated in FIG. 52A, the conductor 450b is preferably in contact with one or both of side surfaces (the side surfaces on the A5 side and the A6 side) of the metal oxide 406 in the channel width direction. As illustrated in FIG. 50B, the conductor 450b may be in contact with the side surface on the A2 side in the channel length direction of the metal oxide 406. Thus, when the structure in which the conductor 450b is in contact with the side surface of the metal oxide 406 in addition to the top surface of the metal oxide 406 is employed, the contact area between the conductor 450b and the metal oxide 406 can be increased without an increase in the area of the top surface of the contact portion, so that the contact resistance between the conductor 450b and the metal oxide 406 can be reduced. Accordingly, miniaturization of the source electrode and the drain electrode of the transistor can be achieved and, in addition, the on-state current can be increased. Note that the same applies to the conductor 450a and the conductor 451a.

Here, the conductor 450a is in contact with the region 426b functioning as one of a source region and a drain region of the transistor 200, and the conductor 450b is in contact with the region 426c functioning as the other of the source region and the drain region of the transistor 200. Therefore, the conductor 450a and the conductor 451a can function as one of a source electrode and a drain electrode, and the conductor 450b and the conductor 451b can function as the other of the source electrode and the drain electrode. Because the region 426b and the region 426c are reduced in resistance, the contact resistance between the conductor 450a and the region 426b and the contact resistance between the conductor 450b and the region 426c are reduced, leading to a large on-state current of the transistor 200.

Here, the conductor 450a and the conductor 450b are preferably formed using a conductive material having a function of inhibiting the passage of impurities such as water or hydrogen, like the conductor 310a or the like. For example, tantalum, tantalum nitride, titanium, titanium nitride, ruthenium, ruthenium oxide, or the like is preferably used, and a single layer or stacked layers may be used. This can prevent entry of impurities such as hydrogen or water from a layer positioned over the insulator 280 to the metal oxide 406 through the conductor 451a and the conductor 451b.

Furthermore, the conductor 451a and the conductor 451b are preferably formed using a conductive material including tungsten, copper, or aluminum as its main component. Although not shown, the conductor 451a and the conductor 451b may have a stacked layer structure, and for example, stacked layers of titanium, titanium nitride, and the above-described conductive material may be formed.

Note that although the conductor 450a and the conductor 450b are in contact with both the metal oxide 406a and the metal oxide 406b in FIG. 50B and FIG. 52A, the structure is not limited to this example. For example, the structure in which the conductor 450a and the conductor 450b are in contact with only the metal oxide 406b may be employed. Furthermore, the top surfaces of the conductors 450a, 451a, 450b, and 451b can be positioned at substantially the same level. Furthermore, although the transistor 200 in which the conductor 450a and the conductor 451a are stacked and the conductor 450b and the conductor 451b are stacked is described, the present invention is not limited to this example. For example, a structure in which only the conductor 451a and the conductor 451b are provided may be employed.

Figure 52B:
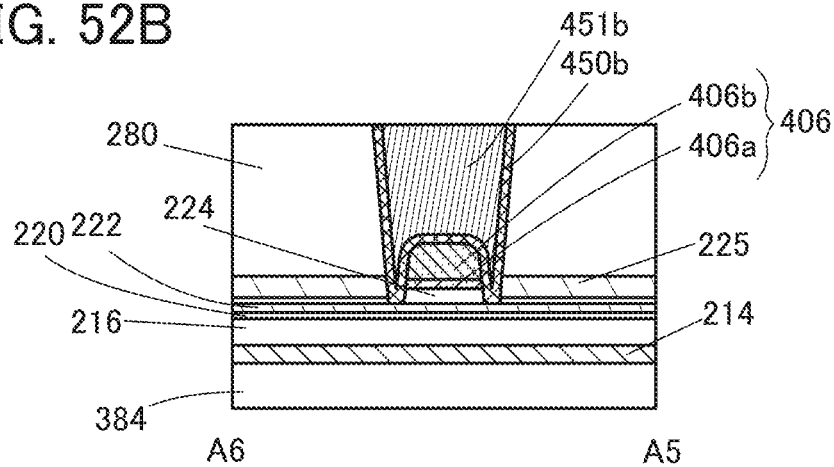

Moreover, although the insulator 224 serves as the bottom portion of the opening in which the conductor 450a and the conductor 450b are provided in FIG. 50B and FIG. 52A, this embodiment is not limited to this structure. As illustrated in FIG. 52B, the insulator 222 may serve as the bottom portion of the opening in which the conductor 450a and the conductor 450b are provided. In the structure illustrated in FIG. 52A, the conductor 450b (the conductor 450a) is in contact with the insulator 224, the metal oxide 406a, the metal oxide 406b, the insulator 225, and the insulator 280. In the structure illustrated in FIG. 52B, the conductor 450b (the conductor 450a) is in contact with the insulator 222, the insulator 224, the metal oxide 406a, the metal oxide 406b, the insulator 225, and the insulator 280.

Next, components of the transistor 200 will be described.
<<Substrate>>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate includes a region having a thickness of, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate, which is caused by dropping or the like, can be reduced. That is, a durable semiconductor device can be provided.

For the substrate which is a flexible substrate, metal, an alloy, resin, glass, or fiber thereof can be used, for example. The flexible substrate preferably has a lower coefficient of linear expansion because deformation due to an environment is inhibited. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<<Insulator>>

The insulator can be an oxide, nitride, oxynitride, nitride oxide, metal oxide, metal oxynitride, metal nitride oxide, or the like having an insulating property.

Note that when the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen is used as the insulator 222 and the insulator 214.

The insulator that has a function of inhibiting the passage of oxygen and impurities such as hydrogen can have, for example, a single-layer structure or a layered structure including an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 222 and the insulator 214 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 222 and the insulator 214 preferably include aluminum oxide, hafnium oxide, or the like.

The insulator 384, the insulator 216, the insulator 220, the insulator 224, and the insulator 412 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 384, the insulator 216, the insulator 220, the insulator 224, and the insulator 412 each preferable include silicon oxide, silicon oxynitride, or silicon nitride.

The insulator 220, the insulator 222, the insulator 224, and/or the insulator 412 preferably include an insulator with a high dielectric constant. For example, the insulator 220, the insulator 222, the insulator 224, and/or the insulator 412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like. Alternatively, the insulator 220, the insulator 222, the insulator 224, and/or the insulator 412 each preferably have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when aluminum oxide, gallium oxide, or hafnium oxide is positioned in contact with the metal oxide 406 in each of the insulator 224 and the insulator 412, silicon included in silicon oxide or silicon oxynitride can be prevented from entering the metal oxide 406. Furthermore, for example, when silicon oxide or silicon oxynitride is in contact with the metal oxide 406 in each of the insulator 224 and the insulator 412, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 384, the insulator 216, and the insulator 280 preferably include an insulator with a low dielectric constant. For example, the insulator 384, the insulator 216, and the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 384, the insulator 216, and the insulator 280 preferably have a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon or aramid), polyimide, polycarbonate, and acrylic.

As the insulator 418 and the insulator 419, an insulator having a function of inhibiting the passage of impurities such as hydrogen and oxygen may be used. As the insulator 418 and the insulator 419, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride may be used, for example.

<<Conductor>>

The conductor 404a, the conductor 404b, the conductor 310a, the conductor 310b, the conductor 450a, the conductor 450b, the conductor 451a, and the conductor 451b can be formed using a material including one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

As the above-described conductors, especially as the conductor 404a, the conductor 310a, the conductor 450a, and the conductor 450b, a conductive material including oxygen and a metal element included in a metal oxide that can be used for the metal oxide 406 may be used. A conductive material including the above-described metal element and nitrogen may be used. For example, a conductive material including nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide 406 can be captured in some cases. Alternatively, hydrogen entering from an external insulator or the like can be captured in some cases.

A stack of a plurality of conductive layers formed using the above materials may be used. For example, a layered structure formed using a combination of a material including any of the metal elements listed above and a conductive material including oxygen may be used. Alternatively, a layered structure formed using a combination of a material including any of the metal elements listed above and a conductive material including nitrogen may be used. Alternatively, a layered structure formed using a combination of a material including any of the metal elements listed above, a conductive material including oxygen, and a conductive material including nitrogen may be used.

When oxide is used for the channel formation region of the transistor, a stacked-layer structure formed using a material containing the above-described metal element and a conductive material including oxygen is preferably used for the gate electrode. In this case, the conductive material including oxygen is preferably formed on the channel formation region side. When the conductive material including oxygen is formed on the channel formation region side, oxygen released from the conductive material is likely to be supplied to the channel formation region.

<<Metal Oxide Applicable to Metal Oxide 406>>

The metal oxide 406 according to the present invention will be described below. As the metal oxide 406, a metal oxide functioning as an oxide semiconductor is preferably used.

The metal oxide 406 preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 contains indium, the element M, and zinc is considered. The terms of the atomic ratio of indium to the element M and zinc contained in the metal oxide 406 are denoted by [In], [M], and [Zn], respectively.

Preferred ranges of the atomic ratio of indium, the element M, and zinc contained in the metal oxide 406 will be described with reference to FIGS. 53A to 53C. Note that the proportion of oxygen atoms is not shown in FIGS. 53A to 53C. The terms of the atomic ratio of indium, the element M, and zinc contained in the metal oxide 406 are denoted by [In], [M], and [Zn], respectively.

Figure 53A:
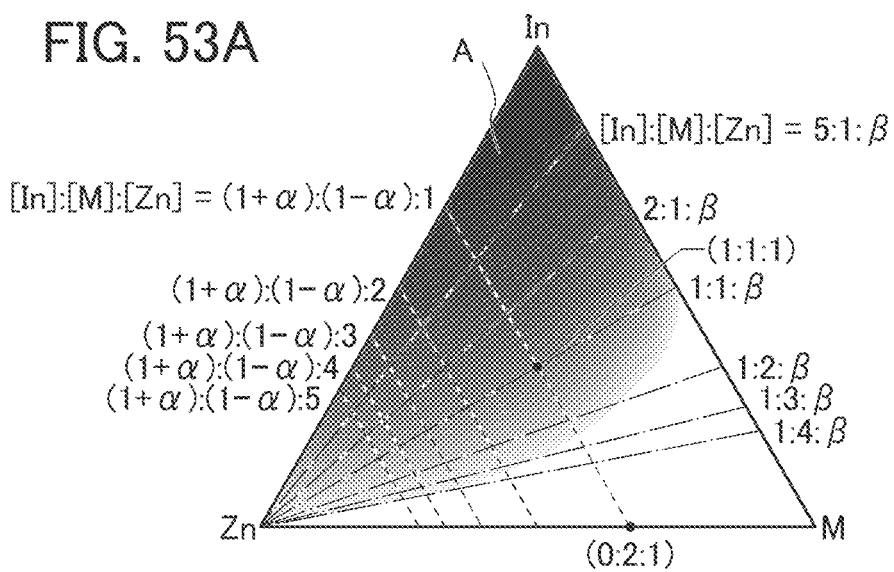
FIGS. 53A to 53C each illustrate an atomic ratio range of a metal oxide.
Figure 53B:
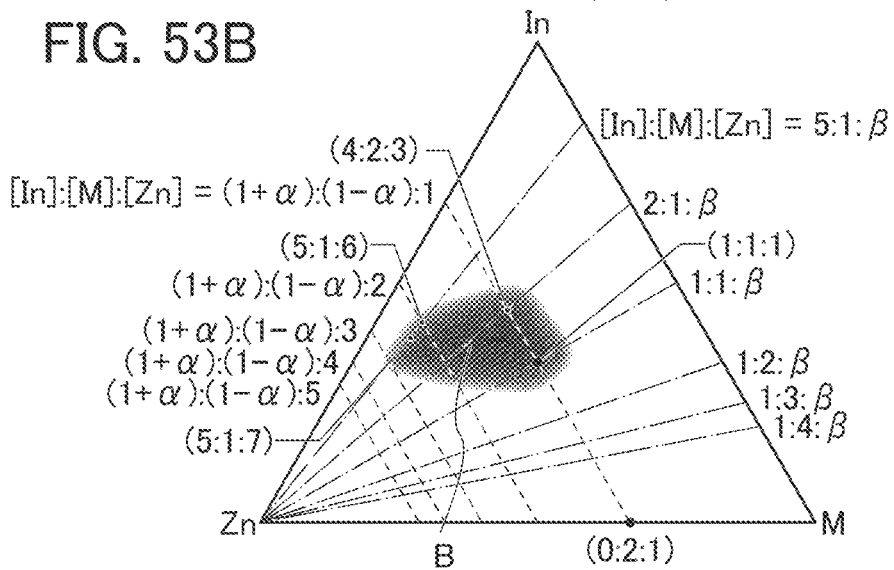
Figure 53C:
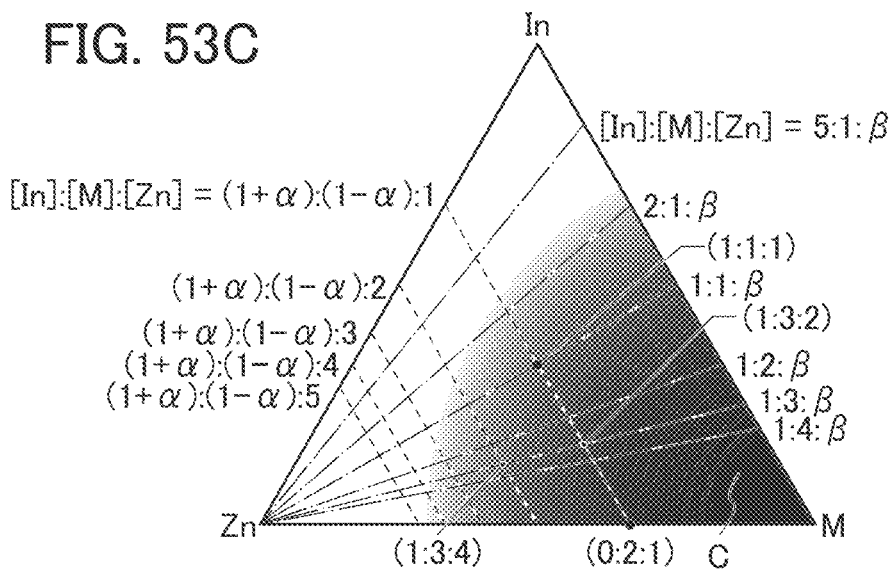

In FIGS. 53A to 53C, broken lines indicate a line where the atomic ratio [In]:[M]:[Zn] is $(1+\alpha):(1-\alpha):1$ $(-1 \leq \alpha \leq 1)$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio [In]:[M]:[Zn] is $5:1:\beta$ $(\beta \geq 0)$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, a metal oxide with the atomic ratio of [In]:[M]:[Zn]=0:2:1 or a neighborhood thereof in FIGS. 53A to 53C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 53A represents an example of the preferred range of the atomic ratio of indium, the element M, and zinc contained in the metal oxide 406.

In addition, the metal oxide having a higher content of indium can have higher carrier mobility (electron mobility). Thus, a metal oxide having a high content of indium has higher carrier mobility than a metal oxide having a low content of indium.

By contrast, when the indium content and the zinc content in a metal oxide become lower, carrier mobility becomes lower. Thus, with an atomic ratio of [In]:[M]:[Zn]=0:1:0 and the vicinity thereof (e.g., a region C in FIG. 53C), insulation performance becomes better.

For example, the metal oxide used as the metal oxide 406b preferably has an atomic ratio represented by the region A in FIG. 53A. The metal oxide with the atomic ratio has high carrier mobility. The atomic ratio of In to Ga and Zn of the metal oxide used as the metal oxide 406b may be 4:2:3 to 4:2:4.1 or in the neighborhood thereof, for example. By contrast, the metal oxide used as the metal oxide 406a preferably has an atomic ratio represented by the region C in FIG. 53C. The metal oxide with the atomic ratio has relatively high insulating properties. The atomic ratio of In to Ga and Zn of the metal oxide used as the metal oxide 406a may be approximately 1:3:4.

A metal oxide having an atomic ratio in the region A, particularly in a region B in FIG. 53B, has high carrier mobility and high reliability and is excellent.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

In the case where the metal oxide 406 is formed of an In-M-Zn oxide, it is preferable to use a target including a polycrystalline In-M-Zn oxide as the sputtering target. Note that the atomic ratio of the formed metal oxide varies from the above atomic ratios of metal elements of the sputtering targets in a range of ±40%. For example, when a sputtering target with an atomic ratio of In:Ga:Zn=4:2:4.1 is used for forming the metal oxide 406, the atomic ratio of In to Ga and Zn in the formed metal oxide may be 4:2:3 or in the neighborhood of 4:2:3. When a sputtering target with an atomic ratio of In:Ga:Zn=5:1:7 is used for forming the metal oxide 406, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide 406 is deposited with a sputtering apparatus, a film having an atomic ratio deviated from the atomic ratio of the target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

<<Composition of Metal Oxide>>

The composition of a cloud-aligned composite oxide semiconductor (CAC-OS) that can be used in an OS transistor will be described below.

In this specification and the like, CAC refers to an example of a function or a material composition and c-axis aligned crystal (CAAC) described later refers to an example of a crystal structure.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

<<Structure of Metal Oxide>>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<<Transistor Including Metal Oxide>>

Next, the case where the metal oxide is used for a transistor will be described.

When the metal oxide is used in a transistor, the transistor can have high field-effect mobility. In addition, the transistor can have high reliability.

Moreover, the carrier density in the region 426a of the metal oxide 406b in the transistor is preferably low. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, the region 426a of the metal oxide 406b has a carrier density lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$.

The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, the transistor whose channel region is formed in the oxide semiconductor having a high density of trap states has unstable electrical characteristics in some cases.

In order to obtain stable electrical characteristics of the transistor, it is effective to reduce the concentration of impurities in the region 426a of the metal oxide 406b. In addition, in order to reduce the concentration of impurities in the region 426a of the metal oxide 406b, the concentration of impurities in a film that is adjacent to the region 426a is preferably reduced. As examples of the impurities, hydrogen, nitrogen, alkali metal, alkaline earth metal, iron, nickel, silicon, and the like are given.

<<Impurities>>

Here, the influence of impurities in the metal oxide will be described.

When silicon or carbon that is one of Group 14 elements is contained in the metal oxide, defect states are formed. Thus, the concentration of silicon or carbon (the concentration is measured by SIMS) in the region 426a of the metal oxide 406b is set to be lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to be normally-on. Therefore, it is preferable to reduce the concentration of an alkali metal or an alkaline earth metal in the region 426a of the metal oxide 406b. Specifically, the concentration of alkali metal or alkaline earth metal in the region 426a of the metal oxide 406b, which is measured by SIMS, is lower than or equal to $1 \times 10^{18}$ atoms/cm$^3$, preferably lower than or equal to $2 \times 10^{16}$ atoms/cm$^3$.

When the metal oxide contains nitrogen, the metal oxide easily becomes n-type by generation of electrons serving as carriers and an increase of carrier density. Thus, the transistor including nitrogen in the region 426a of the metal oxide 406b tends to have normally-on characteristics. For this reason, nitrogen in the region 426a of the metal oxide 406b is preferably reduced as much as possible; for example, the concentration of nitrogen in the region 426a of the metal oxide 406b measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the transistor including much hydrogen in the region 426a of the metal oxide 406b tends to have normally-on characteristics. For this reason, hydrogen in the region 426a of the metal oxide 406b is preferably reduced as much as possible. Specifically, the hydrogen concentration of the metal oxide measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

By reducing impurities in the region 426a of the metal oxide 406b to an enough level, the transistor can have stable electrical characteristics.

<Transistor 201>

Next, the details of the transistor 201 having a different structure from the transistor 200 will be described as an example.

FIG. 54A is a plan view of a semiconductor device including the transistor 201. FIG. 54B is a cross-sectional view of a portion indicated by a dashed-dotted line A1-A2 in FIG. 54A, illustrating a cross section of the transistor 201 in a channel length direction. FIG. 54C is a cross-sectional view of a portion indicated by a dashed-dotted line A3-A4 in FIG. 54A, illustrating a cross section of the transistor 201 in a channel width direction. In the top view of FIG. 54A, some components are not illustrated for simplification of the drawing. The components common to the transistors 201 and 200 are denoted by the same reference numerals.

As illustrated in FIGS. 54A to 54C, the transistor 201 includes the insulator 224 over a substrate (not illustrated), the metal oxide 406a over the insulator 224, the metal oxide 406b in contact with at least part of the top surface of the metal oxide 406a, a conductor 452a and a conductor 452b in contact with at least part of the top surface of the metal oxide 406b, a metal oxide 406c in contact with at least part of the top surface of the metal oxide 406b and over the conductor 452a and the conductor 452b, an insulator 412 over the metal oxide 406c, a conductor 405a over the insulator 412, a conductor 405b over the conductor 405a, and an insulator 420 over the conductor 405b.

A conductor 405 (the conductor 405a and the conductor 405b) can function as a top gate, and the conductor 310 can function as a back gate. The potential of the back gate can be the same as the potential of the top gate, the ground potential, or given potential. By changing the potential of the back gate independently of the potential of the top gate, the threshold voltage of the transistor can be changed.

The conductor 405a can be formed using a material that can be used for the conductor 404a illustrated in FIGS. 50A to 50C. The conductor 405b can be formed using a material that can be used for the conductor 404b illustrated in FIGS. 50A to 50C.

The conductor 452a serves as one of a source electrode and a drain electrode, and the conductor 452b serves as the other of the source electrode and the drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 452a and 452b. Although a single-layer structure is illustrated in the drawings, a stacked-layer structure of two or more layers may be used. Furthermore, a transparent conductive material containing indium oxide, tin oxide, or zinc oxide may be used.

In the transistor 201, a channel is preferably formed in the metal oxide 406b. Therefore, the metal oxide 406c is preferably formed using a material having a higher insulating property than the metal oxide 406b. The metal oxide 406c can be formed using a material that is similar to the material used for the metal oxide 406a.

Providing the metal oxide 406c enables the transistor 201 to be a buried-channel transistor. Moreover, oxidation of end portions of the conductors 452a and 452b can be prevented. Furthermore, a leakage current between the conductor 405 and the conductor 452a (or between the conductor 405 and the conductor 452b) can be prevented. Note that the metal oxide 406c may be omitted depending on the case.

The metal oxide 406b has regions 426d. As illustrated in FIG. 54B, the regions 426d are positioned in regions where the metal oxide 406b is in contact with the conductors 452a and 452b. The regions 426d are formed because of damage caused when the conductors 452a and 452b are formed and the addition of an impurity such as nitrogen contained in the deposition atmosphere. An oxygen vacancy is formed because of the added impurity element and the impurity element enters the oxygen vacancy, thereby increasing the carrier density and reducing resistance in the regions 426d of the metal oxide 406b. In some cases, the regions 426d are formed only at the interface of the metal oxide 406b depending on the deposition conditions of the conductors 452a and 452b.

The insulator 420 is preferably formed using an insulating material having a function of inhibiting the passage of impurities such as water or hydrogen and oxygen. For example, the insulator 420 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride.

Provision of the insulator 420 in the transistor 201 can prevent oxidation of the conductor 405. Furthermore, impurities such as water or hydrogen can be prevented from entering the metal oxide 406.

The transistor 201 can have a larger contact area between the metal oxide 406b and the electrode (the source electrode or the drain electrode) than the transistor 200. Furthermore, a step for forming the region 426b and the region 426c illustrated in FIGS. 50A to 50C is not necessary. Thus, the transistor 201 can have a larger on-state current than the transistor 200. In addition, the manufacturing process can be simplified.

For the details of the other components of the transistor 201, the description of the transistor 200 can be referred to.

Note that this embodiment can be combined with any of the other embodiments in this specification as appropriate.
(Notes on the Description in this Specification and the Like)

The following are notes on the description of the structures in the above embodiments.
<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.
<Notes on Ordinal Numbers>

Ordinal numbers such as "first," "second," and "third" in this specification and the like are used in order to avoid confusion among components. Thus, the ordinal numbers in this specification and the like do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.
<Notes on the Description for Drawings>

Embodiments are described with reference to drawings. It will be readily appreciated by those skilled in the art that modes and details can be changed in various ways without departing from the spirit and scope of the present invention. Therefore, the present invention should not be interpreted as being limited to the description in the embodiments. Note that in the structures of the invention described in the embodiments, the same portions or portions having similar functions are denoted by the same reference numerals in different drawings, and description of such portions is not repeated.

In this specification and the like, terms for describing arrangement, such as "over" and "under," are used for convenience for describing the positional relation between components with reference to drawings. The positional relation between components is changed as appropriate in accordance with a direction in which the components are described. Thus, terms for describing arrangement are not limited to those used in this specification and can be changed to other terms as appropriate depending on conditions.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a perspective view, some components might not be illustrated for clarity of the drawings.

The same components or components having similar functions, components formed using the same material, components formed at the same time, or the like in the drawings are denoted by the same reference numerals in some cases, and the description thereof is not repeated in some cases.

<Notes on Expressions that can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on conditions. In this specification and the like, the two terminals other than the gate may be referred to as a first terminal and a second terminal or as a third terminal and a fourth terminal. In this specification and the like, in the case where a transistor has two or more gates (such a structure is referred to as a dual-gate structure in some cases), these gates are referred to as a first gate and a second gate or as a front gate and a back gate in some cases. In particular, the term "front gate" can be replaced with a simple term "gate." The term "back gate" can be replaced with a simple term "gate." Note that a "bottom gate" is a terminal that is formed before a channel formation region in manufacture of a transistor, and a "top gate" is a terminal that is formed after a channel formation region in manufacture of a transistor.

A transistor has three terminals: a gate, a source, and a drain. A gate functions as a control terminal that controls the conduction state of a transistor. Depending on the channel type of the transistor or levels of potentials applied to the terminals, one of two input/output terminals functions as a source and the other functions as a drain. Therefore, the terms "source" and "drain" can be interchanged in this specification and the like. In this specification and the like, the two terminals other than the gate may be referred to as a first terminal and a second terminal or as a third terminal or a fourth terminal.

In addition, in this specification and the like, the term "electrode" or "wiring" does not limit a function of a component. For example, an "electrode" is used as part of a "wiring" in some cases, and vice versa. Furthermore, the term "electrode" or "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film," "layer," and the like can be interchanged with each other depending on circumstances or conditions. For example, the term "conductive layer" can be changed into the term "conductive film" in some cases. Moreover, the term "insulating film" can be changed into the term "insulating layer" in some cases, or can be replaced with a word not including the term "film" or "layer" depending on circumstances or conditions. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring," "signal line," "power source line," and the like can be interchanged with each other depending on circumstances or conditions. For example, the term "wiring" can be changed into the term "signal line" in some cases. Also, for example, the term "wiring" can be changed into the term "power source line" or the like in some cases. Inversely, the term "signal line," "power source line," or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor includes a channel formation region between the drain (a drain terminal, a drain region, or a drain electrode) and the source (a source terminal, a source region, or a source electrode) and current can flow between the source and the drain through the channel formation region. Note that in this specification and the like, the channel formation region refers to a region through which current mainly flows.

Functions of a source and a drain are sometimes interchanged with each other when a transistor of opposite polarity is used or when the direction of current flow is changed in circuit operation, for example. Therefore, the terms "source" and "drain" can be interchanged in this specification and the like.

<<Switch>>

In this specification and the like, a switch is in a conductive state (on state) or in a non-conductive state (off state) to determine whether current flows therethrough or not. Alternatively, a switch has a function of selecting and changing a current path.

Examples of the switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Connection>>

In this specification and the like, a description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X, Y, and the like each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit expression "X and Y are electrically connected" is the same as the explicit simple expression "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope. Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. In addition, the term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to 60° and less than or equal to 120°.

REFERENCE NUMERALS

PA: display portion, SD: source driver circuit, SD1: source driver circuit, SD2: source driver circuit, SD3: source driver circuit, GD: gate driver circuit, TC: timing controller, AFE: analog front end, DEC: decoder, PP: image processing portion, RCV: receive portion, I/F: interface, CP: control portion, ANT: antenna, RC: remote controller, AIE: AI encoder, AID: AI decoder, IL: input layer, ML1: intermediate layer, ML2: intermediate layer, ML3: intermediate layer, ML4: intermediate layer, OL: output layer, SR: shift register, AB1: analog buffer circuit, AB2: analog buffer circuit, SH: sample-and-hold circuit, SH[1]: sample-and-hold circuit, SH[2]: sample-and-hold circuit, DMX1: demultiplexer, DMX2: demultiplexer, PIX[1]: pixel, PIX[2]: pixel, Tr: transistor, C: capacitor, GNDL: wiring, GWL: wiring, Sig: signal, PSig: signal, SP: start pulse signal, CLK: clock signal, SR[0]: latch circuit, SR[1]: latch circuit, SR[2]: latch circuit, SR[n−1]: latch circuit, SR[n]: latch circuit, D: input terminal, Q: output terminal, AD[1]: AND circuit, AD[2]: AND circuit, AD[n−1]: AND circuit, AD [n]: AND circuit, NT: NOT circuit, SEL[1]: output terminal, SEL[2]: output terminal, SEL[n−1]: output terminal, SEL[n]: output terminal, Tr30: transistor, Tr31: transistor, Tr32: transistor, Tr33: transistor, SDA: source driver circuit, DS: image data, SLT: signal, LT1: latch circuit, LT2: latch circuit, DA: digital-to-analog converter circuit, SOL: wiring, GAL: wiring, PDL [1]: input terminal, PDL[l]: input terminal, PDR[1]: output terminal, PDR[n]: output terminal, PLE[1]: programmable logic element, PLE[m]: programmable logic element, SWC: switch circuit, PSW1: programmable switch, PSW2: programmable switch, PSW3: programmable switch, L[1]: wiring, L[2]: wiring, L[l]: wiring, R[1]: wiring, R[2]: wiring, R[m]: wiring, P[1]: wiring, P[2]: wiring, P[m]: wiring, Q[1]: wiring, Q[2]: wiring, Q[m]: wiring, In[1]: terminal, In[2]: terminal, In[s]: terminal, MLT[1]: multiplier circuit, MLT[s]: multiplier circuit, CMW[1]: configuration memory, CMW[s]: configuration memory, CMF: configuration memory, AD: adder circuit, FC: activation function circuit, KC: retention circuit, TA1: terminal, TA2: terminal, CKT: terminal, TrA: transistor, TrB: transistor, CA: capacitor, AMP: amplifier, NL: NOT circuit, N: node, q[1]: wiring, q[s]: wiring, r[1]: wiring, r[t]: wiring, O[1]: terminal, O[t]: terminal, SW: switch, X: wiring, CMS: configuration memory, OUT[1]: column output circuit, OUT[j]: column output circuit, OUT[j+1]: column output circuit, OUT[n]: column output circuit, Cref: reference column output circuit, SPT[1]: output terminal, SPT[j]: output terminal, SPT[j+1]: output terminal, SPT[n]: output terminal, OT[1]: output terminal, OT[j]: output terminal, OT[j+1]: output terminal, OT[n]: output terminal, OTref: output terminal, OSP: wiring, ORP: wiring, OSM: wiring, ORM: wiring, AM[1, 1]: memory cell, AM[i, 1]: memory cell, AM[m, j]: memory cell, AM[1, 1]: memory cell, AM[i, j]: memory cell, AM[m, j]: memory cell, AM[1, n]: memory cell, AM[i, n]: memory cell, AM[m, n]: memory cell, AM[i+1, j]: memory cell, AM[i, j+1]: memory cell, AM[i+1, j+1]: memory cell, AMref: memory cell, VR: wiring, RW[1]: wiring, RW[i]: wiring, RW[m]: wiring, WW[1]: wiring, WW[i]: wiring, WW[m]: wiring, WD[1]: wiring, WD[j]: wiring, WD[j+1]: wiring, WD [n]: wiring, WDref: wiring, B[1]: wiring, B[j]: wiring, B[j+1]: wiring, B[n]: wiring, Bref: wiring, VDDL: wiring, VSSL: wiring, CI: constant current circuit, CIref: constant current circuit, CM: current mirror circuit, OL[1]: wiring, OL[j]: wiring, OL[n]: wiring, OLref: wiring, IL[1]: wiring, IL[j]: wiring, IL[j+1]: wiring, IL[n]: wiring, ILref: wiring, NCMref: node, N[1, 1]: node, N[i, 1]: node, N[m, 1]: node, N[1, j]: node, N[i, j]: node, N[m, j]: node, N[1, n]: node, N[i, n]: node, N[m, n]: node, N[i+1, j]: node, N[i, j+1]: node, N[i+1, j+1]: node, Nref[1]: node, Nref[i]: node, Nref [i+1]: node, Nref[m]: node, C1: capacitor, C2: capacitor, C3: capacitor, CT1: terminal, CT1-1: terminal, CT1-2: terminal, CT1-3: terminal, CT2: terminal, CT3: terminal, CT4: terminal, CT5[1]: terminal, CT5[j]: terminal, CT5[j+1]: terminal, CT5[n]: terminal, CT6[1]: terminal, CT6[j]: terminal, CT6[j+1]: terminal, CT6[n]: terminal, CT7: terminal, CT8: terminal, Tr1: transistor, Tr2: transistor, Tr3: transistor, Tr5: transistor, Tr7: transistor, Tr8: transistor, Tr9: transistor, Tr11: transistor, Tr12: transistor, Tr21: transistor, Tr22: transistor, Tr23: transistor, M1: transistor, M2: transistor, M3: transistor, $C_{S_{LC}}$: capacitor, $C_{S_{EL}}$: capacitor, GL: gate line, GL2: gate line, SL: signal line, DL: signal line, AL: current supply line, 10: electronic device, 11: display device, 12: receiver, 13: autoencoder, 20: display panel, 21: substrate, 22: pixel, 23: FPC, 24: printed circuit board, 25: FPC, 26: printed circuit board, 27: integrated circuit, 30: display region, 100: NN circuit, 100A: NN circuit, 100B: NN circuit, 150: arithmetic processing circuit, 161: circuit, 163: circuit, 164: circuit, 165: circuit, 200: transistor, 201: transistor, 214: insulator, 216: insulator, 220: insulator, 222: insulator, 224: insulator, 225: insulator, 280: insulator, 301: display element, 302: display element, 306: pixel circuit, 307: pixel circuit, 310: conductor, 310a: conductor, 310b: conductor, 384: insulator, 404: conductor, 404a: conductor, 404b: conductor, 405: conductor, 405a: conductor, 405b: conductor, 406: metal oxide, 406a: metal oxide, 406b: metal oxide, 406c: metal oxide, 412: insulator, 418: insulator, 419: insulator, 420: insulator, 426a: region, 426b: region, 426c: region, 426d: region, 440: conductor, 440a: conductor, 440b: conductor, 450a: conductor, 450b: conductor, 451a: conductor, 451b: conductor, 452a: conductor, 452b: conductor, 612: moving mechanism, 613: moving mechanism, 615: stage, 616: ball screw mechanism, 620: laser oscillator, 621: optical system unit, 622: mirror, 623: microlens array, 624: mask, 625: laser light, 626: laser light, 627: laser beam, 630: substrate, 640: amorphous silicon layer, 641: polycrystalline silicon layer, 700: product-sum operation circuit, 710: offset circuit, 711: offset circuit, 713: offset circuit, 715: offset circuit, 716: offset circuit, 720: memory cell array, 721: memory cell array, 751: offset circuit, 760: memory cell array, 800: semiconductor device, 801: shift register, 1400: display device, 1411: substrate, 1412: substrate, 1420: liquid crystal element, 1421: conductive layer, 1422: liquid crystal, 1423: conductive layer, 1424a: alignment film, 1424b: alignment film, 1426: insulating layer, 1430: transistor, 1431: conductive layer, 1431a: conductive layer, 1432: semiconductor layer, 1432p: semiconductor layer, 1433a: conductive layer, 1433b: conductive layer, 1434: insulating layer, 1435: impurity semiconductor layer, 1437: semiconductor layer, 1438: connection portion, 1439a: polarizing plate, 1439b: polarizing plate, 1441: coloring layer, 1442: light-blocking layer, 1460: capacitor, 1481: insulating layer, 1482: insulating layer, 1483: insulating layer, 1484: insulating layer, 1490: backlight unit, 5221: housing, 5222: display portion, 5223: operation button, 5224: speaker, 6200: digital signage, 6201: wall, 9000: housing, 9001: display portion, 9003: speaker, 9005: operation key, 9006: connection terminal, and 9007: sensor.

This application is based on Japanese Patent Application Serial No. 2017-011939 filed with Japan Patent Office on Jan. 26, 2017, Japanese Patent Application Serial No. 2017-

026719 filed with Japan Patent Office on Feb. 16, 2017, and Japanese Patent Application Serial No. 2017-031672 filed with Japan Patent Office on Feb. 23, 2017, the entire contents of which are hereby incorporated by reference.

The invention claimed is:

1. A semiconductor device comprising:
a shift register;
a sample-and-hold circuit;
a first demultiplexer;
a second demultiplexer;
a first buffer circuit; and
a second buffer circuit,
wherein the sample-and-hold circuit comprises a first input terminal, a second input terminal, and an output terminal,
wherein an output terminal of the first buffer circuit is electrically connected to the first input terminal of the sample-and-hold circuit,
wherein the shift register is electrically connected to the second input terminal of the sample-and-hold circuit,
wherein an input terminal of the second buffer circuit is electrically connected to the output terminal of the sample-and-hold circuit,
wherein the first demultiplexer is electrically connected to the output terminal of the first buffer circuit and the first input terminal of the sample-and-hold circuit,
wherein the second demultiplexer is electrically connected to the shift register and the second input terminal of the sample-and-hold circuit,
wherein an input terminal of the first buffer circuit is configured to receive an analog signal, and
wherein the sample-and-hold circuit is configured to receive the analog signal through the first input terminal when a signal from the shift register is transmitted to the second input terminal and is configured to hold a potential corresponding to the analog signal.

2. The semiconductor device according to claim 1, wherein the sample-and-hold circuit further comprises a first transistor and a first capacitor.

3. The semiconductor device according to claim 2,
wherein a first terminal of the first transistor is electrically connected to the first input terminal,
wherein a second terminal of the first transistor is electrically connected to the output terminal of the sample-and-hold circuit,
wherein a gate of the first transistor is electrically connected to the second input terminal, and
wherein a first terminal of the first capacitor is electrically connected to the second terminal of the first transistor.

4. The semiconductor device according to claim 2, wherein the first transistor comprises a metal oxide in a channel formation region.

5. The semiconductor device according to claim 2, further comprising a display portion,
wherein the display portion comprises a second transistor in a pixel, and
wherein the second transistor comprises hydrogenated amorphous silicon in a channel formation region.

6. The semiconductor device according to claim 2, further comprising a display portion,
wherein the display portion comprises a second transistor in a pixel, and
wherein the second transistor comprises a metal oxide in a channel formation region.

7. The semiconductor device according to claim 1, further comprising an autoencoder,
wherein the autoencoder is electrically connected to the input terminal of the first buffer circuit,
wherein the autoencoder is configured to convert first image data into second image data obtained by feature extraction of the first image data, restore the second image data into the first image data, and output the first image data restored as the analog signal, when a first analog signal based on the first image data is input to the autoencoder, and
wherein the analog signal is input to the input terminal of the first buffer circuit.

8. The semiconductor device according to claim 7,
wherein the autoencoder comprises an encoder and a decoder,
wherein the encoder is configured to convert first image data into second image data by feature extraction and output the second image data to the decoder, and
wherein the decoder is configured to restore the second image data into the first image data and output the first image data.

9. The semiconductor device according to claim 8, wherein the encoder comprises a neural network configured to perform convolution using a weight filter.

10. A semiconductor device comprising:
a shift register;
a first demultiplexer;
a second demultiplexer;
a sample-and-hold circuit;
a first buffer circuit; and
a second buffer circuit,
wherein the sample-and-hold circuit comprises a first input terminal, a second input terminal, and an output terminal,
wherein an output terminal of the first buffer circuit is electrically connected to an input terminal of the first demultiplexer,
wherein an output terminal of the first demultiplexer is electrically connected to the first input terminal,
wherein the shift register is electrically connected to an input terminal of the second demultiplexer,
wherein an output terminal of the second demultiplexer is electrically connected to the second input terminal,
wherein an input terminal of the second buffer circuit is electrically connected to the output terminal of the sample-and-hold circuit, and
wherein the sample-and-hold circuit is configured to receive an analog signal through the first input terminal when a signal from the shift register is transmitted to the second input terminal and is configured to hold a potential corresponding to the analog signal.

11. The semiconductor device according to claim 10, wherein the first demultiplexer and the second demultiplexer are controlled by the same signal.

12. The semiconductor device according to claim 10, wherein the sample-and-hold circuit further comprises a first transistor and a first capacitor.

13. The semiconductor device according to claim 12,
wherein a first terminal of the first transistor is electrically connected to the first input terminal,
wherein a second terminal of the first transistor is electrically connected to the output terminal of the sample-and-hold circuit,
wherein a gate of the first transistor is electrically connected to the second input terminal, and
wherein a first terminal of the first capacitor is electrically connected to the second terminal of the first transistor.

14. The semiconductor device according to claim 12, wherein the first transistor comprises a metal oxide in a channel formation region.

15. The semiconductor device according to claim 12, further comprising a display portion,
   wherein the display portion comprises a second transistor in a pixel, and
   wherein the second transistor comprises hydrogenated amorphous silicon in a channel formation region.

16. The semiconductor device according to claim 12, further comprising a display portion,
   wherein the display portion comprises a second transistor in a pixel, and
   wherein the second transistor comprises a metal oxide in a channel formation region.

17. The semiconductor device according to claim 10, further comprising an autoencoder,
   wherein the autoencoder is electrically connected to an input terminal of the first buffer circuit in the semiconductor device,
   wherein the autoencoder is configured to convert first image data into second image data obtained by feature extraction of the first image data, restore the second image data into the first image data, and output the first image data restored as a second analog signal, when a first analog signal based on the first image data is input to the autoencoder, and
   wherein the second analog signal is input to the input terminal of the first buffer circuit.

\* \* \* \* \*